United States Patent
Rachwal et al.

(10) Patent No.: US 10,840,397 B2
(45) Date of Patent: Nov. 17, 2020

(54) HIGHLY-FLUORESCENT AND PHOTO-STABLE CHROMOPHORES FOR WAVELENGTH CONVERSION

(71) Applicant: NITTO DENKO CORPORATION, Osaka (JP)

(72) Inventors: Mila Rachwal, Oceanside, CA (US); Michiharu Yamamoto, Carlsbad, CA (US)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 16/562,007

(22) Filed: Sep. 5, 2019

(65) Prior Publication Data
US 2019/0393367 A1    Dec. 26, 2019

Related U.S. Application Data

(60) Division of application No. 15/965,329, filed on Apr. 27, 2018, now Pat. No. 10,461,201, which is a continuation of application No. 14/758,949, filed as application No. PCT/US2014/010226 on Jan. 3, 2014, now Pat. No. 9,960,294.

(60) Provisional application No. 61/749,225, filed on Jan. 4, 2013.

(51) Int. Cl.
| C07D 487/04 | (2006.01) |
| H01L 31/0232 | (2014.01) |
| H01L 51/00 | (2006.01) |
| H01L 31/055 | (2014.01) |
| C09K 11/06 | (2006.01) |

(52) U.S. Cl.
CPC ........ *H01L 31/02322* (2013.01); *C09K 11/06* (2013.01); *H01L 31/055* (2013.01); *H01L 51/0071* (2013.01); *C09K 2211/1011* (2013.01); *C09K 2211/1014* (2013.01); *C09K 2211/1022* (2013.01); *C09K 2211/1029* (2013.01); *C09K 2211/1044* (2013.01); *C09K 2211/1051* (2013.01); *C09K 2211/1059* (2013.01); *Y02E 10/52* (2013.01)

(58) Field of Classification Search
CPC .................................................. C07D 487/04
USPC ....................................................... 544/345
See application file for complete search history.

(56) References Cited

U.S. PATENT DOCUMENTS

| 6,135,665 | A  | 10/2000 | Alfieri et al. |
| 7,791,157 | B2 | 9/2010  | Cho et al. |
| 9,287,419 | B2 | 3/2016  | Jiang et al. |
| 9,960,294 | B2 | 5/2018  | Rachwal et al. |
| 10,461,201 | B2 | 10/2019 | Rachwal et al. |
| 2009/0151785 | A1 | 6/2009 | Naum et al. |
| 2010/0012183 | A1 | 1/2010 | Yeh |
| 2010/0294339 | A1 | 11/2010 | Hollars |
| 2011/0016779 | A1 | 1/2011 | Hermans et al. |
| 2012/0262057 | A1 | 10/2012 | Fujita et al. |
| 2012/0267615 | A1 | 10/2012 | Fujita et al. |
| 2013/0111810 | A1 | 5/2013 | Gravisse et al. |
| 2013/0284265 | A1 | 10/2013 | Jiang et al. |
| 2015/0340519 | A1 | 11/2015 | Rachwal et al. |

FOREIGN PATENT DOCUMENTS

| CN | 1 186 835 | 7/1998 |
| CN | 1 269 393 | 10/2000 |
| CN | 1 380 351 | 11/2002 |
| CN | 1 385 490 | 12/2002 |
| CN | 101 343 352 | 1/2009 |
| CN | 102 532 932 | 7/2012 |
| CN | 102 731 533 | 10/2012 |
| EP | 0 579 835 | 1/1994 |

(Continued)

OTHER PUBLICATIONS

Qian, et al., Synthesis and Application of Thiadiazoloquinoxaline-Containing Chromophores as Dopants for Efficient Near-Infrared Organic Light-Emitting Diodes, Journal of Physical Chemistry C, dated Oct. 29, 2008, in 7 pages.

(Continued)

*Primary Examiner* — Douglas M Willis

(74) *Attorney, Agent, or Firm* — Knobbe, Martens, Olson & Bear, LLP

(57) ABSTRACT

The invention provides highly fluorescent materials comprising a heterocyclic systems represented by formula (I): $D_1$-Het$-(L$-Het$-)_i D_2$, wherein i is 0 and Het is

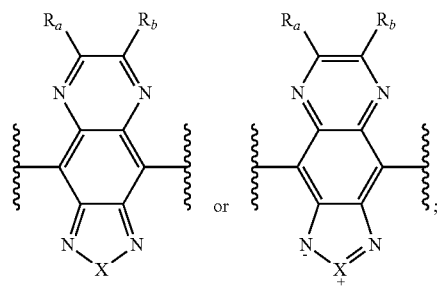

wherein X is —S—. The chromophores are particularly useful for absorption and emission of photons in the visible and near infrared wavelength range. The photo-stable highly luminescent chromophores are useful in various applications, including in wavelength conversion films. Wavelength conversion films have the potential to significantly enhance the solar harvesting efficiency of photovoltaic or solar cell devices.

13 Claims, No Drawings

(56) References Cited

FOREIGN PATENT DOCUMENTS

| | | |
|---|---|---|
| JP | 57-169757 | 10/1982 |
| JP | 58-009151 | 1/1983 |
| JP | 07-170865 | 7/1995 |
| JP | 2007-084792 | 4/2007 |
| JP | 4141025 | 6/2008 |
| JP | 2008-166339 | 7/2008 |
| JP | 2011-102841 | 5/2011 |
| JP | 2011-151094 | 8/2011 |
| JP | 2012-222248 | 11/2012 |
| JP | 2012-224567 | 11/2012 |
| JP | 2013-038245 | 2/2013 |
| JP | 2013-045977 | 3/2013 |
| JP | 5227894 | 3/2013 |
| JP | 2013-140839 | 7/2013 |
| JP | 2013-177327 | 9/2013 |
| JP | 2014-080400 | 5/2014 |
| JP | 2014-082405 | 5/2014 |
| WO | WO 2012/046715 | 4/2012 |
| WO | WO 2013/049062 | 4/2013 |
| WO | WO 2014/107606 | 9/2014 |

OTHER PUBLICATIONS

Japanese Patent Office, Notification of Reasons for Refusal, Application No. 2018-236185, dated Oct. 15, 2019, in 13 pages.
Adegoke et al., "A TD-DFT Study of the Optical Properties of (2,7-fluorene)-Heterocyclic Derivatives", Chemical Physics Letters, 2012, vol. 532, pp. 63-67.
Dallos et al., "Thiadiazoloquinoxalines: Tuning Physical Properties through Smart Synthesis", Organic Letters, 2011, vol. 13, No. 8, pp. 1936-1939.
Denysenko et al., "Reversible Gas-Phase Redox Processes Catalyzed by Co-Exchanged MFU-4l(arge)", Chemical Communications, 2012, vol. 48, No. 9, pp. 1236-1238.
Dong et al., "Synthesis of Novel Narrow-Band-Gap Copolymers Based on [1,2,5]thiadiazolo[3,4-f]Benzotriazole and their Application in Bulk-Heterojunction Photovoltaic Devices", Polymer, Mar. 22, 2012, vol. 53, No. 7, pp. 1465-1472.
Du et al., "Donor-Acceptor Type Silole Compounds with Aggregation-Induced Deep-Red Emission Enhancement: Synthesis and Application for Significant Intensification of Near-Infrared Photoluminescence," Chemical Communications, 2011, vol. 47, pp. 4276-4278.
Du et al., "Efficient Non-doped Near Infrared Organic Light-Emitting Devices Based on Fluorophores with Aggregation-Induced Emission Enhancement," Chemical Materials, 2012, vol. 24, No. 11, pp. 2178-2185.
Fu et al. "An Investigation on the Electronic Properties of Thiadiazoloquinoxaline-Based Copolymers and the Effect of Donor-to-Acceptor Ratio on Their Properties", Journal of Molecular Structure: THEOCHEM, vol. 957, 2010, pp. 94-99.
Hart et al., "Diamino-Benzo[1,2-d:4,5-d']bistriazole (DABT), a New Useful 1,4-Dibenzyne Equivalent", Tetrahedron Letters, 1984, vol. 25, No. 20, pp. 2073-2076.
Hart et al., "Synthesis of 1,5-Diamino-1,5-dihydrobenzo[1,2-d:4,5-d']bistriazole (DABT) and Its Use as a 1,4-Benzadiyne Equivalent", The Journal of Organic Chemistry, 1986, vol. 51, No. 7, pp. 979-986.
International Preliminary Report on Patentability in PCT Application No. PCT/US2014/010226 dated Jul. 16, 2015.
International Search Report and Written Opinion in PCT Application No. PCT/US2014/010226 dated Jul. 21, 2014.
Invitation to Pay Fees in PCT Application No. PCT/US2014/010226 dated May 2, 2014.
Karikomi et al., "New Narrow-Bandgap Polymer Composed of Benzobis(1,2,5-thiadiazole) and Thiophenes," Journal of American Chemical Society, 1995, vol. 117, No. 25, pp. 6791-6792.
Kitamura et al., "Design of Narrow-Bandgap Polymers. Syntheses and Properties of Monomers and Polymers Containing Aromatic-Donor and o-Quinoid-Acceptor Units," Chemical Materials, 1996, vol. 8, pp. 570-578.

Li et al., "Discovery of Novel Checkpoint Kinase 1 Inhibitors by Virtual Screening Based on Multiple Crystal Structures", Journal of Chemical Information and Modeling, 2011, vol. 51, No. 11, pp. 2904-2914.
Longo et al., "Comparison Between Theoretical and Experimental Electronic Properties of some Popular Donor Polymers for Bulk-Heterojunction Solar Cells," Solar Energy Materials & Solar Cells, 2012, vol. 97, pp. 139-149.
Luo et al., "Rational Design, Synthesis, and Optical Properties of Film-Forming, Near-Infrared Absorbing, and Fluorescent Chromophores with Multidonors and Large Heterocuclic Acceptors", Chemistry A European Journal, 2009, vol. 15, pp. 8902-8908.
Murugesan et al., "Synthesis and Characterizations of Benzotriazole Based Donor-Acceptor Copolymers for Organic Photovoltaic Applications", Synthetic Metals, vol. 162, 2012, pp. 1037-1045.
Official Communication in Japanese Patent Application No. 2015-551786, dated Jan. 9, 2018.
Ozdemir et al., "A Promising Combination of Benzotriazole and Quinoxaline Units: A New Acceptor Moiety Toward Synthesis of Multipurpose Donor—Acceptor Type Polymers", Journal of Materials Chemistry, 2012, vol. 22, pp. 4687-4694.
Pasker et al., "Thiophene-2-aryl-2H-benzotriazole-thiophene Oligomers with Adjustable Electronic Properties," Organic Letters, 2011, vol. 13, No. 9, pp. 2338-2341.
Patel et al., "It Takes More Than an Imine: The Role of the Central Atom on the Electron-Accepting Ability of Benzotriazole and Benzothiadiazole Oligomers", Journal of the American Chemical Society, Feb. 8, 2012, vol. 134, No. 5, pp. 2599-2612.
Qian et al., "Synthesis and Application of Thiadiazoloquinoxaline-Containing Chromophores as Dopants for Efficient Near-Infrared Organic Light-Emitting Diodes," Journal of Physical Chemistry, 2009, vol. 113, pp. 1589-1595.
Ryazanova et al., "Absorption and Fluorescent Spectral Studies of Imidazophenazine Derivatives", Spectrochimica Acta Part A: Molecular and Biomolecular Spectroscopy, Jul. 2004, vol. 60, Nos. 8-9, pp. 2005-2011.
Ryazanova et al., "pH-Induced Changes in Electronic Absorption and Fluorescence Spectra of Phenazine Derivatives", Spectrochimica Acta Part A: Molecular and Biomolecular Spectroscopy, Apr. 2007, vol. 66, Nos. 4-5, pp. 849-859.
Sun et al., "Selenophene and Fluorene Based Narrow Band Gap Copolymers with Eg=1.41 eV for Near Infrared Polymer Light Emitting Diodes," Synthetic Metals, 2012, vol. 162, pp. 1406-1410.
Tam et al., "Synthesis and Characterization of [1,2,5]Chalcogenazolo[3,4-f]-benzo[1,2,3]triazole and [1,2,3]Triazolo[3,4-g]quinoxaline Derivatives", Organic Letters, Sep. 2, 2011, vol. 13, No. 17, pp. 4612-4615.
Tam et al., "Synthesis and Characterization of a Series of Annelated Benzotriazole Based Polymers with Variable Bandgap", The Journal of Organic Chemistry, 2012, vol. 77, pp. 10035-10041.
Tam et al., "One-Pot Synthesis of 4,8-Dibromobenzo[1,2-d;4,5-d']Bistriazole and Synthesis of its Derivatives as New Units for Conjugated Materials", Organic Letters, Jan. 20, 2012, vol. 14, No. 2, pp. 532-535.
Wu et al., "Theoretical Electronic Structure and Properties of Alternating Fluorene-Accepto Conjugated Copolymers and Their Model Compounds", Journal of Polymer Research, 2006, vol. 13, pp. 441-449.
Yamashita et al., "Synthesis and Properties of Benzobis(thiadiazole)s with Nonclassical π-Electron Ring Systems," Tetrahedron, Jan. 1997, vol. 53, No. 29, pp. 10169-10178.
Yang et al., "Efficient Near-Infrared Organic Light-Emitting Devices Based on Low-Gap Fluorescent Oligomers", Journal of Applied Physics, 2009, vol. 106, pp. 044509-1-044509-7.
Zhang et al., "Low Bandgap EDOT-Quinoxaline and EDOT-Thiadiazol-Quinoxaline Conjugated Polymers: Synthesis, Redox, and Photovoltaic Device", Polymer, 2010, pp. 2313-2319.
Dorwald, F. Zaragoza, Side Reactions in Organic Synthesis: A Guide to Successful Synthesis Design, Weinheim: Wiley-VCH Verlag GmbH & Co. KGaA, 2005, Preface.
Official Communication in Japanese Patent Application No. 2018-236185, dated Jun. 16, 2020.

(56) References Cited

OTHER PUBLICATIONS

Official Communication in Korean Patent Application No. 10-2015-7020847, dated Jun. 4, 2020.

HIGHLY-FLUORESCENT AND PHOTO-STABLE CHROMOPHORES FOR WAVELENGTH CONVERSION

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present invention generally relates to photo-stable highly luminescent chromophores which are useful in various applications, including in wavelength conversion films. Wavelength conversion films have the potential to significantly enhance the solar harvesting efficiency of photovoltaic or solar cell devices. In particular, the chromophores described herein are useful for wavelength conversion of visible and near infrared radiation.

Description of the Related Art

In recent years, with the need for new optical light collection systems, fluorescence-based solar collectors, fluorescence-activated displays, and single-molecule spectroscopy, various approaches for preparing luminescent chromophores have been explored. However, many technical issues have yet to be overcome.

In the form of monomers, oligomers or polymers, 2H-benzo[d][1,2,3]triazole derivatives have recently become of high interest due to their usefulness in designing electrochromic and optoelectronic devices. Typical derivatives of 2H-benzo[d][1,2,3]triazole from the literature are composed of electron-donating substituents at the N-2, C-4 and C-7 positions, as shown below in Structure A, where typical electron-donors described in the literature comprise alkyl 1-hydroxyphenyl and 1-alkoxyphenyl groups, and typical electron donor groups at N-2 described in the literature comprise alkyl, 2-hydroxyphenyl, and 2-alkoxyphenyl. These derivatives exhibit strong absorption and fluorescence bands in UV and/or short visible wavelength region.

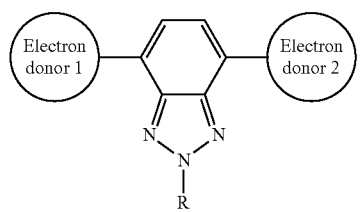

Structure A

Chromophores based on 2-alkylbenzotriazole scaffold have also become of significant interest in recent years. The majority of these types of compounds comprise 2-alkyl-4,7-dithienylbenzotriazole units, similar to Structure B, shown below, with various substituents, usually in the form of polymers and copolymers.

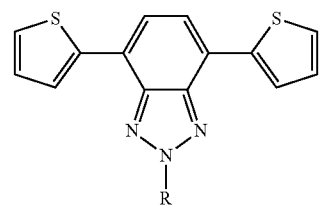

Structure B

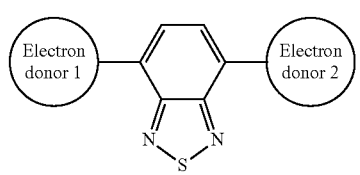

Structure C

Chromophores based on benzothiadiazole, shown by Structure C, are the most common, especially with thienyl groups as electron donors, which are convenient building blocks for fluorescent polymers.

While much of the work on organic luminescent dyes has focused on the two ring core structure described above, there has been very little work reported on luminescent dyes with three ring cores. Some initial studies of compounds with the following three ring core structures have been reported:

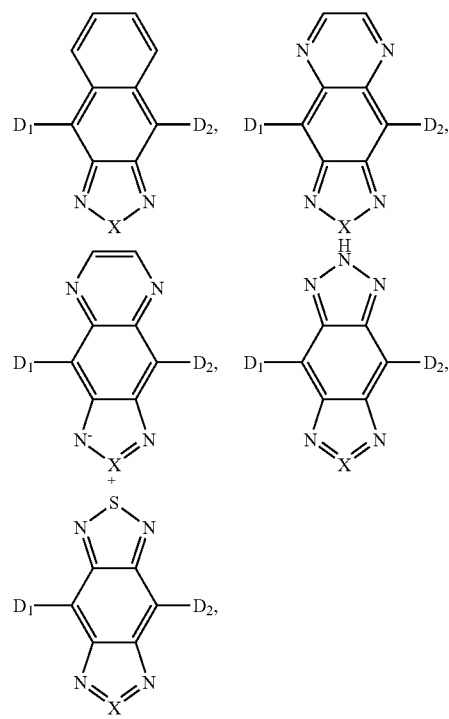

where X is N, S, or Se, and $D_1$ and $D_2$ are hydrogen, furan, or thiophen, and are described in the following publications: Japanese patent applications JP19810054380 and JP19810107409, Organic Letters 2011, 13(17), 4612, Journal of Materials Chemistry 2012, 22, 4687, Organic Letters 2011, 13(9), 2338, Spectrochimica Acta Part A 2007, 66, 849, Spectrochimica Part A 2004, 60, 2005, Journal of Chemical Information and Modeling 2011, 51, 2904, Chem. Commun. 2012, 48, 1236, Organic Letters 2012, 14(2), 532, Journal of Organic Chemistry 1986, 51, 979, Tetrahedron Letters 1984, 25(20), 2073, *Polymer* 2012, 53, 1465, *Journal of the American Chemical Society* 2012, 134, 2599.

One of the useful properties of fluorescence (or photo-luminescent) dyes is that they have the ability to absorb light photons of a particular wavelength, and re-emit the photons at a different wavelength. This phenomenon also makes them useful in the photovoltaic industry. The utilization of solar energy offers a promising alternative energy source to the traditional fossil fuels, and therefore, the development of devices that can convert solar energy into electricity, such as photovoltaic devices (also known as solar cells), has drawn significant attention in recent years. Several different types of mature photovoltaic devices have been developed, including a Silicon based device, a III-V and II-VI PN junction device, a Copper-Indium-Gallium-Selenium (CIGS) thin film device, an organic sensitizer device, an organic thin film device, and a Cadmium Sulfide/Cadmium Telluride (CdS/CdTe) thin film device, to name a few. However, the photoelectric conversion efficiency of many of these devices still has room for improvement and development of techniques to improve this efficiency has been an ongoing challenge for many researchers.

One technique developed to improve the efficiency of photovoltaic devices is to utilize a wavelength conversion film. Many of the photovoltaic devices are unable to effectively utilize the entire spectrum of light as the materials on the device absorb certain wavelengths of light (typically the shorter UV wavelengths) instead of allowing the light to pass through to the photoconductive material layer where it is converted into electricity. Application of a wavelength conversion film absorbs the shorter wavelength photons and re-emits them at more favorable longer wavelengths, which can then be absorbed by the photoconductive layer in the device, and converted into electricity.

While there have been numerous disclosures of wavelength conversion inorganic mediums used in photovoltaic devices and solar cells, there has been very little work reported on the use of photo-luminescent organic mediums for efficiency improvements in photovoltaic devices. The use of luminescent down-shifting materials to improve the efficiency of photovoltaic devices and solar cells has been disclosed in several publications, including U.S. Pat. No. 7,791,157, and U.S. Patent Application Publication Nos. 2009/0151785, 2010/0294339, and 2010/0012183. All of these publications include example embodiments of luminescent down-shifting mediums applied to a photovoltaic device or solar cell in which the medium is composed of an inorganic material. The use of an organic medium, as opposed to an inorganic medium, is attractive in that organic materials are typically cheaper and easier to use, making them a better economical choice. However, most of the currently available organic luminescent dyes are typically not photo-stable for long periods of time, and therefore unusable in photovoltaic applications which require consistent performance for 20+ years.

SUMMARY OF THE INVENTION

Novel compounds of heterocyclic system are disclosed. These compounds are useful as chromophores that provide desirable optical properties and good photo-stability.

Some embodiments provide a chromophore represented by formula I:

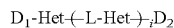  (I)

wherein Het is selected from the group consisting of:

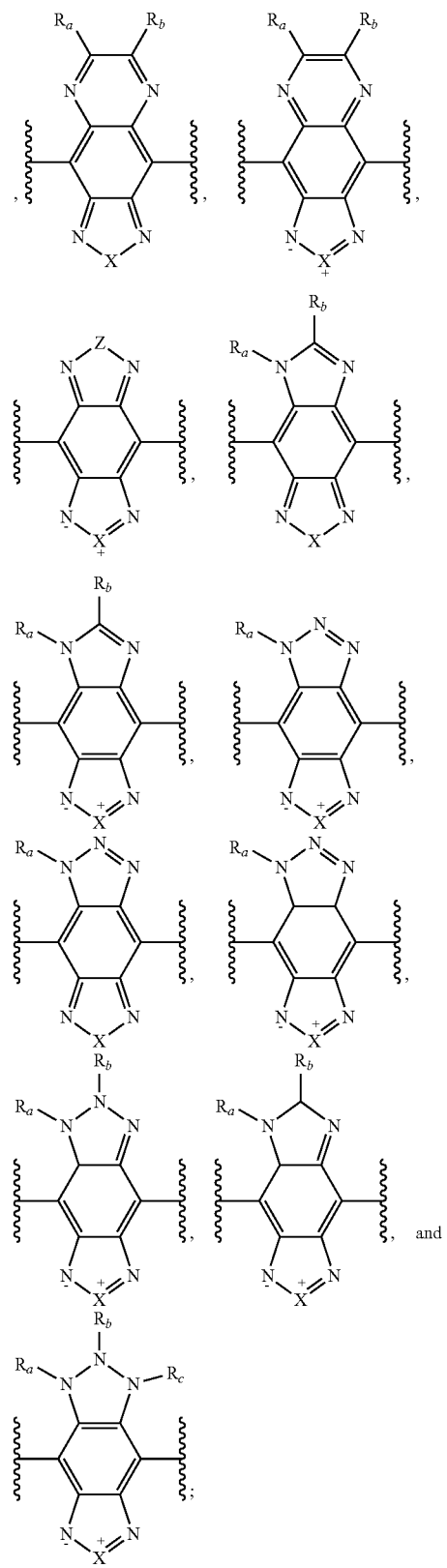

wherein i is 0 or an integer in the range of 1 to 100, X is selected from the group consisting of —N(A$_0$)-, —O—, —S—, —Se—, and —Te—; and Z is selected from the group consisting of —N(R$_a$)—, —O—, —S—, —Se—, and —Te—.

Each A$_0$ of formula I is selected from the group consisting of hydrogen, optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, optionally substituted acyl, optionally substituted carboxy, and optionally substituted carbonyl.

Each R$_a$, R$_b$, and R$_c$, of formula I are independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or R$_a$ and R$_b$, or R$_b$ and R$_c$, or R$_a$ and R$_c$, together form an optionally substituted ring or an optionally substituted polycyclic ring system, wherein each ring is independently cycloalkyl, aryl, heterocyclyl, or heteroaryl.

Each D$_1$ and D$_2$ of formula I are independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, cyclic imido, -aryl-NR'R", -ary-aryl-NR'R", and -heteroaryl-heteroaryl-R'; wherein R' and R" are independently selected from the group consisting of optionally substituted alkyl, optionally substituted alkenyl, and optionally substituted aryl; or one or both of R' and R" forms a fused heterocyclic ring with aryl to which the N is attached to; provided that D$_1$ and D$_2$ are not both hydrogen, and D$_1$ and D$_2$ are not optionally substituted thiophene or optionally substituted furan.

L of formula I is independently selected from the group consisting of optionally substituted alkyl, optionally substituted aryl, optionally substituted heteroaryl, amino, amido, imido, optionally substituted alkoxy, acyl, carboxy, provided that L is not optionally substituted thiophene or optionally substituted furan.

Some embodiments of the invention provide a chromophore represented by formula IIa or formula IIb:

Het$_2$—A$_0$—Het$_2$, (IIa)

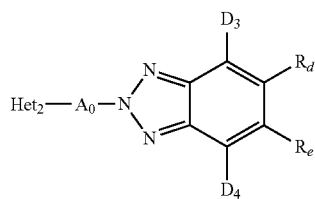
(IIb)

wherein Het$_2$ is selected from the group consisting of:

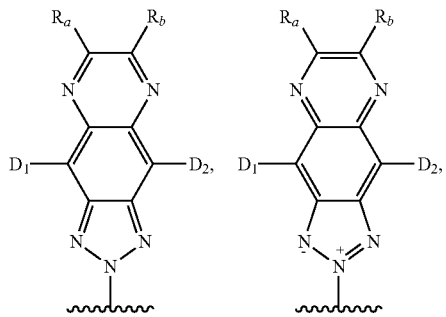

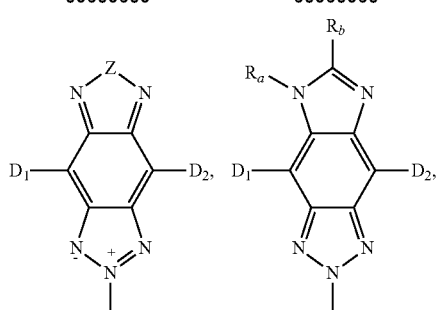

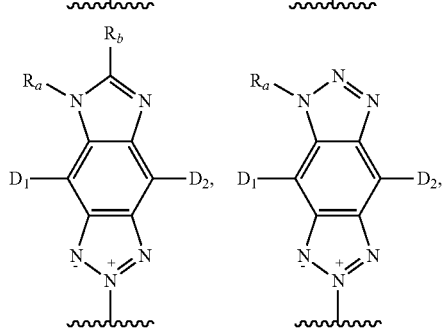

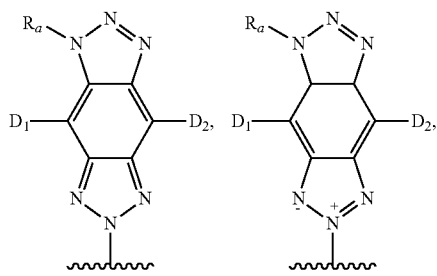

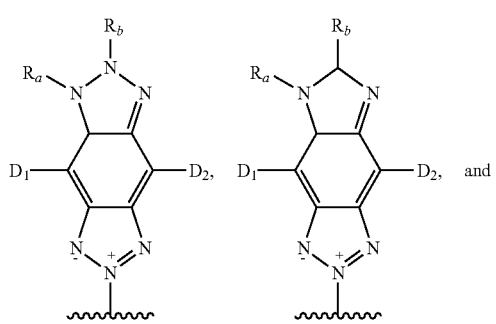

and

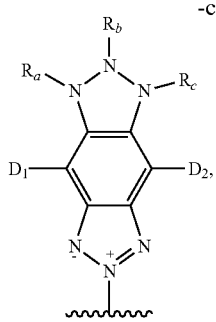

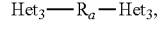

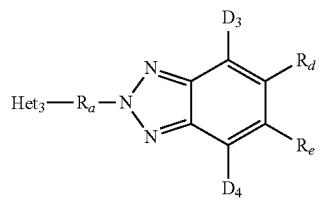

wherein Z is selected from the group consisting of —N(R_a)—, —O—, —S—, —Se—, and —Te—.

Each of the $R_a$, $R_b$, and $R_c$, in formula IIa and formula IIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_a$ and $R_b$, or $R_b$ and $R_c$, or $R_a$ and $R_c$, together form an optionally substituted ring or an optionally substituted polycyclic ring system, wherein each ring is independently cycloalkyl, aryl, heterocyclyl, or heteroaryl.

Each of the $R_d$ and $R_e$ in formula IIa and formula IIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_d$ and $R_e$ together form an optionally substituted ring or an optionally substituted polycyclic ring system, wherein each ring is independently cycloalkyl, aryl, heterocyclyl, or heteroaryl.

Each of $D_1$, $D_2$, $D_3$, and $D_4$ in formula IIa and formula IIb is each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, cyclic imido, -aryl-NR'R", -ary-aryl-NR'R", and -heteroaryl-heteroaryl-R'; wherein R' and R" are independently selected from the group consisting of optionally substituted alkyl, optionally substituted alkenyl, and optionally substituted aryl; or one or both of R' and R" forms a fused heterocyclic ring with aryl to which the N is attached to; provided that $D_1$ and $D_2$ are not both hydrogen, and $D_1$ and $D_2$ are not optionally substituted thiophene or optionally substituted furan.

Some embodiments provide a chromophore represented by formula IIIa and formula IIIb:

wherein Het_3 is selected from the group consisting of:

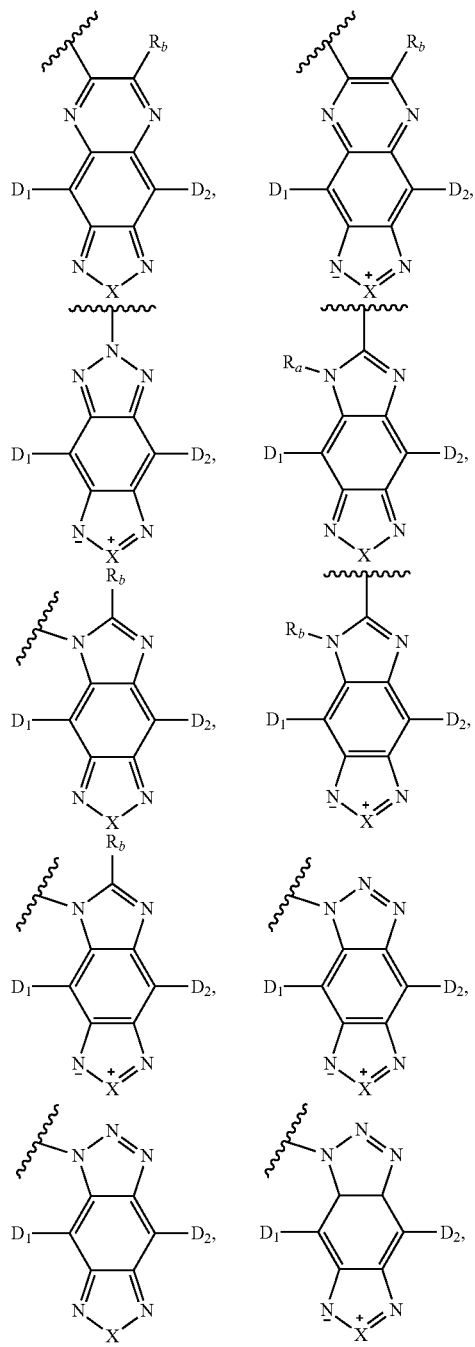

-continued

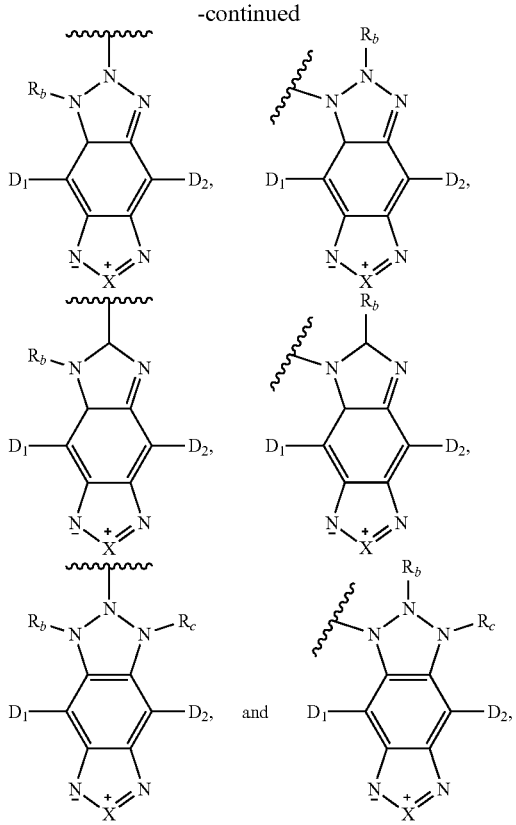

and wherein X is selected from the group consisting of —N(A₀)—, —O—, —S—, —Se—, and —Te—.

Each $A_0$ of formula IIIa and formula IIIb is selected from the group consisting of hydrogen, optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, optionally substituted acyl, optionally substituted carboxy, and optionally substituted carbonyl.

Each $R_a$, $R_b$, and $R_c$, of formula IIIa and formula IIIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_a$ and $R_b$, or $R_b$ and $R_c$, or $R_a$ and $R_c$, together form an optionally substituted ring or an optionally substituted polycyclic ring system, wherein each ring is independently cycloalkyl, aryl, heterocyclyl, or heteroaryl.

Each $R_d$ and $R_e$ of formula IIIa and formula IIIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_d$ and $R_e$ together form an optionally substituted ring or an optionally substituted polycyclic ring system, wherein each ring is independently cycloalkyl, aryl, heterocyclyl, or heteroaryl.

Each $D_1$, $D_2$, $D_3$, and $D_4$ of formula IIIa and formula IIIb is independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, cyclic imido, -aryl-NR'R", -ary-aryl-NR'R", and -heteroaryl-heteroaryl-R'; wherein R' and R" are independently selected from the group consisting of optionally substituted alkyl, optionally substituted alkenyl, and optionally substituted aryl; or one or both of R' and R" forms a fused heterocyclic ring with aryl to which the N is attached to; provided that $D_1$ and $D_2$ are not both hydrogen, and $D_1$ and $D_2$ are not optionally substituted thiophene or optionally substituted furan.

Some embodiments also provide a wavelength conversion luminescent medium comprising an optically transparent polymer matrix and at least one luminescent dye comprising a chromophore as disclosed herein.

Some embodiments also provide a photovoltaic module comprising at least one photovoltaic device or solar cell, and a wavelength conversion luminescent medium as disclosed herein, wherein the wavelength conversion luminescent medium is positioned such that the incident light passes through the wavelength conversion luminescent medium prior to reaching the photovoltaic device or solar cell.

Some embodiments provide a method for improving the performance of a photovoltaic device or solar cell, comprising applying a wavelength conversion luminescent medium as disclosed herein directly onto the light incident side of the photovoltaic device or solar cell, or encapsulate the wavelength conversion luminescent medium in the photovoltaic device or solar cell.

Further aspects, features and advantages of this invention will become apparent from the detailed description of the preferred embodiments which follow.

DETAILED DESCRIPTION

One of the useful properties of fluorescence (or photoluminescent) dyes is that they have the ability to absorb light photons of a particular wavelength, and re-emit the photons at a different wavelength. This phenomenon also makes them useful in the photovoltaic industry.

The chromophores represented by general formula I, formula IIa, formula IIb, formula IIIa, and formula IIIb, are useful as fluorescent dyes in various applications, including in wavelength conversion films. As shown in the formulae, the dye comprises a benzo heterocyclic system. Additional detail and examples, without limiting the scope of the invention, on the types of compounds that can be used are described below.

The term "alkyl" refers to a branched or straight fully saturated acyclic aliphatic hydrocarbon group (i.e. composed of carbon and hydrogen containing no double or triple bonds). Alkyls include, but are not limited to, methyl, ethyl, propyl, isopropyl, butyl, isobutyl, tertiary butyl, pentyl, hexyl, and the like.

The term "heteroalkyl" used herein refers to an alkyl group comprising one or more heteroatoms. When two or more heteroatoms are present, they may be the same or different.

The term "cycloalkyl" used herein refers to saturated aliphatic ring system radical having three to twenty carbon atoms including, but not limited to, cyclopropyl, cyclopentyl, cyclohexyl, cycloheptyl, and the like.

The term "alkenyl" used herein refers to a monovalent straight or branched chain radical of from two to twenty carbon atoms containing at least one carbon double bond including, but not limited to, 1-propenyl, 2-propenyl, 2-methyl-1-propenyl, 1-butenyl, 2-butenyl, and the like.

The term "alkynyl" used herein refers to a monovalent straight or branched chain radical of from two to twenty carbon atoms containing a carbon triple bond including, but not limited to, 1-propynyl, 1-butynyl, 2-butynyl, and the like.

The term "aryl" used herein refers to homocyclic aromatic radical whether one ring or multiple fused rings. Examples of aryl groups include, but are not limited to, phenyl, naphthyl, phenanthrenyl, naphthacenyl, fluorenyl, pyrenyl, and the like. Further examples include:

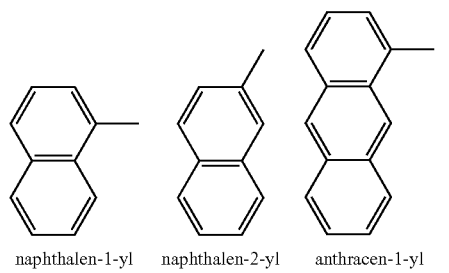

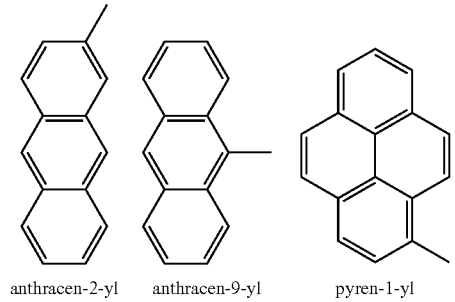

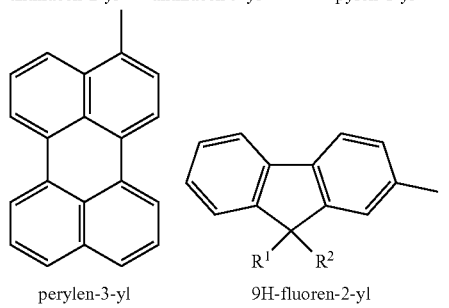

The term "alkaryl" or "alkylaryl" used herein refers to an alkyl-substituted aryl radical. Examples of alkaryl include, but are not limited to, ethylphenyl, 9,9-dihexyl-9H-fluorene, and the like.

The term "aralkyl" or "arylalkyl" used herein refers to an aryl-substituted alkyl radical. Examples of aralkyl include, but are not limited to, phenylpropyl, phenylethyl, and the like.

The term "heteroaryl" used herein refers to an aromatic group comprising one or more heteroatoms, whether one ring or multiple fused rings. When two or more heteroatoms are present, they may be the same or different. In fused ring systems, the one or more heteroatoms may be present in only one of the rings. Examples of heteroaryl groups include, but are not limited to, benzothiazyl, benzoxazyl, quinazolinyl, quinolinyl, isoquinolinyl, quinoxalinyl, pyridinyl, pyrrolyl, oxazolyl, indolyl, thiazyl and the like. Further examples of substituted and unsubstituted heteroaryl rings include:

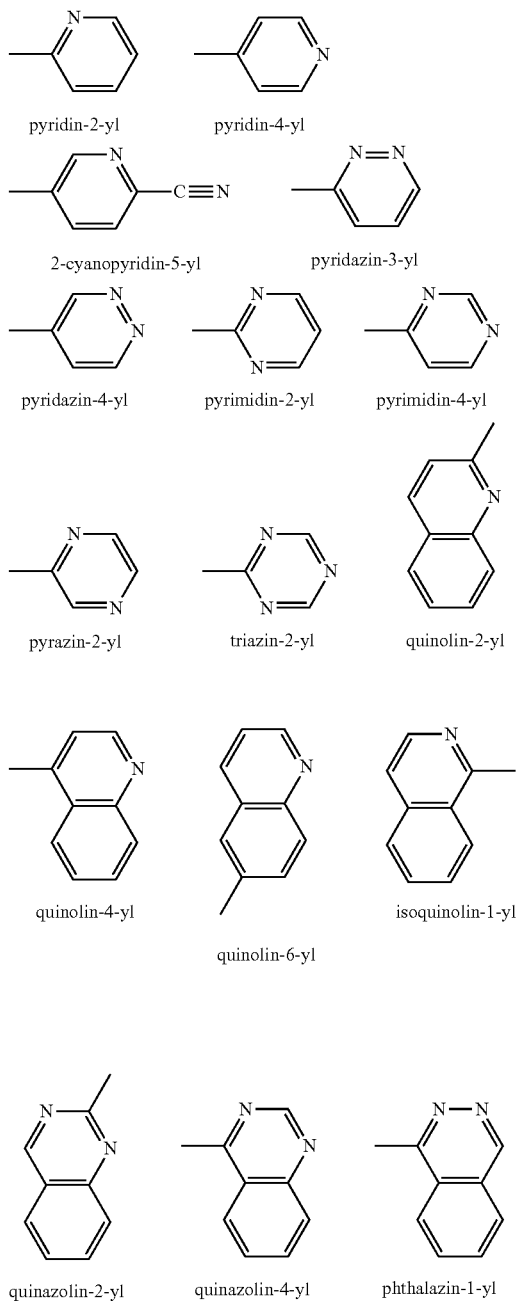

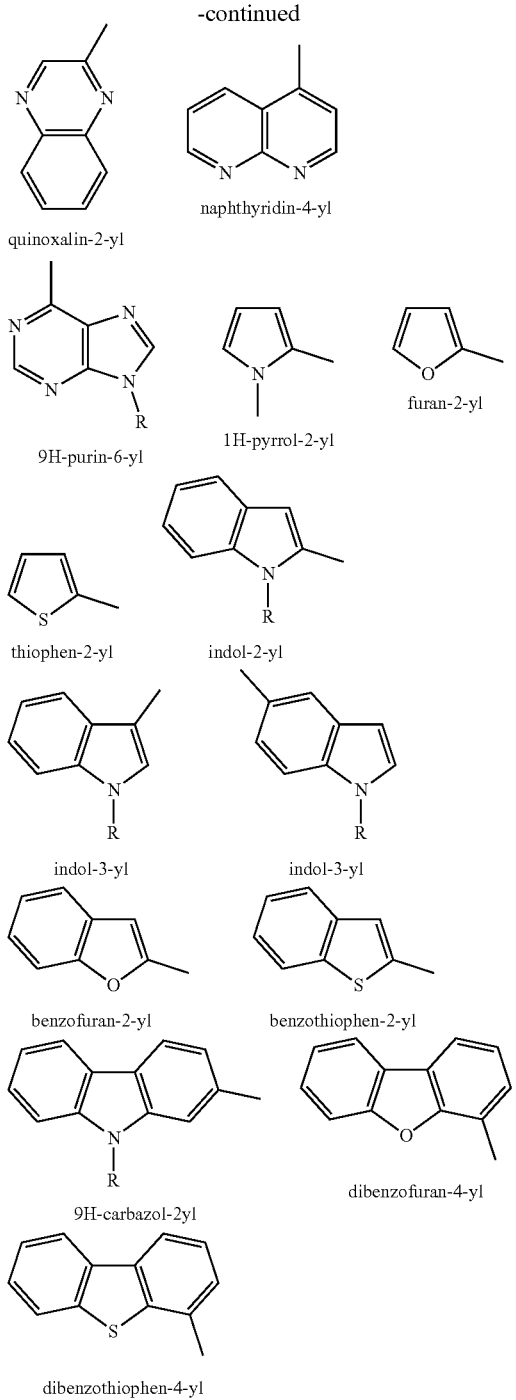

The term "alkoxy" used herein refers to straight or branched chain alkyl radical covalently bonded to the parent molecule through an —O— linkage. Examples of alkoxy groups include, but are not limited to, methoxy, ethoxy, propoxy, isopropoxy, butoxy, n-butoxy, sec-butoxy, t-butoxy and the like.

The term "heteroatom" used herein refers to any atom that is not C (carbon) or H (hydrogen). Examples of heteroatoms include S (sulfur), N (nitrogen), and O (oxygen).

The term "cyclic amino" used herein refers to either secondary or tertiary amines in a cyclic moiety. Examples of cyclic amino groups include, but are not limited to, aziridinyl, piperidinyl, N-methylpiperidinyl, and the like.

The term "cyclic imido" used herein refers to an imide in the radical of which the two carbonyl carbons are connected by a carbon chain. Examples of cyclic imide groups include, but are not limited to, 1,8-naphthalimide, pyrrolidine-2,5-dione, 1H-pyrrole-2,5-dione, and the likes.

The term "acyl" used herein refers to a radical —C(=O)R.

The term "aryloxy" used herein refers to an aryl radical covalently bonded to the parent molecule through an —O— linkage.

The term "acyloxy" used herein refers to a radical —O—C(=O)R.

The term "carbamoyl" used herein refers to a radical —C(=O)NH$_2$.

The term "carbonyl" used herein refers to a functional group C=O.

The term "carboxy" used herein refers to a radical —COOR.

The term "ester" used herein refers to a functional group RC(=O)OR'.

The term "amido" used herein refers to a radical —C(=O)NR'R".

The term "amino" used herein refers to a radical —NR'R".

The term "heteroamino" used herein refers to a radical —NR'R" wherein R' and/or R" comprises a heteroatom.

The term "heterocyclic amino" used herein refers to either secondary or tertiary amines in a cyclic moiety wherein the group further comprises a heteroatom.

The term "cycloamido" used herein refers to an amido radical of —C(=O)NR'R" wherein R' and R" are connected by a carbon chain.

As used herein, a substituted group is derived from the unsubstituted parent structure in which there has been an exchange of one or more hydrogen atoms for another atom or group. When substituted, the substituent group(s) is (are) one or more group(s) individually and independently selected from $C_1$-$C_6$ alkyl, $C_1$-$C_6$ alkenyl, $C_1$-$C_6$ alkynyl, $C_3$-$C_7$ cycloalkyl (optionally substituted with a moiety selected from the group consisting of halo, alkyl, alkoxy, carboxyl, haloalkyl, CN, —SO$_2$-alkyl, —CF$_3$, and —OCF$_3$), cycloalkyl geminally attached, $C_1$-$C_6$ heteroalkyl, $C_3$-$C_{10}$ heterocycloalkyl (e.g., tetrahydrofuryl) (optionally substituted with a moiety selected from the group consisting of halo, alkyl, alkoxy, carboxyl, CN, —SO$_2$-alkyl, —CF$_3$, and —OCF$_3$), aryl (optionally substituted with a moiety selected from the group consisting of halo, alkyl, arylalkyl, alkoxy, aryloxy, carboxyl, amino, imido, amido (carbamoyl), optionally substituted cyclic imido, cylic amido, CN, —NH—C(=O)-alkyl, —CF$_3$, —OCF$_3$, and aryl optionally substituted with $C_1$-$C_6$ alkyl), arylalkyl (optionally substituted with a moiety selected from the group consisting of halo, alkyl, alkoxy, aryl, carboxyl, CN, —SO$_2$-alkyl, —CF$_3$, and —OCF$_3$), heteroaryl (optionally substituted with a moiety selected from the group consisting of halo, alkyl, alkoxy, aryl, heteroaryl, aralkyl, carboxyl, CN, —SO$_2$-alkyl, —CF$_3$, and —OCF$_3$), halo (e.g., chloro, bromo, iodo and fluoro), cyano, hydroxy, optionally substituted cyclic imido, amino, imido, amido, —CF$_3$, $C_1$-$C_6$ alkoxy (optionally substituted with halo, alkyl, alkoxy, aryl, carboxyl, CN, —SO$_2$-alkyl, —CF$_3$, and —OCF$_3$), aryloxy, acyloxy, sulfhydryl (mercapto), halo($C_1$-$C_6$)alkyl, $C_1$-$C_6$ alkylthio, arylthio, mono- and di-($C_1$-$C_6$)alkyl amino, quaternary ammonium salts, amino($C_1$-$C_6$)alkoxy, hydroxy($C_1$-$C_6$)alkylamino, amino($C_1$-$C_6$)alkylthio, cyanoamino, nitro, carbamoyl, keto (oxy), carbonyl, carboxy, acyl, glycolyl, glycyl, hydrazino, guanyl, sulfamyl, sulfonyl, sulfinyl, thiocarbonyl, thiocarboxy, sulfonamide, ester, C-amide, N-amide, N-carbamate, O-carbamate, urea and combinations thereof. Wherever a substituent is described as "optionally substituted" that substituent can be substituted with the above substituents.

Formula I

Some embodiments provide a chromophore having one of the structures below:

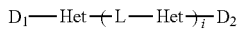
(I)

wherein Het is selected from the group consisting of:

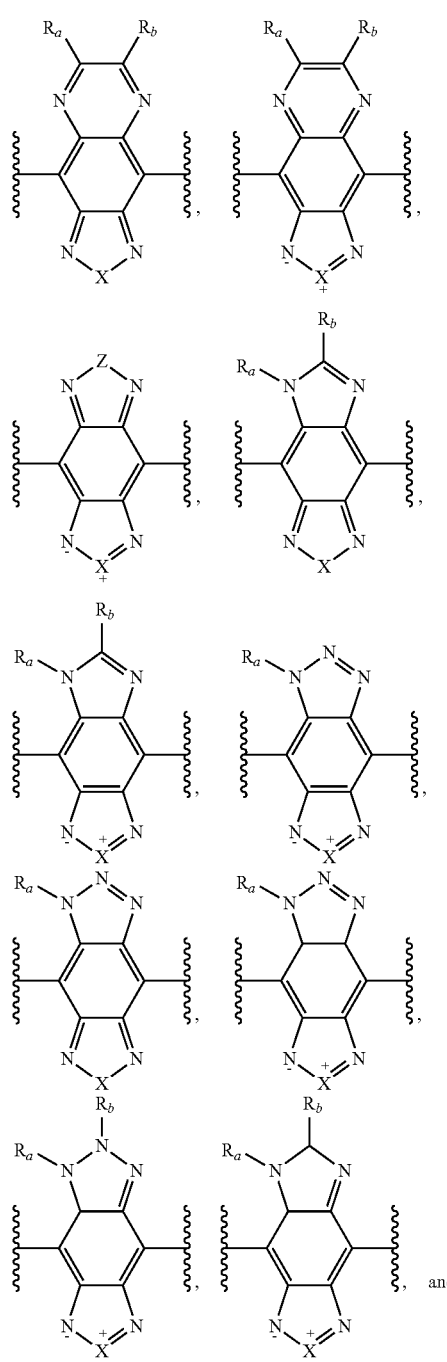

-continued

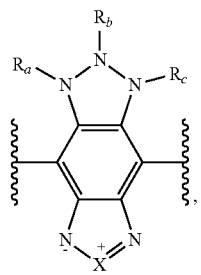

wherein i is 0 or an integer in the range of 1 to 100, X is selected from the group consisting of —N($A_0$)—, —O—, —S—, —Se—, and —Te—, and Z is selected from the group consisting of —N($R_a$)—, —O—, —S—, —Se—, and —Te—.

Each $A_0$ in formula I is selected from the group consisting of hydrogen, optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, optionally substituted acyl, optionally substituted carboxy, and optionally substituted carbonyl. In some embodiments, each $A_0$ of formula I is selected from the group consisting of hydrogen, optionally substituted $C_{1-8}$ alkyl, optionally substituted $C_{2-8}$ alkenyl, and optionally substituted $C_{6-10}$ aryl.

Each $R_a$, $R_b$, and $R_c$, of formula I independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_a$ and $R_b$, or $R_b$ and $R_c$, or $R_a$ and $R_c$, together form an optionally substituted ring or an optionally substituted polycyclic ring system, wherein each ring is independently cycloalkyl, aryl, heterocyclyl, or heteroaryl.

In some embodiments, each $R_a$, $R_b$, and $R_c$, of formula I are independently selected from the group consisting of hydrogen, optionally substituted $C_{1-8}$ alkyl, optionally substituted $C_{6-10}$ aryl, and optionally substituted $C_{6-10}$ heteroaryl. In some embodiments, each $R_a$, $R_b$, and $R_c$, of formula I are independently selected from the group consisting of hydrogen, $C_{1-8}$ alkyl, $C_{6-10}$ aryl, and $C_{6-10}$ heteroaryl, wherein $C_{1-8}$ alkyl, $C_{6-10}$ aryl, and $C_{6-10}$ heteroaryl may each be optionally substituted by optionally substituted $C_{3-10}$ cycloalkyl, optionally substituted $C_{1-8}$ alkoxy, halo, cyano, carboxyl, optionally substituted $C_{6-10}$ aryl, optionally substituted $C_{6-10}$ aryloxy,

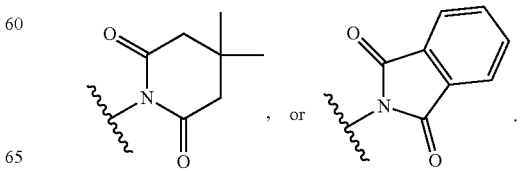

In some embodiments, $R_a$ and $R_b$, or $R_b$ and $R_c$, or $R_a$ and $R_c$, together form an optionally substituted ring system selected from the group consisting of:

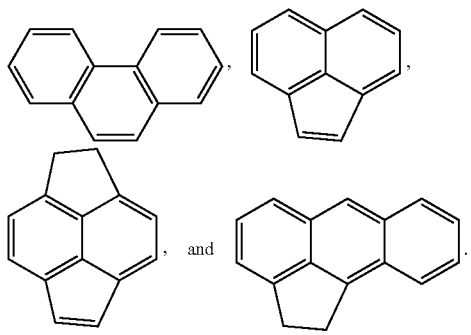

Each $D_1$ and $D_2$ of formula I are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, -aryl-NR'R", -aryl-aryl-NR'R", and -heteroaryl-heteroaryl-R'; wherein R' and R" are independently selected from the group consisting of optionally substituted alkyl, optionally substituted alkenyl, and optionally substituted aryl; or one or both of R' and R" forms a fused heterocyclic ring with aryl to which the N is attached to; provided that $D_1$ and $D_2$ are not both hydrogen, and $D_1$ and $D_2$ are not optionally substituted thiophene or optionally substituted furan.

In some embodiments, the chromophore is represented by formula I, wherein $D_1$ and $D_2$ are each independently selected from the group consisting of alkoxyaryl, -aryl-NR'R", and -aryl-aryl-NR'R"; wherein R' and R" are independently selected from the group consisting of alkyl and aryl optionally substituted by alkyl, alkoxy, or —C(=O)R; wherein R is optionally substituted aryl or optionally substituted alkyl; or one or both of R' and R" forms a fused heterocyclic ring with aryl to which the N is attached to.

In some embodiments, each $D_1$ and $D_2$ of formula I are independently $C_{6-10}$ aryl or optionally substituted $C_{6-10}$ aryl. The substituent(s) on the $C_{6-10}$ aryl may be selected from the group consisting of —NR'R", —$C_{6-10}$ aryl-NR'R", $C_{1-8}$ alkyl and $C_{1-8}$ alkoxy; wherein R' and R" are independently selected from the group consisting of $C_{1-8}$ alkyl, $C_{1-8}$ alkoxy, $C_{6-10}$ aryl, $C_{6-10}$ aryl-$C_{1-8}$ alkyl, $C_{6-10}$ aryl-$C_{1-8}$ alkoxy, and $C_{6-10}$ aryl-C(=O)R, wherein R is optionally substituted $C_{1-8}$ alkyl, optionally substituted $C_{1-8}$ alkoxy or optionally substituted $C_{6-10}$ aryl; or one or both of R' and R" forms a fused heterocyclic ring with aryl to which the N is attached to.

L of formula I is independently selected from the group consisting of optionally substituted alkyl, optionally substituted aryl, optionally substituted heteroaryl, amino, amido, imido, optionally substituted alkoxy, acyl, carboxy, provided that L is not optionally substituted thiophene or optionally substituted furan.

In some embodiments, the chromophore is represented by formula I, wherein L is independently selected from the group consisting of haloalkyl, alkylaryl, alkyl substituted heteroaryl, arylalkyl, heteroamino, heterocyclic amino, cycloamido, cycloimido, aryloxy, acyloxy, alkylacyl, arylacyl, alkylcarboxy, arylcarboxy, optionally substituted phenyl, and optionally substituted naphthyl.

In some embodiments, the chromophore is represented by formula I, provided that when Het is:

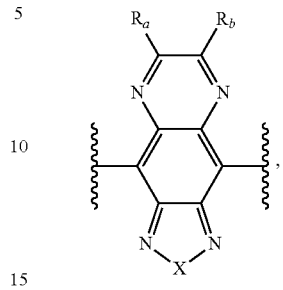

$R_a$ and $R_b$ are not both hydrogen, and $D_1$ and $D_2$ are independently selected from the group consisting of:

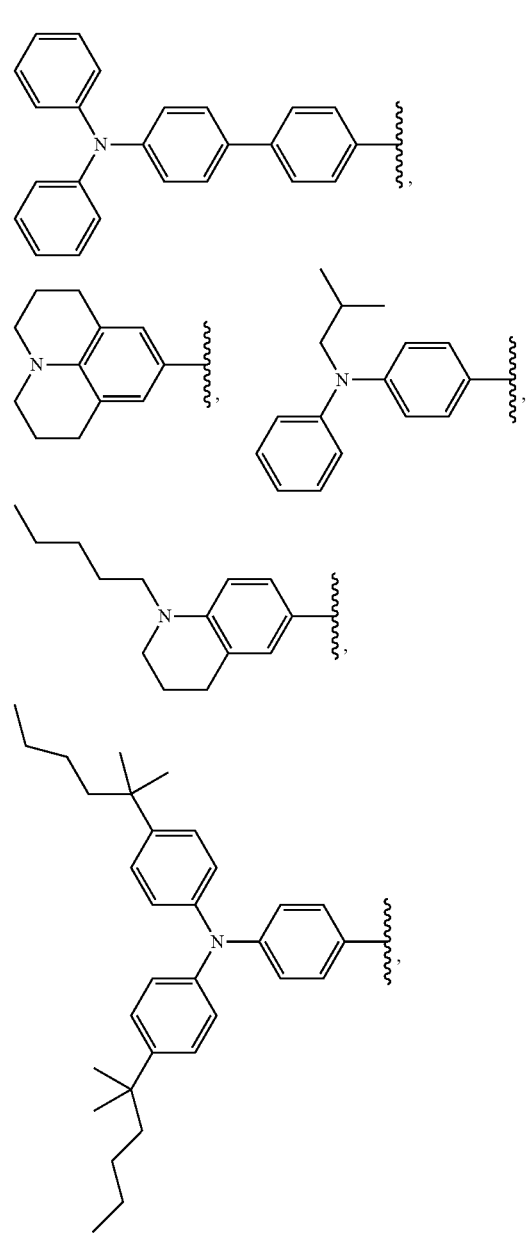

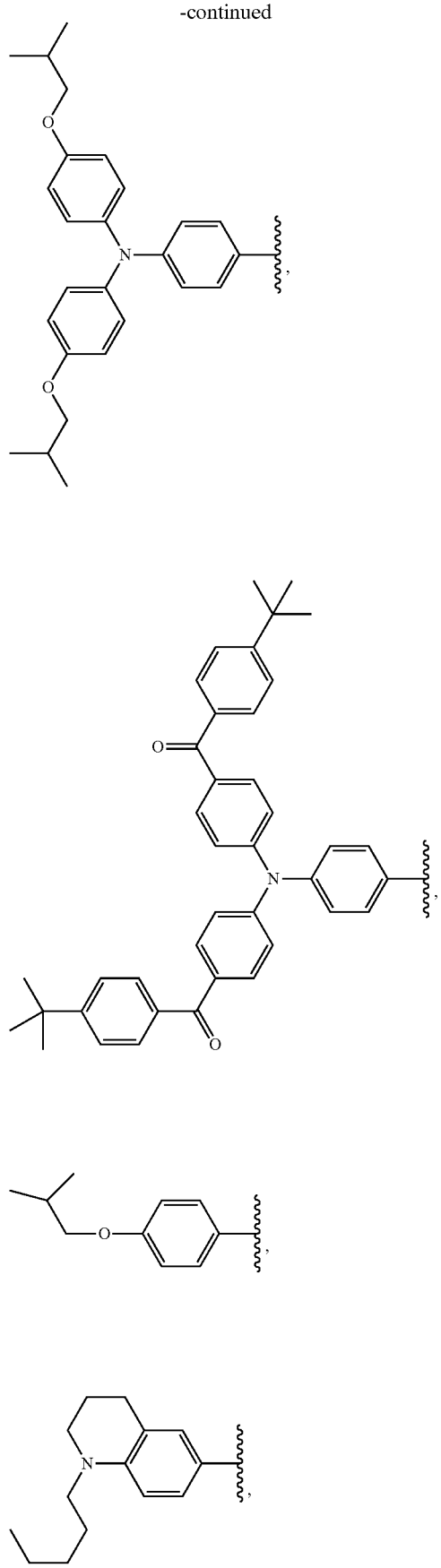

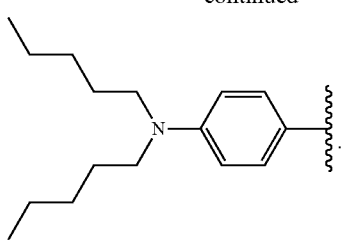

In some embodiments, the chromophore is represented by formula I, provided that when Het is

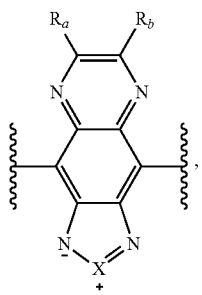

$R_a$ and $R_b$ are not both hydrogen.

In some embodiments, the chromophore is represented by formula I, wherein Het is

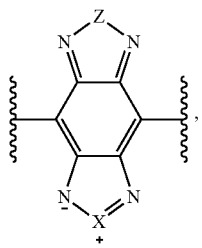

X is selected from the group consisting of —N(A₀)- and —Se—, Z is selected from the group consisting of —N(R$_a$)— and —S—, and D₁ and D₂ are independently selected from the group consisting of:

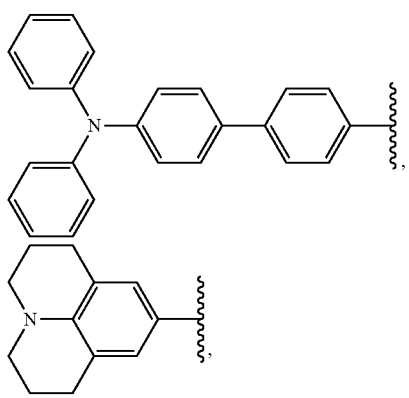

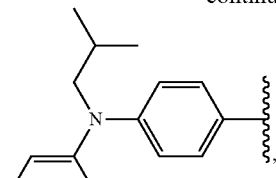

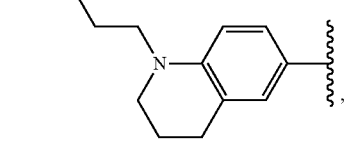

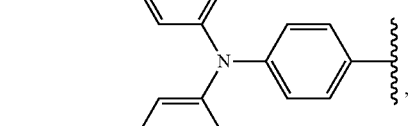

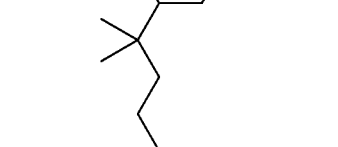

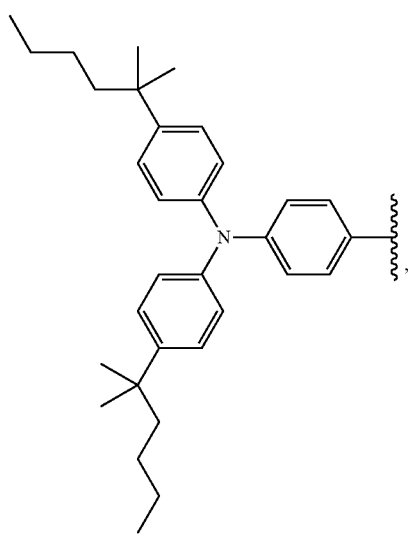

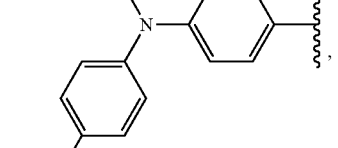

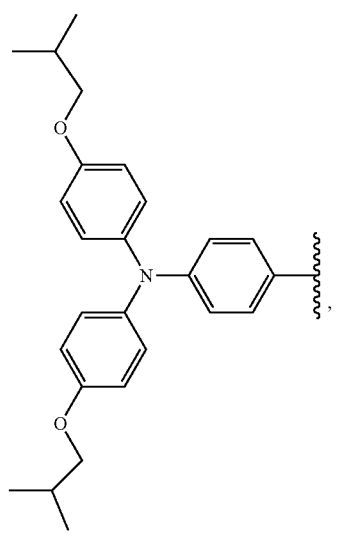

23
-continued
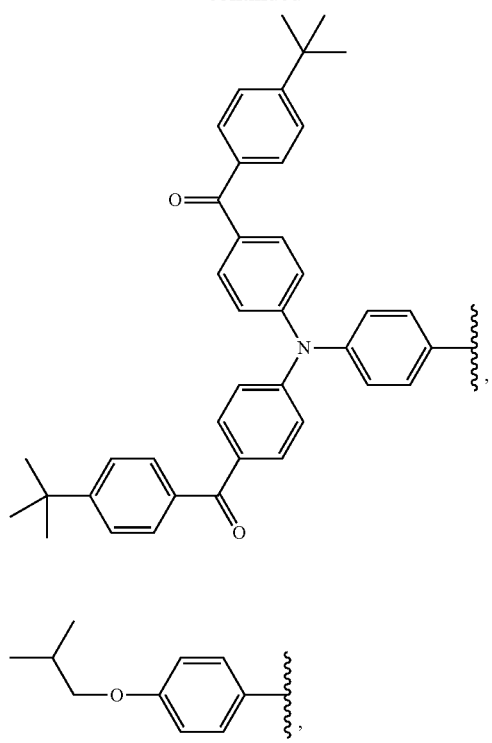
24
-continued
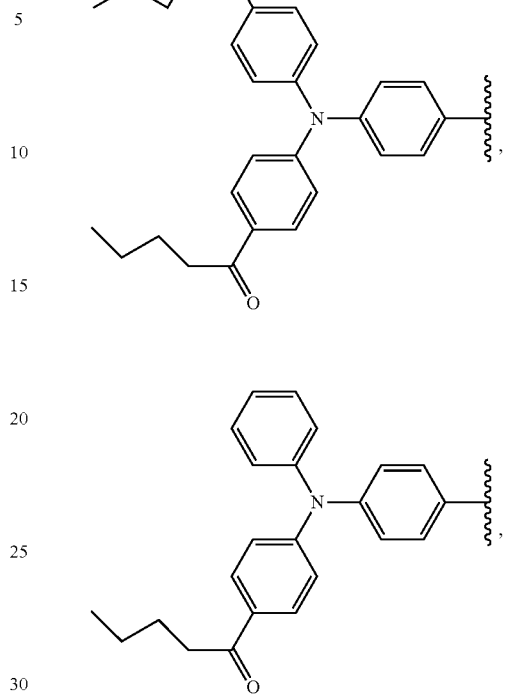
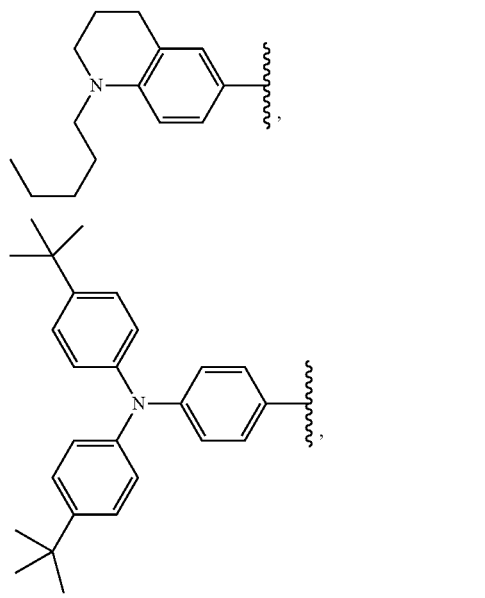
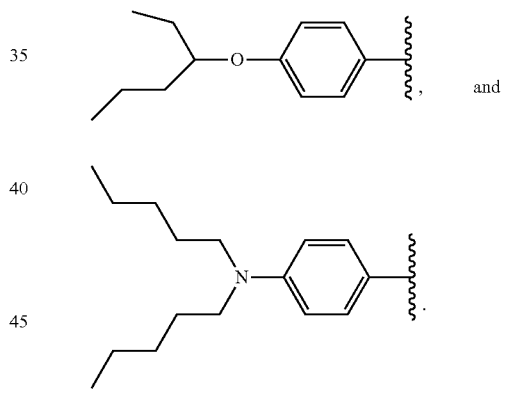
In some embodiments, the chromophore is represented by formula I, wherein Het is:
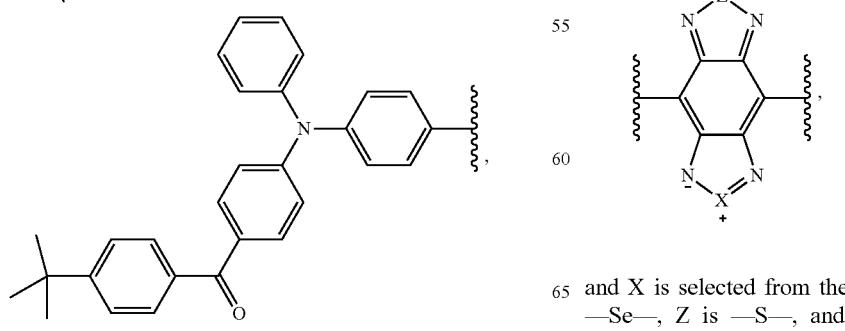
and X is selected from the group consisting of —S— and —Se—, Z is —S—, and $D_1$ and $D_2$ are independently selected from the group consisting of:

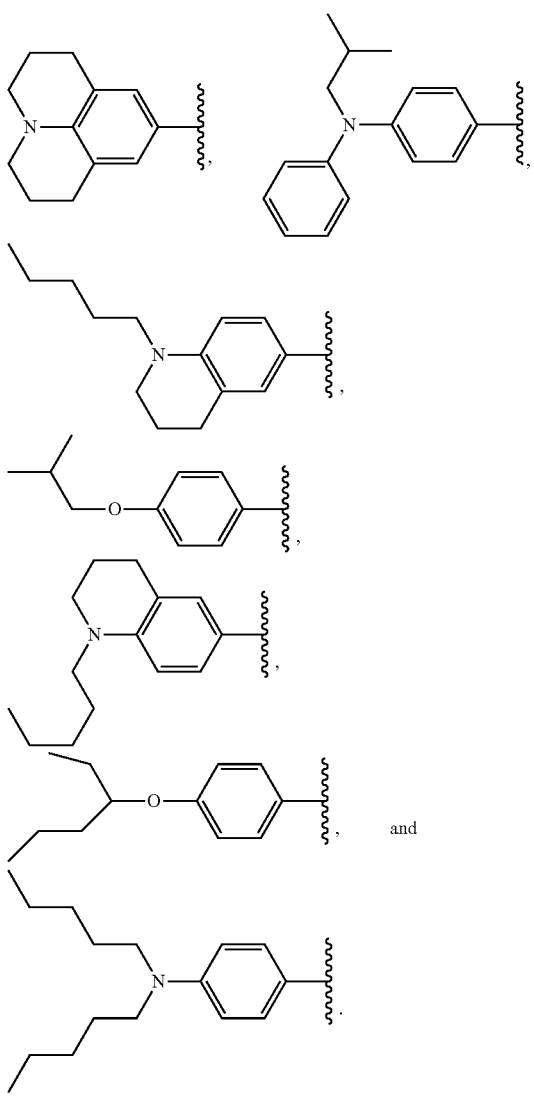

In some embodiments, the chromophore is represented by formula I, wherein Het is

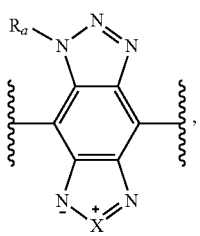

and wherein $D_1$ and $D_2$ are not hydroxy, or

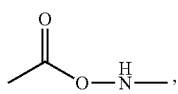

and $D_1$ and $D_2$ do not comprise bromine.

In formulae I, i is 0 or an integer in the range of 1 to 100. In some embodiments, i is 0 or an integer in the range of 1 to 50, 1 to 30, 1 to 10, 1 to 5, or 1 to 3. In some embodiments, i is 0, 1, 2, 3, 4, 5, 6, 7, 8, 9, or 10.

Formula II

Some embodiments of the invention provide a chromophore represented by formula IIa or formula IIb:

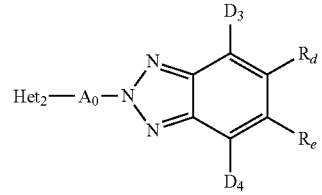

wherein $Het_2$ is selected from the group consisting of:

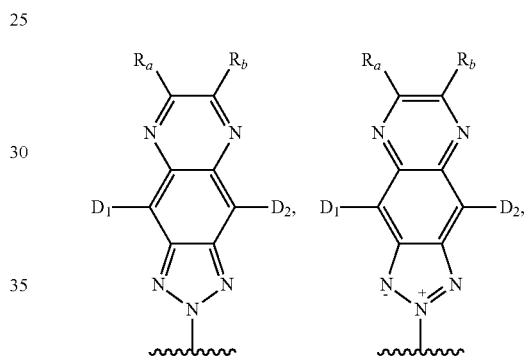

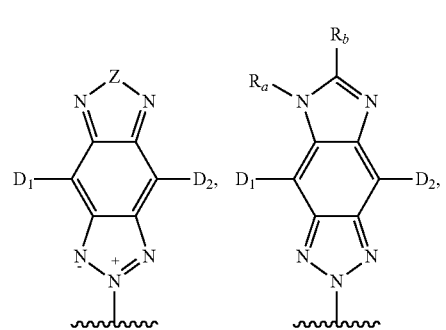

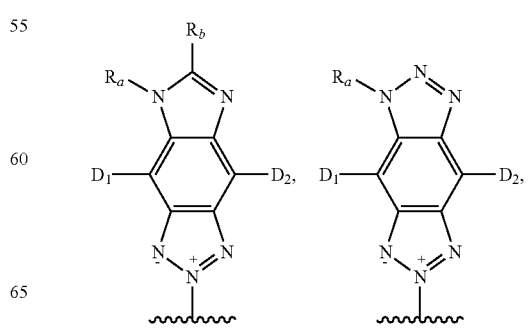

-continued

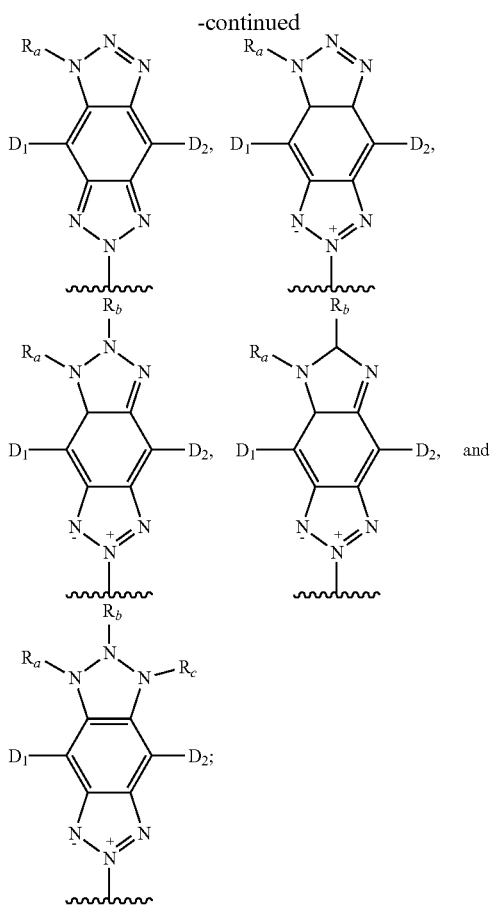

wherein Z is selected from the group consisting of —N(R$_a$)—, —O—, —S—, —Se—, and —Te—.

Each of the R$_a$, R$_b$, and R$_c$ in formula IIa and formula IIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or R$_a$ and R$_b$, or R$_b$ and R$_c$, or R$_a$ and R$_c$, together form an optionally substituted ring or an optionally substituted polycyclic ring system, wherein each ring is independently cycloalkyl, aryl, heterocyclyl, or heteroaryl.

Each of the R$_d$ and R$_e$ in formula IIa and formula IIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or R$_d$ and R$_e$ together form an optionally substituted ring or an optionally substituted polycyclic ring system, wherein each ring is independently cycloalkyl, aryl, heterocyclyl, or heteroaryl.

In some embodiments, each R$_a$, R$_b$, and R$_c$ is independently selected from the group consisting of hydrogen, optionally substituted C$_{1-8}$ alkyl, optionally substituted C$_{6-10}$ aryl, and optionally substituted C$_{6-10}$ heteroaryl. In some embodiments, each R$_a$, R$_b$, and R$_c$, of formula I are independently selected from the group consisting of hydrogen, C$_{1-8}$ alkyl, C$_{6-10}$ aryl, and C$_{6-10}$ heteroaryl, wherein C$_{1-8}$ alkyl, C$_{6-10}$ aryl, and C$_{6-10}$ heteroaryl may each be optionally substituted by optionally substituted C$_{3-10}$ cycloalkyl, optionally substituted C$_{1-8}$ alkoxy, halo, cyano, carboxyl, optionally substituted C$_{6-10}$ aryl, optionally substituted C$_{6-10}$ aryloxy,

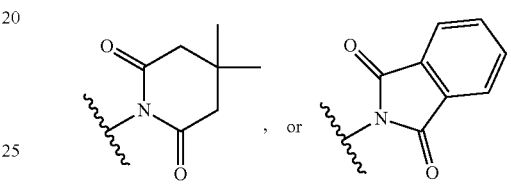

In some embodiments, R$_a$ and R$_b$, or R$_b$ and R$_c$, or R$_a$ and R$_c$, together form an optionally substituted ring system selected from the group consisting of:

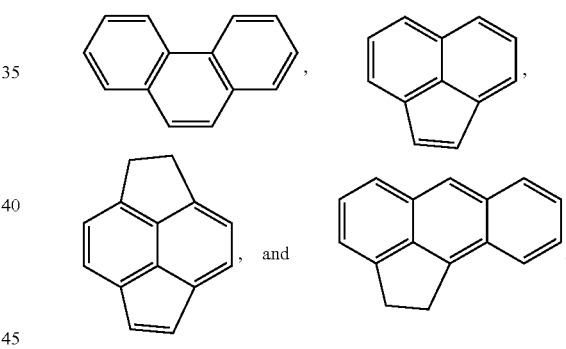

Each of D$_1$, D$_2$, D$_3$, and D$_4$ in formula IIa and formula IIb is independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, -aryl-NR'R", -aryl-aryl-NR'R", and -heteroaryl-heteroaryl-R'; wherein R' and R" are independently selected from the group consisting of optionally substituted alkyl, optionally substituted alkenyl, and optionally substituted aryl; or one or both of R' and R" forms a fused heterocyclic ring with aryl to which the N is attached to; provided that D$_1$ and D$_2$ are not both hydrogen, and D$_1$ and D$_2$ are not optionally substituted thiophene or optionally substituted furan.

In some embodiments, the chromophore is represented by formula IIa or IIb, wherein D$_1$ and D$_2$ are each independently selected from the group consisting of alkoxyaryl, -aryl-NR'R", and -aryl-aryl-NR'R"; wherein R' and R" are independently selected from the group consisting of alkyl and aryl optionally substituted by alkyl, alkoxy, or —C(=O)R; wherein R is optionally substituted aryl or optionally substituted alkyl; or one or both of R' and R" forms a fused heterocyclic ring with aryl to which the N is attached to.

In some embodiments, each of $D_1$, $D_2$, $D_3$, and $D_4$ in formula IIa and formula IIb are each independently $C_{6-10}$ aryl or optionally substituted $C_{6-10}$ aryl. The substituent(s) on the $C_{6-10}$ aryl may be selected from the group consisting of —NR'R", —$C_{6-10}$ aryl-NR'R", $C_{1-8}$ alkyl and $C_{1-8}$ alkoxy, wherein R' and R" are independently selected from the group consisting of $C_{1-8}$ alkyl, $C_{1-8}$ alkoxy, $C_{6-10}$ aryl, $C_{6-10}$ aryl-$C_{1-8}$ alkyl, $C_{6-10}$ aryl-$C_{1-8}$ alkoxy, and $C_{6-10}$ aryl-C(=O)R, wherein R is optionally substituted $C_{1-8}$ alkyl, optionally substituted $C_{1-8}$ alkoxy or optionally substituted $C_{6-10}$ aryl; or one or both of R' and R" forms a fused heterocyclic ring with aryl to which the N is attached to.

In some embodiments, the chromophore is represented by formula IIa or formula IIb, wherein $Het_2$ is

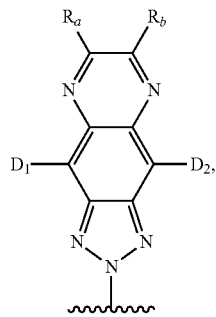

provided that $R_a$ and $R_b$ are not both hydrogen, and $D_1$ and $D_2$ are independently selected from the group consisting of:

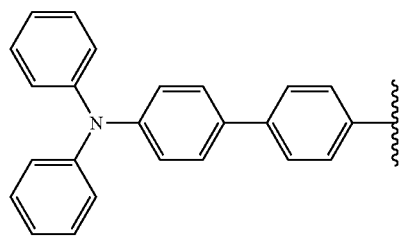

,

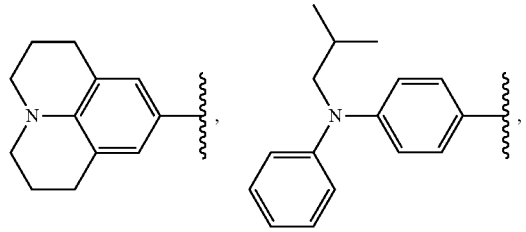

,

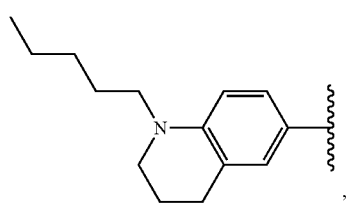

,

-continued

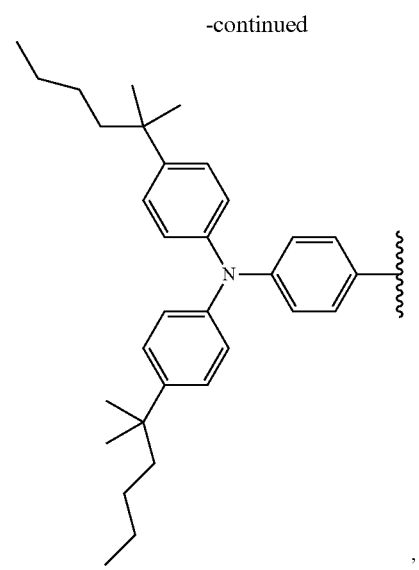

,

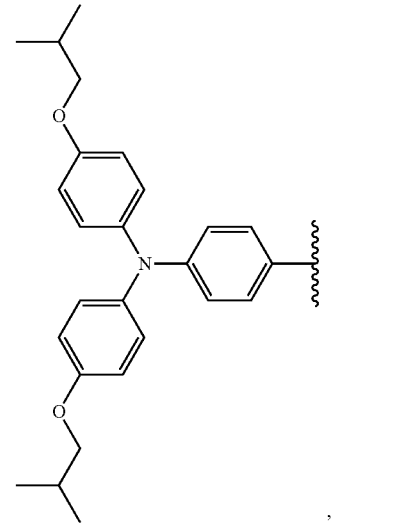

,

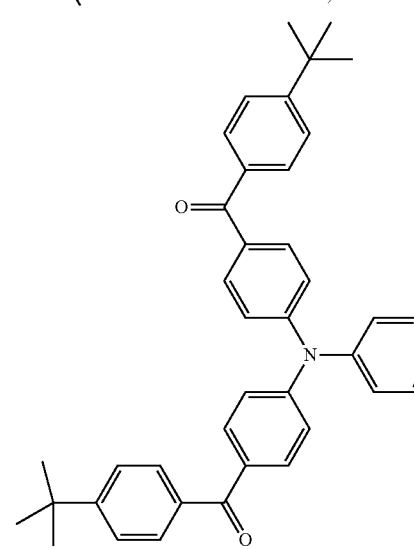

,

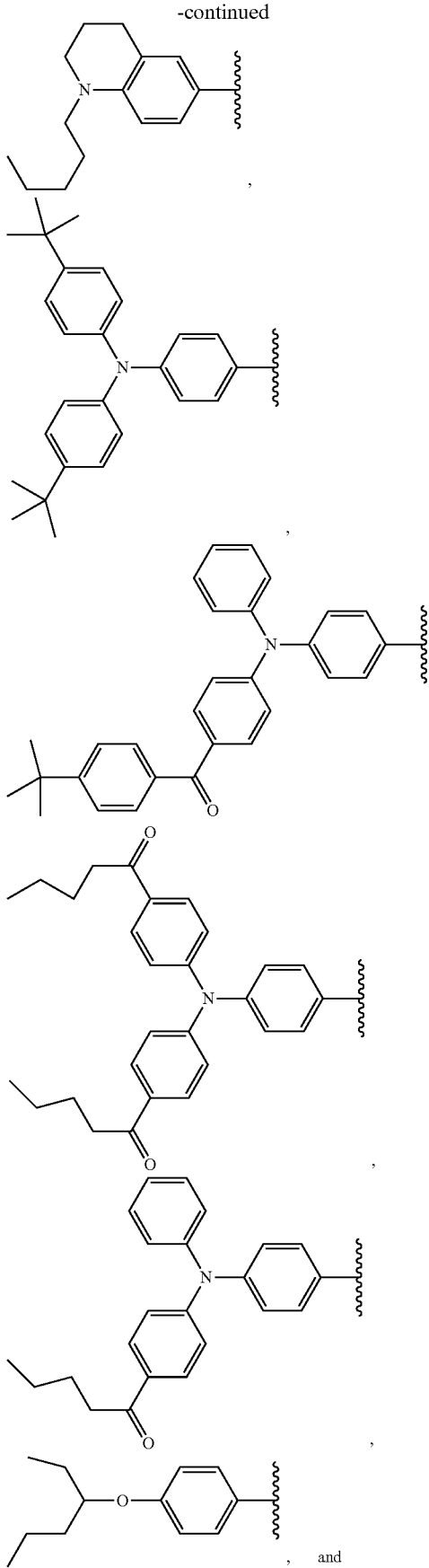
,
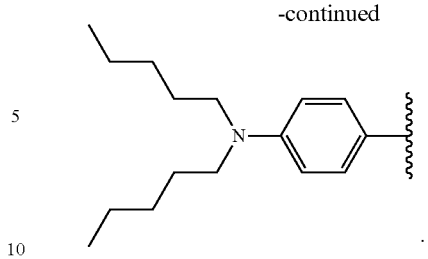
In some embodiments, the chromophore is represented by formula IIa or formula IIb, wherein Het$_2$ is
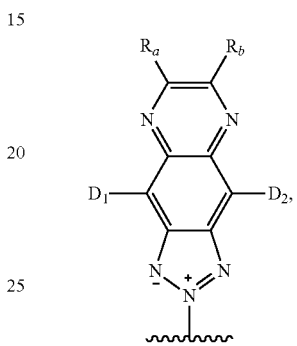
provided that R$_a$ and R$_b$ are not both hydrogen.
In some embodiments, the chromophore is represented by formula IIa or formula IIb, wherein Het$_2$
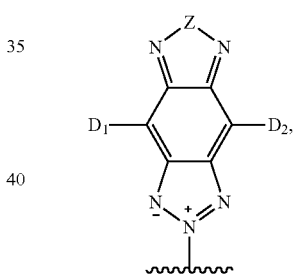
and provided that D$_1$ and D$_2$ are independently selected from the group consisting of:
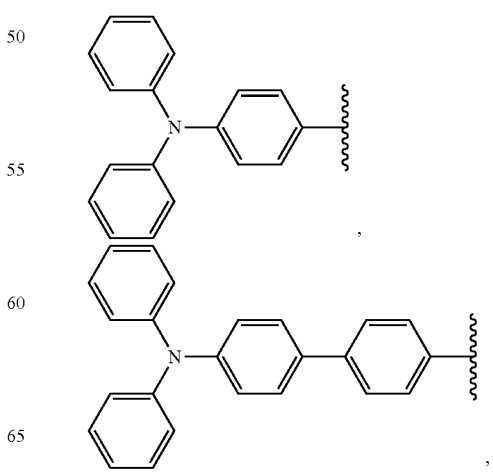
, 33
-continued
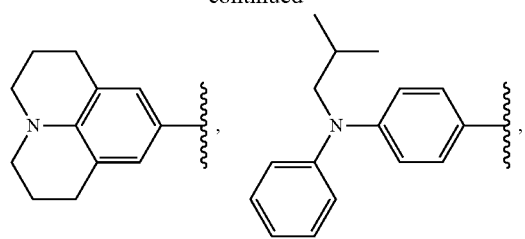
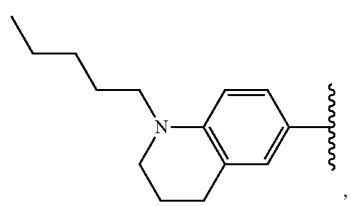
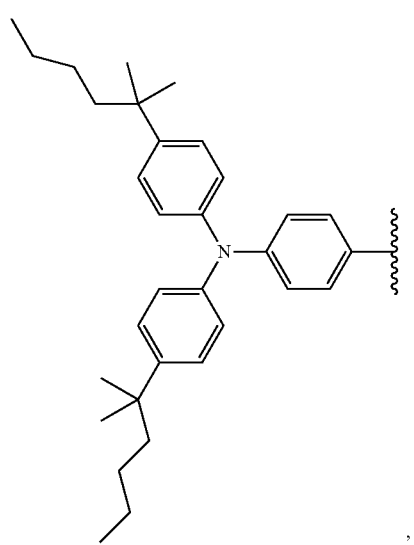
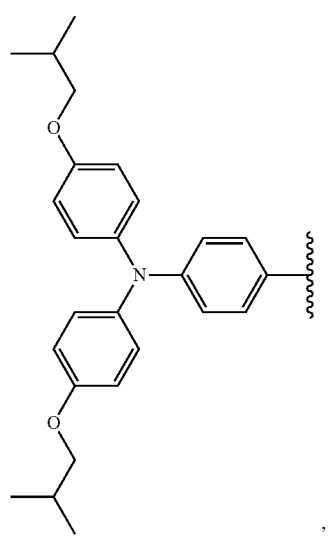
34
-continued
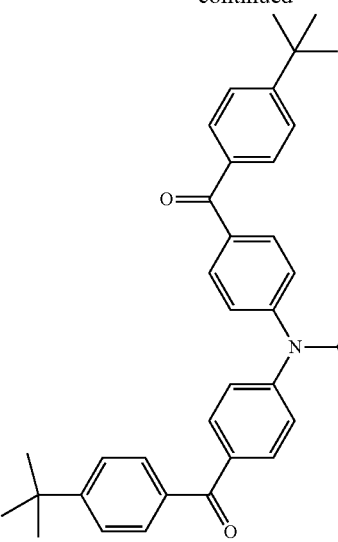
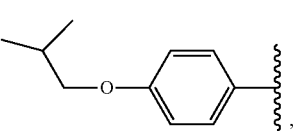
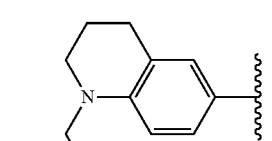
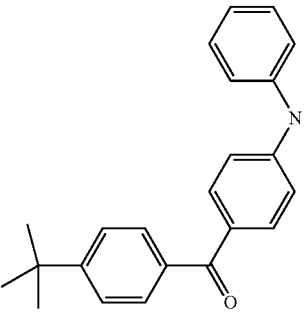

-continued
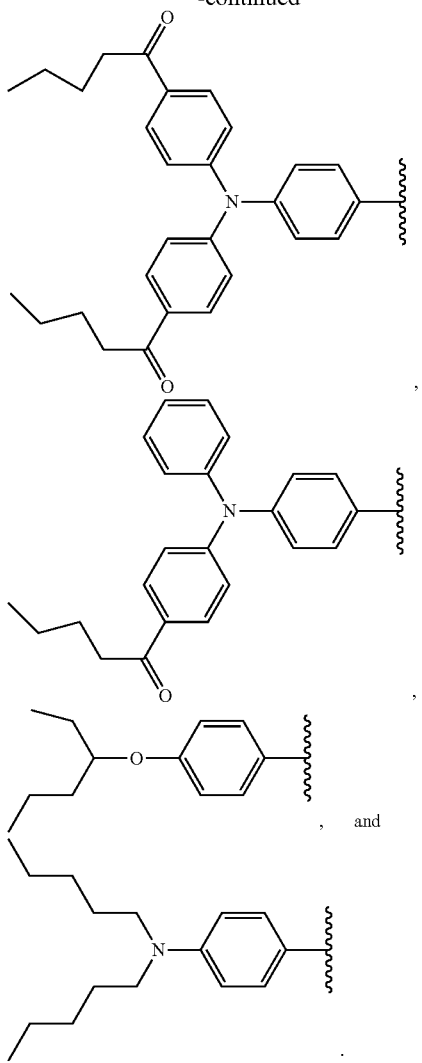
In some embodiments, the chromophore is represented by formula IIa or IIb, wherein $Het_2$ is
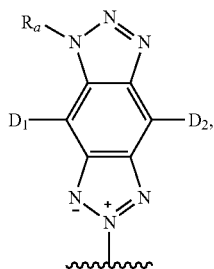
provided that $D_1$ and $D_2$ are not hydroxy or
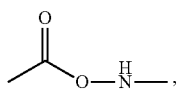
and $D_1$ and $D_2$ do not comprise bromine.
Formula III
Some embodiments provide a chromophore represented by formula IIIa and formula IIIb:
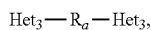
(IIIa)
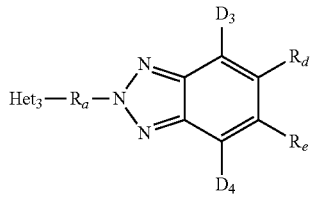
(IIIb)
wherein $Het_3$ is selected from the group consisting of:
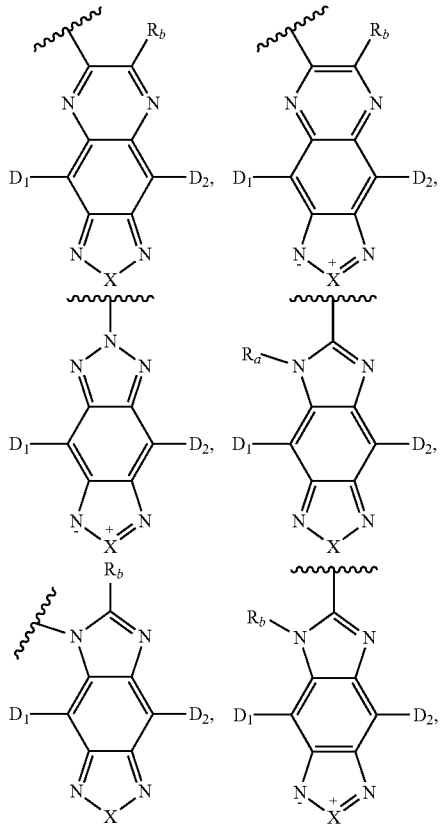
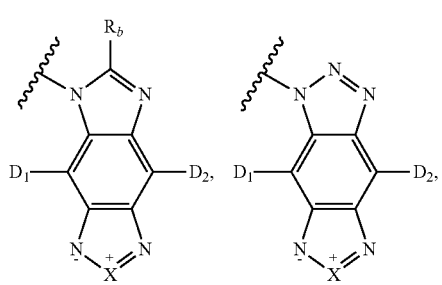

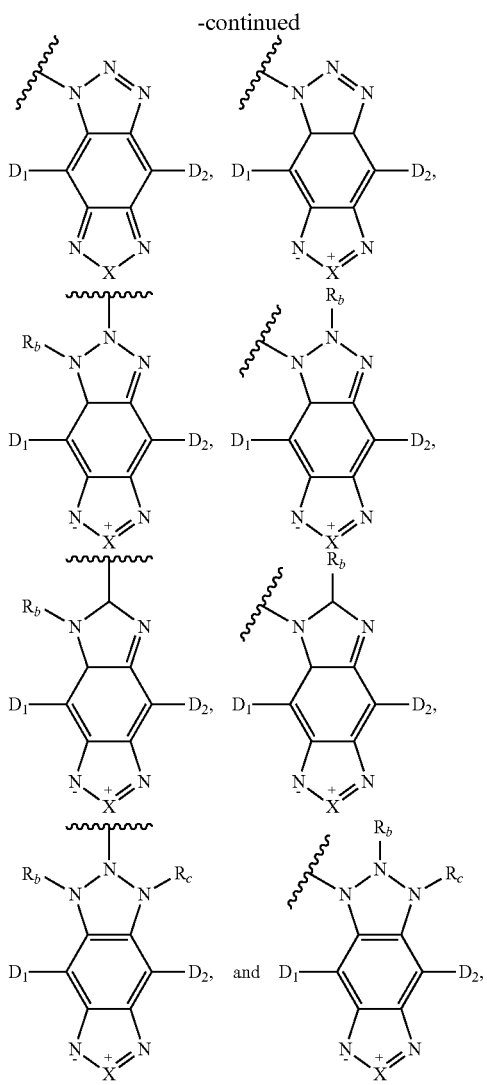

wherein X is selected from the group consisting of —N(A₀)-, —O—, —S—, —Se—, and —Te—.

Each A₀ of formula IIIa and formula IIIb is selected from the group consisting of hydrogen, optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, optionally substituted acyl, optionally substituted carboxy, and optionally substituted carbonyl. In some embodiments, A₀ is $C_{1-8}$ alkyl.

Each $R_a$, $R_b$, and $R_c$, of formula IIIa and formula IIIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_a$ and $R_b$, or $R_b$ and $R_c$, or $R_a$ and $R_c$, together form an optionally substituted ring or an optionally substituted polycyclic ring system, wherein each ring is independently cycloalkyl, aryl, heterocyclyl, or heteroaryl.

In some embodiments, each $R_a$, $R_b$, and $R_c$ is independently selected from the group consisting of hydrogen, optionally substituted $C_{1-8}$ alkyl, optionally substituted $C_{6-10}$ aryl, and optionally substituted $C_{6-10}$ heteroaryl. In some embodiments, each $R_a$, $R_b$, and $R_c$, of formula I are independently selected from the group consisting of hydrogen, $C_{1-8}$ alkyl, $C_{6-10}$ aryl, and $C_{6-10}$ heteroaryl, wherein $C_{1-8}$ alkyl, $C_{6-10}$ aryl, and $C_{6-10}$ heteroaryl may each be optionally substituted by optionally substituted $C_{3-10}$ cycloalkyl, optionally substituted $C_{1-8}$ alkoxy, halo, cyano, carboxyl, optionally substituted $C_{6-10}$ aryl, optionally substituted $C_{6-10}$ aryloxy,

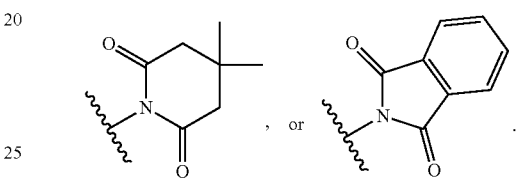

In some embodiments, $R_a$ and $R_b$, or $R_b$ and $R_c$, or $R_a$ and $R_c$, together form an optionally substituted ring system selected from the group consisting of:

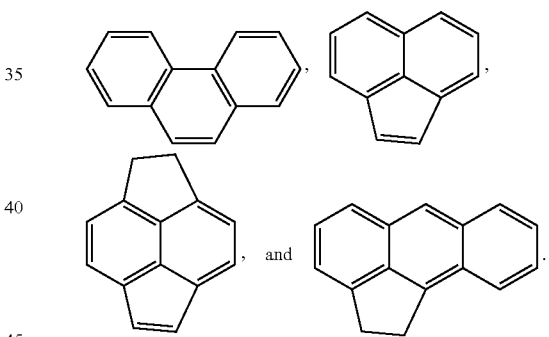

Each $R_d$ and $R_e$ of formula IIIa and formula IIIb is independently selected from the group consisting of hydrogen, optionally substituted alkyl, optionally substituted alkoxyalkyl, optionally substituted alkenyl, optionally substituted heteroalkyl, optionally substituted heteroalkenyl, optionally substituted aryl, optionally substituted arylalkyl, optionally substituted heteroaryl, optionally substituted cylcoalkyl, optionally substituted cycloalkenyl, optionally substituted cycloheteroalkyl, optionally substituted cycloheteroalkenyl, optionally substituted amino, optionally substituted amido, optionally substituted cyclic amido, optionally substituted cyclic imido, optionally substituted alkoxy, optionally substituted carboxy, and optionally substituted carbonyl; or $R_d$ and $R_e$ together form an optionally substituted ring or an optionally substituted polycyclic ring system, wherein each ring is independently cycloalkyl, aryl, heterocyclyl, or heteroaryl.

Each $D_1$, $D_2$, $D_3$, and $D_4$ of formula IIIa and formula IIIb is independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, -aryl-NR'R", -ary-aryl-NR'R", and -heteroaryl-heteroaryl-R'; wherein R' and R" are independently selected from the group consisting of optionally substituted alkyl, optionally substituted alkenyl, and optionally substituted aryl; or one or both of R' and R" forms a fused heterocyclic ring with aryl to which the N is attached to; provided that $D_1$ and $D_2$ are not both hydrogen, and $D_1$ and $D_2$ are not optionally substituted thiophene or optionally substituted furan.

In some embodiments, the chromophore is represented by formula IIIa or formula IIIb, wherein $D_1$ and $D_2$ are each independently selected from the group consisting of alkoxyaryl, -aryl-NR'R", and -aryl-aryl-NR'R"; wherein R' and R" are independently selected from the group consisting of alkyl and aryl optionally substituted by alkyl, alkoxy, or —C(=O)R; wherein R is optionally substituted aryl or optionally substituted alkyl; or one or both of R' and R" forms a fused heterocyclic ring with aryl to which the N is attached to.

In some embodiments, each of $D_1$, $D_2$, $D_3$, and $D_4$ in formula IIIa and formula IIIb are each independently $C_{6-10}$ aryl or optionally substituted $C_{6-10}$ aryl. The substituent(s) on the $C_{6-10}$ aryl may be selected from the group consisting of —NR'R", —$C_{6-10}$ aryl-NR'R", $C_{1-8}$ alkyl and $C_{1-8}$ alkoxy, wherein R' and R" are independently selected from the group consisting of $C_{1-8}$ alkyl, $C_{1-8}$ alkoxy, $C_{6-10}$ aryl, $C_{6-10}$ aryl-$C_{1-8}$ alkyl, $C_{6-10}$ aryl-$C_{1-8}$ alkoxy, and $C_{6-10}$ aryl-C(=O)R, wherein R is optionally substituted $C_{1-8}$ alkyl, optionally substituted $C_{1-8}$ alkoxy or optionally substituted $C_{6-10}$ aryl; or one or both of R' and R" forms a fused heterocyclic ring with aryl to which the N is attached to.

In some embodiments, the chromophore is represented by formula IIIa or formula IIIb, wherein $Het_3$ is

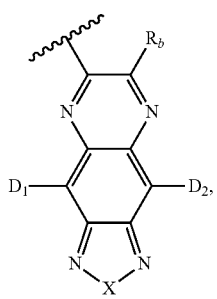

provided that $D_1$ and $D_2$ are independently selected from the group consisting of:

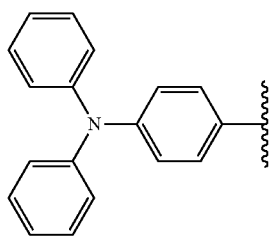

-continued

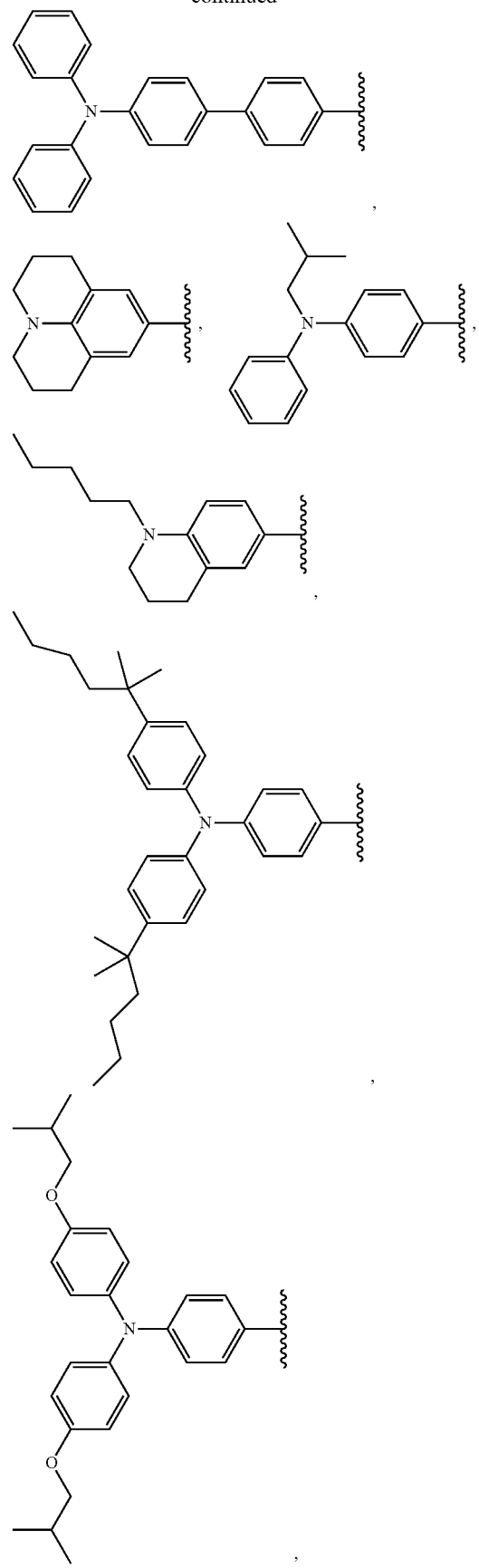

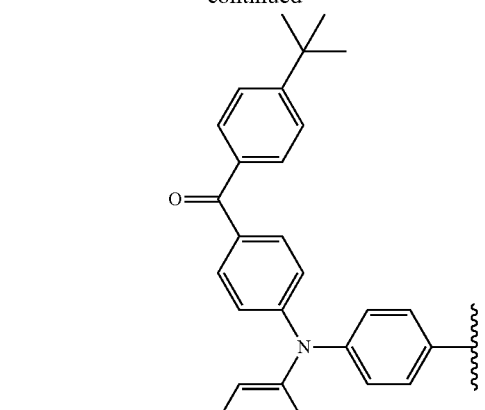,
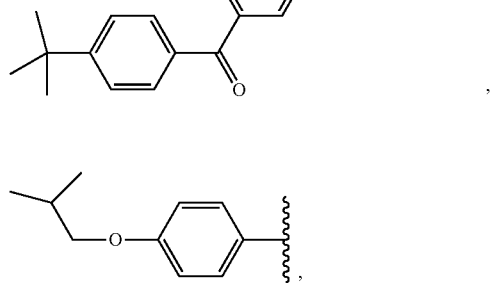,
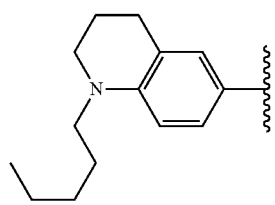,
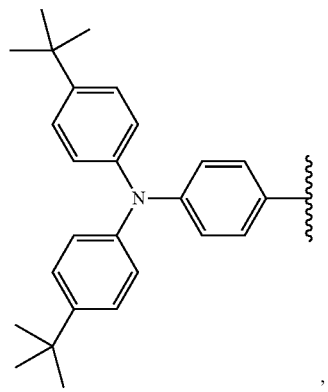,
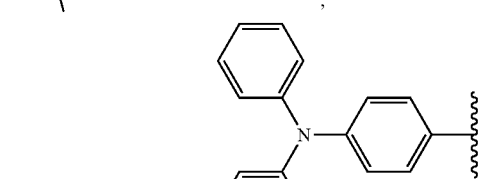,
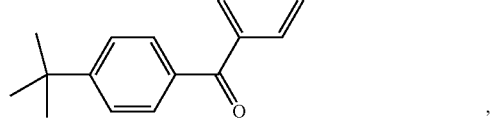,
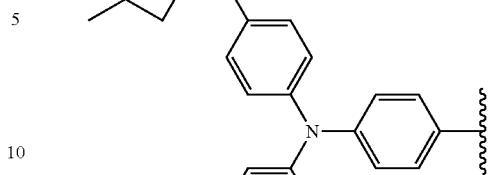,
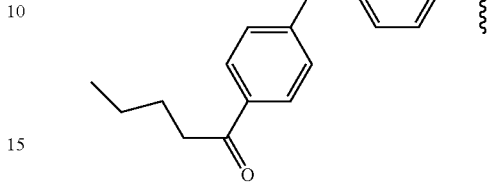,
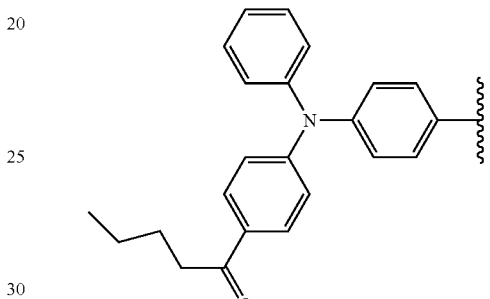, and
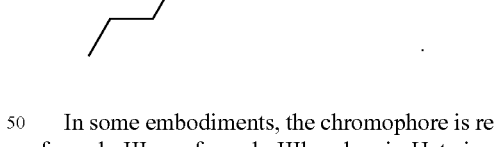.
In some embodiments, the chromophore is represented by formula IIIa or formula IIIb, wherein $Het_3$ is
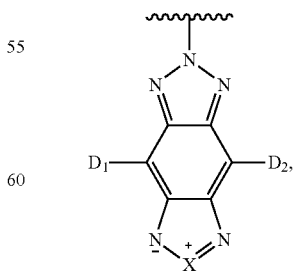
provided that $D_1$ and $D_2$ are independently selected from the group consisting of:

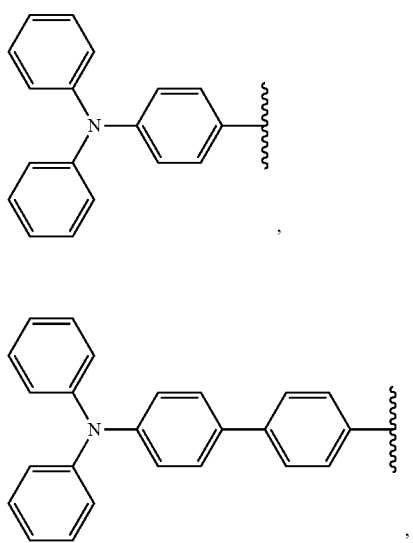
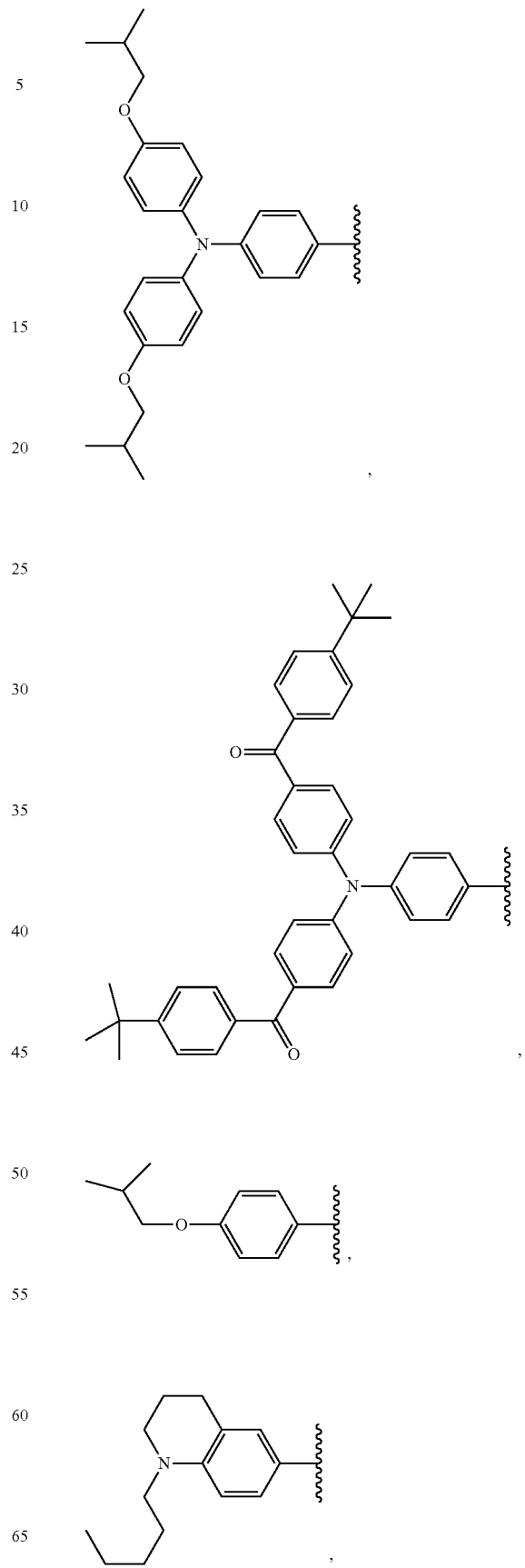

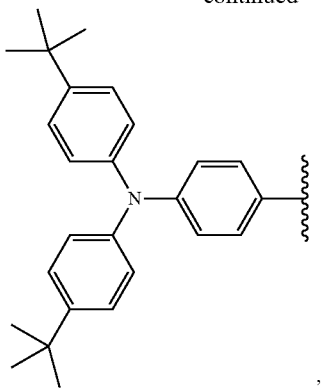

,

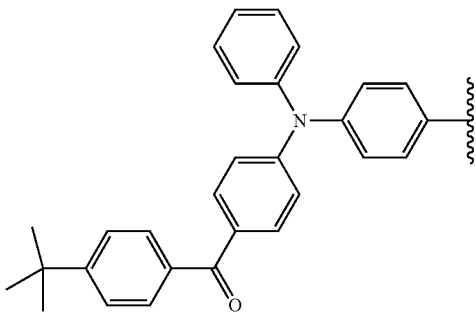

,

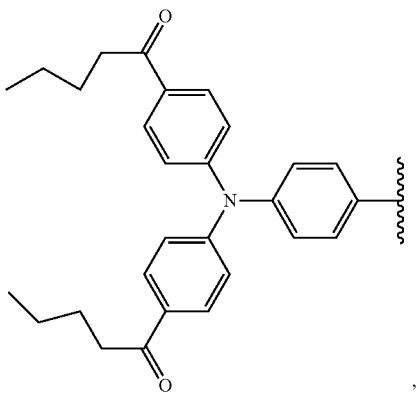

,

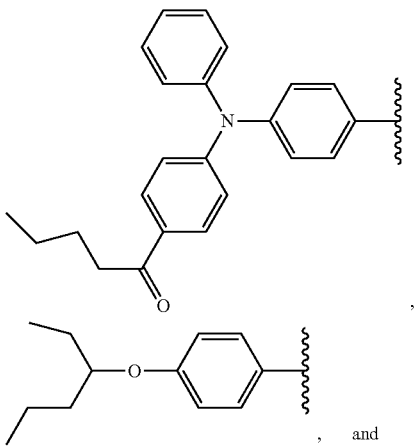

, and

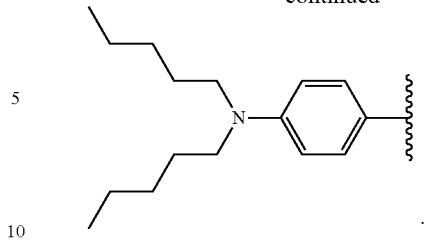

In some embodiments, the chromophore is represented by formula IIIa or formula IIIb, wherein $Het_3$ is

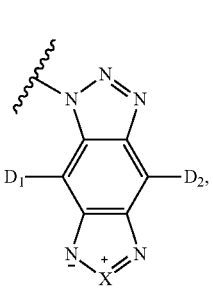

provided that $D_1$ and $D_2$ are not hydroxy or

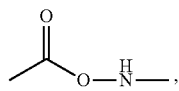

, and $D_1$ and $D_2$ do not comprise bromine.

In some embodiments, X in formula I, formula IIIa, and formula IIIb, is selected from the group consisting of —N($A_0$)-, —S—, and —Se—.

In some embodiments, Z in formula I, formula IIa, and formula IIb, is selected from the group consisting of —N($R_a$)—, —S—, and —Se—.

In some embodiments, $A_0$ in formula I, formula IIa, formula IIb, formula IIIa, and formula IIIB, is selected from the group consisting of hydrogen, optionally substituted $C_{1-10}$ alkyl, optionally substituted aryl, optionally substituted heteroaryl, and optionally substituted alkoxyalkyl. In some embodiments, $A_0$ is selected from the group consisting of: hydrogen, methyl, ethyl, propyl, isopropyl, butyl, isobutyl, tert-butyl, pentyl, hexyl,

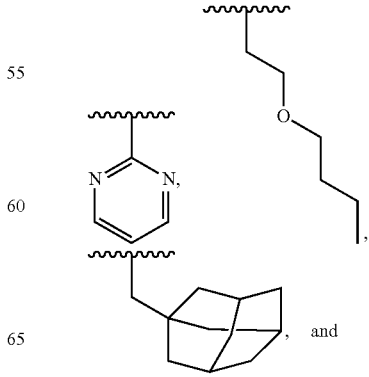

, and

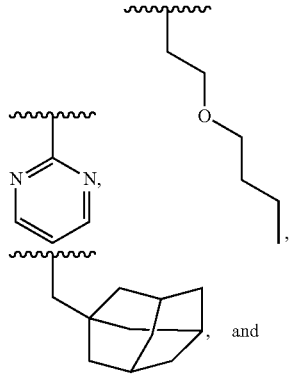

,

-continued

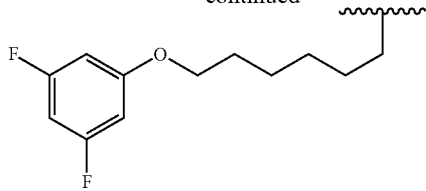

In some embodiments, $A_0$ is hydrogen or $C_{1-8}$ alkyl. In some embodiments $A_0$ is isobutyl. In some embodiments A is tert-butyl. In some embodiments, $A_0$ is

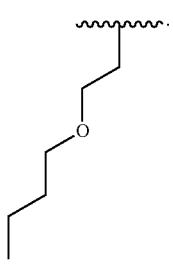

In some embodiments, $A_0$ is

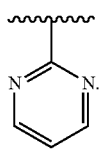

In some embodiments, $R_a$, $R_b$, or $R_c$, in formula I, formula IIa, formula IIb, formula IIIa, and formula IIIB, are independently selected from the group consisting of hydrogen, optionally substituted $C_{1-10}$ alkyl, optionally substituted aryl, optionally substituted heteroaryl, and optionally substituted alkoxyalkyl. In some embodiments $R_a$ and $R_b$, or $R_b$ and $R_c$, or $R_a$ and $R_c$, together form an optionally substituted polycyclic ring system.

In some embodiments, $R_a$, $R_b$, or $R_c$, in formula I, formula IIa, formula IIIb, formula IIIa, and formula IIIB, are independently selected from the group consisting of hydrogen, methyl, ethyl, propyl, isopropyl, butyl, isobutyl, tert-butyl, pentyl, hexyl,

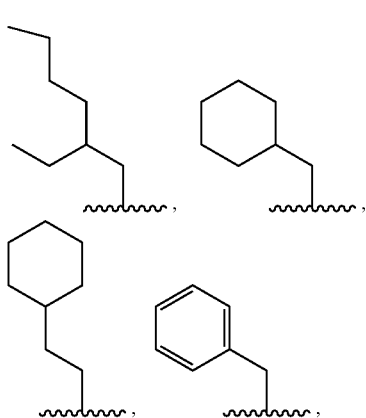

-continued

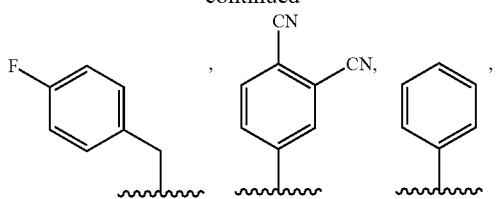

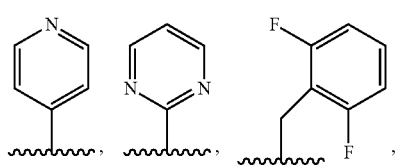

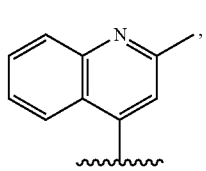
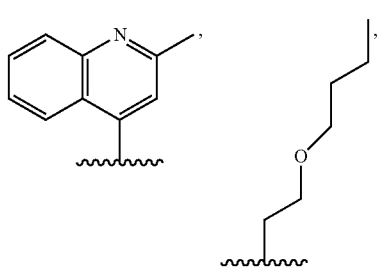

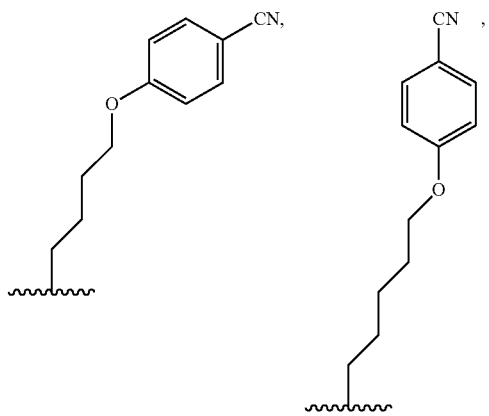

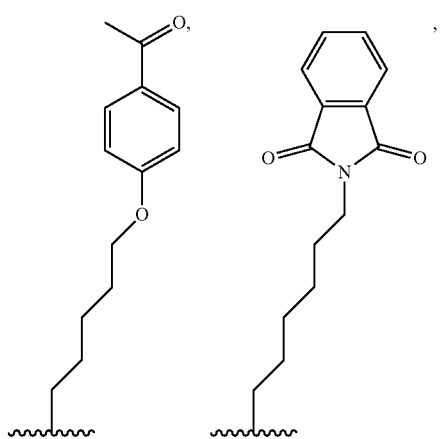

-continued
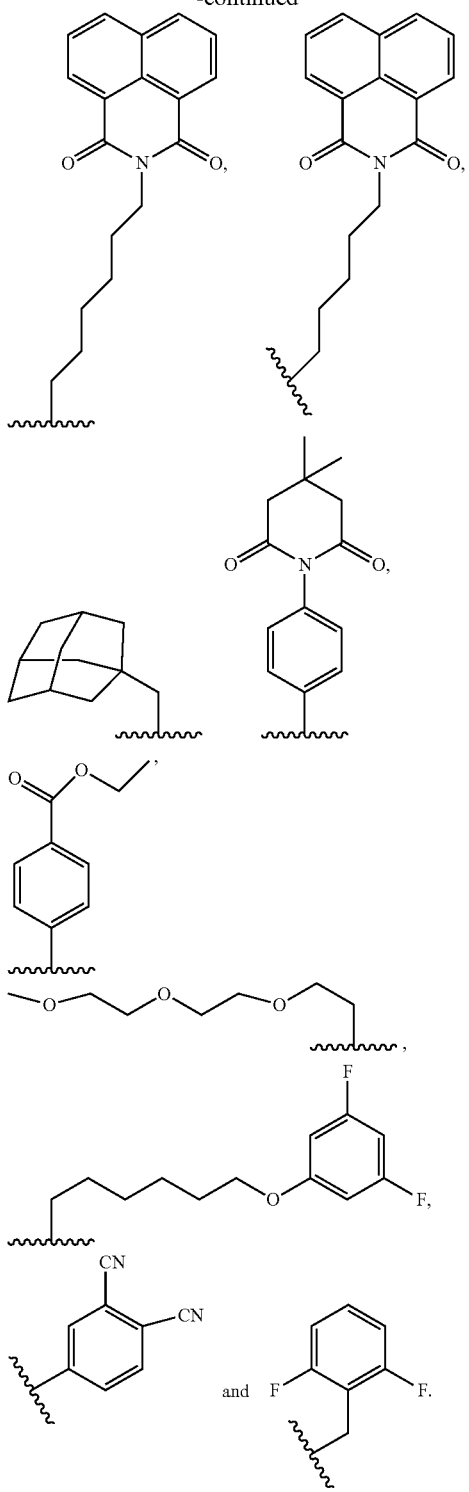
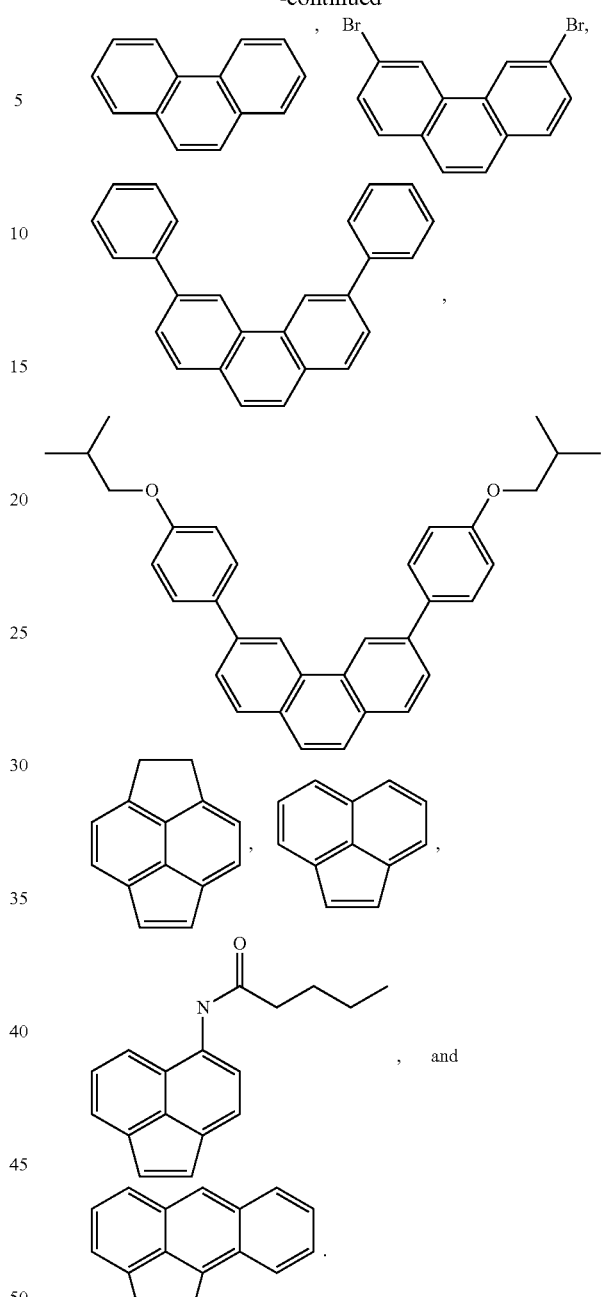
In some embodiments, $R_a$ and $R_b$, or $R_b$ and $R_c$, together form one of the following ring structures:
In some embodiments, $D_1$ and $D_2$ are each independently selected from the group consisting of the following structures:
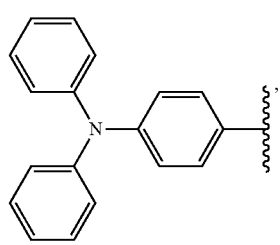

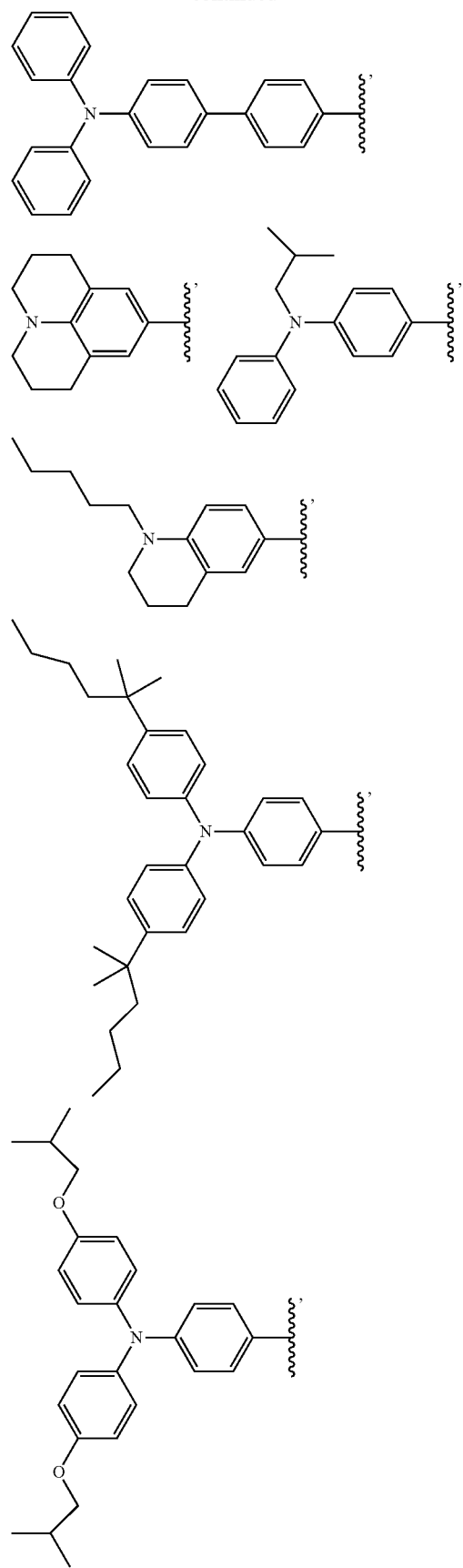
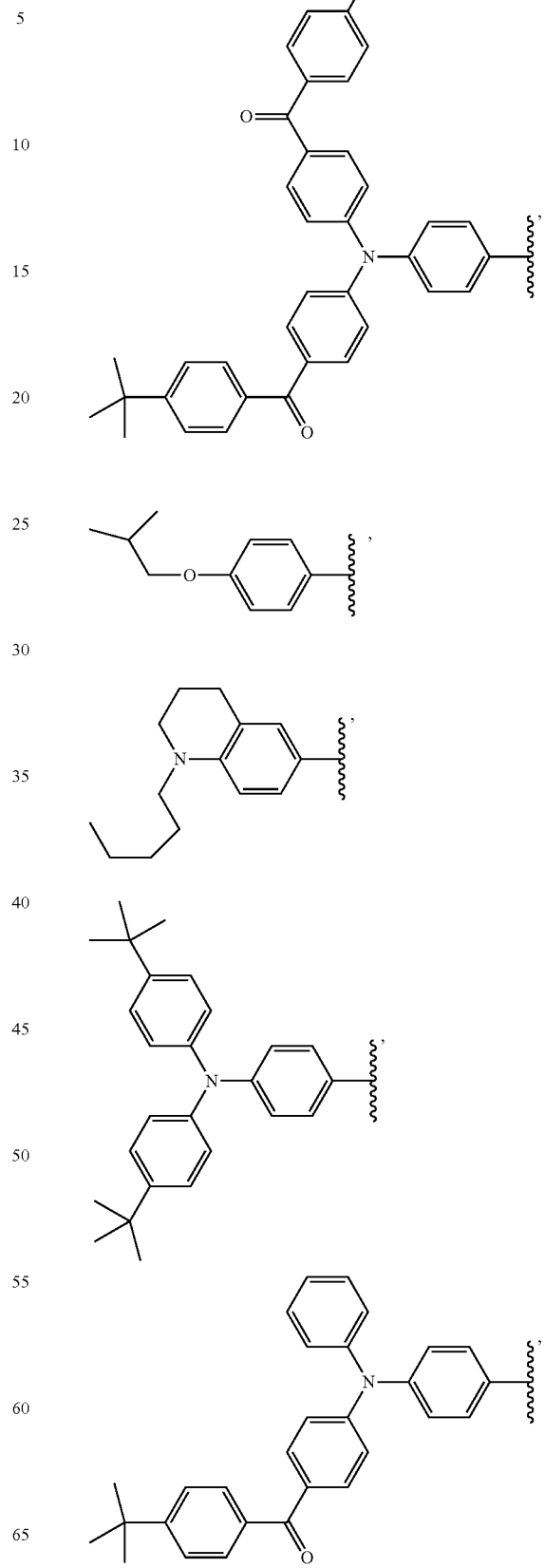

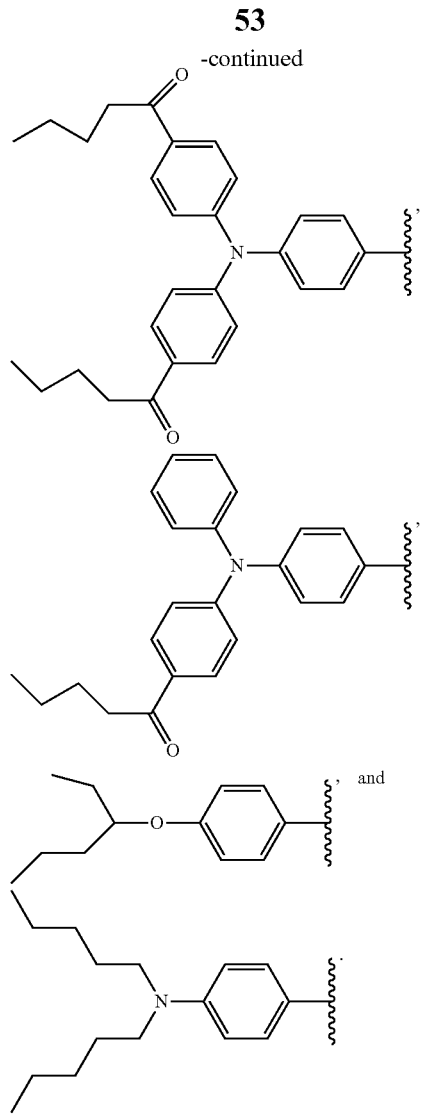

In some embodiments, at least one of the L in formula I is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b,d]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

With regard to L in any of the formulae above, the electron linker represents a conjugated electron system, which may be neutral or serve as an electron donor itself. In some embodiments, some examples are provided below, which may or may not contain additional attached substituents.

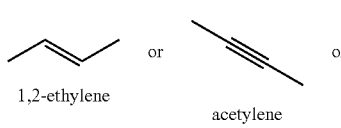

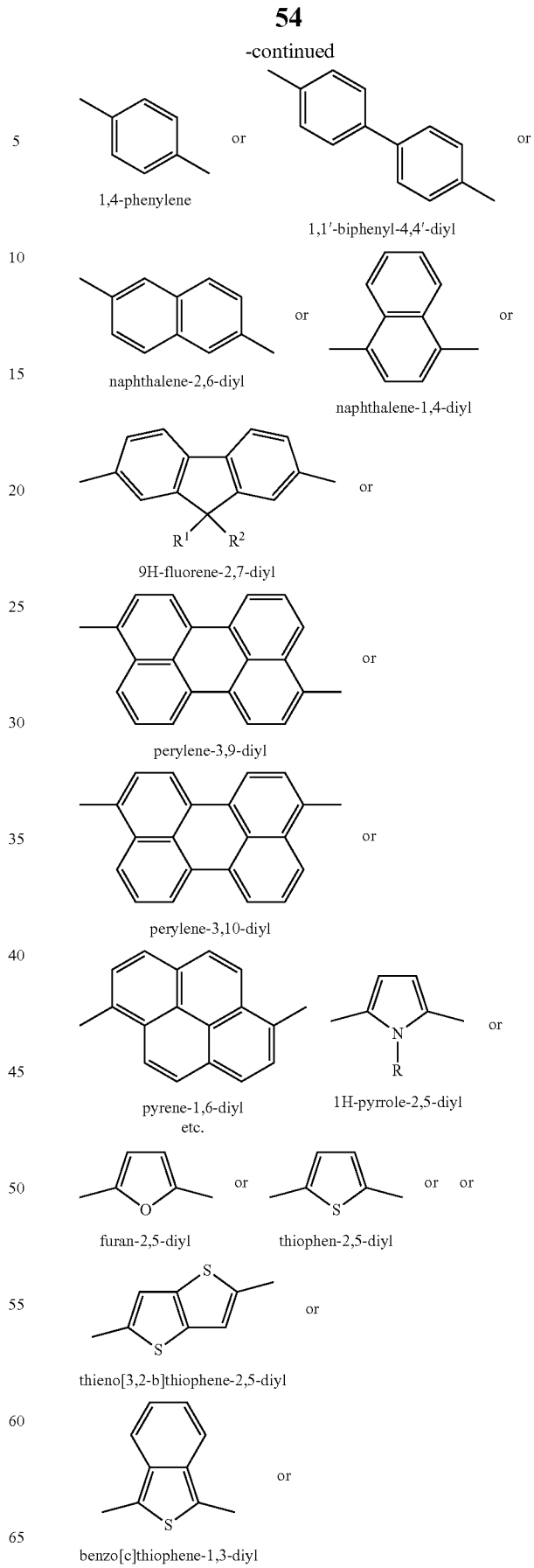

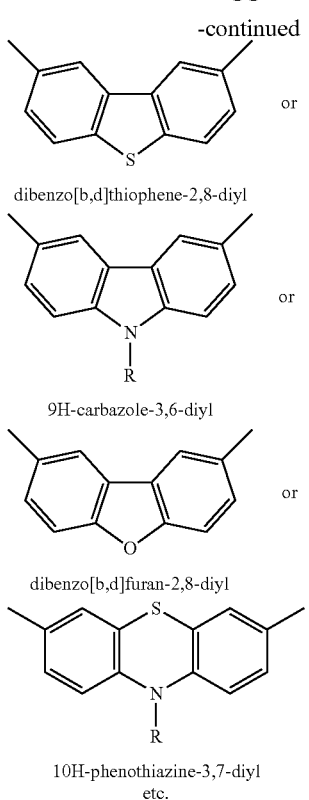

dibenzo[b,d]thiophene-2,8-diyl or 9H-carbazole-3,6-diyl or dibenzo[b,d]furan-2,8-diyl or 10H-phenothiazine-3,7-diyl
etc.

Wavelength Conversion Luminescent Medium

The chromophores disclosed herein are useful and may be suitable for providing a fluorescence film for use in improving long wavelength conversion efficiency and provide high fluorescence quantum efficiency. The chromophores can provide a wavelength conversion luminescent medium that provides excellent light conversion effects. The wavelength conversion luminescent medium receives as input at least one photon having a first wavelength, and provides as output at least one photon having a second wavelength which is longer (higher) than the first wavelength.

The wavelength conversion luminescent medium comprises an optically transparent polymer matrix and at least one organic luminescent dye comprising a chromophore disclosed herein. In some embodiments, the polymer matrix is formed from a substance selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

In some embodiments, the luminescent dye is present in the polymer matrix in an amount in the range of about 0.01 wt % to about 3 wt %, about 0.03 wt % to about 2 wt %, about 0.05 wt % to about 1 wt %, about 0.1 wt % to about 0.9 wt %, or about 0.2 wt % to about 0.7 wt %. In an embodiment of the medium, the luminescent dye is present in the polymer matrix in an amount of about 0.5 wt %.

In some embodiments, the refractive index of the polymer matrix material is in the range of about 1.4 to about 1.7, about 1.45 to about 1.65, or about 1.45 to about 1.55. In some embodiments, the refractive index of the polymer matrix material is about 1.5.

In some embodiments, a wavelength conversion luminescent medium is fabricated into a thin film structure by (i) preparing a polymer solution with dissolved polymer powder in a solvent such as tetrachloroethylene (TCE), cyclopentanone, dioxane, etc., at a predetermined ratio; (ii) preparing a luminescent dye containing a polymer mixture by mixing the polymer solution with the luminescent dye at a predetermined weight ratio to obtain a dye-containing polymer solution, (iii) forming a dye/polymer thin film by directly casting the dye-containing polymer solution onto a glass substrate, then heat treating the substrate from room temperature up to 100° C. in 2 hours, completely removing the remaining solvent by further vacuum heating at 130° C. overnight, and (iv) peeling off the dye/polymer thin film under the water and then drying out the free-standing polymer film before use; (v) the film thickness can be controlled by varying the dye/polymer solution concentration and evaporation speed.

The luminescent thin film thickness may vary over a wide range. In some embodiments, the luminescent thin film thickness is between about 0.1 µm to about 1 mm, about 0.5 µm to about 1 mm, or about 1 µm to about 0.8 mm. In some embodiments, the luminescent thin film thickness is between about 5 µm to about 0.5 mm.

Wavelength conversion mediums are useful in various applications, such as optical light collection systems, fluorescence-based solar collectors, fluorescence-activated displays, and single-molecule spectroscopy, to name a few. The use of the organic wavelength down-shifting luminescent medium as disclosed herein, significantly enhances the photoelectric conversion efficiency of photovoltaic devices or solar cells by greater than 0.5% when applied directly to the light incident surface of the device or encapsulated directly into the device during fabrication.

Photovoltaic Module and Method

Another aspect of the invention provides a photovoltaic module for the conversion of solar light energy into electricity, the photovoltaic module comprises at least one photovoltaic device or solar cell, and a wavelength conversion luminescent medium as described herein. The at least one photovoltaic device or solar cell is adapted to convert incident solar light energy into electricity. The wavelength conversion luminescent medium is positioned such that the incident light passes through the wavelength conversion luminescent medium prior to reaching the photovoltaic device or solar cell. The photovoltaic module utilizes the wavelength conversion luminescent medium to enhance the photoelectric conversion efficiency of a photovoltaic device.

Many of these photovoltaic devices or solar cells utilize materials on the light incident side of the device which absorb certain wavelengths of the solar spectrum, typically the shorter ultra violet (UV) wavelengths, instead of allowing the light to pass through to the photoconductive material of the device. This UV absorption effectively reduces the efficiency of the device. The use of a down-shifting medium in these photovoltaic devices and solar cells, when applied to the light incident side of the device, causes the shorter wavelength light to become excited and re-emitted from the medium at a longer (higher) more favorable wavelength, which can then be utilized by the photovoltaic device or solar cell, effectively enhancing the photoelectric conversion efficiency by allowing a wider spectrum of solar energy to be converted into electricity.

Another aspect of the disclosure is a method for improving the performance of a photovoltaic device or solar cell comprising applying a wavelength conversion luminescent medium directly onto the light incident side of the solar cell or photovoltaic device.

Yet another aspect of the disclosure provides a method for improving the performance of a photovoltaic device or solar cell, comprising incorporating a wavelength conversion luminescent medium directly into the photovoltaic device or solar cell during its fabrication, such that the luminescent medium is encapsulated between the photovoltaic device or solar cell and a cover substrate on the light incident side.

In some embodiments, the luminescent film is directly attached onto the light incident surface of a solar cell. A photovoltaic device or solar cell in which a thin film wavelength conversion luminescent medium is directly attached to the light incident surface of the device. A refractive index matching liquid or optical adhesive is applied between the luminescent film and the light incident surface of the solar cell to ensure better light out-coupling efficiency.

In some embodiments, a refractive index matching liquid or optical adhesive is applied between the luminescent film and the front substrate of the solar cell to ensure better light out-coupling efficiency.

In some embodiments, the luminescent film is directly applied as the encapsulation layer during solar cell fabrication. The luminescent film is encapsulated between the solar cell module and its front cover substrate. A photovoltaic device or solar cell in which a thin film wavelength conversion luminescent medium can be fabricated directly into the module as the encapsulation layer between the optically transparent light incident surface of the module and the photovoltaic device or solar cell.

In some embodiments, the solar cell is a CdS/CdTe solar cell. In another embodiment the solar cell is a CIGS solar cell. In an embodiment the solar cell is selected from the group consisting of an amorphous Silicon solar cell, a microcrystalline Silicon solar cell, or a crystalline Silicon solar cell.

In some embodiments, the solar cell efficiency is measured with and without the thin film organic down-shifting luminescent medium under one sun irradiation (AM1.5G) by using a Newport solar simulator system. The efficiency enhancement of the solar cell with the luminescent medium is determined by the equation below:

Efficiency Enhancement=$(\eta_{cell+luminescent\,film}-\eta_{cell})/\eta_{cell}*100\%$ In some embodiments, a crystalline Silicon solar cell is modified with a wavelength conversion luminescent medium according to the method disclosed herein, and the efficiency enhancement is determined to be greater than about 0.2%. In an embodiment, the efficiency enhancement is determined to be greater than about 0.4%. In an embodiment, the efficiency enhancement is determined to be greater than about 0.5%. In an embodiment, the efficiency enhancement is determined to be greater than about 0.8%. In an embodiment, the efficiency enhancement is determined to be greater than about 1.0%.

In some embodiments, a CdS/CdTe solar cell with an efficiency $\eta_{cell}$ of 11.3%, which is similar to the efficiency level achieved in most commercially available CdS/CdTe cells, is modified with a wavelength conversion luminescent medium according to the method disclosed herein, and the efficiency enhancement is determined to be greater than about 2%.

In some embodiments, a CIGS solar cell with an efficiency $\eta_{cell}$ of 14.0%, which is slightly higher than the efficiency level achieved in most commercially available CIGS cells, is modified with a wavelength conversion luminescent medium according to the method disclosed herein, and the efficiency enhancement is determined to be greater than about 6%.

In some embodiments, a photovoltaic device or solar cell comprises at least one device selected from the group consisting of a Cadmium Sulfide/Cadmium Telluride solar cell, a Copper Indium Gallium Diselenide solar cell, an amorphous Silicon solar cell, a microcrystalline Silicon solar cell, or a crystalline Silicon solar cell.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the examples which follow.

EXAMPLES

The embodiments will be explained with respect to certain embodiments which are not intended to limit the present invention. In the present disclosure, the listed substituent groups include both further substituted and unsubstituted groups unless specified otherwise. Further, in the present disclosure where conditions and/or structures are not specified, the skilled artisan in the art can readily provide such conditions and/or structures, in view of the present disclosure, as a matter of routine experimentation guided by the present disclosure.

For each example compound, the maximum absorption and fluorescence emission wavelength were measured in a solution and/or in a polymer film. For example, in a dichloromethane solution of the obtained chromophore Compound 1 (4,4'-(6,7-diethyl-2-isobutyl-2H-[1,2,3]triazolo[4,5-g]quinoxaline-4,9-diyl)bis(N,N-diphenylaniline)), the maximum absorption of the chromophore was 484 nm and the maximum fluorescence absorption was 616 nm upon 484 nm light illumination. In a PMMA (polymethyl methacrylate) film (having 0.3 wt % chromophore) comprising chromophore Compound 1, the maximum absorption of the film was 481 nm and the maximum fluorescence emission was 593 nm upon 481 nm light illumination. The wavelength differences between maximum absorption and maximum fluorescence is an improved property that is useful for new optical light collection systems and fluorescence-based solar collectors.

Example Synthesis and Spectral Data

General Procedure for Preparation of Tosylates

Equimolar amounts of p-toluenesulfonic chloride, corresponding alcohols and 1.2 equivalents of triethylamine were stirred in dichloromethane overnight at room temperature. Work-up with water, drying with anhydrous MgSO$_4$, and concentration provided 95-98% pure tosylated alcohols which were used without purification in the synthesis of the compounds described below.

Intermediate A

Intermediate A was synthesized according to the following reaction scheme:

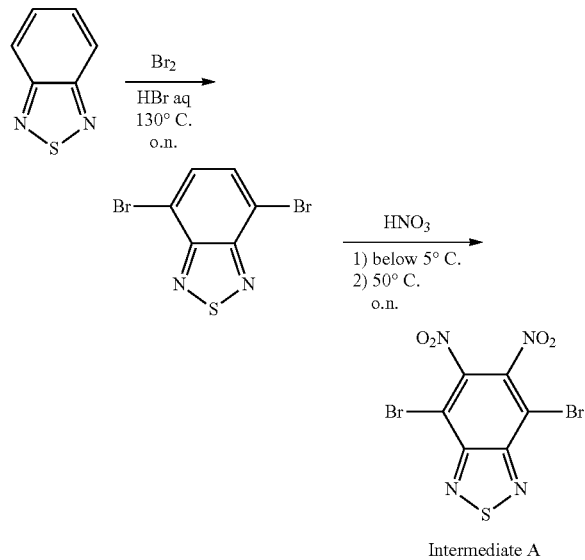

Intermediate A

Benzothiadiazole (25 g, 184 mmol) was reacted overnight with 20.8 mL bromine (2.2 eq) in 400 mL of 48% HBr (in water) at 125-130° C. After cooling the reaction mixture (heavy suspension of reddish-brown solid) was poured into 1 liter of crushed ice and left to stir for 30 minutes. Filtration, washing with water, followed by washing with sodium sulfite solution and water gave 4,7-dibromobenzothiadiazole as brick colored needles, (50.1 g, 92%, after drying in vacuum oven). This material was used for nitration with fuming nitric acid in trifluoromethanesulfonic acid (TFMSA) as follows: nitric acid (10.0 mL) was added dropwise to TFMSA (150 g) which was cooled below 5° C. with intensive stirring (white solid formed). 4,7-Dibromobenzothiadiazole (as solid) was added portionwise to the above reaction mixture and, after it became homogenous, the flask was placed in an oil bath and left to stir at 50° C. for 16-24 hours. The reaction was monitored by $^{13}$C NMR (110.4, 145.0, and 151.4 ppm). Pouring the solution into 500 mL of ice/water afforded Intermediate A (4,7-dibromo-5,6-dinitrobenzothiadiazole) as a yellowish solid which was thoroughly washed with water and dried in vacuum oven (30.6 g, 94%).

Intermediate B

Intermediate B was synthesized according to the following reaction scheme:

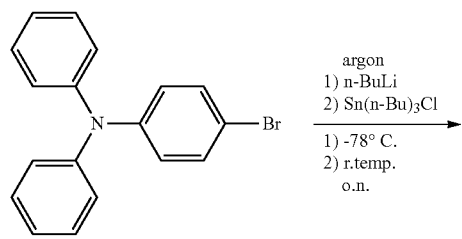

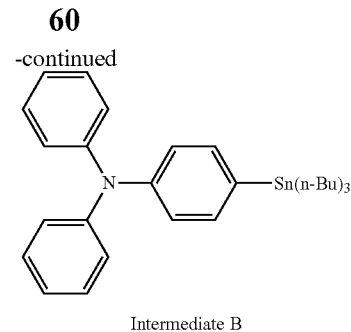

Intermediate B

4-Bromotriphenylamine (65.0 g, 200 mmol) was placed in a 500 ml dry three necked RB flask equipped with a magnetic stirring bar, low temperature thermometer and argon inlet. Tetrahydrofurane was transferred to the reaction flask using a cannula (200 ml) and cooled in a dry-ice acetone bath to −78° C. and n-BuLi 91.6M in hexane (130 mL) was added dropwise over a period of 30 minutes. The reaction mixture was left to stir at the same temperature for 30 minutes at which time tributyltin chloride (65.0 mL) was added dropwise over 30 minutes. The reaction was left to stir overnight, after which the reaction was allowed to warm to room temperature. The solution was poured into ice-cold water (approximately 500 mL) and extracted using diethyl ether (2×250 mL). The organic layer was dried with MgSO$_4$ and the solvent was removed by evaporation to give 106.5 g of Intermediate B as yellowish oil, by $^1$H NMR approximately 95% pure.

Intermediate C

Intermediate C was synthesized according to the following reaction scheme:

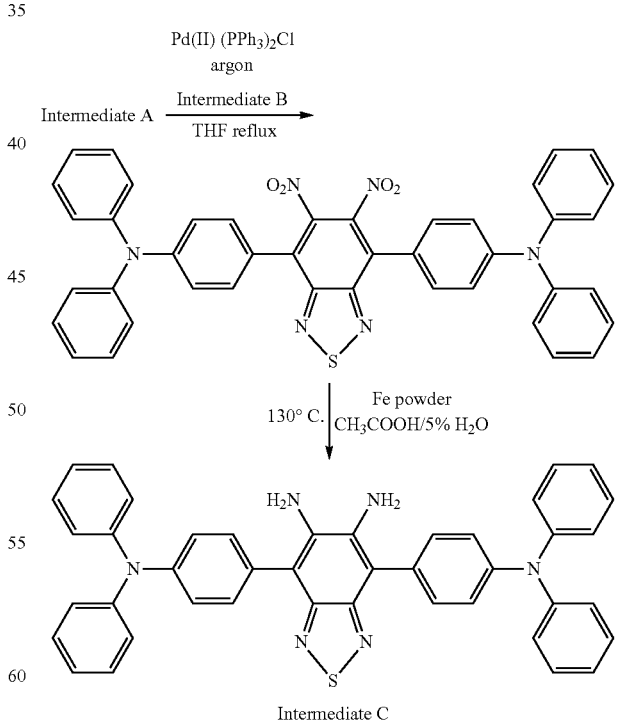

Intermediate C

Step 1: A mixture of Intermediate A (3.84 g, 10 mmol), Intermediate B (10.7 g, mmol), and Bis(triphenylphosphine)palladium(II) chloride (1.40 g, 2.0 mmol) in tetrahydrofurane was stirred and heated under argon at 70° C. for 5 hours. The solvent was removed and MeOH was added (100 mL) to the residue. The purple solid was separated by filtration, washed with MeOH, and dried to give 4,4'-(5,6-dinitrobenzo[c][1,2,5]thiadiazole-4,7-diyl)bis(N,N-diphenylaniline) (7.0 g) as purple solid.

Step 2: A mixture of the above crude 4,4'-(5,6-dinitrobenzo[c][1,2,5]thiadiazole-4,7-diyl)bis(N,N-diphenylaniline) (calculated for 10 mmol) and iron dust (5.6 g, 100 mmol) was heated in glacial acetic acid (100 mL) with 5% of water (to prevent formation of side product, imidazole) at 110° C. for 2 hours. The solution was poured into ice-water (200 mL) and the resulting solid was separated by filtration, washed with water and dried. After filtering through 2 layers of silica gel (to remove particles of iron) using ethyl DCM/hexane (3:2) and concentration, Intermediate C (4,7-bis(4-(diphenylamino)phenyl)benzo[c][1,2,5]thiadiazole-5,6-diamine) was collected as a light brown solid (4.50 g, 68%, after 2 steps). $^1$H NMR (400 MHz, CDCl$_3$): δ 7.44 (d, J=8.6 Hz, 4H), 7.16-7.30 (m, 20H), 7.44 (t, J=6.3 Hz, 4H).

Intermediate D

Intermediate D was synthesized according to the following reaction scheme:

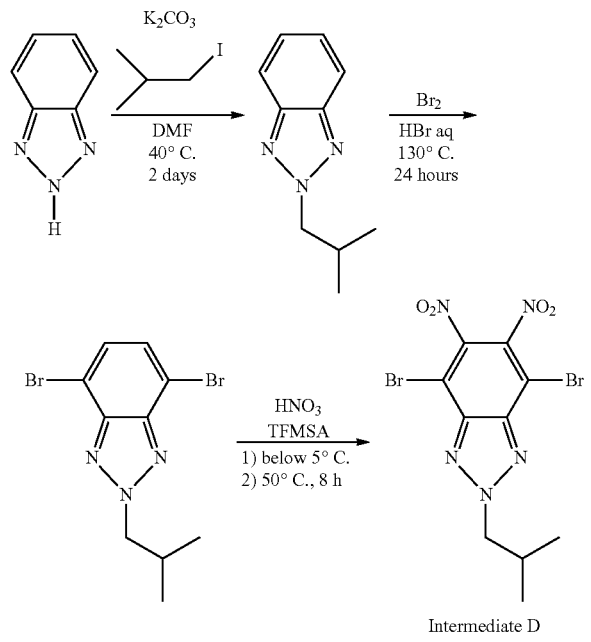

Intermediate D

Step 1: A mixture of benzotriazole (11.91 g, 100 mmol), 1-iodo-2-methylpropane (13.8 mL, 120 mmol), potassium carbonate (41.46 g, 300 mmol), and dimethylformamide (200 mL) was stirred and heated under argon at 40° C. for 2 days. The reaction mixture was poured into ice/water (1 L) and extracted with toluene/hexanes (2:1, 2×500 mL). The extract was washed with 1 N HCl (2×200 mL) followed by brine (100 mL). The extract was then dried over anhydrous MgSO$_4$, and the solvent was removed under reduced pressure. The residue was triturated with hexane (200 mL) and set aside at room temperature for 2 hours. The precipitate was separated and discarded, and the solution was filtered through a layer of silica gel (200 g). The silica gel was washed with hexane/dichloromethane/ethyl acetate (37:50:3, 2 L). The filtrate and washings were combined, and the solvent was removed under reduced pressure to yield 2-isobutyl-2H-benzo[d][1,2,3]triazole (8.81 g, 50% yield) as an oily product. $^1$H NMR (400 MHz, CDCl$_3$): δ 7.86 (m, 2H, benzotriazole), 7.37 (m, 2H, benzotriazole), 4.53 (d, J=7.3 Hz, 2H, i-Bu), 2.52 (m, 1H, i-Bu), 0.97 (d, J=7.0 Hz, 6H, i-Bu).

Step 2: A mixture of 2-isobutyl-2H-benzo[d][1,2,3]triazole (8.80 g, 50 mmol), bromine (7.7 mL, 150 mmol) and 48% HBr (50 mL) was heated at 130° C. for 24 hours under a reflux condenser connected with an HBr trap. The reaction mixture was poured into ice/water (200 mL), treated with 5 N NaOH (100 mL) and extracted with dichloromethane (2×200 mL). The extract was dried over anhydrous magnesium sulfate, and the solvent was removed under reduced pressure. A solution of the residue in hexane/dichloromethane (1:1, 200 mL) was filtered through a layer of silica gel and concentrated to yield 4,7-dibromo-2-isobutyl-2H-benzo[d][1,2,3]triazole, (11.14 g, 63% yield) as an oil that slowly solidified upon storage at room temperature. $^1$H NMR (400 MHz, CDCl$_3$): δ 7.44 (s, 2H, benzotriazole), 4.58 (d, J=7.3 Hz, 2H, i-Bu), 2.58 (m, 1H, i-Bu), 0.98 (d, J=6.6 Hz, 6H, i-Bu).

Step 3: 4,7-dibromo-2-isobutyl-2H-benzo[d][1,2,3]triazole (17.8 g, 53 mmol) was added at 0-5° C. to a premixed fuming HNO$_3$ (7.0 mL) and TFMSA (110 g) portionwise and after approximately 10 minutes the reaction mixture was placed in an oil bath and heated at 55° C. for 8 hours. The solution was then cooled by pouring into 500 mL of ice/water. The solid obtained was thoroughly washed with water, followed by MeOH and dried in a vacuum oven to yield Intermediate D (4,7-dibromo-2-isobutyl-5,6-dinitro-2H-benzo[d][1,2,3]triazole) as yellowish solid (20.4 g, 91%). $^1$H NMR (400 MHz, CDCl$_3$): δ 4.66 (δ, J=7.2 Hz, 2H, i-Bu), 2.60 (m, 1H, i-Bu), 1.01 (d, J=7.0 Hz, 6H, i-Bu).

Intermediate E

Intermediate E was synthesized according to the following reaction scheme:

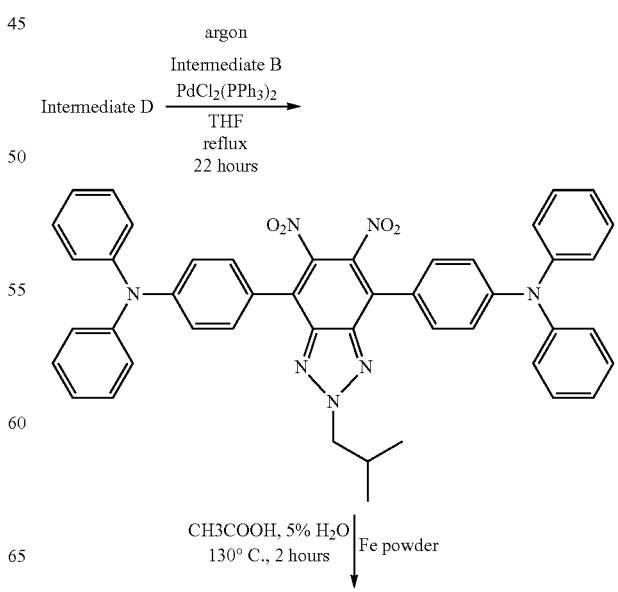

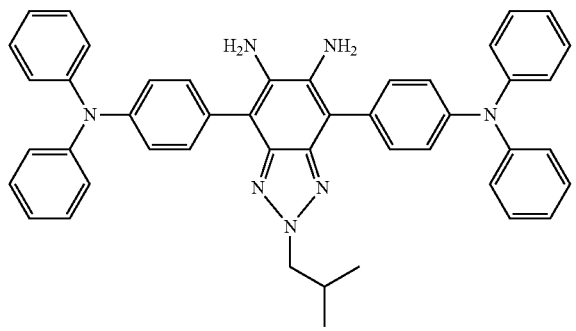

Intermediate E

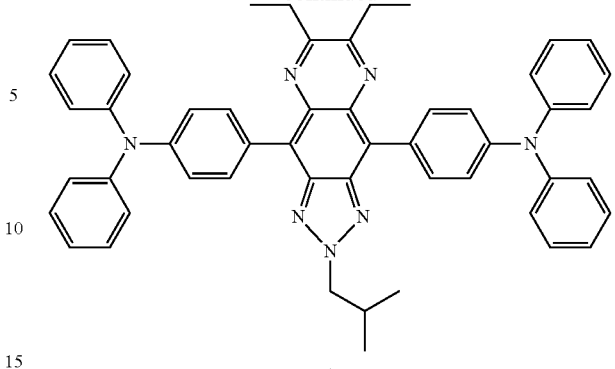

1

Step 1: In a three necked reaction flask equipped with argon inlet and magnetic stirring bar, was placed THF (100 mL), Intermediate B (31.1 g, 30 mmol), and argon was bubbled through for approximately 10 minutes before bis(triphenylphosphine)palladium(II) chloride (10% molar per Intermediate B, 1.80 g, 2.5 mmol) was added. The reaction was stirred under argon for 10 minutes before Intermediate D (10.6 g, 25 mmol) was added in one portion. The reaction mixture was refluxed for 22 hours. The reaction was monitored by LCMS and TLC. The reaction was cooled and MeOH (200 mL) was added while stirring. A dark orange color solid was formed which was separated by filtration, washed with MeOH, and dried to give 4,4'-(2-isobutyl-5,6-dinitro-2H-benzo[d][1,2,3]triazole-4,7-diyl)bis(N,N-diphenylaniline) (11.5 g, 62%, purity by LCMS 86%).

Step 2: A mixture of 4,4'-(2-isobutyl-5,6-dinitro-2H-benzo[d][1,2,3]triazole-4,7-diyl)bis(N,N-diphenylaniline) (6.0 g, 8.0 mmol) and iron powder (4.5 g, 80 mmol) was heated and stirred in glacial acetic acid (100 mL) at 130° C. for 2 hours. The reaction was monitored by LCMS and TLC. The reaction was cooled and poured into water to yield yellow solid which was separated by filtration, washed with water and dried to give Intermediate E (4,7-bis(4-(diphenylamino)phenyl)-2-isobutyl-2H-benzo[d][1,2,3]triazole-5,6-diamine) (4.6 g, 66%, purity by LCMS 82%).

Compound 1

Synthesis of Compound 1 was performed according to the following scheme:

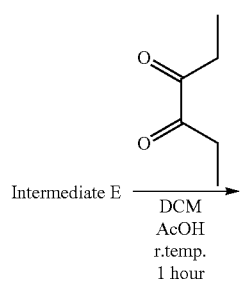

Intermediate E $\xrightarrow{\text{DCM} \atop \text{AcOH} \atop \text{r.temp.} \atop \text{1 hour}}$ Intermediate E (crude, 990 mg, calculated for 1.2 mmol) and 1,4-hexanedione (170 mg, 1.5 mmol) was stirred in a mixture of acetic acid and DCM (20 mL, 1:1) at room temperature for one hour. Evaporating DCM and adding water (50 mL) provided a red solid which was separated by filtration, washed with water, followed by MeOH, and dried. Column chromatography (DCM/Hexane, 1:1) gave Compound 1 (4,4'-(6,7-diethyl-2-isobutyl-2H-[1,2,3]triazolo[4,5-g]quinoxaline-4,9-diyl)bis(N,N-diphenylaniline)) as a red solid (590 mg, 64%). $^1$H NMR (400 MHz, CDCl$_3$): δ 8.06 (d, J=8.8 Hz, 4H), 7.24-7.29 (m, 20H), 7.05 (t, J=7.2 Hz, 4H), 4.67 (d, J=7.3 Hz, 2H), 3.00 (q, J=7.3 Hz, 4H), 2.61-2.67 (m, 1H), 1.39 (t, J=6.5 Hz, 6H), 1.01 (d, J=6.5 Hz, 6H). UV-vis spectrum: $\lambda_{max}$=484 nm (dichloromethane), 481 nm (PMMA film). Fluorimetry: $\lambda_{max}$=616 nm (dichloromethane), 593 nm (PMMA film).

Compound 2

Synthesis of Compound 2 was performed according to the following scheme:

Intermediate E $\xrightarrow[\substack{\text{THF} \\ \text{1) below 10° C.} \\ \text{2) r. temp.}}]{\substack{\text{NaNO}_2 \\ \text{acetic acid}}}$

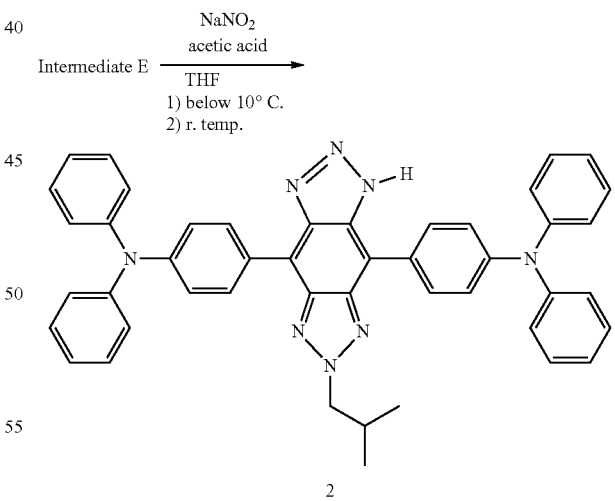

2

Intermediate E (5.54 g, 8 mmol) was dissolved in 50 mL of THF (for solubility) and 50 mL of acetic acid was added. The mixture was then cooled in an ice/water bath before 12 mL of 1M solution of NaNO$_2$ in water was added. After 10 minutes the reaction was complete. Diluting with 400 mL of water afforded an orange color solid which was separated by filtration, washed and dried to give Compound 2, 4,4'-(6-isobutyl-1,6-dihydrobenzo[1,2-d:4,5-d']bis([1,2,3]triazole)-

4,8-diyl)bis(N,N-diphenylaniline) as an orange solid (2.72 g, 48%). $^1$H NMR (400 MHz, CDCl$_3$): δ 8.5 (bs, 1H), 7.9 (bs, 1H), 7.2-7.3 (m, 24H), 7.08 (t, J=7.3 Hz, 4H), 4.65 (d, J=7.4 Hz, 2H), 2.64 (m, 1H), 1.01 (d, J=6.5 Hz, 6H). UV-vis spectrum: $\lambda_{max}$=474 nm (dichloromethane), 474 nm (PMMA film). Fluorimetry: $\lambda_{max}$=575 nm (dichloromethane), 555 nm (PMMA film).

Compound 3

Synthesis of Compound 3 was performed according to the following scheme:

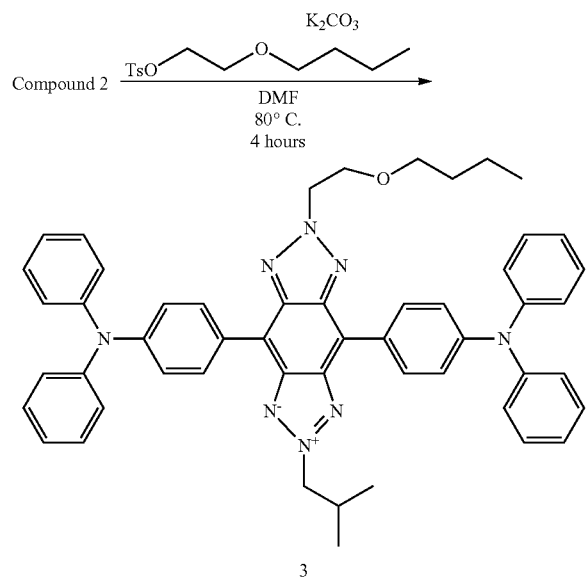

1.70 g of 4,4'-(6-isobutyl-1,6-dihydrobenzo[1,2-d:4,5-d'] bis([1,2,3]triazole)-4,8-diyl)bis(N,N-diphenylaniline (Compound 2), calculated for 2.5 mmol was dissolved in DMF (30 mL). Potassium carbonate (2.80 g, 20 mmol) was added, followed by 2-butoxyethyl 4-methylbenzenesulfonate (1.36 g, 5 mmol) and the reaction mixture was heated at 125° C. for 50 minutes. The solution was rotavaped and the residue was triturated with MeOH. The reddish-brown solid was separated, washed with MeOH and dried. Column chromatography (silica gel, DCM/Hex-3:2) provided Compound 3 (4,4'-(2-(2-butoxyethyl)-6-isobutyl-1,2,3,6-tetrahydrobenzo[1,2-d:4,5-d']bis([1,2,3]triazole)-4,8-diyl)bis(N,N-diphenylaniline)) as a red solid (1.62 g, 80%). $^1$H NMR (400 MHz, CDCl$_3$): δ 8.60 (d, J=8.7 Hz, 4H), 7.20-732 (m, 20H), 7.06 (t, J=7.3 Hz, 4H), 5.02 (t, J=5.8 Hz, 2H), 4.66 (d, J=7.4 Hz, 2H), 4.20 (t, J=6.0 Hz, 2H), 3.48 (t, J=6.6 Hz, 2H), 2.66 (d, J=6.9 Hz, 2H), 1.50 (m, 2H), 1.23 (m, 2H), 1.00 (m, 2H), □1.03 (d, J=6.6 Hz, 6H), 0.78 (t, J=7.7 Hz). UV-vis spectrum: $\lambda_{max}$=517 nm (dichloromethane), 512 nm (PMMA film). Fluorimetry: $\lambda_{max}$=615 nm (dichloromethane), 606 nm (PMMA film).

Compound 4

Synthesis of Compound 4 was performed according to the following scheme:

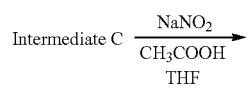

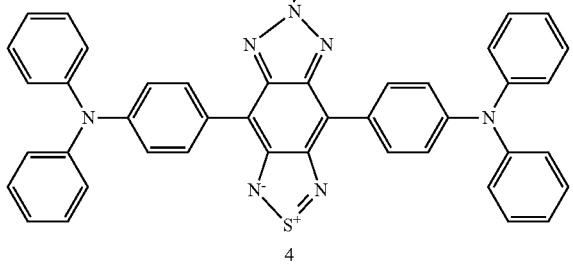

Intermediate C (6.5 g, 10 mmol) was dissolved in a mixture of THF and acetic acid (25 mL+25 mL) in a beaker and vigorously stirred in ice/water bath to keep the temperature below 10° C. The solution of NaNO$_2$ (0.83 g) in 10 mL of water was prepared and after cooling in the same bath was added portionwise to the reaction mixture. After 10 minutes, the mixture was removed from the cooling bath and left to stir at room temperature for one hour (monitored by TLC, Hexane/EA-4:1). A strong purple color of the product formed in comparison to yellow color of the starting material. The crude reaction mixture was partitioned between water and DCM, and the organic layer was washed with water and the solvent removed. The solid residue was triturated with MeOH and the dark purple solid was separated by filtration and dried to give Compound 4, (4,4'-1H-[1,2,3]triazolo[4',5':4,5]benzo[1,2-c][1,2,5]thiadiazole-4,8-diyl)bis(N,N-diphenylaniline)) (5.9 g, 80% pure by LCMS) which was used without further purification for the next step. UV-vis spectrum: $\lambda_{max}$=550 nm (dichloromethane), Fluorimetry: $\lambda_{max}$=707 nm (dichloromethane).

Compound 5

Synthesis of Compound 5 was performed according to the following scheme:

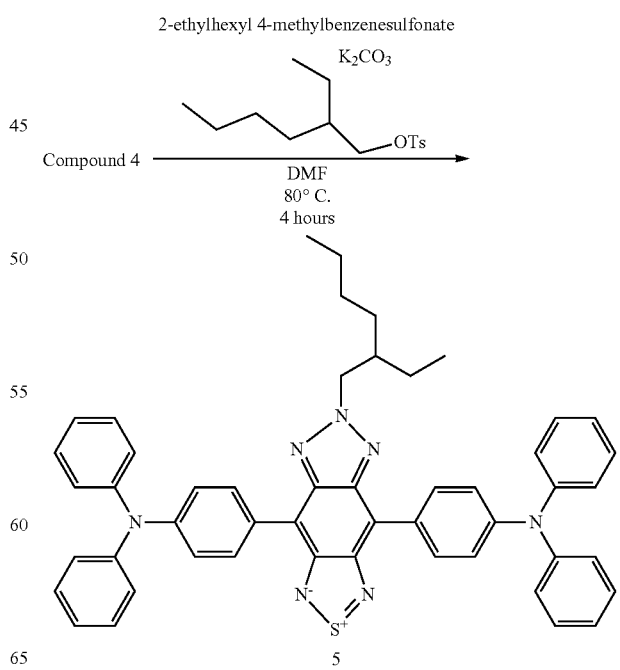

The Compound 4 crude material (3.32 g, 5 mmol) was dissolved in 20 mL of DMF. 2-ethylhexyl 4-methylbenzenesulfonate (1.71 g, 7.0 mmol) was added followed by K$_2$CO$_3$ (1.38 g, 10 mmol). The reaction mixture was stirred at 80° C. (oil bath) for 4 hours. The reaction was monitored by TLC, and a strong blue color was observed. After reaction was accomplished it was poured into water and the resulting precipitate was separated, washed with water, followed by MeOH, and dried in a vacuum oven. Purification by column chromatography (Hexane/DCM, 1:1) afforded Compound 5 (4,4'-(6-(2-ethylhexyl)-1H-[1,2,3]triazolo[4',5':4,5]benzo[1,2-c][1,2,5]thiadiazole-4,8-diyl)bis(N,N-diphenylaniline)) as dark blue solid (1.42 g, 36%). $^1$H NMR (400 MHz, CDCl$_3$): δ 8.37 (J=8.8 Hz, 4H), 7.24-7.31 (m, 20H), 7.06-7.09 (t, J=7.0 Hz, 4H), 4.79 (d, J=7.3 Hz, 2H), 2.35 (m, 1H), 1.2-1.4 (m, 8H), 0.96 (t, J=7.3 Hz, 3H), 0.85 (t, J=7.0 Hz, 3H). UV-vis spectrum: λ$_{max}$=604 nm (dichloromethane), 613 nm (PMMA film). Fluorimetry: λ$_{max}$=755 nm (dichloromethane), 695 nm (PMMA film).

Compound 6

Synthesis of Compound 6 was performed according to the following scheme:

Intermediate D-2

Synthesis of Intermediate D-2 was performed according to the following scheme:

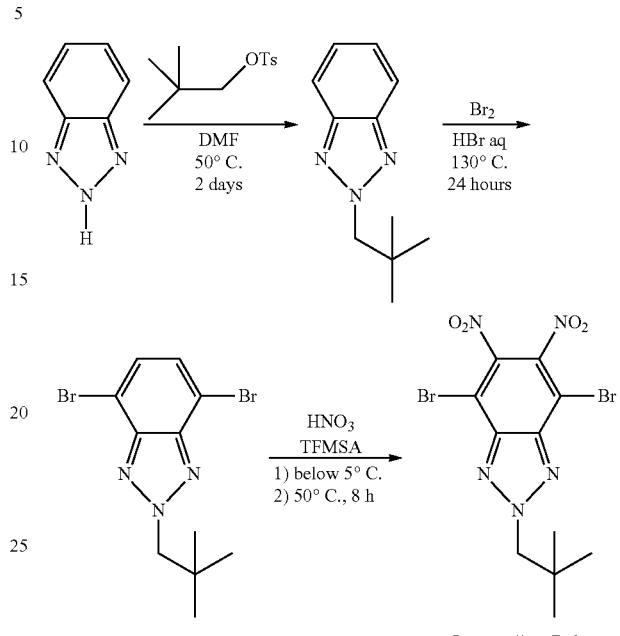

Intermediate D-2

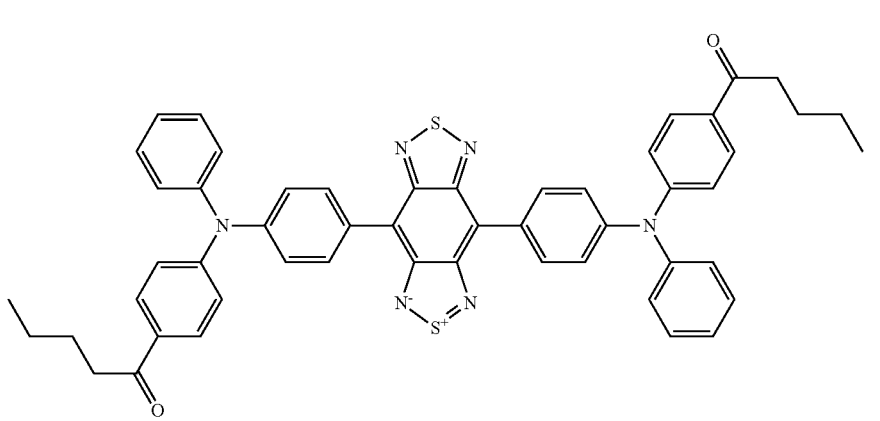

6

Compound 6 was prepared from Intermediate C by cyclization with N-thionyl aniline (0.5 mL/1 mmol) in pyridine at 80° C. overnight in the presence of trimethylsilyl chloride (2.0 mL/1 mmol). After work-up and purification by column chromatography with DCM/hexane (3:2) the mixture was reacted with valeryl chloride (10 eq) in DCM in the presence of zinc chloride (10 eq). The reaction mixture was then refluxed for four hours (monitored by LCMS). After cooling the reaction mixture was poured onto ice/cold water and neutralized with sodium bicarbonate. The organic layer was washed with water, dried (magnesium sulfate) and the solvent evaporated. Then, column chromatography with hexane/ethyl acetate allowed separation of the main isomer to obtain Compound 6. $^1$H NMR (400 MHz, CDCl$_3$): δ 8.25 (d, J=8.8 Hz, 4H), 7.87 (d, J=8.8 Hz, 4H), 7.37 (m, 8H), 7.20-7.29 (m, 10H), 2.92 (m, 4H), 1.74 (m, 4H), 1.41 (m, 4H), 0.95 (t, J=7.3 Hz). UV-vis spectrum: λ$_{max}$=667 nm (dichloromethane), Fluorimetry: λ$_{max}$=814 nm (dichloromethane).

Intermediate D-2 was prepared similar to the procedure for Intermediate D, except that neopentyl tosylate was used instead of 1-iodo-2-methylpropane and potassium carbonate. $^1$H NMR for Intermediate D-2 (400 MHz, CDCl$_3$): δ 7.53 (d, J=8.8 Hz, 4H), 7.29 (t, J=8.4 Hz, 8H), 7.20 (d, J=8.4 Hz, 12H), 7.05 (t, J=7.0 Hz, 4H), 4.38 (s, 2H), 0.99 (s, 9H).

Intermediate E-2

Synthesis of Intermediate E-2 was performed according to the following scheme:

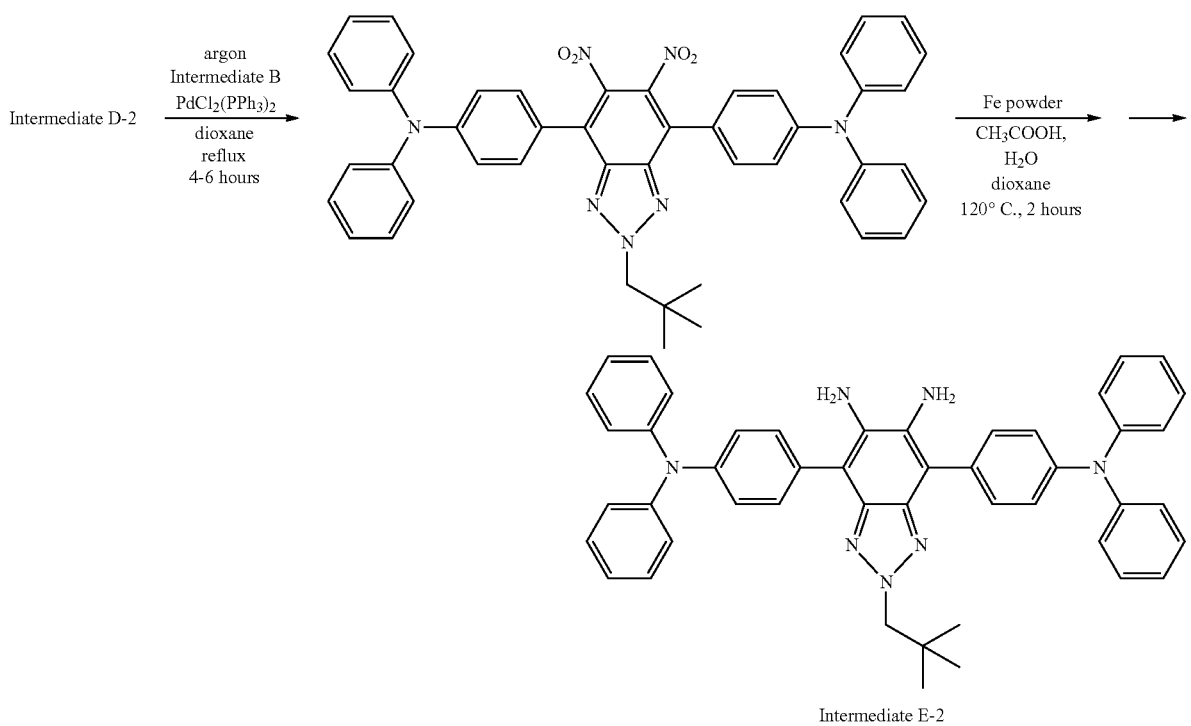

Intermediate E-2

Intermediate E-2 was prepared similar to the procedure for Intermediate E. $^1$H NMR for nitro intermediate (400 MHz, CDCl$_3$): δ 4.66 (s, 2H), 1.08 (s, 9H). $^1$H NMR for Intermediate E-2, 7.43 (d, J=8.8 Hz, 4H), 7.31 (t, J=7.0 Hz, 8H), 7.20 (d, J=-8.4 Hz, 8H), 7.11 (t, J=8.8 Hz, 4H), 4.57 (s, 2H), 1.02 (s, 9H).

Compound 7

Synthesis of Compound 6 was performed according to the following scheme:

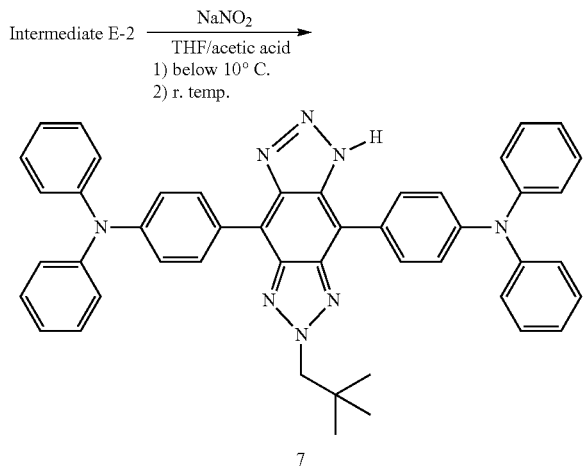

7

Compound 7 was prepared following the same sequence of reaction as for Compound 2, except Intermediate E-2 was used instead of Intermediate E. $^1$H NMR for Compound 6 (400 MHz, CDCl$_3$): δ 8.0-8.5 (bs, 4H), 7.17-7.35 (m, 20H), 7.02-7.12 (bs, 4H), 4.66 (s, 2H), 1.11 (s, 9H).

Compound 8

Synthesis of Compound 8 was performed according to the following procedures:

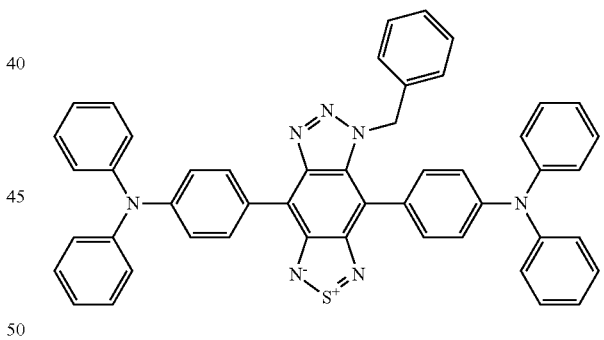

8

Compound 8 was prepared from 870 mg of Compound 4 and benzylbromide (1.0 mL, 8.4 mmol). The reaction mixture was heated in DMF (20 mL) in the presence of potassium carbonate (1.4 g, 10 mmol) for two hours at 130° C. The reaction was monitored by TLC, and a substance with a purple color of lower polarity than the blue starting material was formed. After cooling the reaction mixture was poured into ice-cold water and left to stir. A solid was obtained, which was separated, and then washed with water, followed by methanol, and dried. Column chromatography (silica gel, DCM/Hexane—2:1) produced Compound 7 as a purple solid (Bt-1 isomer, 510 mg, yield 56%). $^1$H NMR (400 MHz, CDCl$_3$): δ 8.36 (d, J=8.8 Hz, 2H), 7.11-7.34 (m, 29H), 6.64 (d, J=6.6 Hz, 2H), 5.81 (s, 2H). δ 9.15. UV-vis spectrum: $\lambda_{max}$=534 nm (dichloromethane), Fluorometry: $\lambda_{max}$=699 nm (dichloromethane).

Compound 9

Synthesis of Compound 9 was performed according to the following procedures:

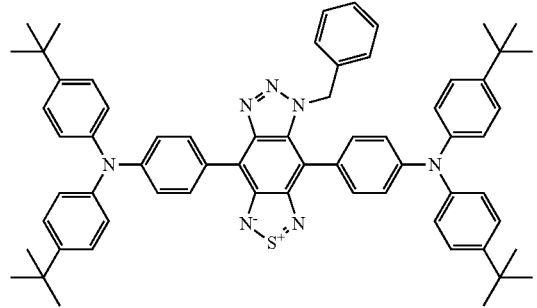

9

Compound 8 (500 mg, 0.66 mmol) was reacted with 1.0 mL of dry tert-butanol in 25 mL of trifluoroacetic acid at reflux for six hours. The reaction was monitored by TLC (different color and polarity). Evaporation of TFA and co-evaporation with toluene followed. Stirring with water provided a purple solid which was separated and dried. Purification by column chromatography (DCM/hexane—3:2) gave Compound 9 (Bt-1 isomer, 160 mg, yield 25%) as purple solid. $^1$H NMR (400 MHz, CDCl$_3$): δ 8.33 (d, J=8.8 Hz, 2H), 7.10-7.40 (m, 25H), 6.64 (d, J=6.6 Hz, 2H), 5.81 (s, 2H), 1.34 (s, 36H). δ 9.15 UV-vis spectrum: λmax=551 nm (dichloromethane), Fluorometry: λmax=697 nm (dichloromethane). λmax=798 nm (dichloromethane).

Compound 10

Synthesis of Compound 10 was performed according to the following procedures:

10

Compound 10 was prepared from Compound 5 following a similar procedure as was used for Compound 9. Purification was performed by column chromatography (DCM/hexane—1:1) to obtain Compound 10 (Bt-2 isomer). UV-vis spectrum: $\lambda_{max}$=627 nm (dichloromethane), Fluorometry: $\lambda_{max}$=789 nm (dichloromethane).

Compound 11

Synthesis of Compound 11 was performed according to the following procedures:

11

Compound 11 was prepared similarly to Compound 9 except 4-fluorobenzyl bromide was used instead of tert-butanol. Compound 11 was obtained (Bt-1 isomer). $^1$H NMR (400 MHz, CDCl$_3$): δ 8.28 (d, J=8.8 Hz, 2H), 7.84 (d, J=2H), 7.74 (m, 2H), 7.0-7.4 (m, 22H), 2.22 (t, J=8.8 Hz, 2H), 6.48 (m, 2H), 5.28 (s, 2H). UV-vis spectrum: $\lambda_{max}$=585 nm (dichloromethane), Fluorometry: $\lambda_{max}$=655 nm (dichloromethane).

Compound 12

Synthesis of Compound 12 was performed according to the following procedures:

12

Compound 12 was prepared similarly to Compound 4 but 2-butoxy-ethanol tosylate (2 eq, prepared according to general procedure) was used instead of tert-butanol. The reaction was carried out for 8 hours at 130° C. After work-up and purification, Compound 12 was isolated as a purple solid (600 mg, yield 35%—Bt-1 isomer). $^1$H NMR (400 MHz, CDCl$_3$): δ 8.34 (d, J=8.8 Hz, 2H), 7.46 (d, J=8.8 Hz, 2H), 7.2-7.35 (m, 20H), 4.68 (t, J=6.3 Hz, 2H), 3.56 (t, J=6.1 Hz, 2H), 3.26 (t, J=6.4 Hz, 2H), 1.36-1.40 (m, 2H), 1.115-1.20 (m, 2H), 0.77 (t, J=7.7 Hz, 3H). UV-vis spectrum: $\lambda_{max}$=536 nm (dichloromethane), Fluorometry: $\lambda_{max}$=690 nm (dichloromethane).

Compound 13

Synthesis of Compound 13 was performed according to the following procedures:

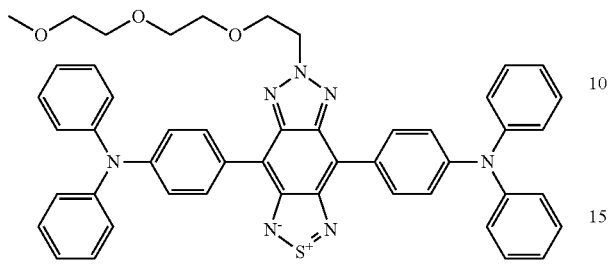

13

Compound 4 (330 mg, 0.5 mmol) was reacted with tosylate of triethylene glycol monomethyl ether (640 mg, 2 mmol) in the presence of potassium carbonate (0.7 g, 5 mmol) in dry DMF (10 mL) at 130° C. for two hours. The reaction was monitored by TLC and LCMS. The reaction mixture was poured into water and extracted with DCM, and then dried (MgSO$_4$anh.) and rotavaped. Column chromatography (silica gel/DCM and gradually up to 2.5% ethyl acetate) yielded pure Compound 12 as a dark navy solid (320 mg, yield 78%, of pure Bt-2 isomer). $^1$H NMR (400 MHz, CDCl$_3$): δ 8.36 (d, J=8.8 Hz, 4H), 7.22-7.33 (m, 20H), 7.08 (t, J=7.3 Hz, 4H), 5.06 (t, J=5.6 Hz, 2H), 4.30 (t, J=5.8 Hz, 2H), 3.66-3.68 (m, 2H), 3.56-3.58 (m, 2H), 3.49-3.52 (m, 2H), 3.36-3.39 (m, 2H), 3.25 (s, 3H). UV-vis spectrum: λ$_{max}$=616 nm (dichloromethane), Fluorometry: λ$_{max}$=758 nm (dichloromethane).

Compound 14

Synthesis of Compound 14 was performed according to the following procedures:

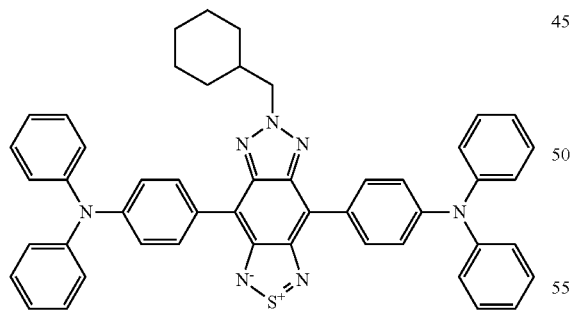

14

Compound 4 (660 mg, 1 mmol) was reacted according to the procedure for Compound 5 but with tosylate of cyclohexylmethyl alcohol (prepared as in general procedure, 1.1 g, 5 eq) in dry DMF (10 mL) at 120° C. for 1 hour. The reaction was monitored by TLC (starting material violet color, product dark blue). After work-up and column chromatography Compound 14 was obtained as a dark blue solid (320 mg, yield 42%, Bt-2 isomer). $^1$H NMR (400 MHz, CDCl$_3$): δ 8.37 (d, J=8.8 Hz, 4H), 4.22-4.33 (m, 20H), 7.08 (t, J=7.3 Hz, 4H), 4.70 (d, J=7.4 Hz, 2H), 2.33 (m, 1H), 1.66-1.76 (m, 4H), 1.11-1.28 (m, 6H).). UV-vis spectrum: λ$_{max}$=612 nm (dichloromethane), Fluorometry: λ$_{max}$=739 nm (dichloromethane).

Compound 15

Synthesis of Compound 15 was performed according to the following procedures:

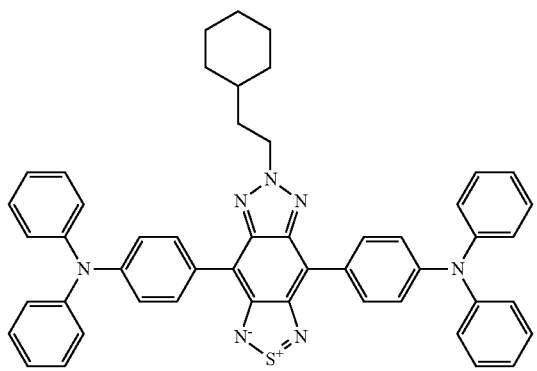

15

Compound 15 was prepared similarly to Compound 14. UV-vis spectrum: λ$_{max}$=612 nm (dichloromethane), Fluorometry: λ$_{max}$=696 nm (dichloromethane).

Compound 16

Synthesis of Compound 16 was performed according to the following procedures:

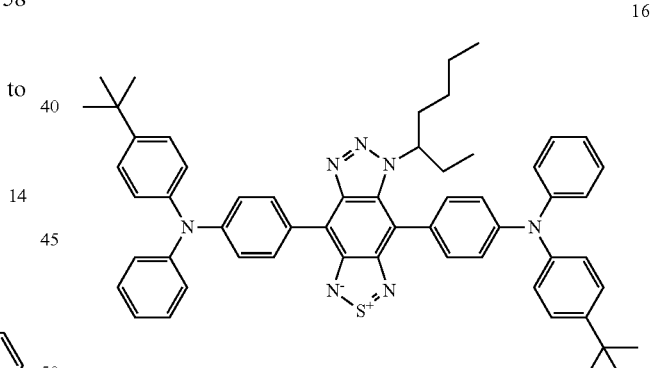

16

Compound 16 was prepared from the Bt-1 isomer of Compound 5 using a reaction procedure similar to that of Compound 9. The reaction was monitored by TLC (initially blue starting material, later purple product of lower polarity). Purified by column chromatography (in hexane/ethyl acetate—4:1), to yield Compound 16. $^1$H NMR (400 MHz, CDCl$_3$) Bt-1 isomer: δ 8.31 (d, J=8.8 Hz, 2H), 8.20 (d, J=8.8 Hz, 2H), 7.71 (d, J=8.8 Hz, 2H), 7.41 (d, J=8.4 Hz, 2H), 7.14-7.33 (m, 20H), 3.48 (d, J=5.5 Hz, 2H), 1.2-1.7 (m, 14H), 1.32 (s, 18H). UV-vis spectrum: $\lambda_{max}$=546 nm (dichloromethane), Fluorometry: $\lambda_{max}$=685 nm (dichloromethane).

Intermediate B-3

Synthesis of Intermediate B-3 was performed according to the following scheme:

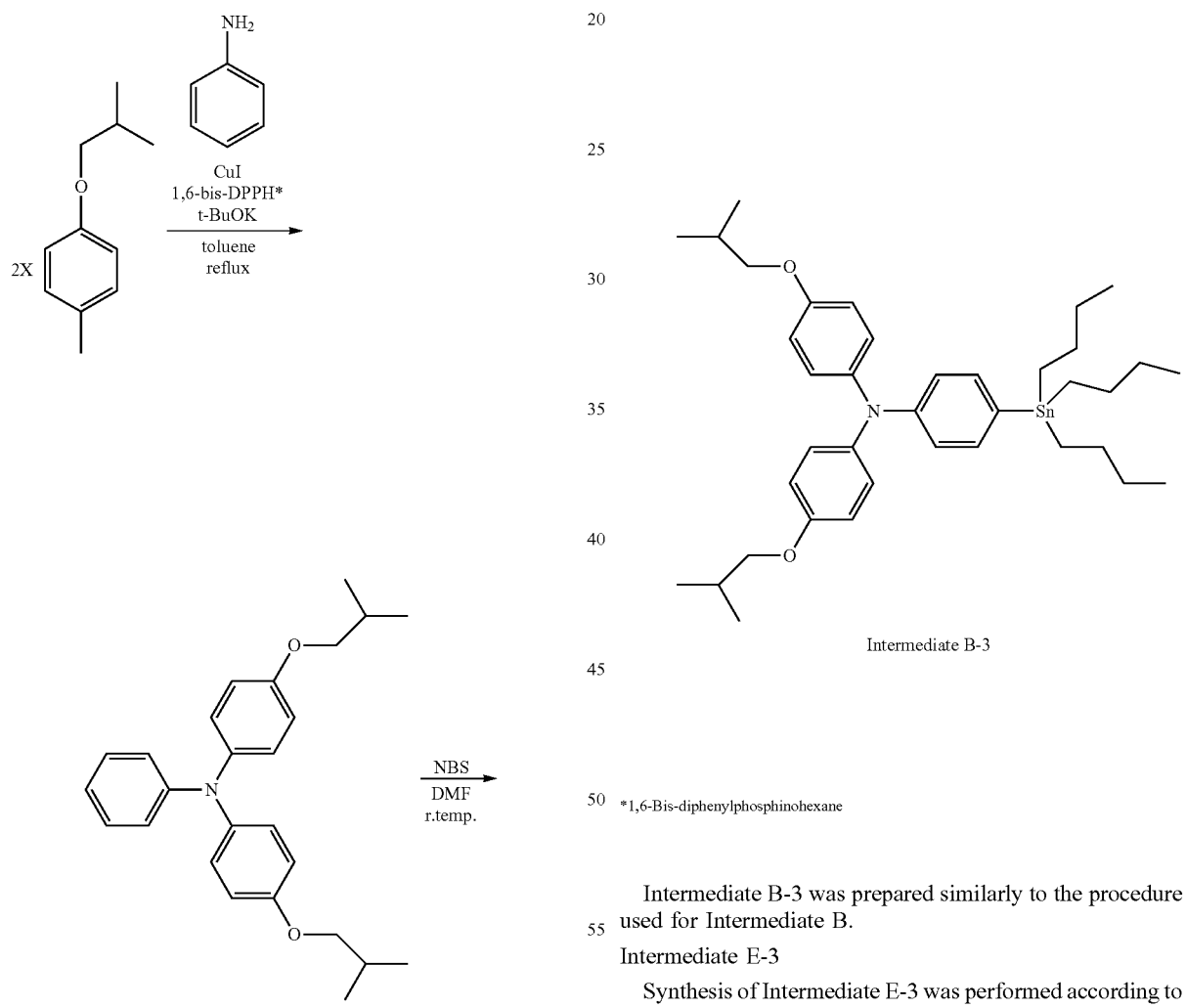

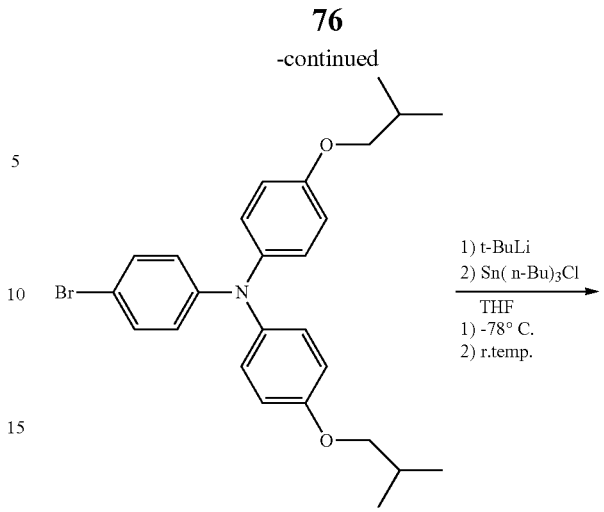

*1,6-Bis-diphenylphosphinohexane

Intermediate B-3 was prepared similarly to the procedure used for Intermediate B.

Intermediate E-3

Synthesis of Intermediate E-3 was performed according to the following scheme:

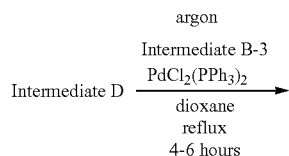

-continued
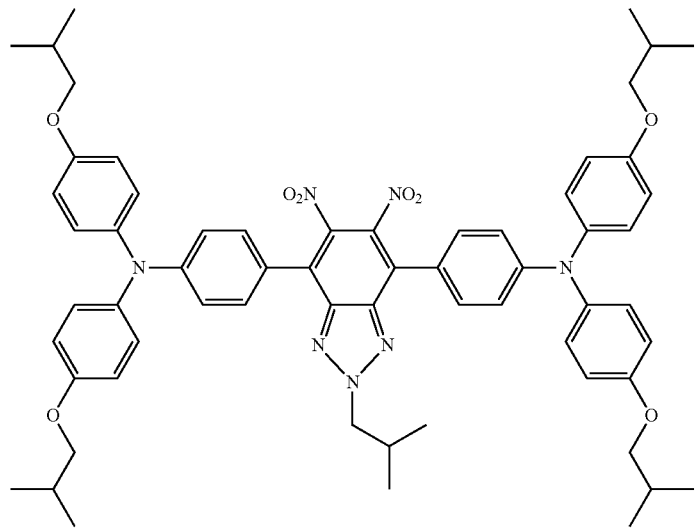
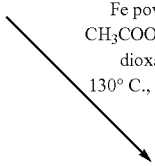
Fe powder
CH₃COOH, H₂O
dioxane
130° C., 2 hours
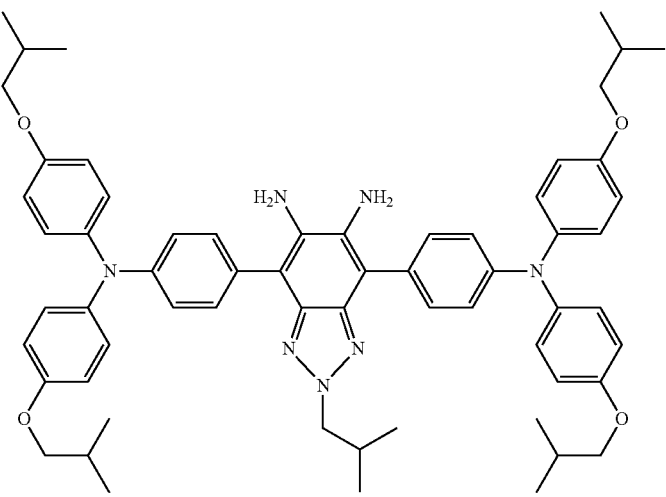
Intermediate E-3

Intermediate E-3 was prepared similarly to the procedure used for Intermediate E, except that Intermediate B-3 was used instead of Intermediate B.

Compound 17

Synthesis of Compound 17 was performed according to the following scheme:

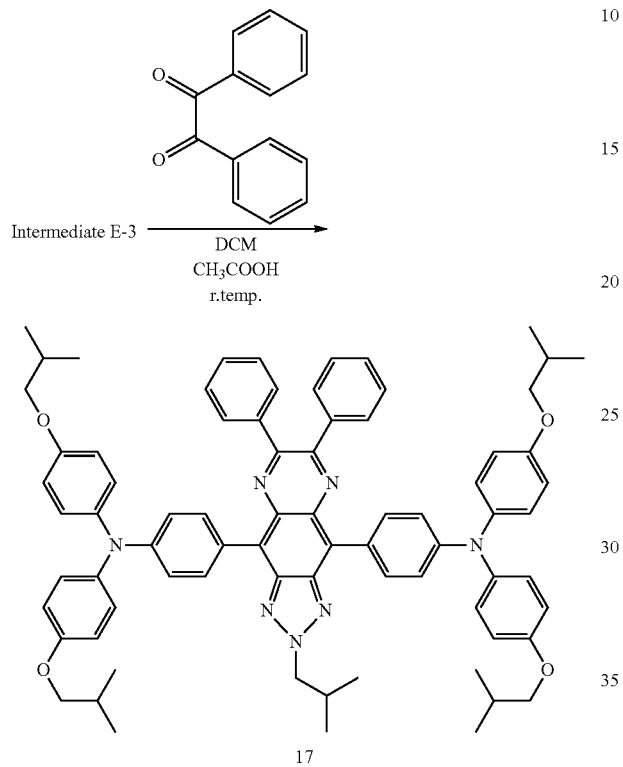

Compound 17 was prepared from Intermediate E-3 by reaction with benzil (1.2 eq) in DCM in the presence of acetic acid at room temperature for one hour. Column Chromotography (DCM/hexane—2:1) yielded Compound 17 as a red solid. $^1$H NMR (400 MHz, CDCl$_3$) δ 8.04 (d, J=8.8 Hz, 4H), 7.97 (d, J=7.3 Hz, 2H), 7.65 (m, 4H), 7.52 (t, J=7.7 Hz, 2H), 7.30 (m, 4H), 7.19 (d, J=8.8 Hz, 6H), 7.12 (d, J=8.8 Hz, 4H), 6.87 (d, J=8.8 Hz, 8H), 4.68 (d, J=7.3 Hz, 2H), 3.72 (d, J=6.2 Hz, 8H), 2.66 (m, 1H), 2.08 (m, 4H), 1.04 (2 doublets overlapped, 30H). UV-vis spectrum: $\lambda_{max}$=553 nm (dichloromethane), Fluorometry: $\lambda_{max}$=688 nm (dichloromethane).

Intermediate B-4

Synthesis of Intermediate B-4 was performed according to the following scheme:

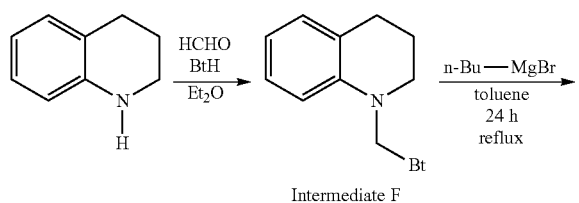

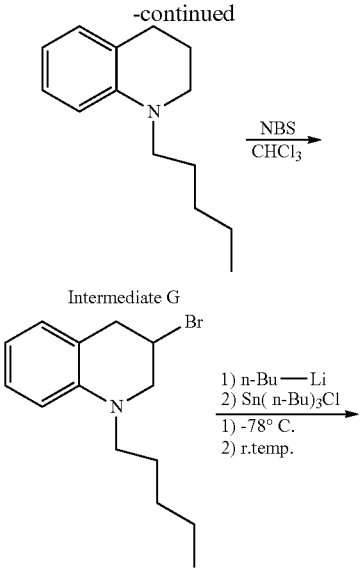

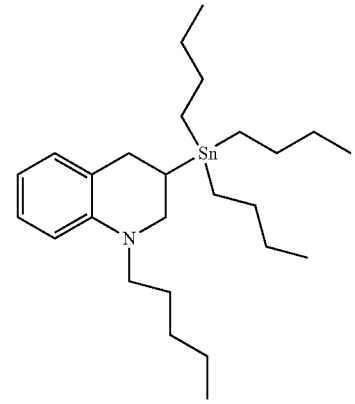

Intermediate B-4 was prepared similarly to the procedure used for Intermediate B. To a solution of tetrahydroquinoline and benzotriazole in ethanol, formaldehyde, 37% in water, was added portionwise while stirring. After one hour heavy precipitate of Intermediate F was formed, which was separated, washed with ethanol, and dried.

To a solution of Intermediate F in toluene, Grignard reagent (solution in ether) was added portionwise (1.2 eq) and the reaction mixture was left to stir at room temperature for 24 hours. The reaction was monitored by TLC (Hexane/Ethyl Acetate-4:1). Then, the reaction was worked-up with water, dried (MgSO4 anhydrous), evaporated, and column chromatography yielded Intermediate G as oil (10.8 g, 64%). $^1$H NMR (400 MHz, CDCl$_3$): δ 7.03 (t, J=7.4 Hz, 1H), 6.92 (d, J=7.0 Hz, 1H), 6.50-6.57 (m, 2H), 3.25 (t, J=5.5 Hz, 2H), 3.21 (t, J=7.7 Hz, 2H), 2.74 (t, J=6.2 Hz, 2H), 1.93 (m, 2H), 1.56 (m, 2H), 1.33 (m, 4H), 0.90 (t, J=7.0 Hz, 3H).

Intermediate G was brominated with NBS (1 eq) at room temperature in chloroform for one hour. For work-up, hexane was added, and the solid was disposed, filtered, and then the filtrate was washed with water, and dried to give Intermediate H as an oil, (yield 72%). $^1$H NMR (400 MHz, CDCl$_3$): δ 7.08 (dd, J=8.8 and 2.6 Hz, 1H), 7.01 (d, J=2.6 Hz, 1H), 6.39 (d, J=8.8 Hz, 1H), 3.24 (t, J=5.5 Hz, 2H), 3.18 (t, J=7.7 Hz, 2H), 2.70 (t, J=6.4 Hz, 2H), 1.90 (m, 2H), 1.54 (m, 2H), 1.30 (m, 4H), 0.90 (t, J=7.3 Hz, 3H).

Intermediate H was lithiated with n-BuLi (1.1 eq) and reacted with tributyltin chloride (1.15 eq) at −78 C and later left overnight at room temperature. The mixture was extracted with ether, washed with water and dried to obtain crude product which was used directly for the next step. Intermediate B-4 was obtained as a yellowish oil. Yield approximately 100% but 80% pure by LCMS. $^1$H NMR (400 MHz, CDCl$_3$): 7.11 (d, J=7.7 Hz, 1H), 6.98 (s, 1H), 6.54 (d, J=6.1 Hz, 1H), 3.25 (t, J=5.9 Hz, 2H), 3.20 (t, J=7.7 Hz, 2H), 2.97 (t, J=6.2 Hz, 2H), 1.93 (m, 2H), 1.54 (m, 8H), 1.30 (m, 10H), 0.90 (t, J=7.3 Hz, 3H), 0.88 (t, J=7.3 Hz, 9H).

Intermediate C-4

Synthesis of Intermediate C-4 was performed according to the following scheme:

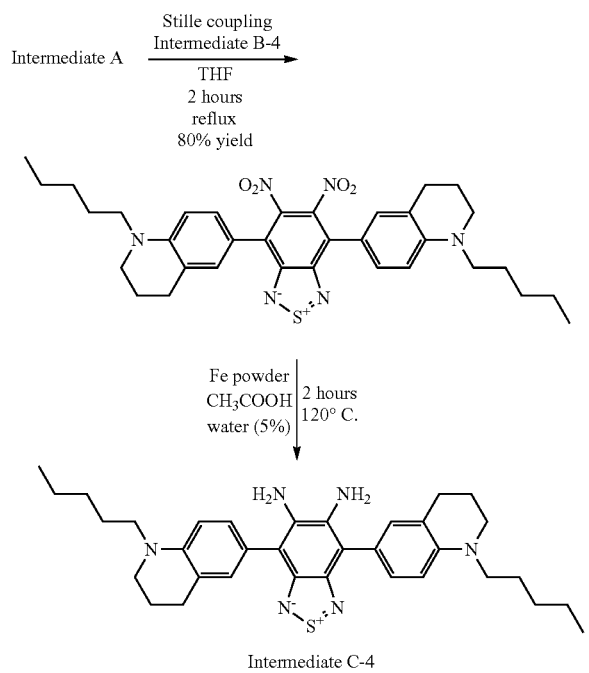

Intermediate C-4

Intermediate C-4 was prepared similarly to the procedure used for Intermediate C, except that Intermediate B-4 was used instead of Intermediate B.

Compound 18

Synthesis of Compound 18 was performed according to the following scheme:

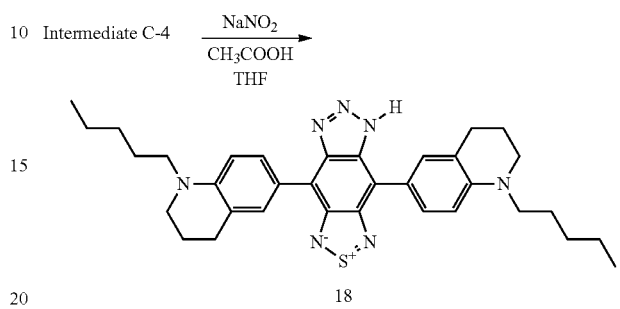

18

Compound 18 was prepared according to the procedure for Compound 4 except that Intermediate C-4 was used instead of Intermediate C. Column chromatography with DCM followed by 5% ethyl acetate in DCM yielded pure Compound 18 as a dark blue solid. $^1$H NMR (400 MHz, CDCl$_3$): δ 8.13-8.30 (2bs, 2H), 7.51-7.69 (2bs, 2H), 6.76 (d, J=8.1 Hz, 2H), 3.39 (m, 4H), 3.32 (m, 4H), 2.90 (bs, 4H), 2.01 (m, 4H), 1.58-1.70 (m, 4H), 1.30-1.40 (m, 8H), 1.13 (m, 4H), 0.93 (t, J=7.0 Hz, 6H). UV-vis spectrum: $\lambda_{max}$=614 nm (dichloromethane), Fluorometry: $\lambda_{max}$=777 nm (dichloromethane).

Compound 19

Synthesis of Compound 19 was performed according to the following scheme:

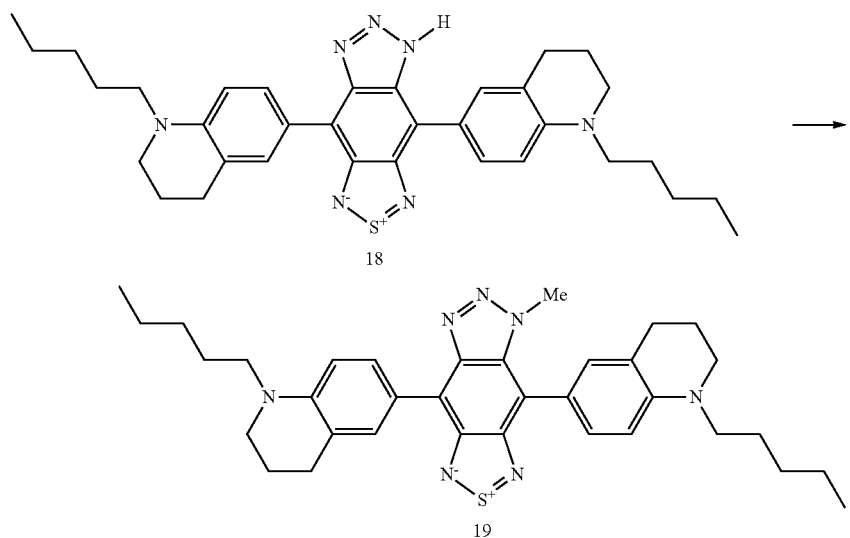

Compound 19 was obtained from Compound 18 by alkylation with methyl methanesulfonate in the presence of potassium carbonate in DMF at 65° C. for 3 hours. Work-up with water, extraction with ethyl acetate, drying, and evaporation of the solvent gave crude product which was purified by column chromatography (silica gel-hexane/ethyl acetate-4:1) to give dark blue oily product, Compound 19. UV-vis spectrum: $\lambda_{max}$=633 nm (dichloromethane), Fluorometry: $\lambda_{max}$=769 nm (dichloromethane).

Compound 20

Synthesis of Compound 20 was performed according to the following scheme:

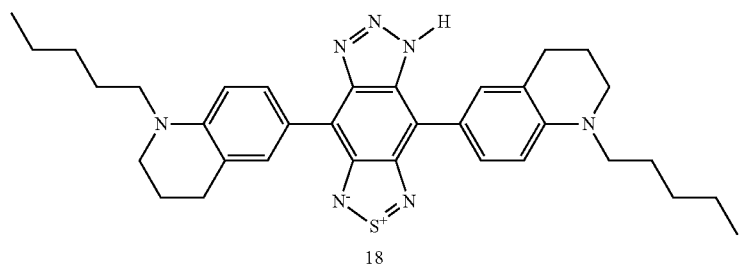

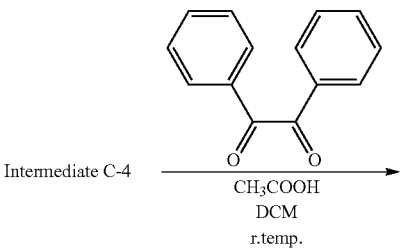

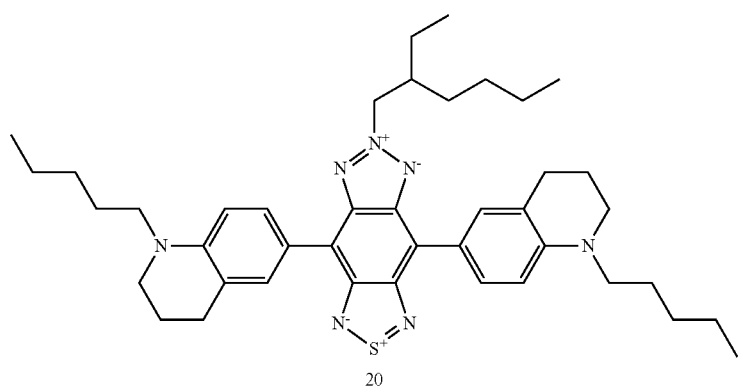

Compound 20 was obtained from Compound 18 by alkylation with 2-ethylhexyl-4-methylbenzenesulfonate in DMF, at 80° C. in DMF in the presence of potassium carbonate. Work-up followed the same procedure as that of Compound 5, to yield Compound 20. UV-vis spectrum: $\lambda_{max}$=667 nm (dichloromethane), Fluorometry: $\lambda_{max}$=812 nm (dichloromethane).

Compound 21

Synthesis of Compound 21 was performed according to the following scheme:

-continued

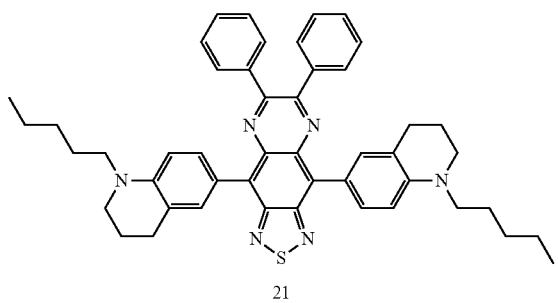

Compound 21 was prepared from Intermediate C-4 by reaction with benzyl (1.2 eq) in DCM in the presence of acetic acid at room temperature for one hour. Column chromatography (DCM/hexane-2:1) afforded pure Compound 21 as a greenish-blue solid. $^1$H NMR (400 MHz, CDCl$_3$): δ 7.84 (d, J=8.4 Hz, 2H), 7.77 (s, 2H), 7.67 (d, J=6.6 Hz, 4H), 7.25 (m, 6H), 6.80 (d, J=8.6 Hz, 2H), 3.39 (m, 8H), 2.96 (t, J=6.0 Hz, 4H), 2.06 (m, 4H), 1.69 (m, 4H), 1.39 (m, 8H), 0.94 (t, J=6.8 Hz, 6H). UV-vis spectrum: $\lambda_{max}$=686 nm (dichloromethane), Fluorometry: $\lambda_{max}$=817 nm (dichloromethane).

Compound 22

Synthesis of Compound 22 was performed according to the following scheme:

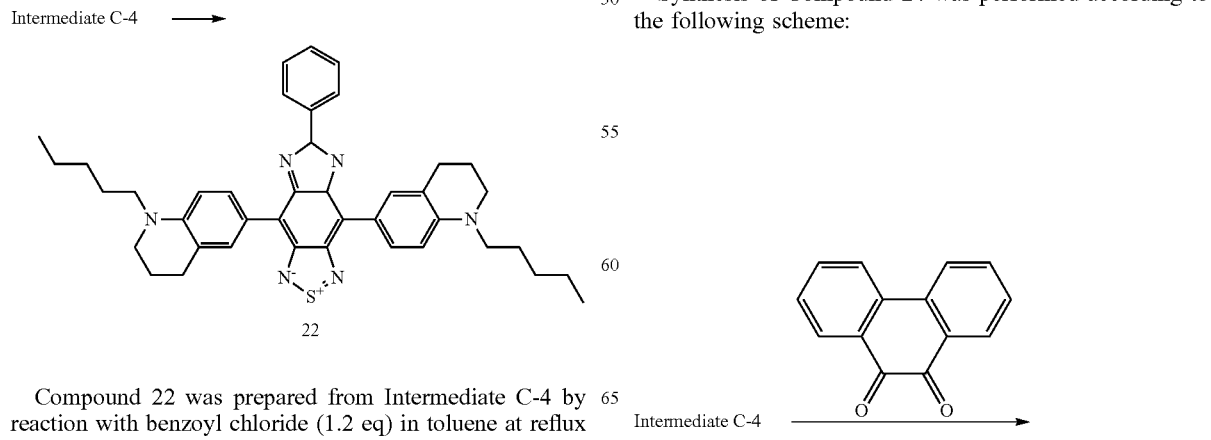

Compound 22 was prepared from Intermediate C-4 by reaction with benzoyl chloride (1.2 eq) in toluene at reflux for two hours. Work-up and column chromatography (DCM only, top spot) produced pure purple color Compound 22. $^1$H NMR (400 MHz, CDCl$_3$): δ 9.42 (bs, 2H), 8.11 (m, 4H), 8.03 (bs, 2H), 7.51 (m, 6H), 6.77 (bs, 2H). UV-vis spectrum: $\lambda_{max}$=541 nm (dichloromethane), Fluorometry: $\lambda_{max}$=687 nm (dichloromethane).

Compound 23

Synthesis of Compound 23 was performed according to the following scheme:

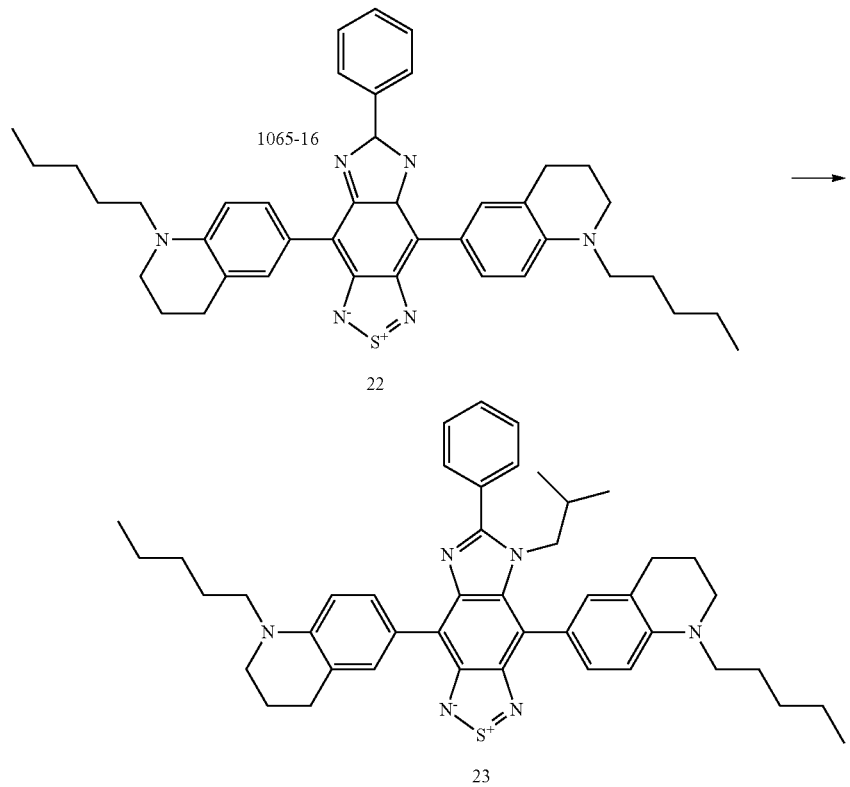

Compound 23 was obtained by alkylation of Compound 22 under standard conditions. The product was characterized only by TLC and LCMS, due to the small amount obtained. UV-vis spectrum: $\lambda_{max}$=686 nm (dichloromethane), Fluorometry: $\lambda_{max}$=817 nm (dichloromethane).

Compound 24

Synthesis of Compound 24 was performed according to the following scheme:

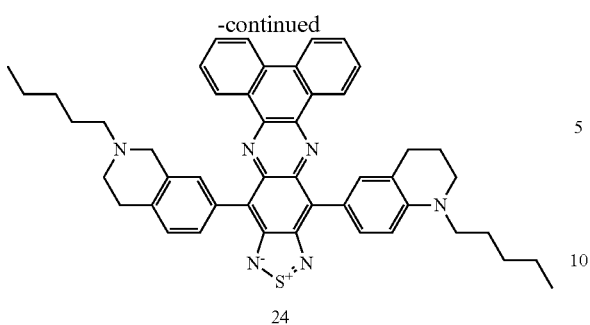

24

Compound 24 was obtained from Intermediate C-4 by reaction with phenanthrenequinone (1.2 eq) in DCM in the presence of acetic acid (20% by volume). The reaction mixture was left at room temperature overnight. DCM was removed by evaporation and the residue triturated with water. The solid obtained was separated, washed with methanol, dried, and purified by column chromatography (DCM/hexane, 1:1) to give a dark blue product, Compound 24. $^1$H NMR (400 MHz, CDCl$_3$): δ 9.11 (d, J=7.7 Hz, 2H), 8.43 (d, J=8.1 Hz, 2H), 7.97 (d, J=8.4 Hz, 2H), 7.90 (s, 2H), 7.23 (t, J=7.0 Hz, 2H), 7.62 (t, J=7.7 Hz, 2H), 6.88 (d, J=8.8 Hz, 2H), 3.45 (m, 8H), 2.99 (t, J=6.0 Hz, 4H), 2.10 (m, 4H), 1.74 (m, 4H), 1.42 (m, 8H), 0.97 (t, J=6.6 Hz, 6H). UV-vis spectrum: $\lambda_{max}$=767 nm (dichloromethane), Fluorometry: $\lambda_{max}$=830 nm (dichloromethane).

Compound 25

Synthesis of Compound 25 was performed according to the following scheme:

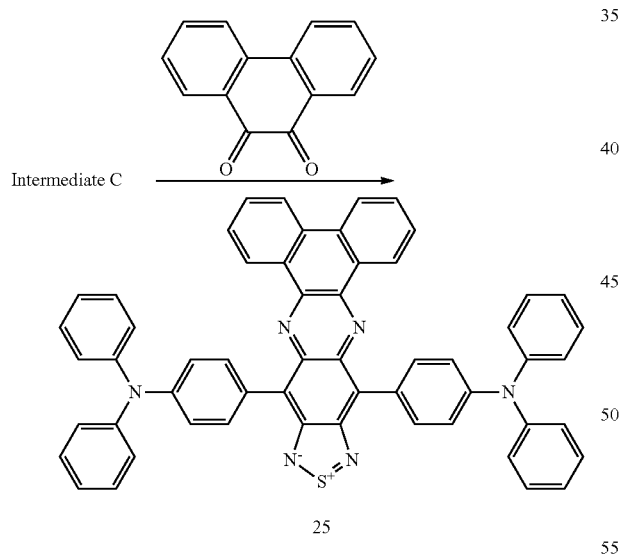

25

Compound 25 was prepared from Intermediate C by reaction with phenanthrenequinone, similar to the procedure described for Compound 24. Column chromatography in DCM/hexane (1:1) gave pure product of Compound 25. 1H NMR (400 MHz, CDCl$_3$): δ 9.03 (d, J=8.1 Hz, 2H), 8.44 (d, J=8.1 Hz, 2H), 8.07 (d, J=8.8 Hz, 4H), 7.76 (t, J=7.0 Hz, 2H), 7.64 (t, J=7.4 Hz, 2H), 7.28-740 (m, 20H), 7.06-7.14 (m, 4H), 3.45 (m, 8H), 2.99 (t, J=6.0 Hz, 4H), 2.10 (m, 4H), 1.74 (m, 4H), 1.42 (m, 8H), 0.97 (t, J=6.6 Hz, 6H). (UV-vis spectrum: $\lambda_{max}$=665 nm (dichloromethane), Fluorometry: $\lambda_{max}$=810 nm (dichloromethane).

Compound 26

Synthesis of Compound 26 was performed according to the following scheme:

Intermediate E 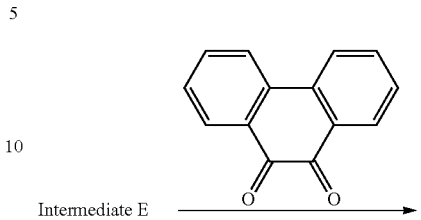

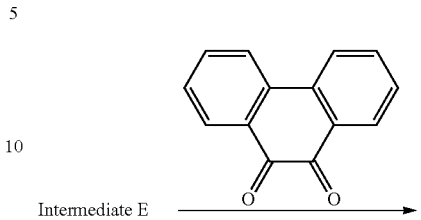

26

Compound 26 was prepared from Intermediate E using the same procedure as described for Compound 25. $^1$H NMR (400 MHz, CDCl$_3$): δ 9.09 (d, J=7.7 Hz, 2H), 8.46 (d, J=8.1 Hz, 2H), 8.22 (d, J=8.8 Hz, 4H), 7.74 (t, J=7.0 Hz, 2H), 7.64 (t, J=7.4 Hz, 2H), 7.33-7.38 (m, 20H), 7.07-7.12 (m, 4H), 4.76 (d, J=7.3 Hz, 2H), 2.71 (m, 1H), 1.06 (d, J=6.6 Hz, 6H). UV-vis spectrum: $\lambda_{max}$=589 nm (dichloromethane), Fluorometry: $\lambda_{max}$=716 nm (dichloromethane).

Compound 27

Synthesis of Compound 27 was performed according to the following scheme:

Intermediate E 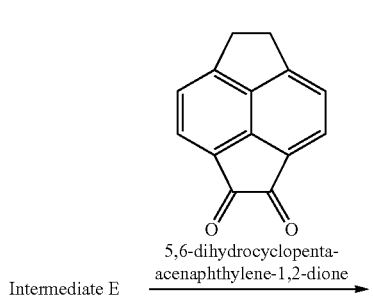

5,6-dihydrocyclopenta-acenaphthylene-1,2-dione

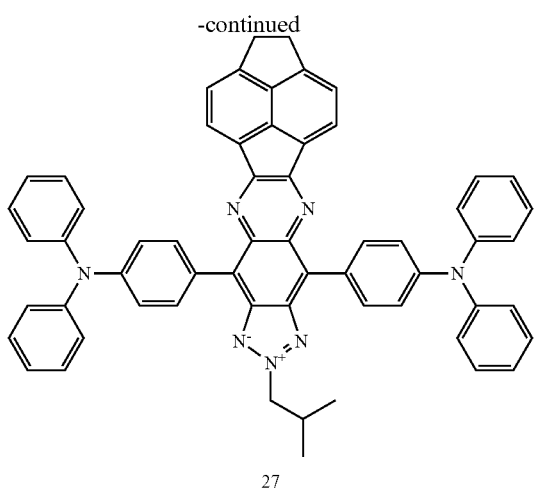

27

Compound 27 was prepared from Intermediate E using the same procedure as described for Compound 24, except 6,6-dihydrocyclopentaacenaphthylene-1,2-dione is used as the reagent. $^1$H NMR (400 MHz, CDCl$_3$): δ 8.23 (d, J=7.0 Hz, 2H), 8.13 (d, J=8.8 Hz, 4H), 7.59 (d, J=7.3 Hz, 2H), 7.30-7.35 (m, 20H), 7.06-7.10 (m, 4H), 4.70 (d, J=7.3 Hz, 2H), 3.62 (s, 4H), 2.67 (m, 1H), 1.04 (d, J=7.0, 6H). UV-vis spectrum: $\lambda_{max}$=517 nm (dichloromethane), Fluorometry: $\lambda_{max}$=640 nm (dichloromethane).

Compound 28

Synthesis of Compound 28 was performed according to the following scheme:

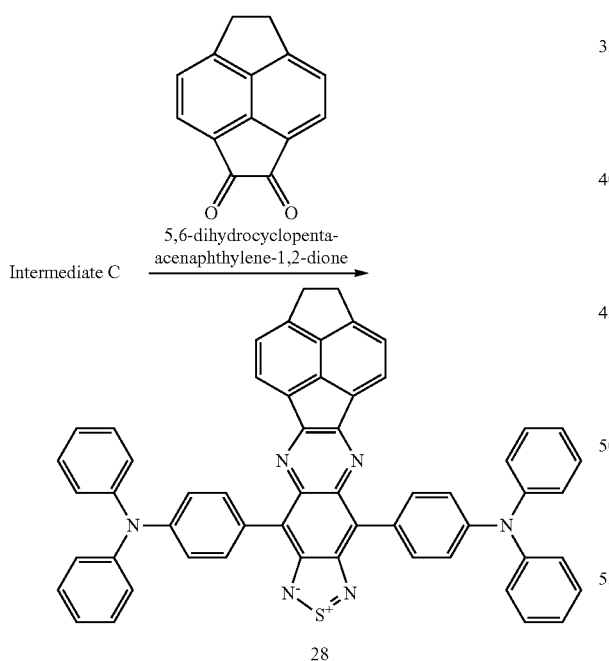

28

Compound 28 was prepared from Intermediate C using the same procedure as described for Compound 24, except 6,6-dihydrocyclopentaacenaphthylene-1,2-dione is used as the reagent. $^1$H NMR (400 MHz, CDCl$_3$): δ 8.25 (d, J=7.0 Hz, 2H), 7.96 (d, J=8.4 Hz, 4H), 7.62 (d, 7.3 Hz, 2H), 7.30-7.40 (m, 20H), 7.06-7.10 (m, 4H), 3.63 (s, 4H). UV-vis spectrum: $\lambda_{max}$=592 nm (dichloromethane), Fluorometry: $\lambda_{max}$=736 nm (dichloromethane).

Compound 29

Synthesis of Compound 29 was performed according to the following scheme:

Intermediate E ⟶

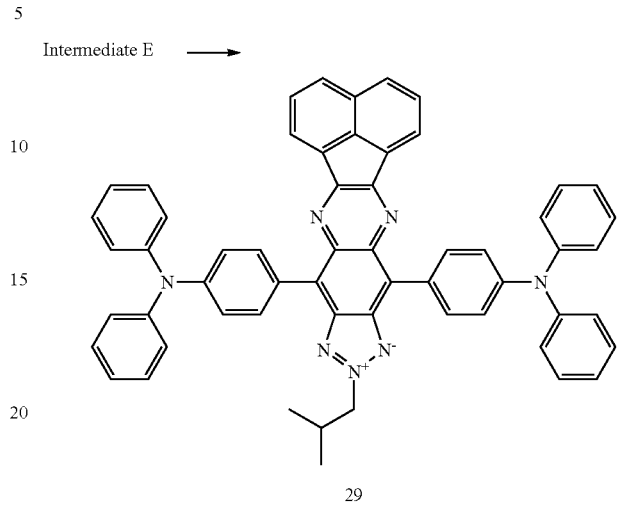

29

Compound 29 was prepared from Intermediate E and acenaphthenequinone in a mixture of acetic acid and DCM (1:1) which was stirred at room temperature for one hour. Column chromatography in hexane/ethyl acetate (4:1) provided Compound 29. $^1$H NMR (400 MHz, CDCl$_3$): δ 8.29 (d, J=7.0 Hz, 2H), 8.11 (d, J=8.4 Hz, 4H), 8.06 (d, J=8.4 Hz, 2H), 7.80 (t, J=8.0 Hz, 2H), 7.30-7.35 (m, 20H), 7.08 (t, J=6.5 Hz, 4H).), 4.70 (d, J=7.0 Hz, 2H), 2.66 (m, 1H), 1.04 (d, J=7.0 Hz, 6H). UV-vis spectrum: $\lambda_{max}$=525 nm (dichloromethane), Fluorometry: $\lambda_{max}$=660 nm (dichloromethane).

Compound 30

Synthesis of Compound 30 was performed according to the following scheme:

Intermediate C ⟶

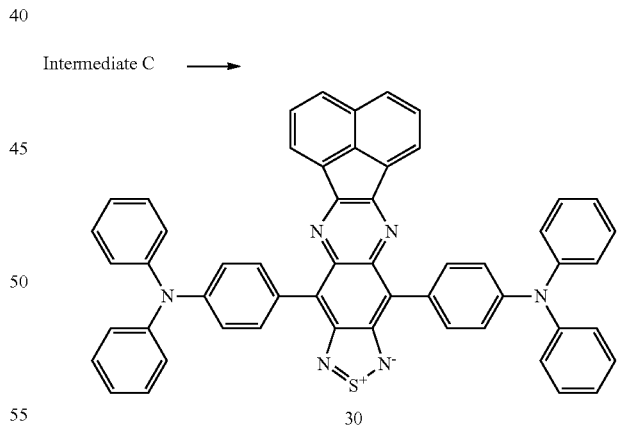

30

Compound 30 was prepared from Intermediate C and acenaphthenequinone in a mixture of acetic acid and DCM (1:1) which was stirred at room temperature for one hour. Column chromatography in hexane/ethyl acetate (4:1) provided Compound 30. The reaction was monitored by TLC. $^1$H NMR (400 MHz, CDCl$_3$): δ 8.31 (d, J=7.0 Hz, 2H), 8.11 (d, J=8.4 Hz, 2H), 7.96 (d, J=8.4 Hz, 4H), 7.82 (t, J=8.0 Hz, 2H), 7.30-7.35 (m, 20H), 7.10 (m, 4H). UV-vis spectrum: $\lambda_{max}$=598 nm (dichloromethane), Fluorometry: $\lambda_{max}$=756 nm (dichloromethane).

Intermediate B-5
Synthesis of Intermediate B-5 was performed according to the following scheme:
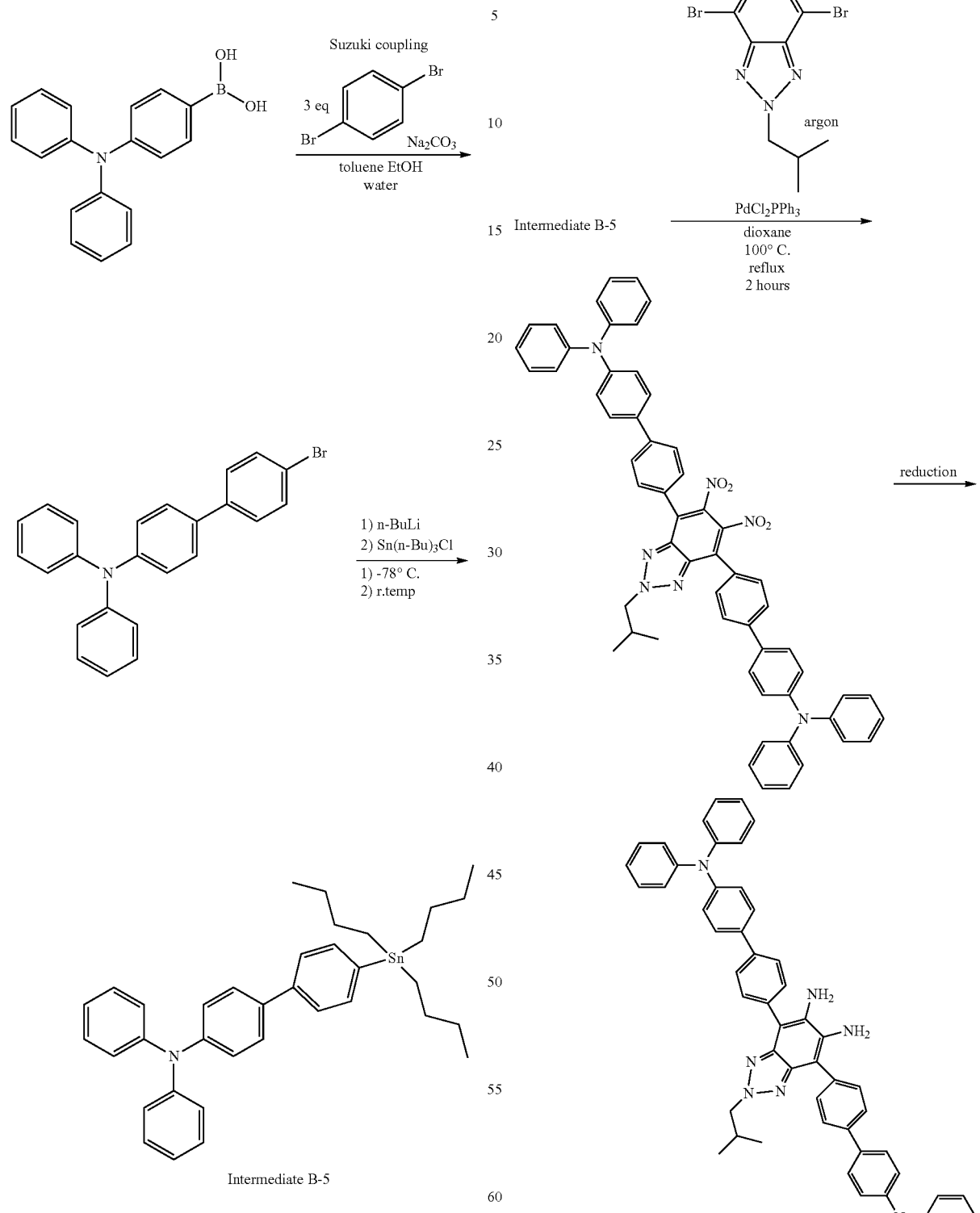
Intermediate B-5 was prepared similarly to the procedure used for Intermediate B.
Intermediate E-5
Synthesis of Intermediate E-5 was performed according to the following scheme:

Intermediate E-5 was prepared similarly to the procedure used for Intermediate E.

Compound 31

Synthesis of Compound 31 was performed according to the following scheme:

Intermediate E-5 ⟶

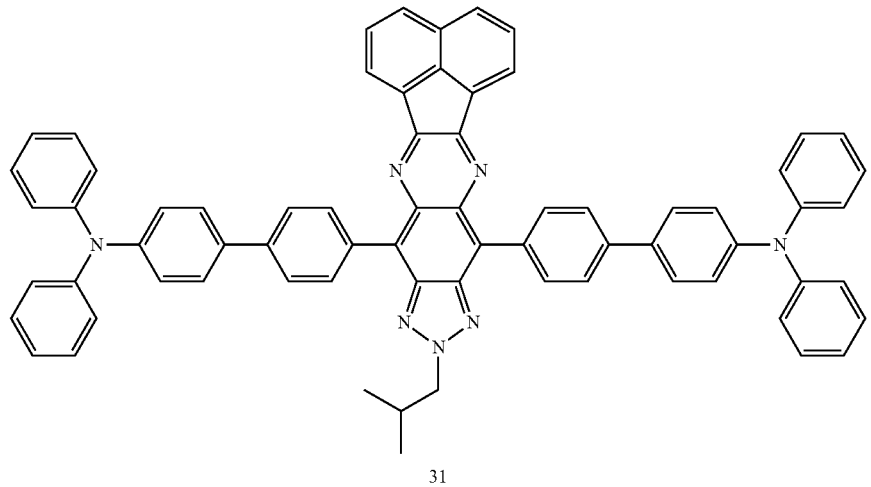

31

Compound 31 was prepared from Intermediate E-5 and acenaphthenequinone in a mixture of acetic acid and DCM (1:1) which was stirred at room temperature for one hour. Column chromatography in hexane/ethyl acetate (4:1) provided Compound 31. $^1$H NMR (400 MHz, CDCl$_3$): δ 8.31 (d, J=7.0 Hz, 2H), 8.23 (d, J=8.4 Hz, 4H), 8.07 (d, J=8.0 Hz, 2H), 7.86 (d, J=8.4 Hz, 4H), 7.80 (t, J=8.0 Hz, 2H), 7.67 (t, J=8.8 Hz, 4H), 7.30 (m, 8H), 7.20 (m, 12H), 7.06 (t, J=7.3 Hz, 4H). UV-vis spectrum: $\lambda_{max}$=471 nm (dichloromethane), Fluorometry: $\lambda_{max}$=623 nm (dichloromethane).

Compound 32

Synthesis of Compound 32 was performed according to the following scheme:

Intermediate E-5 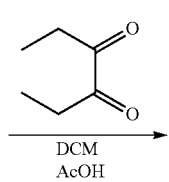 $\xrightarrow{\text{DCM}}_{\text{AcOH}}$

-continued

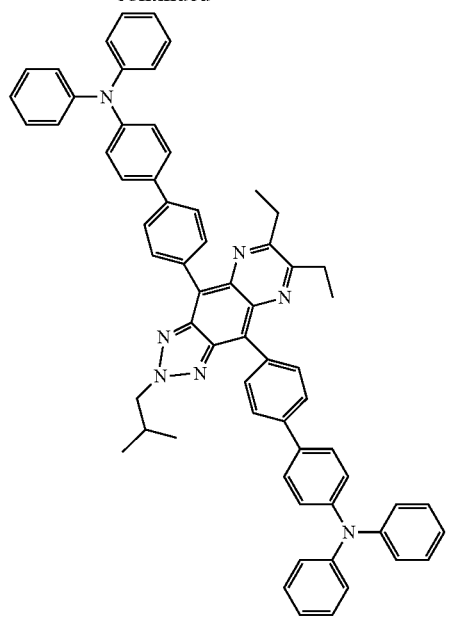

32

Compound 32 was prepared by reaction of Intermediate E-5 with 3,4-hexanedione for one hour in DCM:AcOH (1:1) at room temperature. $^1$H NMR (400 MHz, CDCl$_3$): δ 8.18 (d, J=8.4 Hz, 4H), 87.76 (d, J=7.0 Hz, 4H), 7.60 (d, J=7.7 Hz, 4H), 7.25 (m, 6H), 7.16 (m, 14H), 4.03 (m, 4H). UV-vis spectrum: $\lambda_{max}$=446 nm (dichloromethane), Fluorometry: $\lambda_{max}$=545 nm (dichloromethane).

Compound 33

Synthesis of Compound 33 was performed according to the following scheme:

Intermediate E-5 ⟶

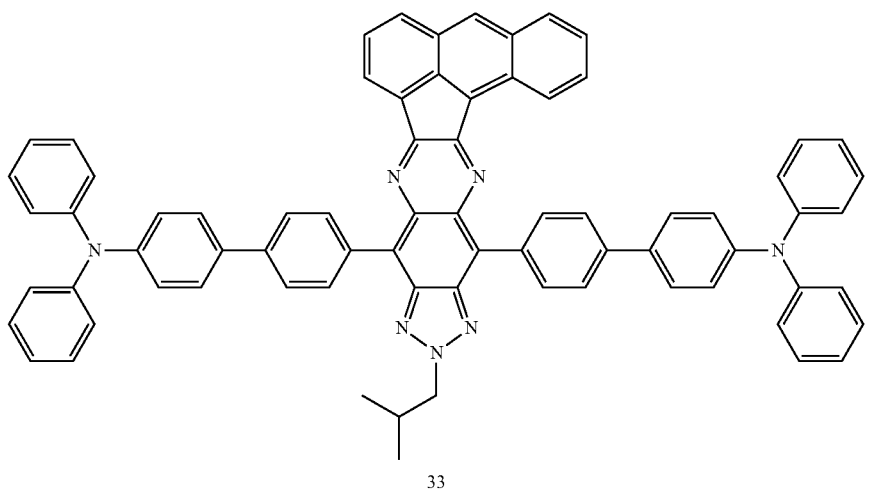

33

Compound 33 was prepared by reaction of Intermediate E-5 with aceanthrenequinone for one hour in DCM:AcOH (1:1) at room temperature. $^1$H NMR (400 MHz, CDCl$_3$): δ 8.66 (s, 1H), 8.38 (d, J=8.3 Hz, 2H), 8.34 (d, J=6.6 Hz, 1H), 8.26 (d, J=8.0 Hz, 2H), 8.20 (d, J=8.0 Hz, 2H), 7.92 (d, J=8.4 Hz, 2H), 7.87 (d, J=8.4 Hz, 2H), 7.28-7.30 (m, 8H), 7.18-7.22 (m, 20H), 7.05-7.08 (m, 4H). UV-vis spectrum: $\lambda_{max}$=476 nm (dichloromethane), Fluorometry: $\lambda_{max}$=623 nm (dichloromethane).

Compound 34

Synthesis of Compound 34 was performed according to the following scheme:

Intermediate E ⟶

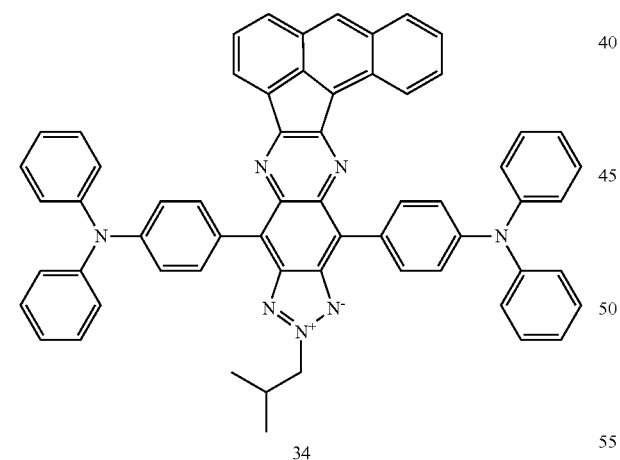

34

Compound 34 was prepared by reaction of Intermediate E with aceanthrenequinone for one hour in DCM:AcOH (1:1) at room temperature. $^1$H NMR (400 MHz, CDCl$_3$): δ 9.45 (m, 1H), 8.65 (s, 1H), 8.32 (d, J=6.6 Hz, 1H), 8.14-8.25 (3 doublets, 6H), 7.62 (m, 2H), 7.28-7.42 (m, 20H), 7.08-7.13 (m, 4H). UV-vis spectrum: $\lambda_{max}$=524 nm (dichloromethane), Fluorometry: $\lambda_{max}$=658 nm (dichloromethane).

Compounds 35 and 36

Synthesis of Compound 35 and Compound 36 was performed according to the following scheme:

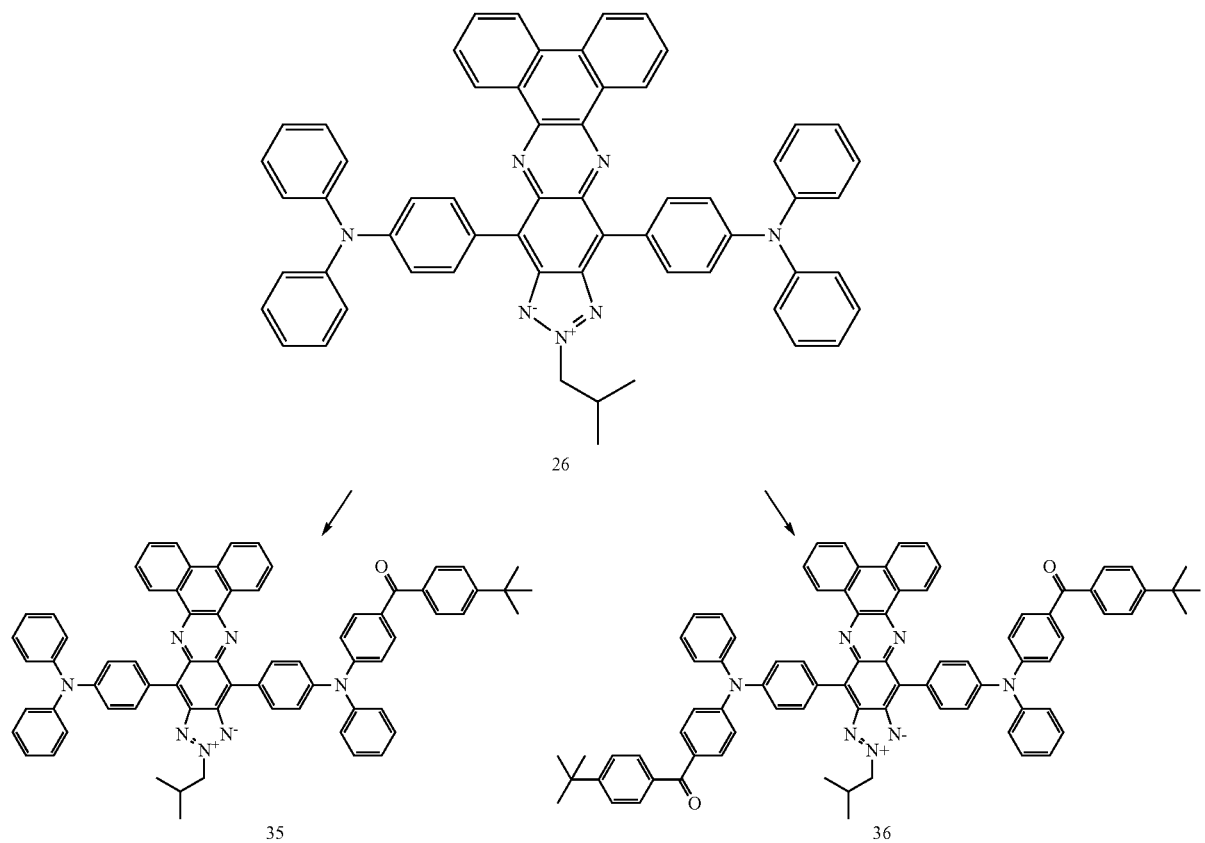

Compound 35 and Compound 36 were prepared from Compound 26 by reaction with 4-tert-butylbenzoylchloride (8 eq) by refluxing overnight in DCM in the presence of anhydrous zinc chloride (8 eq).

$^1$H NMR for Compound 35 (first isomer isolated, eluted with DCM, monosubstituted (400 MHz, CDCl$_3$): δ 9.09 (t, J=8.4 Hz, 2H), 8.47 (d, J=8.1 Hz, 2H), 8.28 (d, J=8.4 Hz, 2H), 8.23 (d, J=8.4 Hz, 2H), 7.65-7.81 (m, 10H), 7.49 (t, J=8.4 Hz, 6H), 7.28-7.42 (m, 12H), 7.08-7.13 (m, 3H). UV-vis spectrum: λ$_{max}$=581 nm (dichloromethane), Fluorometry: λ$_{max}$=669 nm (dichloromethane).

$^1$H NMR for Compound 36 (second isomer isolated, eluted with DCM plus 2% MeOH, bis-substituted) (400 MHz, CDCl$_3$): δ 9.08 (d, J=8.0 Hz, 2H), 8.48 (d, J=8.1 Hz, 2H), 8.28 (d, J=8.4 Hz, 4H), 7.80 (d, J=8.8 Hz, 4H), 7.77 (d, J=8.0 Hz, 4H), 7.66 (t, J=7.3 Hz, 2H), 7.49 (d, J=8.1 Hz, 4H), 7.48 (d, J=8.0 Hz, 4H), 7.41 (m, 8H), 7.29 (d, J=8.8 Hz, 4H), 7.22 (m, 2H). UV-vis spectrum: λ$_{max}$=570 nm (dichloromethane), Fluorometry: λ$_{max}$=693 nm (dichloromethane).

Compounds 37 and 38

Synthesis of Compound 37 and Compound 38 was performed according to the following scheme:

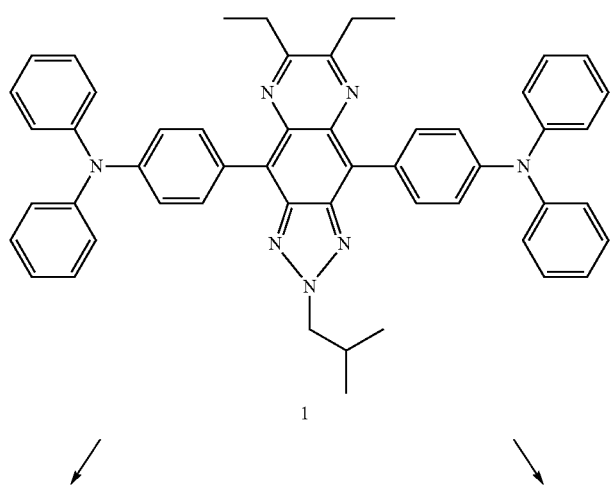

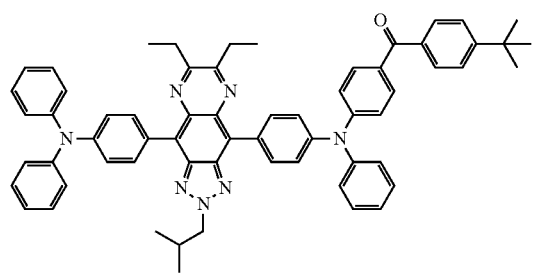

37

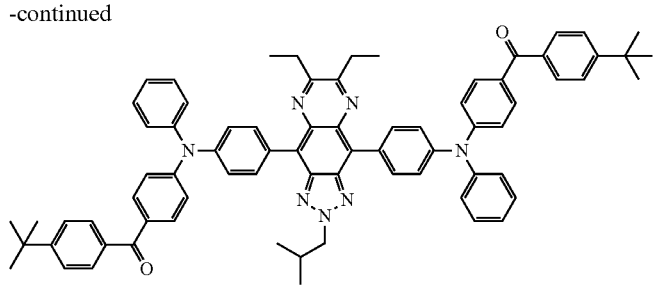

38

Compound 37 and Compound 38 were prepared from Compound 1 by reaction with 4-tert-butylbenzoylchloride (8 eq) by refluxing overnight in DCM in the presence of anhydrous zinc chloride (8 eq). Two isomers were isolated.

$^1$H NMR of Compound 37 (this was the first one isolated, less polar) $^1$H NMR (400 MHz, CDCl$_3$): δ 8.13 (d, J=8.4 Hz, 2H), 8.07 (d, J=8.0 Hz, 2H), 7.75 (d, J=8.4 Hz, 4H), 7.48 (d, J=8.0 Hz, 2H), 7.18-7.37 (m, 19H), 7.05 (m, 2H), 4.68 (d, J=7.5 Hz, 2H), 3.01 (q, J=7.3 Hz, 4H), 2.65 (m, 1H), 1.39 (t, J=7.3 Hz, 6H), 1.35 (s, 9H), 1.02 (d, J=6.6 Hz, 6H). UV-vis spectrum: λ$_{max}$=475 nm (dichloromethane), Fluorometry: λ$_{max}$=614 nm (dichloromethane).

Compound 38 was the second isomer (bis-substituted) isolated, more polar. $^1$H NMR (400 MHz, CDCl$_3$): δ 8.13 (d, J=8.4 Hz, 2H), 7.75 (d, J=8.8 Hz, 4H), 7.48 (d, J=8.4 Hz, 2H), 7.26-7.40 (m, 24H), 7.20 (d, J=8.4 Hz, 2H), 4.69 (d, J=7.3 Hz, 2H), 3.02 (q, J=7.0 Hz, 4H), 2.66 (m, 1H), 1.39 (t, 7.3 Hz, 6H), 1.36 (s, 18H), 1.03 (d, J=7.0 Hz, 6H). UV-vis spectrum: λ$_{max}$=474 nm (dichloromethane), Fluorometry: λ$_{max}$=606 nm (dichloromethane).

Compound 39

Synthesis of Compound 39 was performed according to the following scheme:

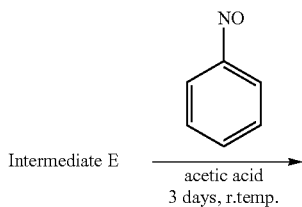

Intermediate E  →  acetic acid, 3 days, r.temp.

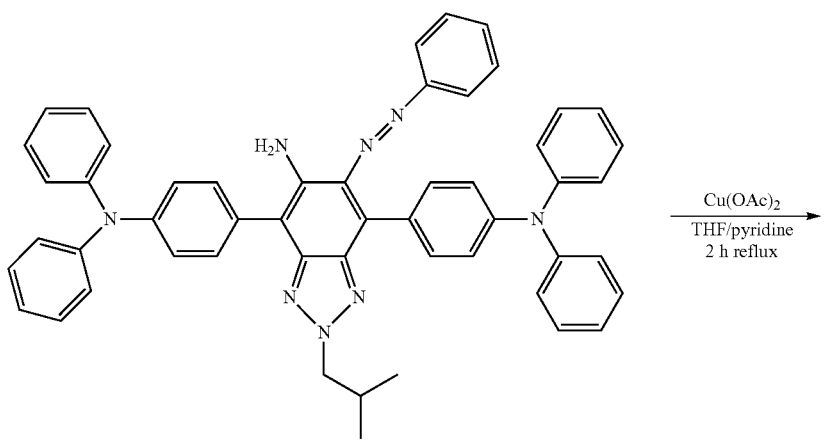

Cu(OAc)$_2$
THF/pyridine
2 h reflux

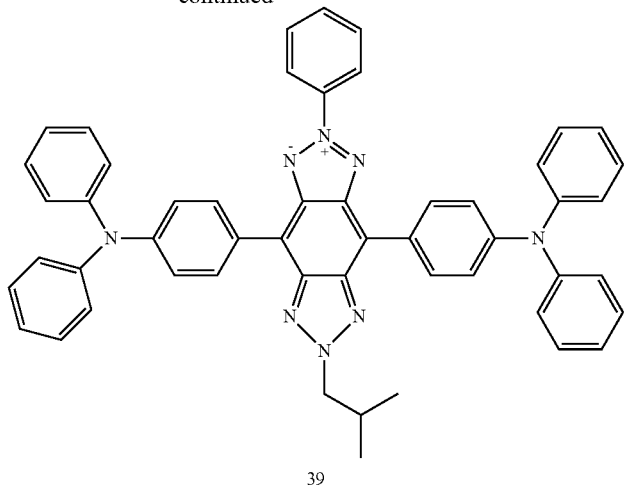

39

Compound 39 was obtained in two steps. First, Intermediate E was reacted with nitrozobenzene in acetic acid, and protected from air (nitrogen) for three days. The reaction was monitored by TLC and LCMS. After work-up, the solution was heated at reflux in a mixture of pyridine and THF (1:1) in the presence of copper (II) acetate for two hours. Work-up with water, extraction with DCM, drying, and evaporation of the solvent gave crude product as a purple solid. It was purified by column chromatography with DCM/hexane (1:1) to obtain Compound 39. $^1$H NMR (400 MHz, CDCl$_3$): δ 8.56 (d, 7.7 Hz, 2H), 7.58 (t, J=7.7 Hz, 2H), 7.48-7.52 (m, 2H), 7.00-7.40 (two broadened multiplets, 27H), 14.67 (bs, 2H), 2.70 (m, 1H), 1.06 (d, J=7.0, 6H). UV-vis spectrum: λ$_{max}$=559 nm (dichloromethane), Fluorometry: λ$_{max}$=671 nm (dichloromethane).

Compound 40

Synthesis of Compound 40 was performed according to the following scheme:

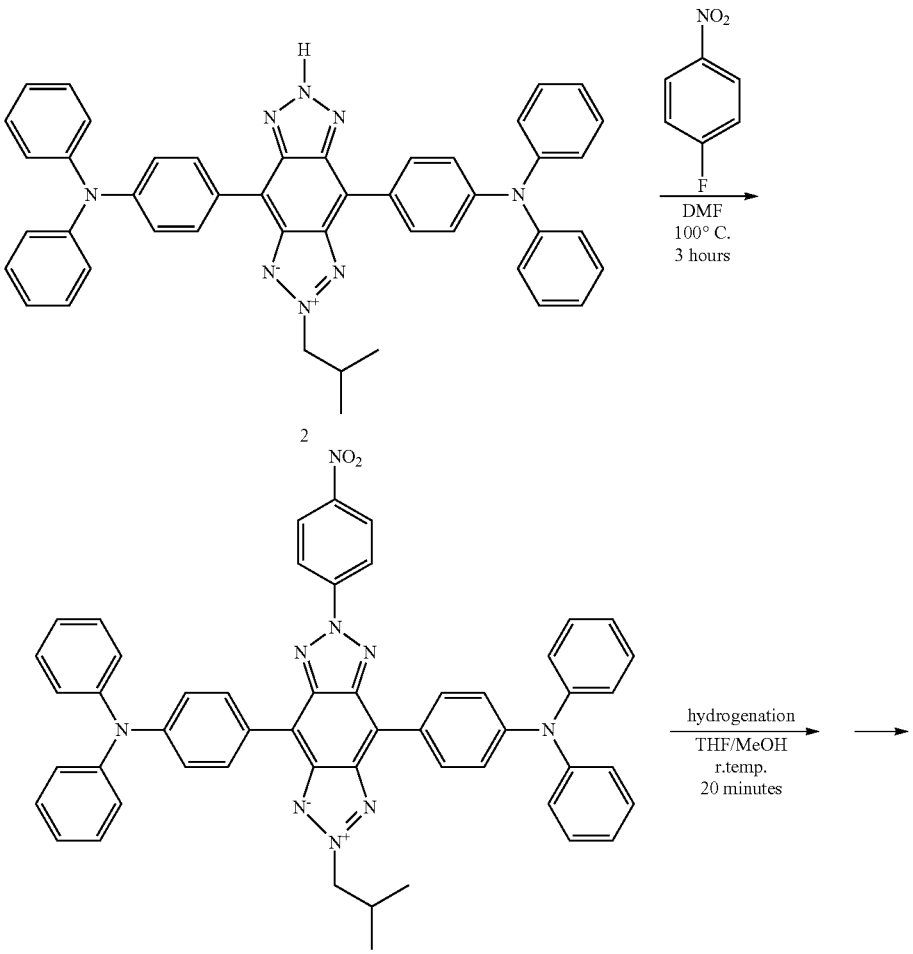

-continued

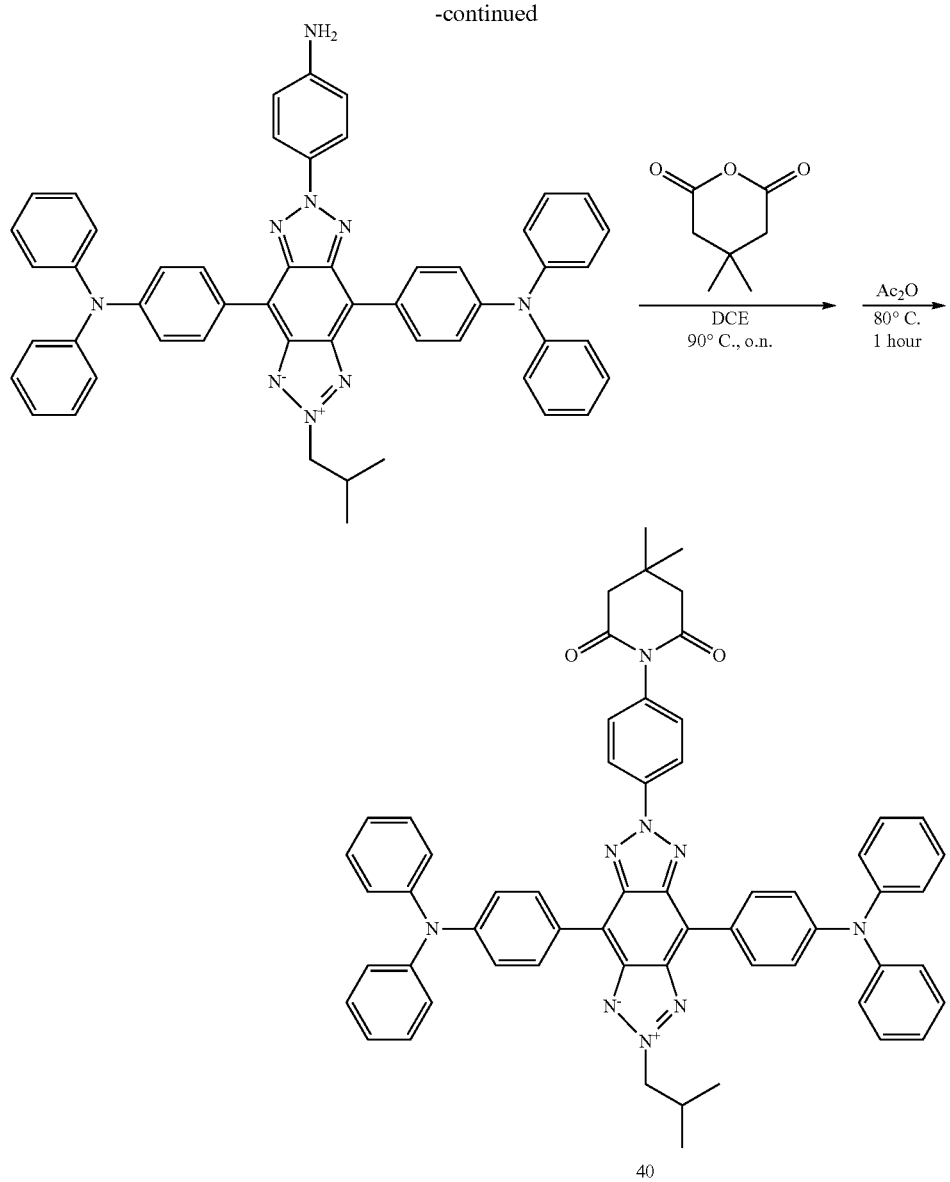

40

Compound 40 was prepared from Compound 2 in three steps. First, Compound 2 was reacted with 4-1-fluoro4-nitrobenzene to give the nitro compound as blue solid. $^1$H NMR (400 MHz, CDCl$_3$): δ 8.75 (d, 9.2 Hz, 2H), 8.68 (d, 8.8 Hz, 4H), 7.24-7.34 (m, 20H), 7.09 (t, J=7.3 Hz, 4H), 4.67 (d, J=7.3 Hz, 2H), 2.69 (m, 1H), 1.06 (d, J=6.6 Hz, 6H).

The nitro compound was then reduced by hydrogenation at 50 psi for 20 minutes in a mixture of THF and MeOH, and then filtered trough Cellite, and the solvent was removed to give the amino compound as a purple solid. $^1$H NMR (400 MHz, CDCl$_3$): δ 8.73 (d, 8.8 Hz, 4H), 8.35 (d, 8.8 Hz, 2H), 7.22-7.32 (m, 20H), 7.07 (t, J=7.3 Hz, 4H), 6.80 (d, J=8.8 Hz, 2H), 4.66 (d, J=7.3 Hz, 2H), 4.0 (bs, 2H), 2.69 (m, 1H), 1.05 (d, J=7.0 Hz, 6H).

The amino compound was then heated at 110° C. for 20 hours with glutaric anhydride, the temperature was lowered to 80° C. and after addition of acetyl chloride, the solution was heated for one hour. Work-up with water, extraction with ethyl acetate, evaporation of the solvent, and column chromatography (DCM/hexane—3:2) yielded pure Compound 40 as a purple solid. $^1$H NMR (400 MHz, CDCl$_3$): 8.70 (bs, 2H), 8.65 (d, J=8.8 Hz, 2H), 7.20-7.33 (m, 24H), 7.07 (t, J=7.0 Hz, 4H), 4.67 (d, J=7.3 Hz, 2H), 2.7 (s, 4H), 1.24 (s, 6H), 1.05 (d, J=6.6 Hz, 6H). UV-vis spectrum: λ$_{max}$=566 nm (dichloromethane), Fluorometry: λ$_{max}$=678 nm (dichloromethane).

Compound 41

Synthesis of Compound 41 was performed according to the following scheme:

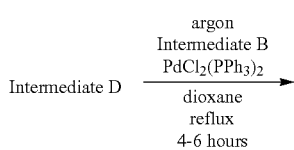

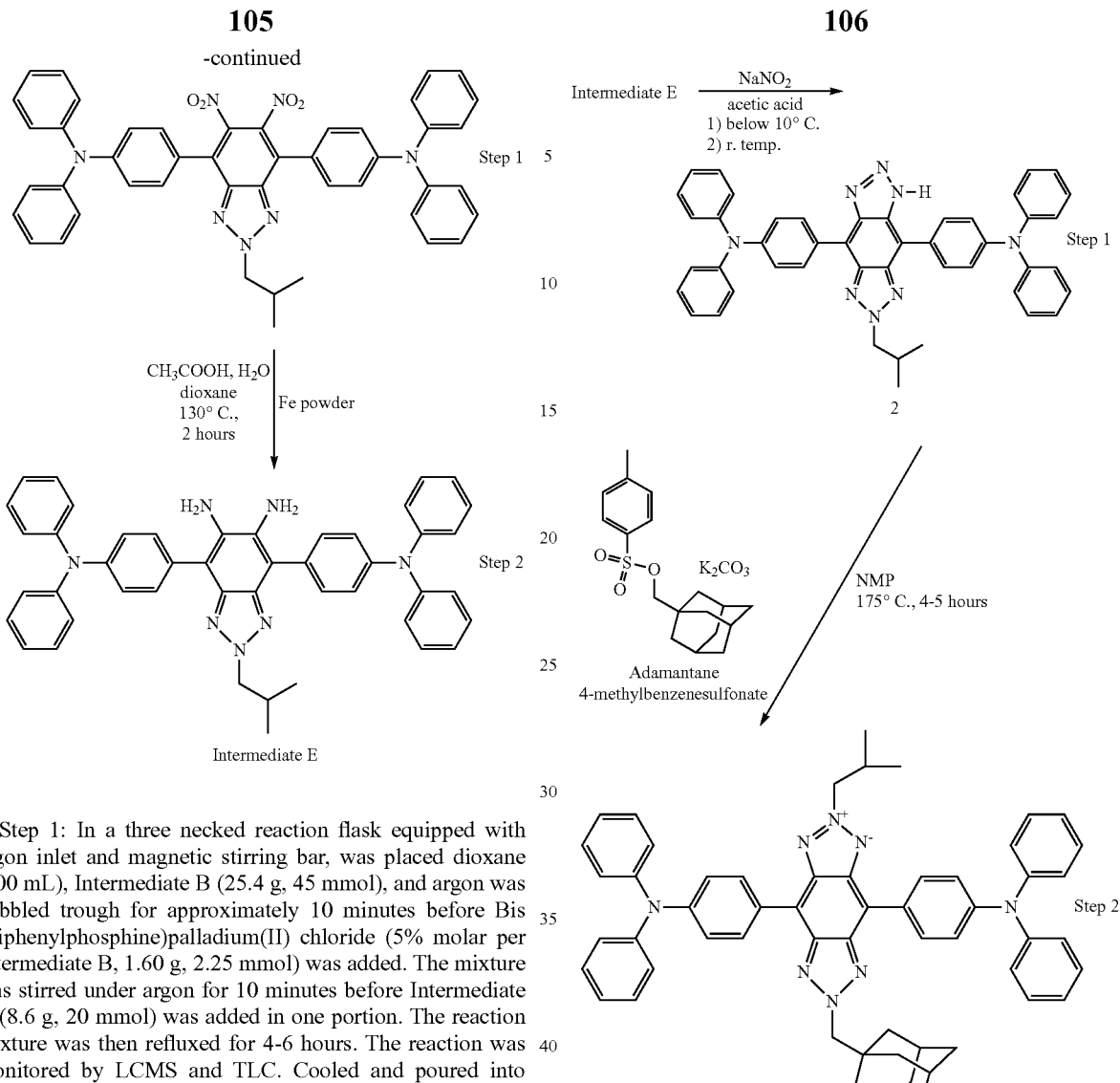

Step 1: In a three necked reaction flask equipped with argon inlet and magnetic stirring bar, was placed dioxane (200 mL), Intermediate B (25.4 g, 45 mmol), and argon was bubbled trough for approximately 10 minutes before Bis (triphenylphosphine)palladium(II) chloride (5% molar per Intermediate B, 1.60 g, 2.25 mmol) was added. The mixture was stirred under argon for 10 minutes before Intermediate D (8.6 g, 20 mmol) was added in one portion. The reaction mixture was then refluxed for 4-6 hours. The reaction was monitored by LCMS and TLC. Cooled and poured into MeOH (500 mL) while stirred. Dark orange color solid soon was formed which was separated by filtration, washed with more MeOH, and dried to give 4,4'-(2-isobutyl-5,6-dinitro-2H-benzo[d][1,2,3]triazole-4,7-diyl)bis(N,N-diphenylaniline) (13.3 g, of purity by LCMS approx 90%).

Step 2: 4,4'-(2-isobutyl-5,6-dinitro-2H-benzo[d][1,2,3]triazole-4,7-diyl)bis(N,N-diphenylaniline) from above, crude as it was (calculated for 15.9 mmol) and iron powder (8.7 g, 160 mmol) was heated and stirred in a mixture of glacial acetic acid (50 mL), dioxane (100 mL—for solubility), and 5 ml of water (to prevent formation of side product, imidazole) at 130° C. for 2 hours. The reaction was monitored by LCMS and TLC. Cooled and poured into 500 ml of ice cold water and stirred with magnetic bar retriever (to remove unreacted iron powder together with magnetic stirrer which was also covered with iron particles). Filtration and washing with water followed by MeOH afforded 14.9 g of crude product as olive color solid after drying in vacuum oven (purity by LCMS 82%). Fast column chromatography (DCM, silica gel) gave 8.2 g of pure Intermediate E, (4,7-bis(4-(diphenylamino)phenyl)-2-isobutyl-2H-benzo[d][1,2,3]triazole-5,6-diamine) $^1$H NMR (400 MHz, CDCl$_3$): δ 7.51 (δ, J=8.4 Hz, 4H), 7.28 (m, 12H), 7.19 (m, 8H), 7.05 (t, J=7.4 Hz, 4H), 4.37 (d, J=7.7 Hz, 2H), 2.45 (m, 1H, i-Bu), 0.91 (d, J=7.0 Hz, 6H, i-Bu).

To obtain Compound 41, Intermediate E (8.2, 11.7 mmol) was dissolved in 120 mL of THF and 30 mL of acetic acid and cooled in ice/water bath. A solution of NaNO$_2$ (24 mmol, 1.65 g) in 20 mL of water was then added dropwise. Soon the color of the reaction mixture turned to deep orange. The reaction mixture was left to stir for one hour at room temperature. The solution was then poured into 400 mL of ice cold water, which produced an orange-brownish solid which was separated by filtration, washed, dried, and purified by column chromatography (silica gel-DCM/hexane—3:2) to give 4,4'-(6-isobutyl-1,6-dihydrobenzo[1,2-d:4,5-d']bis([1,2,3]triazole)-4,8-diyl)bis(N,N-diphenylaniline) as orange solid (4.95, 58%). $^1$H NMR (400 MHz, CDCl$_3$): δ 8.5 (bs, 1H), 7.9 (bs, 1H), 7.2-7.3 (m, 24H), 7.08 (t, J=7.3 Hz, 4H), 4.65 (d, J=7.4 Hz, 2H), 2.64 (m, 1H), 1.01 (d, J=6.5 Hz, 6H).

The adamantane 4-methylbenzenesulfonate was synthesized by reacting adamantyl alcohol (20.5 g, 123 mmol) with p-toluenesulfonic chloride (23.6 g, 123 mmol) in 75 mL of regular DCM, in the presence of 25 mL of triethylamine for 48 hours at room temperature. More DCM was added (100 mL) and the organic layer was washed with water (3×100 mL). Drying, (MgSO4), and evaporation of the solvent gave 34.5 g of tea color oil which under trituration with hexane afforded white solid adamantane 4-methylbenzenesulfonate (30.5 g, 76%).

Then, 4,4'-(6-isobutyl-1,6-dihydrobenzo[1,2-d:4,5-d']bis ([1,2,3]triazole)-4,8-diyl)bis(N,N-diphenylaniline (4.9 g, 7 mmol) was dissolved in NMP (50 mL). Potassium carbonate (4.2 g, 30 mmol) was added, followed by adamantane 4-methylbenzenesulfonate (2.7 g, 8.4 mmol) and reaction mixture was heated at 175° C. for 4-5 hours. The reaction was monitored by LCMS and TLC. Two isomers were formed, the major one, was the desired product (Bt-2 isomer) and is of lower polarity. With longer time and higher temperature, more of the side product of higher polarity (Bt-1 isomer) is formed. After almost all starting material was consumed, the reaction mixture was cooled, poured into ice-cold water (400 mL), and left to stir, allowing formation of fine precipitate. The solid was filtered, washed with water, and dried to give 6.9 g of crude dark purple product. Column chromatography (silica gel, DCM/Hexane-3:2) provided Compound 41, (2-((3r,5r,7r)-adamantan-1-ylmethyl)-4,8-bis (4-(diphenylamino)phenyl)-6-isobutyl-2H-benzo[1,2-d:4,5-d']bis([1,2,3]triazole)-6-ium-5-ide) (2.42 g, 40%). $^1$H NMR (400 MHz, toluene-d$_3$): δ 9.15 (d, J=8.7 Hz, 4H), 7.41 (d, J=8.8 Hz, 4H), 7.13, m, 8H, overlapped with toluene), 7.02 (8H, overlapped with toluene), 6.84 (t, J=7.3 Hz, 4H), 4.25 (bs, 4H, 2×CH$_2$), 2.40 (m, 1H), 1.72 (bs, 3H), 1.51 (bs, 6H), 1.46 (bs, 3H), 1.36 (bs, 3H), 0.70 (d, J=7.0 Hz, 6H). UV-vis spectrum: $\lambda_{max}$=520 nm (dichloromethane), Fluorometry: $\lambda_{max}$=610 nm (dichloromethane).

Compound 42

Synthesis of Compound 42 was performed according to the following procedures:

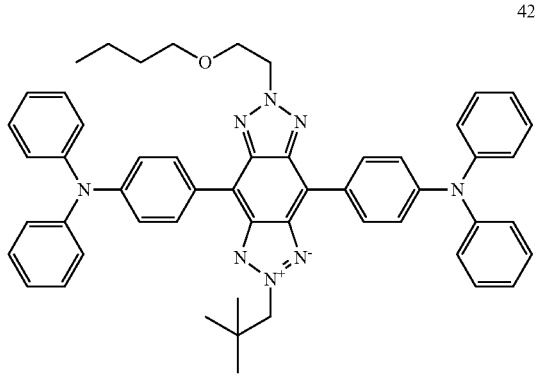

Compound 42 was prepared from Compound 6 by alkylation with 2-butoxyethyl-tosylate for one hour at 100° C. The mixture was poured into water and the solid obtained was separated, washed with water, followed by MeOH, dried, and purified by column chromatography (DCM/hexane) to give product as red solid, Compound 42. $^1$H NMR (400 MHz, CDCl$_3$): δ 8.59 (d, J=8.8 Hz, 4H), 7.38 (t, J=7.7 Hz, 8H), 7.12-7.16 (m, 16H), 5.07 (t, J=5.1 Hz, 2H), 4.73 (s, 2H), 4.11 (t, J=5.1 Hz, 2H), 3.40 (m, 2H), 1.36 (m, 2H), 1.10 (m, 2H), 1.06 (s, 9H), 0.65 (t, J=7.3 Hz, 3H). UV-vis spectrum: $\lambda_{max}$=522 nm (dichloromethane), Fluorometry: $\lambda_{max}$=616 nm (dichloromethane).

Compound 43

Synthesis of Compound 43 was performed according to the following procedures:

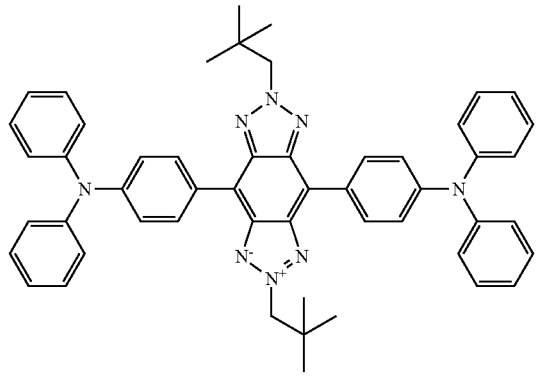

Compound 43 was prepared similar to the procedure described for Compound 42, except neopentyl tosylate is used instead. $^1$H NMR (400 MHz, DMSO-d$_6$): δ 8.61 (d, J=8.8 Hz, 4H), 8.16 (s, 4H), 7.33 (m, 8H), 7.08-7.35 (m, 14H), 4.67 (s, 4H), 1.06 (s, 18H). UV-vis spectrum: $\lambda_{max}$=522 nm (dichloromethane), Fluorometry: $\lambda_{max}$=613 nm (dichloromethane).

Compound 44

Synthesis of Compound 44 was performed according to the following procedures:

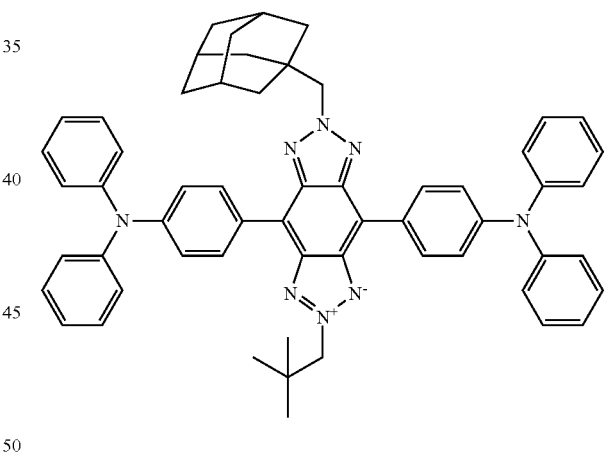

Compound 44 was prepared similar to the procedure described for Compound 42, except adamantyl tosylate is used instead. $^1$H NMR (400 MHz, toluene-t$_3$): δ 9.18 (d, J=8.8 Hz, 4H), 7.42 (d, J=8.8 Hz, 4H), 7.08-7.15 (m, 8H, overlapped with toluene), 7.00-7.04 (m, 8H, overlapped with toluene), 6.84 (t, J=7.3 Hz, 4H), 4.28 (s, 2H), 4.24 (s, 2H), 1.72 (bs, 3H), 1.50 bs, 2H), 1.46 (bs, 2H), 1.38 (bs, 2H), 1.35 (bs, 2H), 0.88 (s, 9H). UV-vis spectrum: $\lambda_{max}$=521 nm (dichloromethane), Fluorometry: $\lambda_{max}$=611 nm (dichloromethane).

Compound 45

Synthesis of Compound 45 was performed according to the following procedures:

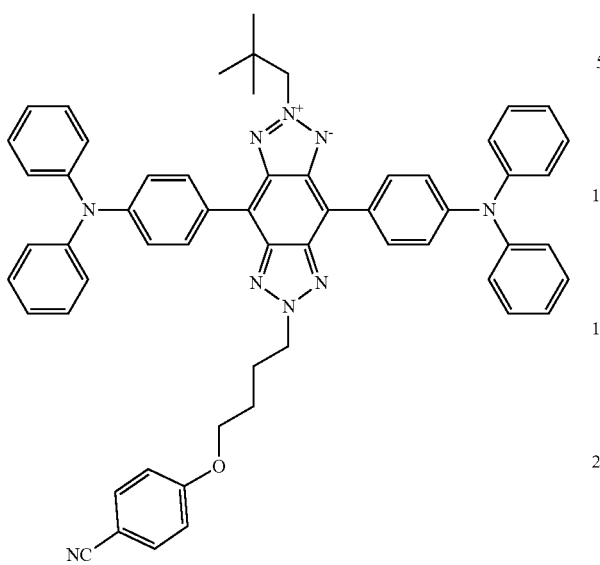

45

Compound 45 was prepared by alkylation of Compound 7 with 1,4-dibromobutane followed by reaction with 4-cyanophenol under standard conditions. $^1$H NMR (400 MHz, toluene-$d_3$): δ 9.10 (d, J=9.2 Hz, 4H), 7.41 (d, 8.8 Hz, 4H), 7.14 (d, J=7.7 Hz, 8H), 7.05 (d, J=7.3 Hz, 8H), two protons overlapped with toluene, 6.87 (t, J=7.3 Hz, 4H), 6.25 (d, J=8.8 Hz, 2H), 4.40 (t, J=7.1 Hz, 2H), 4.29 (s, 2H), 3.14 (t, J=6.2 Hz, 2H), 1.35 (m, 4H), 0.88 (s, 9H). UV-vis spectrum: $\lambda_{max}$=519 nm (dichloromethane), Fluorometry: $\lambda_{max}$=616 nm (dichloromethane).

Compound 46

Synthesis of Compound 46 was performed according to the following procedures:

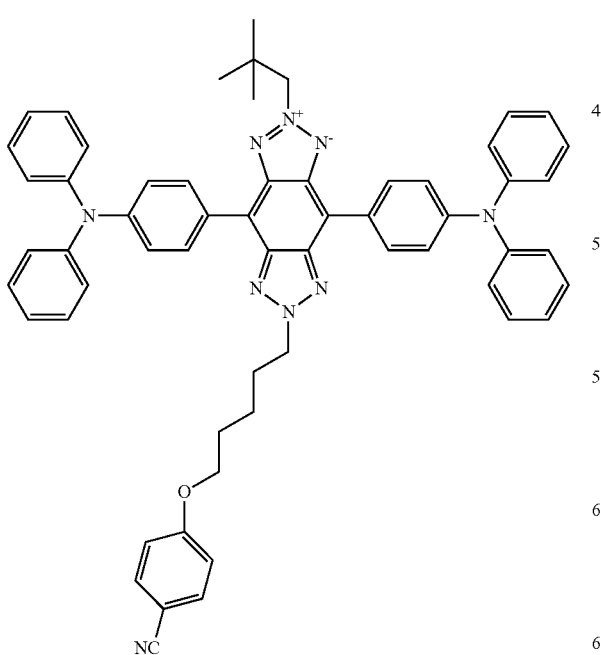

46

Compound 46 was prepared similar to the procedure described for Compound 45, except alkylation was performed with 1,5-dibromopentane. UV-vis spectrum: $\lambda_{max}$=520 nm (dichloromethane), Fluorometry: $\lambda_{max}$=613 nm (dichloromethane).

Compound 47

Synthesis of Compound 47 was performed according to the following procedures:

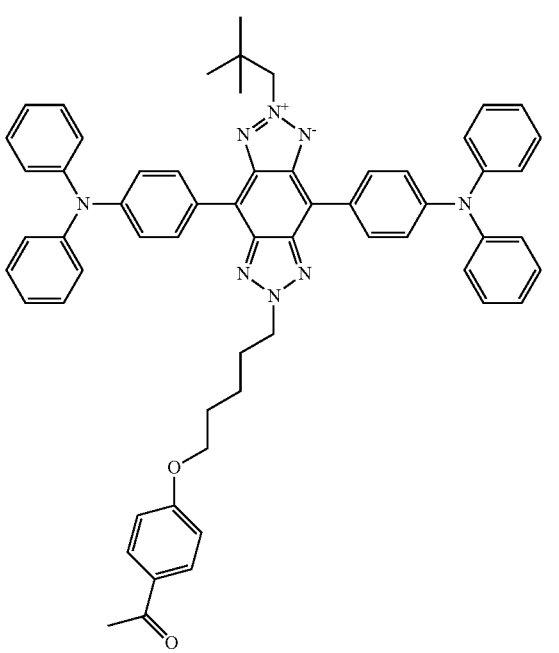

47

Compound 47 was prepared from Compound 46, and further reacted with 4-hydroxyacetophenone at 130° C. for five hours (monitored by LCMS and TLC). Column chromatography (DCM/hexane-3:2) provided pure product Compound 47. $^1$H NMR (400 MHz, CDCl$_3$): δ 8.62 (d, J=8.8 Hz, 4H), 7.85 (d, J=8.8 Hz, 2H), 7.18-7.24 (m, 20H), 7.06 (t, J=7.3 Hz, 4H), 6.84 (d, J=8.8 Hz, 2H), 4.90 (t, J=7.3 Hz, 2H), 4.66 (s, 2H), 4.00 (t, J=4.8 Hz, 2H), 2.5 (s, 3H), 2.32 (m, 2H), 1.90 (m, 2H), 1.63 (m, 2H), 1.13 (S, 9H). (UV-vis spectrum: $\lambda_{max}$=520 nm (dichloromethane), Fluorometry: $\lambda_{max}$=614 nm (dichloromethane).

Compound 48

Synthesis of Compound 48 was performed according to the following scheme:

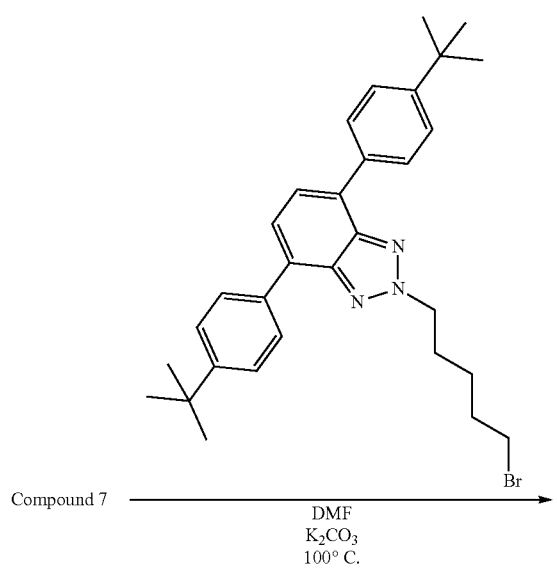

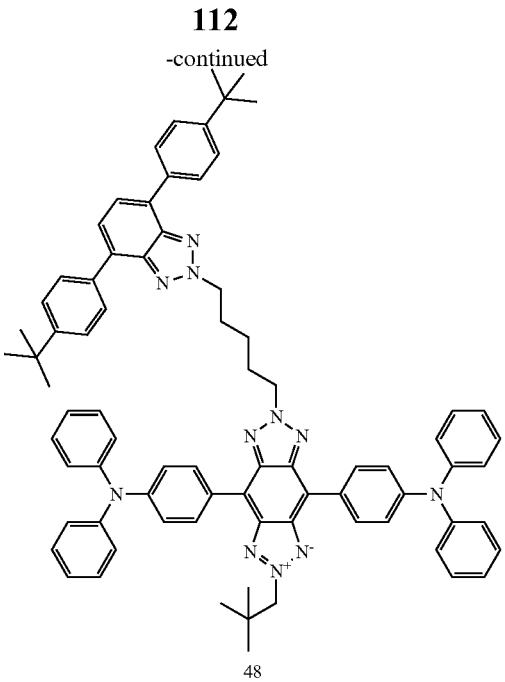

Compound 48 was prepared according to the scheme above, with two chromophores connected. One of the chromophores, the smaller one, serves as internal UV protector, to improve the stability of the original chromophore. Two isomers have been isolated (Bt(2)-Bt(2) of lower polarity and Bt(1)-Bt(2) of higher polarity. One, predominant is reported. $^1$H NMR (400 MHz, toluene-d$_3$) for Compound 48 (Bt-2-Bt-2), isomer: δ 9.09 (d, J=9.1 Hz, 4H), 8.22 (J=8.8 Hz, 4H), 7.59 (s, 2H), 7.47 (d, J=8.4 Hz, 4H), 7.40 (d, J=9.1 Hz, 4H), 7.12 (m, 8H) and 7.02 (m, 8H) overlapped with toluene, 6.84 (t, J=7.3 Hz, 4H), 4.25 (m, 4H), 1.70 (m, 4H), 1.30 (s, 18H), 0.88 (s, 9H). UV-vis spectrum: $\lambda_{max}$=521 nm (dichloromethane), Fluorometry: $\lambda_{max}$=613 nm (dichloromethane).

Compound 49

Synthesis of Compound 49 was performed according to the following scheme:

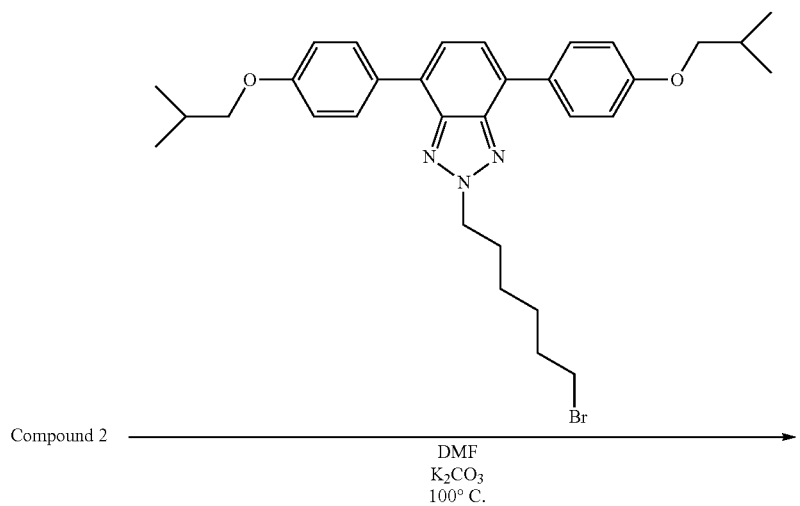

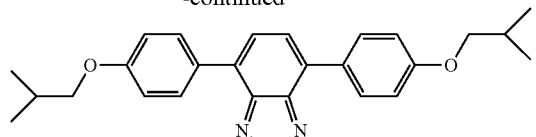

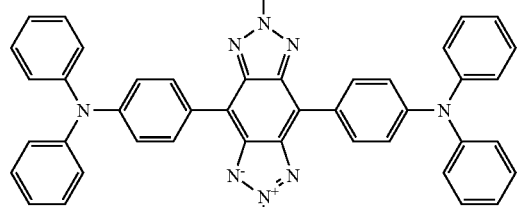

49

Compound 49 was prepared according to the scheme above, with two chromophores connected. One of the chromophores, the smaller one, serves as internal UV protector, to improve the stability of the original chromophore. Two isomers have been isolated (Bt(2)-Bt(2) of lower polarity and Bt(1)-Bt(2) of higher polarity. One, predominant is reported. $^1$H NMR (400 MHz, CDCl$_3$) for Compound 49 (Bt-2-Bt-2), isomer: δ 8.59 (d, J=8.8 Hz, 4H), 7.96 (d, J=8.8 Hz, 4H), 7.52 (s, 2H), 7.19-7.27, m, 30H), 7.04 (t, J=7.0 Hz, 4H), 7.0 (d, J=8.8 Hz, 4H), 4.83 (t, J=7.2 Hz, 2H), 4.75 (t, J=7.2 Hz, 2H), 4.65 (d, J=7.3 Hz, 2H), 3.75 (d, J=6.6 Hz, 4H), 1.05 (m, 1H), 2.08-2.23 (m, 8H), 1.02 (2 doublets, 18H).

Compound 50

Synthesis of Compound 50 was performed according to the following scheme:

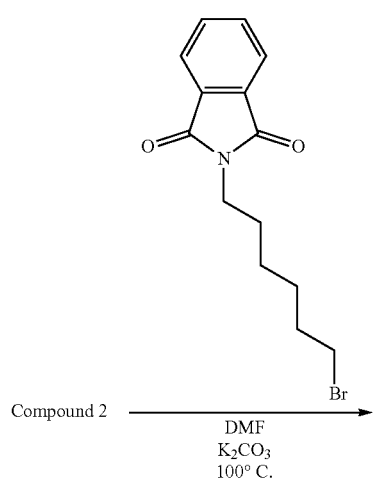

Compound 2 →
DMF
K$_2$CO$_3$
100° C.

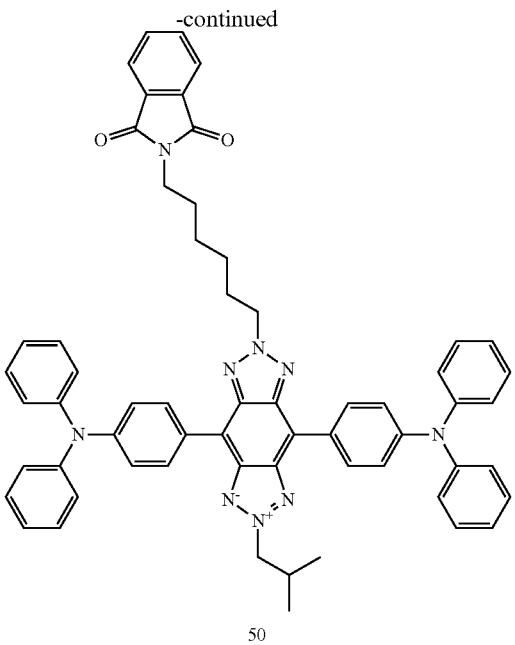

50

Compound 50 was prepared according to the scheme above, with two chromophores connected. One of the chromophores, the smaller one, serves as internal UV protector, to improve the stability of the original chromophore. Two isomers have been isolated (Bt(2)-Bt(2) of lower polarity and Bt(1)-Bt(2) of higher polarity. One, predominant is reported. $^1$H NMR (400 MHz, CDCl$_3$) for Compound 50 (Bt-2-Bt-2), isomer: δ 8.59 (d, J=8.8 Hz, 4H), 7.79 (m, 2H), 7.67 (m, 2H), 7.15-7.34 (m, 20H), 7.05 (t, J=7.3 Hz, 4H), 4.83 (t, J=7.0 Hz, 2H), 4.65 (d, J=7.3 Hz, 2H), 3.66 (t, J=7.0 Hz, 2H), 2.67 (m, 1H), 2.22 (m, 2H), 1.68 (m, 2H), 1.4-1.5 (m, 4H), 1.03 (d, J=6.6 Hz, 6H).

Compound 51
Synthesis of Compound 51 was performed according to the following scheme:
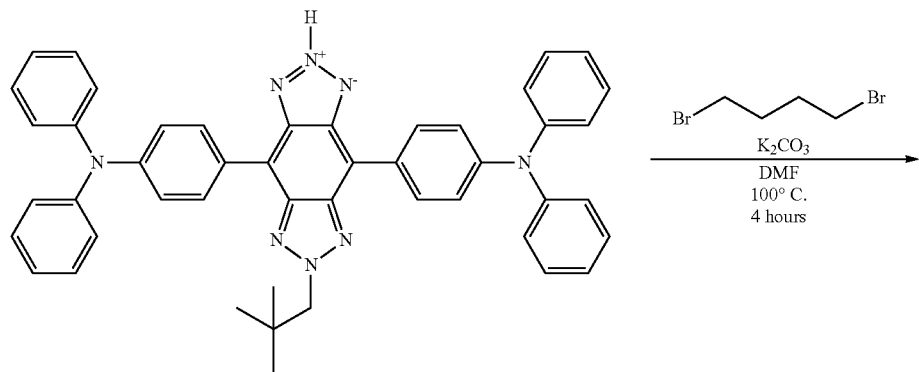
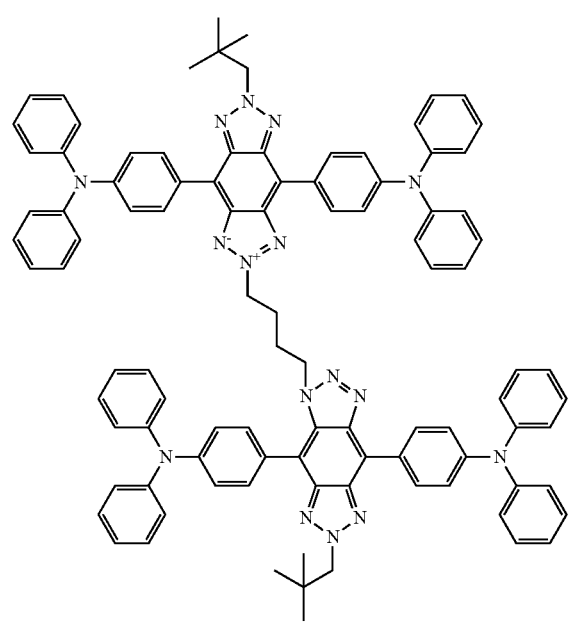
51

Compound 51 was prepared according to the scheme above, using standard alkylation procedure.
Compound 52
Synthesis of Compound 52 was performed according to the following scheme:
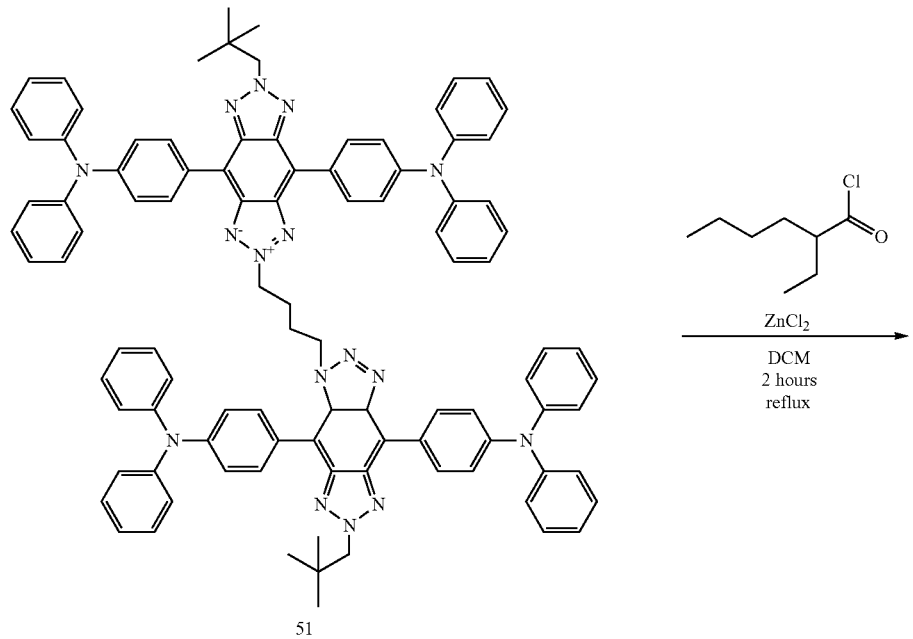
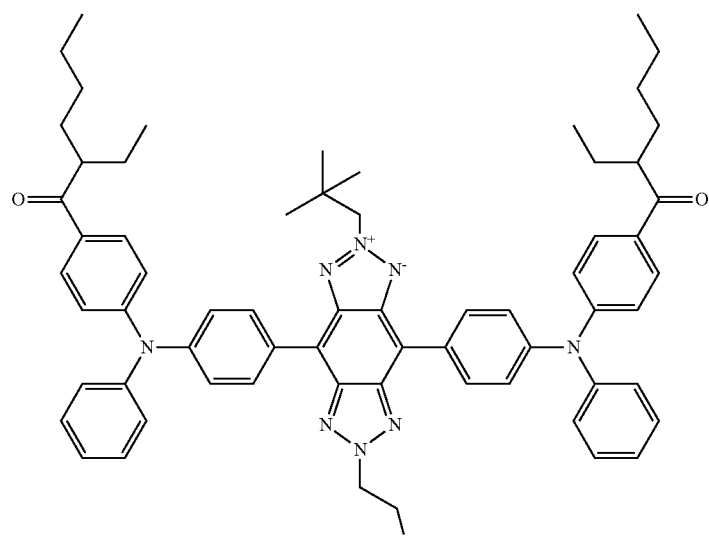

-continued
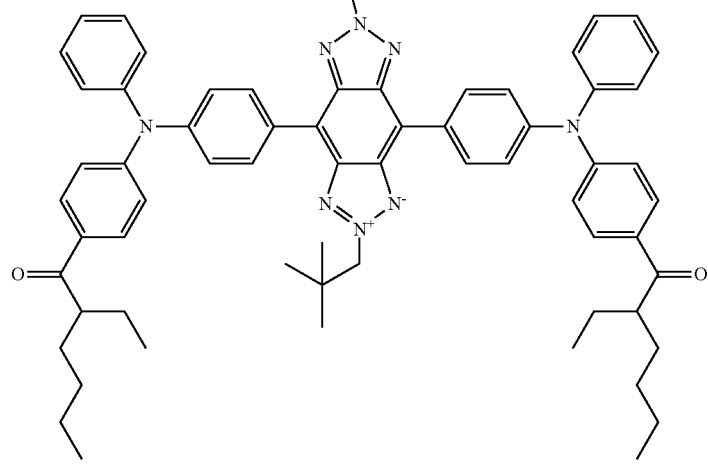
52
Compound 52 was obtained by acylation of Compound 51. $^1$H NMR (400 MHz, CDCl$_3$)): δ 8.64 (d, J=8.8 Hz, 6H), 7.84 (d, J=8.8 Hz, 6H), 7.11-7.35 (m, 40H), 4.99 (bs, 4H), 4.66 (bs, 4H), 3.27 (m, 4H), 2.39 (bs, 4H), 1.72-1.80 (m, 8H), 1.45-1.62 (m, 8H), 1.21-1.28 (m, 16H), 1.13 (s, 18H), 0.86 (m, 24H-8 triplets overlapped)
Compound 53
Synthesis of Compound 53 was performed according to the following scheme:
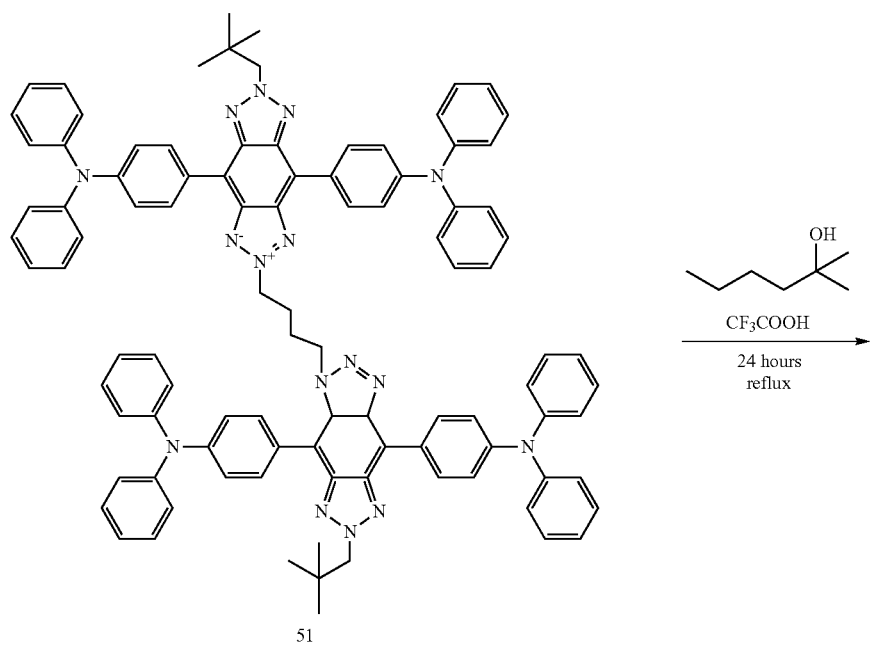
51

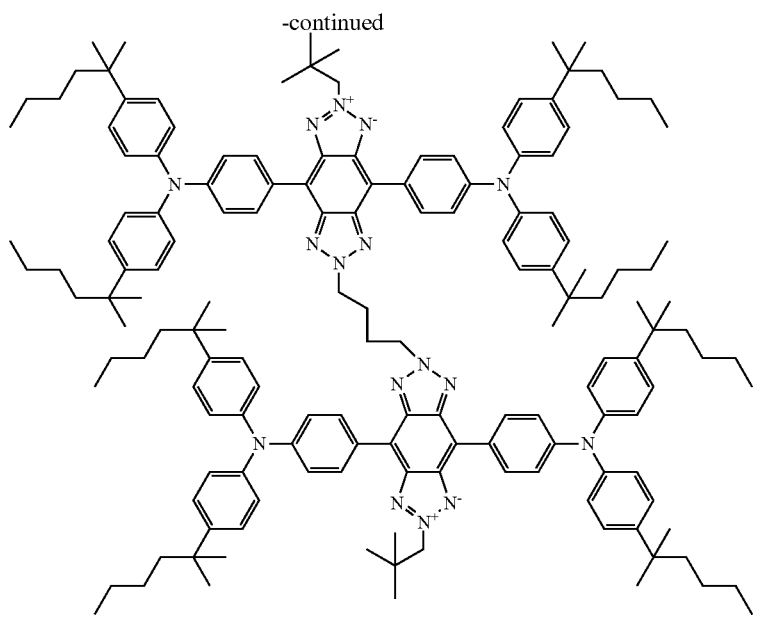

53

Compound 53 was obtained by alkylation of Compound 51 (1194-26B). $^1$H NMR (400 MHz, CDCl$_3$)): δ 9.08 (d, J=8.8 Hz, 8H), 7.48 (8.8 Hz, 8H), 7.21 (d, J=8.4 Hz, 16H), 7.11 (m, 8H), 6.98 (m, 8H), 4.29 bs, 8H), 1.51-1.55 (m, 8H), 1.20 (s, 66H), 1.45-0.80 (multiplets, 68H).

Intermediate B-6

Synthesis of Intermediate B-6 was performed according to the following scheme:

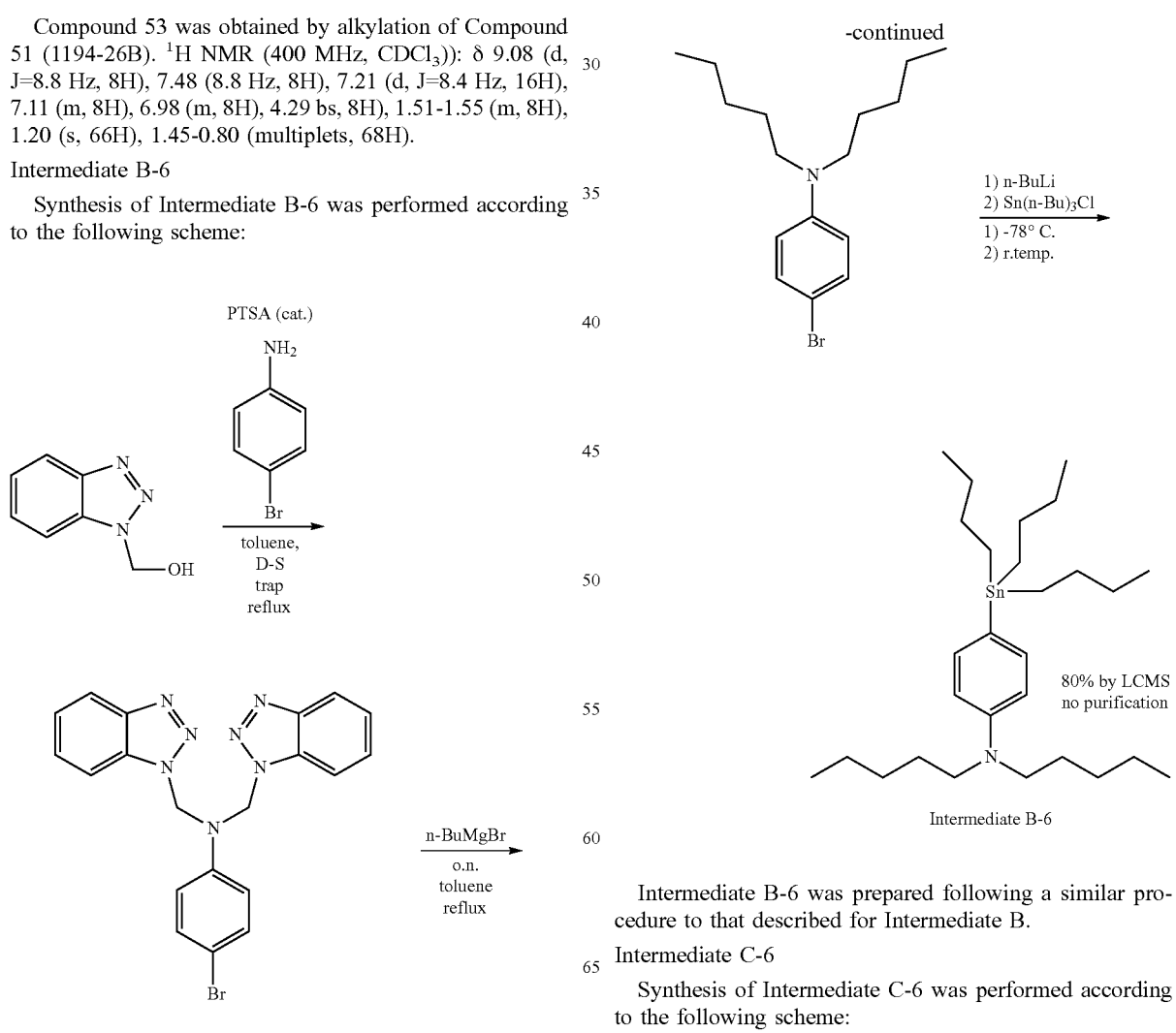

Intermediate B-6 was prepared following a similar procedure to that described for Intermediate B.

Intermediate C-6

Synthesis of Intermediate C-6 was performed according to the following scheme:

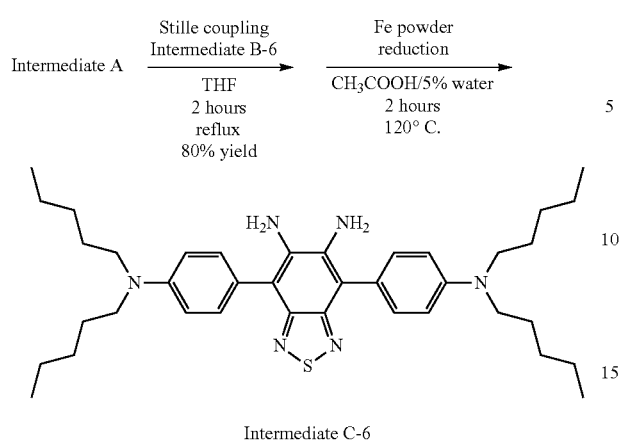

Intermediate C-6

Intermediate C-6 was prepared following a similar procedure to that described for Intermediate C, except that Intermediate B-6 was used instead of Intermediate B.

Compound 54

Synthesis of Compound 54 was performed according to the following scheme:

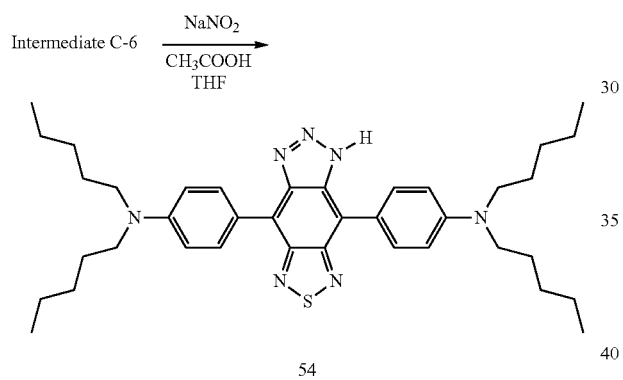

54

Compound 54 was prepared following the same procedure as for Compound 4 except that Intermediate C-6 was used instead of Intermediate C. $^1$H NMR (400 MHz, CHCl$_3$): δ 8.47 bs, 2H), 7.84 (bs, 2H), 6.88 (b, 4H), 3.37 (m, 8H), 1.64-1.74 (m, 8H), 1.31-1.41 (m, 16H), 0.94 (t, J=7.0 Hz, 12H). UV-vis spectrum: $\lambda_{max}$=602 nm (dichloromethane), Fluorometry: $\lambda_{max}$=742 nm (dichloromethane).

Compound 55

Synthesis of Compound 55 was performed according to the following procedures:

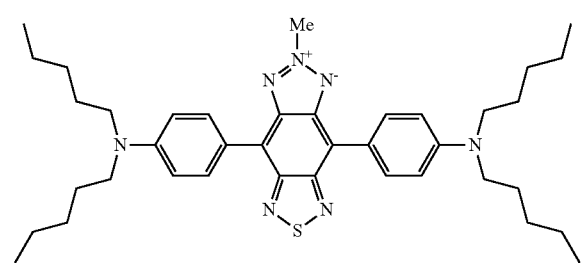

Compound 55 was prepared from Compound 54 by alkylation with methylmethanesulfonate in the presence of potassium carbonate in DMF at 65° C. for 3 hours. $^1$H NMR (400 MHz, CDCl$_3$): δ 8.31 (d, J=9.2 Hz, 4H), 6.85 (d, J=9.2 Hz, 4H), 3.36 (m, 8H), 2.15 (s, 3H), 1.68 (m, 8H), 1.53 (m, 8H), 1.36 (m, 8H), 0.93 (t, J=6.6 Hz, 12H). UV-vis spectrum: $\lambda_{max}$=645 nm (dichloromethane), Fluorometry: 798 nm (dichloromethane).

Compound 56

Synthesis of Compound 56 was performed according to the following procedures:

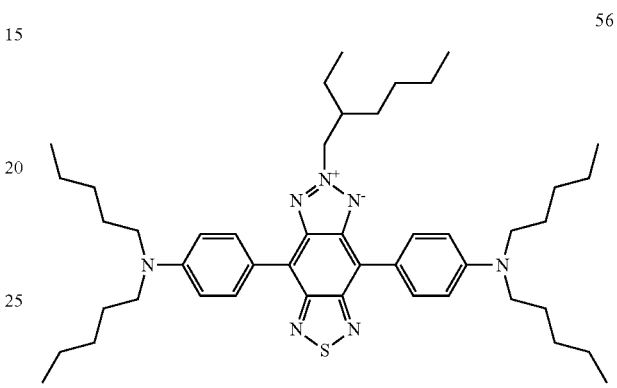

56

Compound 56 was prepared from Compound 54 by alkylation with tosylate of 2-ethylhexanol (prepared according to general procedure) in the presence of potassium carbonate (4 eq) in DMF at 65° C. for 3 hours. $^1$H NMR—no NMR, no sample). UV-vis spectrum: $\lambda_{max}$=659 nm (dichloromethane), Fluorometry: 812 nm (dichloromethane). Small sample, characterized only by LCMS.

Compound 57

Synthesis of Compound 57 was performed according to the following scheme:

Intermediate C-6 ⟶

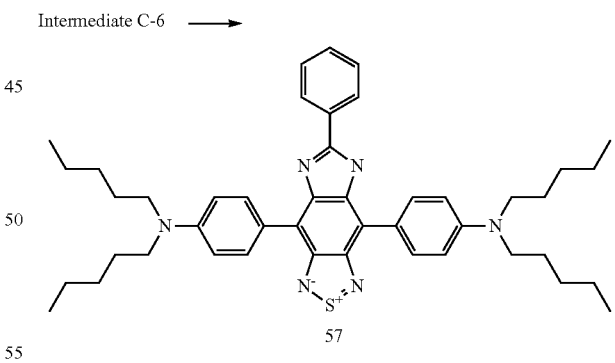

57

Compound 57 was prepared from Intermediate C-6 by reaction with benzoyl chloride (1.1 eq) in refluxing toluene for one hour. Work-up with cold sodium bicarbonate and water, evaporation of the solvent followed by column chromatography (DCM/hexane-3:2 gave pure product as purple oil, Compound 57. $^1$H NMR (400 MHz, CHCl$_3$): δ 9.42 (s, 1H), 8.33 (d, J=8.4 Hz, 2H), 8.14 (m, 2H), 7.78 (d, J=8.1 Hz, 2H), 7.52 (m, 3H), 6.86 (m, 2H), 3.37 (t, J=7.3 Hz, 8H), 1.57-1.72 (m, 8H), 1.25-1.44 (m, 16H), 0.91 (t, J=7.3 Hz, 12H). UV-vis spectrum: $\lambda_{max}$=537 nm (dichloromethane), Fluorometry: $\lambda_{max}$=675 nm (dichloromethane).

Compound 58

Synthesis of Compound 58 was performed according to the following procedures:

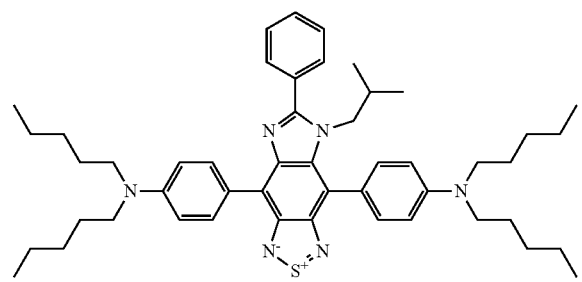

Compound 58 was prepared by alkylation of Compound 57 with tosylate of isobutyl alcohol in DMF (under standard condition), at 90° C., overnight. The structure was confirmed by LCMS, very small sample obtained. UV-vis spectrum: $\lambda_{max}$=516 nm (dichloromethane), Fluorometry: $\lambda_{max}$=668 nm (dichloromethane).

Compound 59

Synthesis of Compound 59 was performed according to the following procedures:

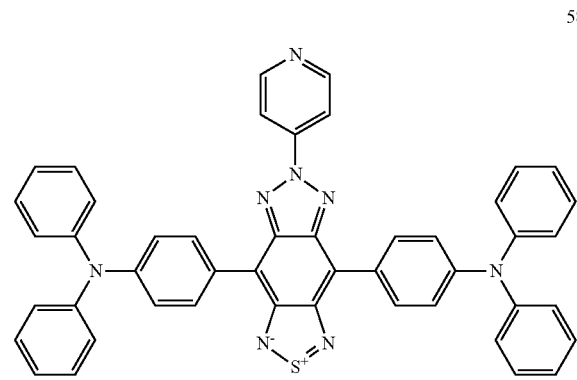 [SMILES: c1ccc(N(c2ccccc2)c2ccc(-c3c4nn(-c5ccncc5)nc4c(-c4ccc(N(c5ccccc5)c5ccccc5)cc4)c4[n-][s+]nc34)cc2)cc1]

Compound 59 was prepared from Compound 4 by reaction with 4-chloropyridine (2 eq) in quinoline at 190° C. overnight. Work-up with sodium carbonate solution and DCM, then the organic layer was dried, rotavaped, and diluted with methanol until the precipitate was formed. Chromatographed with DCM-2.5% ethyl acetate. Pure product was obtained as a bluish-green solid. ¹H NMR (400 MHz, CDCl₃): δ 8.87 (d, J=5.9 Hz, 2H), 8.45 (m, 6H, two doublets overlapped), 7.2-7.4 (m, 20H), 7.11 (t, J=7.4 Hz, 4H). UV-vis spectrum: $\lambda_{max}$=684 nm (dichloromethane), Fluorometry: $\lambda_{max}$=820 nm (dichloromethane).

Compound 60

Synthesis of Compound 60 was performed according to the following procedures:

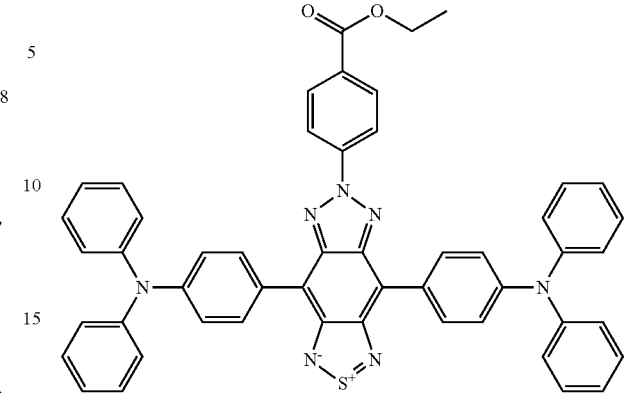

Compound 60 was prepared similarly to Compound 59 except 4-fluoroethylbenzoate was used instead (4 eq). The reaction time was 4 days. Cooling and diluting with methanol afforded crude product which was purified by column chromatography (hexane-ethyl acetate, 4:1). ¹H NMR (400 MHz, CDCl₃): δ 8.36 (d, J=8.8 Hz, 4H), 7.22-7.40 (m, 22H), 7.08 (t, J=7.0 Hz, 6H), 4.95 (q, J=7.3 Hz, 2H), 1.83 (t, J=7.3 Hz, 3H). UV-vis spectrum: $\lambda_{max}$=607 nm (dichloromethane), Fluorometry: $\lambda_{max}$=751 nm (dichloromethane).

Compound 61

Synthesis of Compound 61 was performed according to the following procedures:

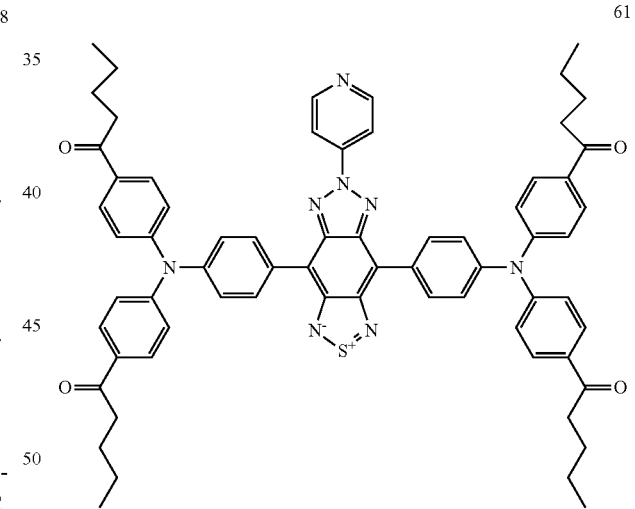

Compound 61 was prepared from Compound 59 by acylation with valeryl chloride in the presence of zinc chloride in anhydrous DCM at reflux for four hours. The reaction mixture was cooled, poured into ice-cold sodium bicarbonate and stirred for 30 minutes. The organic layer was washed with sodium bicarbonate, followed by water, dried, and the solvent was evaporated. Column chromatography (DCM-ethyl acetate 2.5%-20%) afforded pure product. ¹H NMR (400 MHz, CDCl₃): δ 8.92 (m, 2H), 8.56 (d, J=8.8 Hz, 4H), 8.48 (d, J=6.2 Hz, 2H), 7.94 (d, J=8.8 Hz, 4H), 7.41 (d, J=8.4 Hz, 4H), 7.28 (m, 14H), 2.95 (t, J=7.7 Hz, 8H), 1.74 (m, 8H), 1.44 (m, 8H), 0.97 (t, J=7.3 Hz, 12H). UV-vis spectrum: $\lambda_{max}$=632 nm (dichloromethane), Fluorometry: $\lambda_{max}$=794 nm (dichloromethane).

Compounds 62 and 63

Synthesis of Compound 62 and Compound 63 was performed according to the following procedures:

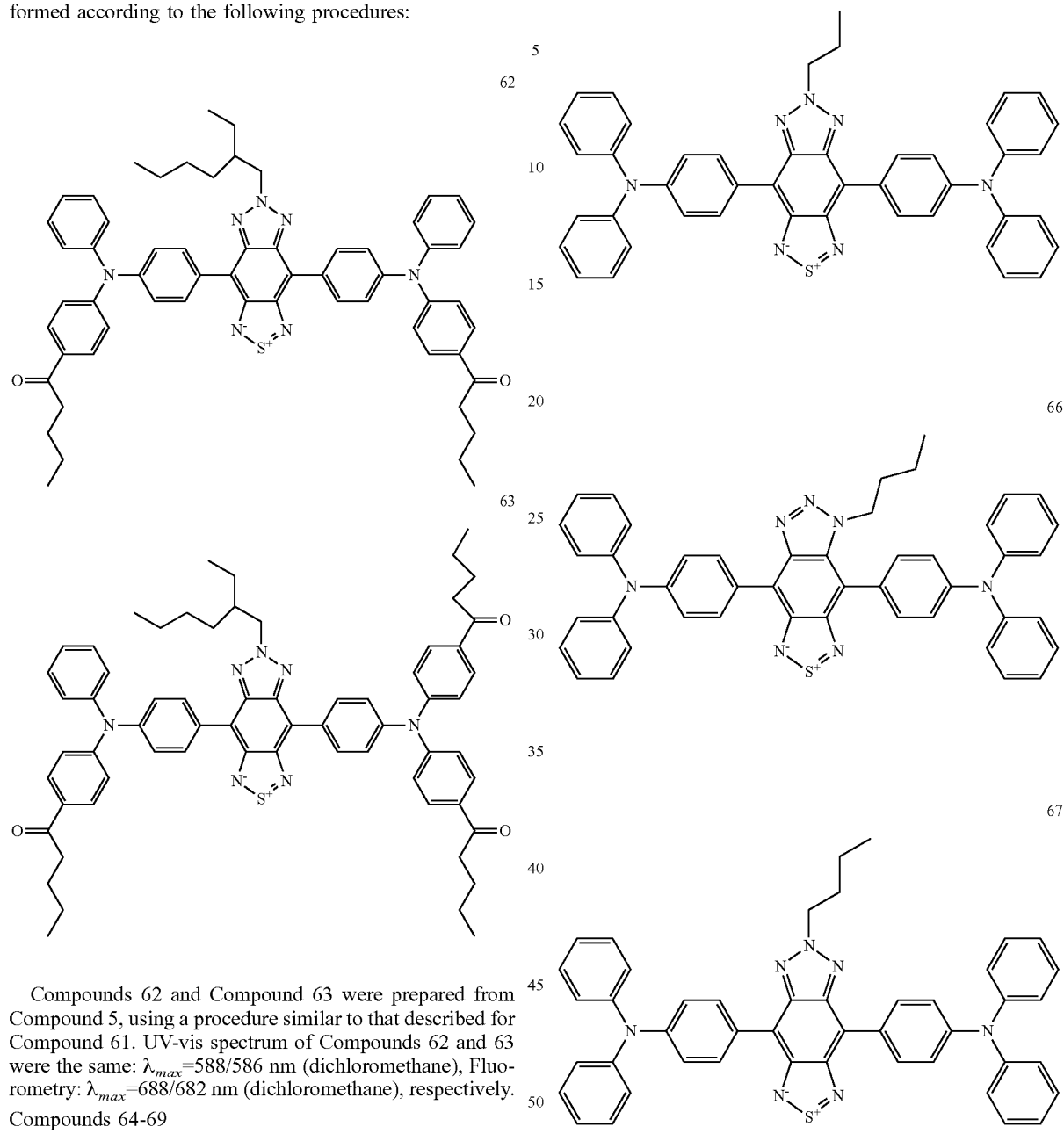

Compounds 62 and Compound 63 were prepared from Compound 5, using a procedure similar to that described for Compound 61. UV-vis spectrum of Compounds 62 and 63 were the same: $\lambda_{max}$=588/586 nm (dichloromethane), Fluorometry: $\lambda_{max}$=688/682 nm (dichloromethane), respectively.

Compounds 64-69

Synthesis of Compound 64, 65, 66, 67, 68, and 69 were performed according according to the following procedures:

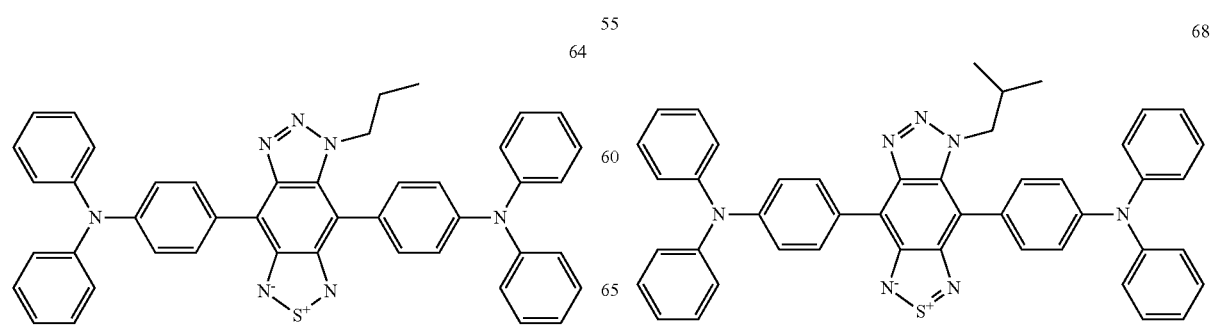

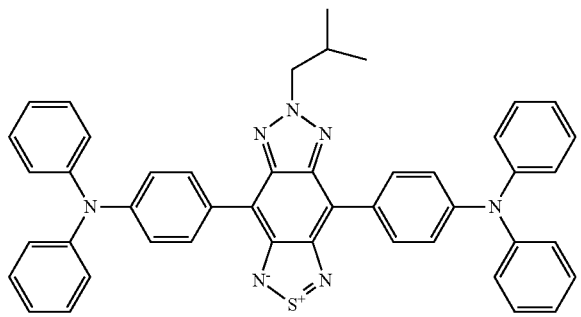

Compounds 64, 65, 66, 67, 68, and 69 were prepared according to the general procedure for alkylation of benzotriazole as is described for Compound 3. Their optical properties are almost identical. Only one set of NMR data is presented below as representatives of two isomers of benzotriazole formed at different ratio depending on the temperature of the reaction. Benzotriazole-1 (as Compound 66) is predominantly formed at higher temperature and benzotriazole-2 (as Compound 67) at lower temperature.

$^1$H NMR for Compound 66 isomer (400 MHz, CDCl$_3$): δ 8.35 (d, J=8.4 Hz, 2H), 7.46 (d, J=8.4 Hz, 2H), 7.18-7.34 (m, 18H), 7.08 (m, 6H), 4.51 (t, J=7.8 Hz, 2H), 1.54 (m, 2H), 1.14 (m, 2H), 0.82 (t, J=7.3 Hz, 3H).). UV-vis spectrum: λ$_{max}$=536 nm (dichloromethane), Fluorometry: λ$_{max}$=681 nm (dichloromethane).

$^1$H NMR for Compound 67 isomer (400 MHz, CDCl$_3$): δ 8.92 8.36 (d, J=8.8 Hz, 4H), 7.22-7.32 (m, 20H), 7.08 (t, J=7.3 Hz, 4H), 4.88 (t, J=7.3 Hz, 2H), 2.22 (m, 2H), 1.46 (m, 2H), 1.00 (t, J=7.3 Hz, 3H). UV-vis spectrum: λ$_{max}$=603 nm (dichloromethane), Fluorometry: λ$_{max}$=747 nm (dichloromethane).

Compound 68 was prepared by analogy to Compound 66. Two isomers were also separated. $^1$H NMR for Compound 68 isomer (400 MHz, CDCl$_3$): δ 8.35 (d, J=8.8 Hz, 2H), 7.46 (d, J=8.8 Hz, 2H), 7.15-7.39 (m, 20H), 7.09 (m, 4H), 4.35 (d, J=7.4 Hz, 2H), 1.73 (m, 1H), 1.14 (m, 2H), 0.69 (d, J=6.6 Hz, 6H).). UV-vis spectrum: λ$_{max}$=529 nm (dichloromethane), Fluorometry: λ$_{max}$=681 nm (dichloromethane).

$^1$H NMR for Compound 69 isomer (400 MHz, CDCl$_3$): δ 8.36 (d, J=8.8 Hz, 4H), 7.22-7.32 (m, 20H), 7.08 (t, J=7.3 Hz, 4H), 4.69 (d, J=7.3 Hz, 2H), 2.69 (m, 1H), 1.04 (d, J=7.0 Hz, 6H). UV-vis spectrum: λ$_{max}$=604 nm (dichloromethane), Fluorometry: λ$_{max}$=750 nm (dichloromethane).

Compound 70

Synthesis of Compound 70 was performed according to the following procedures:

Compound 70 was prepared from Compound 69 by alkylation with 2-methyl-2-hexanol (12 eq) in refluxing TFA for six hours. The reaction was monitored by TLC, where the blue spot disappeared and dark green of lower polarity indicated product. Evaporation and column chromatography (DCM/hexane—2:3) gave pure tetraalkylated product. $^1$H NMR (400 MHz, CDCl$_3$): δ 8.35 (d, J=8.4 Hz, 4H), 7.24 (m, 12H), 7.15 (d, J=8.4 Hz, 8H), 4.68 (d, J=7.3 Hz, 2H), 2.70 (m, 1H), 1.59 (t, J=6.0 Hz, 8H), 1.29 (s, 24H), 1.26 (m, 8H), 1.09 (m, 8H), 1.04 (d, 6.6 Hz, 6H), 0.86 (t, J=7.3 Hz, 12H). UV-vis spectrum: λ$_{max}$=626 nm (dichloromethane), Fluorometry: λ$_{max}$=787 nm (dichloromethane).

Compounds 71 and 72

Synthesis of Compound 71 and Compound 72 were performed according to the following procedures:

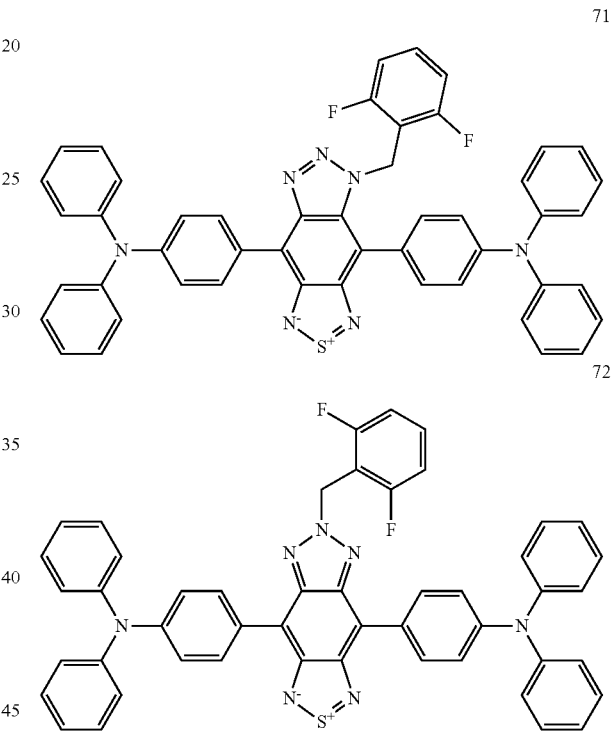

Compounds 71 and 72 were prepared by reaction of Compound 4 with 2,6-difluorobenzylbromide (1.5 eq) in the

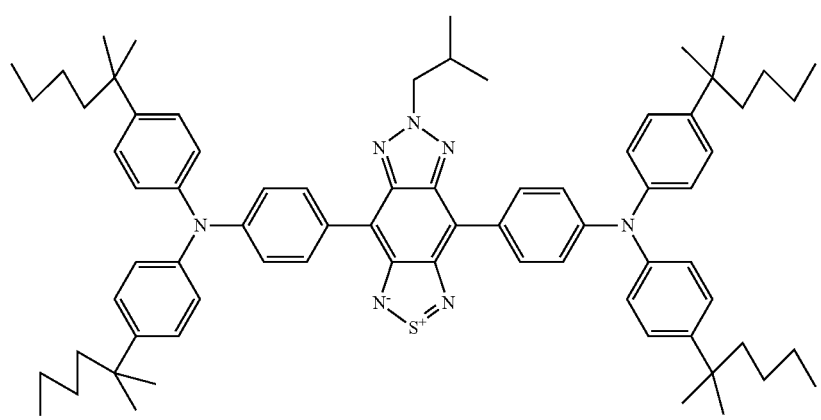

presence of potassium carbonate (5 eq), in DMF, for one hour at 130° C. Two isomers were formed. For the first time benzotriazole-2 was formed as predominant, probably due to bulkiness of the bromide used. The best way to assign which isomers are formed is by position of the methylene group attached to benzotriazole. Benzotriazole-2 is downfield in comparison to benzotriazole-1. They are easily separated due to different polarity and color.

Compound 71 Bt(1) isomer: (400 MHz, CDCl$_3$): δ 8.35 (d, J=9.1 Hz, 2H), 7.38 (d, J=8.4 Hz, 2H), 7.17-7.35 (m, 21H), 7.09 (m, 4H), 6.79 (t, J=8.1 Hz, 2H), 5.69 (s, 2H).). UV-vis spectrum: $\lambda_{max}$=535 nm (dichloromethane), Fluorometry: $\lambda_{max}$=684 nm (dichloromethane).

Compound 72 Bt(2) isomer: (400 MHz, CDCl$_3$): δ 8.36 (d, J=8.8 Hz, 4H), 7.30 (t, J=8.4 Hz, 8H), 7.21-7.25 (m, 13H), 7.08 (t, J=7.3 Hz, 4H), 6.98 (t, J=8.4 Hz, 2H), 6.14 (s, 2H). (UV-vis spectrum: $\lambda_{max}$=612 nm (dichloromethane), Fluorometry: $\lambda_{max}$=764 nm (dichloromethane).

Compound 73

Synthesis of Compound 73 was performed according to the following procedures:

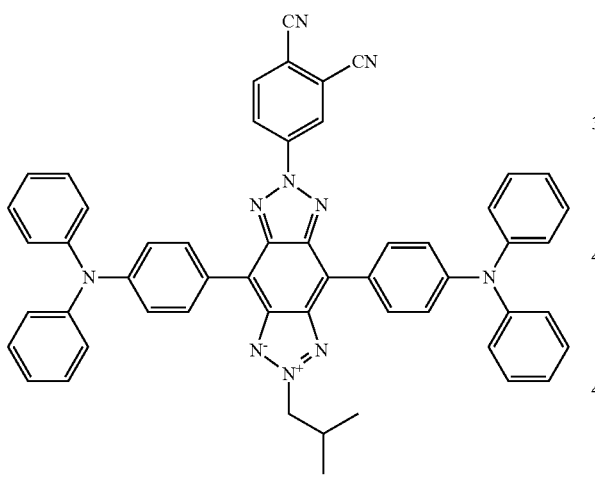

73

Compound 73 was obtained by reacting Compound 2 with 4-fluorobenzonitrile (2 eq) by heating in DMF for one hour in the presence of potassium carbonate (5 eq). Only benzotriazole-2 isomer was formed. (400 MHz, CDCl$_3$): δ 9.01 (d, J=2.2 Hz, 1H), 8.93 (dd, J=2.2 and 8.8 Hz, 1H), 8.62 (d, J=8.8 Hz, 4H), 8.02 (d, J=8.8 Hz, 1H), 7.23-7.34 (m, 20H), 7.10 (t, J=7.3 Hz, 4H), 4.67 (d, J=7.3 Hz, 2H), 2.69 (m, 1H), 1.06 (d, J=6.6 Hz, 6H). UV-vis spectrum: $\lambda_{max}$=626 nm (dichloromethane), Fluorometry: $\lambda_{max}$=783 nm (dichloromethane).

Compound 74

Synthesis of Compound 74 was performed according to the following procedures:

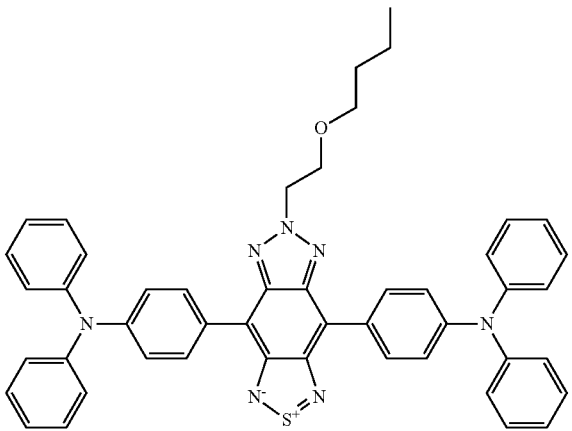

74

Compound 74 was obtained from Compound 4 by alkylation with tosylate of 2-butoxyethanol (2 eq) in the presence of potassium carbonate (5 eq) in DMF at 80° C. for 30 minutes. Under this condition only benzotriazole-2 isomer is formed. Pouring into water afforded solid which was separated by filtration, washed with water, followed by methanol, dried, and subjected to column chromatography (DCM/hexane—3:2) to give pure product as dark blue solid. $^1$H NMR (400 MHz, CDCl$_3$): δ 8.36 (d, J=8.8 Hz, 4H), 7.22-7.32 (m, 20H), 7.08 (t, J=8.8 Hz, 4H), 5.05 (t, J=5.9 Hz, 2H), 4.21 (t, J=5.9 Hz, 2H), 3.48 (t, J=6.6 Hz, 2H), 1.48 (m, 2H), 1.24 (m, 2H), 0.77 (t, J=7.3 Hz, 3H). UV-vis spectrum: $\lambda_{max}$=606 nm (dichloromethane), Fluorometry: $\lambda_{max}$=752 nm (dichloromethane).

Compound 75

Synthesis of Compound 75 was performed according to the following procedures:

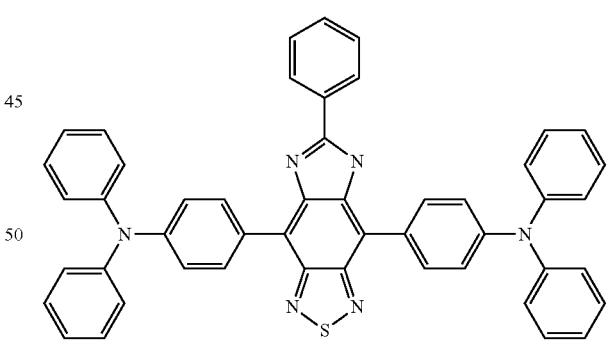

75

Compound 75 was prepared from Intermediate C by reaction with benzoyl chloride in refluxing toluene for one hour. Work-up with ice cold NaHCO$_3$, dried, and the solvent removed, followed by column chromatography (DCM/hexane-3:2) gave pure product as a pink solid. $^1$H NMR (400 MHz, CDCl$_3$): δ 9.48 (s, 1H), 8.36 (d, J=8.8 Hz, 2H), 8.14 (m, 2H), 7.81 (d, J=8.4 Hz, 2H), 7.54 (bs, 3H), 7.2-7.4 (m, 22H), 7.10 (m, 4H). UV-vis spectrum: $\lambda_{max}$=502 nm (dichloromethane), Fluorometry: $\lambda_{max}$=637 nm (dichloromethane).

Compound 76

Synthesis of Compound 76 was performed according to the following procedures:

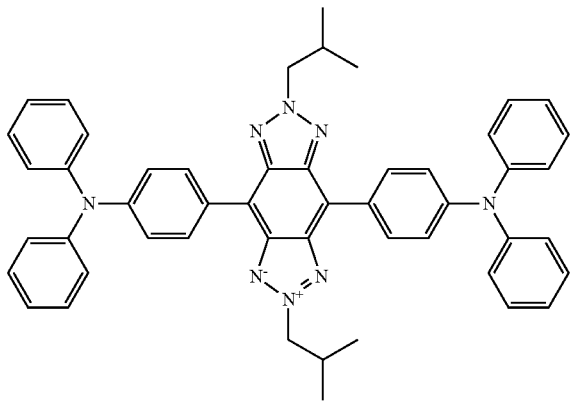

76

Compound 76 was prepared from Compound 2 by alkylation with tosylate prepared from isobutyl alcohol following the same procedure used for Compound 3. $^1$H NMR (400 MHz, CDCl$_3$): δ 8.61 (d, J=8.8 Hz, 4H), 7.16-7.36 (m, 20H), 7.06 (t, J=7.2 Hz, 4H), 4.66 (d, J=7.0 Hz, 4H), 2.67 (m, 2H), 1.03 (d, J=6.6 Hz, 12H). UV-vis spectrum: $\lambda_{max}$=512 nm (dichloromethane), Fluorometry: $\lambda_{max}$=611 nm (dichloromethane).

Compound 77

Synthesis of Compound 77 was performed according to the following procedures:

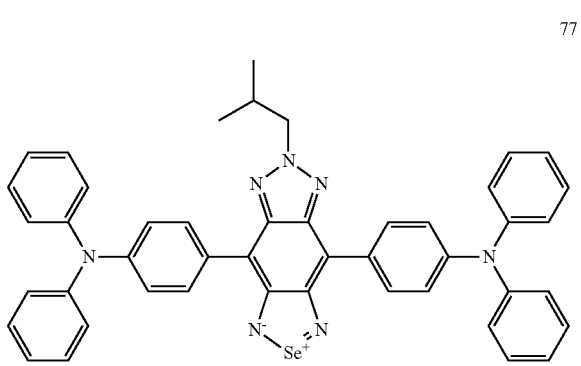 [SMILES: CC(C)Cn1nc2c(-c3ccc(N(c4ccccc4)c4ccccc4)cc3)c3n[se+][n-]c3c(-c3ccc(N(c4ccccc4)c4ccccc4)cc3)c2n1]

77

Compound 77 was prepared from Intermediate E by reaction with selenium oxide dissolved in hot water added to solution of Intermediate E in hot ethanol. The reaction mixture was heated at reflux for five hours. After cooling, the solid was separated, washed with methanol and dried. Column chromatography with DCM gave pure product as a dark green solid. $^1$H NMR (400 MHz, CDCl$_3$): δ 8.25 (d, J=8.4 Hz, 4H), 7.22-7.32 (m, 20H), 7.07 (t, J=7.0 Hz, 4H), 4.63 (d, J=7.3 Hz, 2H), 2.68 (m, 1H), 1.04 (d, J=6.6 Hz, 6H). UV-vis spectrum: $\lambda_{max}$=669 nm (dichloromethane), Fluorometry: $\lambda_{max}$=807 nm (dichloromethane).

Compound 78

Synthesis of Compound 78 was performed according to the following procedures:

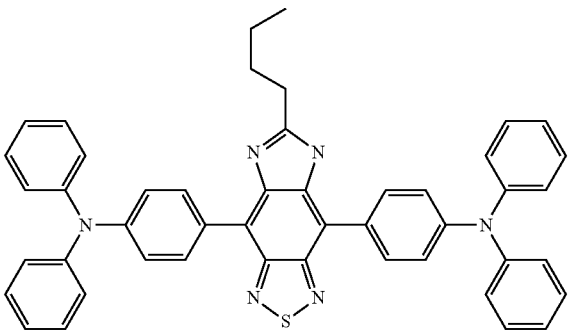

78

Compound 78 was prepared from Intermediate C by reaction with valeryl chloride (1.1 eq) in refluxing toluene, for two hours. Column chromatography without work-up (DCM/hexane—3:2) afforded pure product as purple solid. $^1$H NMR (400 MHz, CDCl$_3$): δ 8.20 (bs, J=2H), 7.75 (bs, 2H), 7.20-7.29 (m, 20H), 2.94 (t, J=8.0 Hz, 2H), 1.83-1.90 (m, 2H), 1.46-1.54 (m, 2H), 0.98 (t, J=7.3 Hz, 3H). UV-vis spectrum: $\lambda_{max}$=480 nm (dichloromethane), Fluorometry: $\lambda_{max}$=622 nm (dichloromethane).

Compound 79

Synthesis of Compound 79 was performed according to the following procedures:

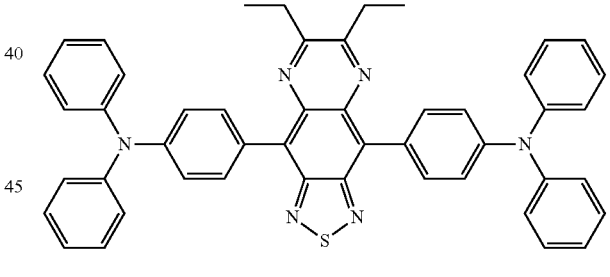

79

Compound 79 was prepared from Intermediate C and 3,4-hexanedione using the same procedure used for Compound 1, at room temperature in DCM in the presence of acetic acid (it takes 15 minutes to accomplish). Evaporation of the solvent and trituration with methanol gives pure product as a violet solid. $^1$H NMR (400 MHz, CDCl$_3$): δ 7.89 (d, J=8.8 Hz, 4H), 7.24-7.30 (m, 20H), 7.06 (t, J=7.0 Hz, 4H), 3.01 (q, J=7.0 Hz, 4H), 1.38 (t, J=7.3 Hz, 6H). UV-vis spectrum: $\lambda_{max}$=561 nm (dichloromethane), Fluorometry: $\lambda_{max}$=725 nm (dichloromethane).

Compound 80

Synthesis of Compound 80 was performed according to the following procedures:

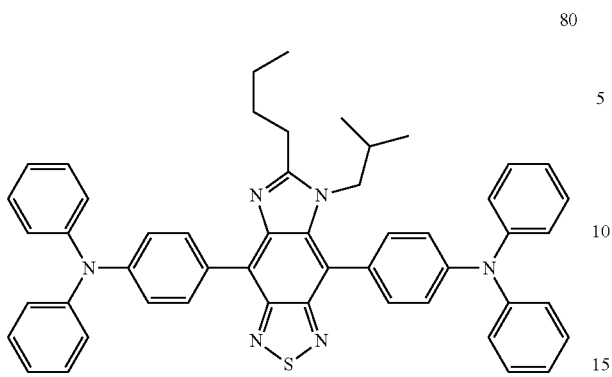

80

Compound 80 was obtained from Compound 78 (following standard procedure for alkylation with tosylate of isobutyl alcohol for four hours at 120° C. UV-vis spectrum: $\lambda_{max}$=472 nm (dichloromethane), Fluorometry: $\lambda_{max}$=616 nm (dichloromethane).

Compound 81

Synthesis of Compound 81 was performed according to the following procedures:

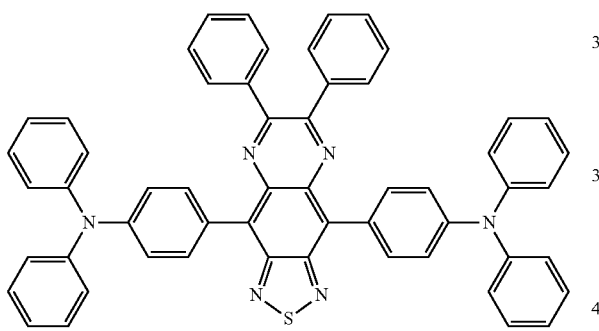

81

Compound 81 was obtained from Intermediate C with benzil in DCM in the presence of acetic acid and stirred for one hour at room temperature. Column chromatography (DCM/hexane) provided pure product as a dark blue solid. $^1$H NMR (400 MHz, CDCl$_3$): δ 7.96 (d, J=8.4 Hz, 4H), 7.65 (d, J=7.3 Hz, 4H), 7.25-7.34 (m, 26H), 7.09 (t, J=7.3 Hz, 4H). UV-vis spectrum: $\lambda_{max}$=609 nm (dichloromethane), Fluorometry: $\lambda_{max}$=777 nm (dichloromethane).

Intermediate B-7

Synthesis of Intermediate B-7 was performed according to the following scheme:

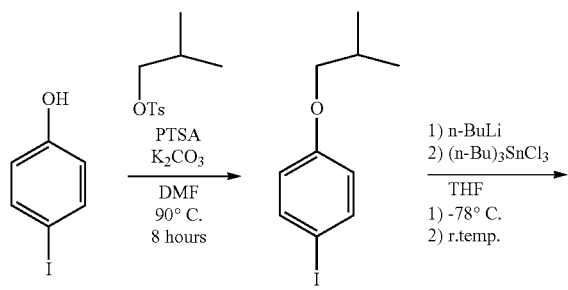

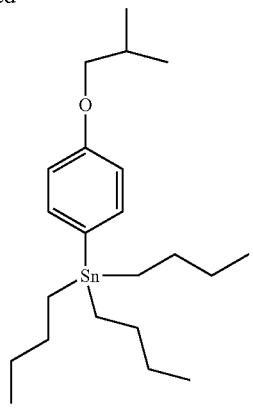

Intermediate B-7

Intermediate B-7 was prepared similarly to the procedure used for Intermediate B. In the first step 4-iodophenol was alkylated with tosylate of isobutyl alcohol with close to quantitative yield. The crude product was used directly for the preparation of stannyl derivative according to the general procedure.

Intermediate C-7

Synthesis of Intermediate C-7 was performed according to the following scheme:

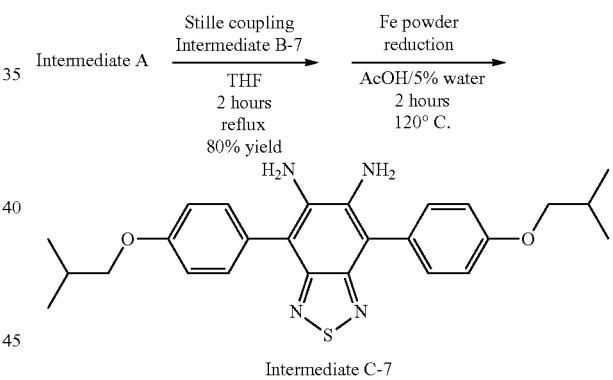

Intermediate C-7

Intermediate C-7 was prepared similarly to the procedure used for Intermediate C. The crude product from Intermediate B-7 (yellowish oil) was used for the Stille coupling with Intermediate A (5 hours reflux in THF). Work-up with water and DCM, evaporation of the solvent and trituration with MeOH gave the nitro-derivative as a yellow solid. It was reduced with iron powder (10 eq) at 130° C. in acetic acid with 5% of water at 130 C for two hours. Pouring into water afforded yellowish-green solid which was dried and washed through a layer of silica gel to remove particles of iron (DCM/hexane, 1:1). All steps were monitored by TLC and LCMS (purity above 80%). The crude product was cyclized to benzotriazole under standard conditions. Purification by column chromatography gave a reddish-orange solid.

Compound 82

Synthesis of Compound 82 was performed according to the following scheme:

Intermediate C-7 $\xrightarrow[\text{THF}]{\text{NaNO}_2}$

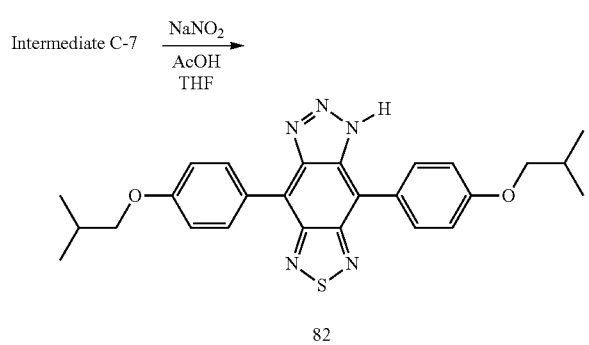

82

Compound 82 was prepared using Intermediate C-7. $^1$H NMR (400 MHz, CDCl$_3$): δ 8.39 (bs, 2H), 7.86 bs, 2H)), 7.06 (d, J=8.1 Hz, 4H), 3.81 (d, J=6.2 Hz, 4H), 2.14 (m, 2H), 1.05 (d, J=6.6 Hz, 6H). UV-vis spectrum: $\lambda_{max}$=490 nm (dichloromethane), Fluorometry: $\lambda_{max}$=603 nm (dichloromethane).

Compound 83

Synthesis of Compound 83 was performed according to the following scheme:

Intermediate C-7 ⟶

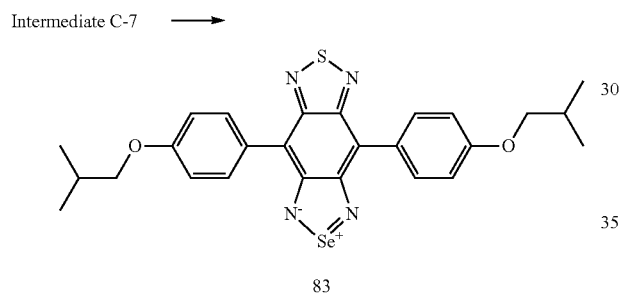

83

Compound 83 was prepared from Intermediate C-7 by reaction with selenium oxide in a mixture of ethanol and water (2:1) by refluxing for one hour. Evaporation of the solvent gave solid which was separated, washed with water followed by methanol, and dried to give a pure dark green solid. $^1$H NMR (400 MHz, CDCl$_3$): δ 8.08 (d, J=8.4 Hz, 4H), 7.15 (d, J=8.4 Hz, 4H)), 3.85 (d, J=6.6 Hz, 4H), 2.16 (m, 2H), 1.06 (d, J=6.6 Hz, 6H). UV-vis spectrum: $\lambda_{max}$=674 nm (dichloromethane), Fluorometry: $\lambda_{max}$=806 nm (dichloromethane).

Compound 84

Synthesis of Compound 84 was performed according to the following scheme:

Intermediate C-7 ⟶

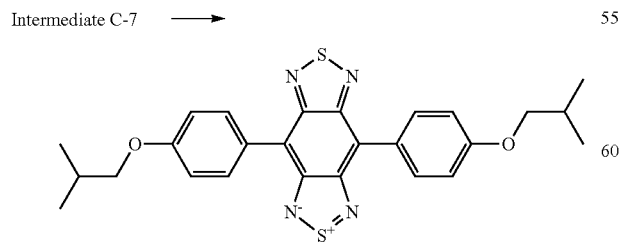

84

Compound 84 was prepared from Intermediate C-7 by reaction with thionylpyridine in dry pyridine, in the presence of trimethylsilylchloride, for four hours at 80° C. Column chromatography (DCM/hexane) afforded pure product. $^1$H NMR (400 MHz, CDCl$_3$): δ 8.16 (d, J=8.8 Hz, 4H), 7.16 (d, J=9.1 Hz, 4H), 3.85 (d, J=6.7 Hz, 4H), 2.16 (m, 2H), 1.06 (d, J=6.6 Hz, 6H). UV-vis spectrum: $\lambda_{max}$=605 nm (dichloromethane), Fluorometry: $\lambda_{max}$=732 nm (dichloromethane).

Intermediate E-7

Synthesis of Intermediate E-7 was performed according to the following scheme:

Intermediate D $\xrightarrow[\substack{\text{THF} \\ \text{2 hours} \\ \text{reflux} \\ \text{80\% yield}}]{\substack{\text{Stille coupling} \\ \text{Intermediate B-7}}}$ $\xrightarrow[\substack{\text{AcOH/5\% water} \\ \text{2 hours} \\ \text{120° C.}}]{\substack{\text{Fe powder} \\ \text{reduction}}}$

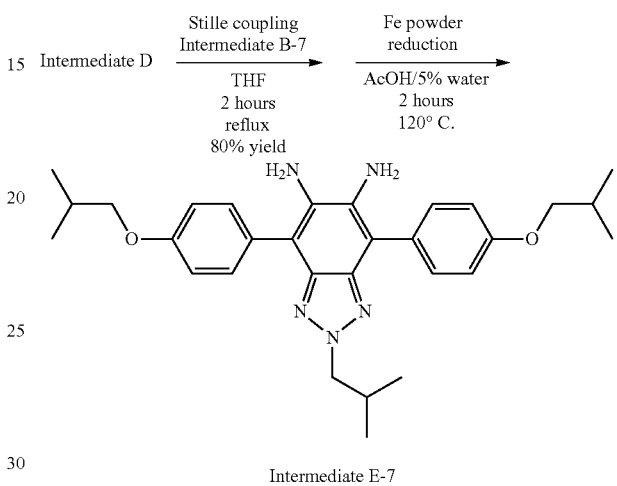

Intermediate E-7

Intermediate E-7 was prepared similarly to the procedure used for Intermediate E.

Compound 85

Synthesis of Compound 85 was performed according to the following scheme:

Intermediate E-7 $\xrightarrow[\text{AcOH}]{\text{DCM}}$

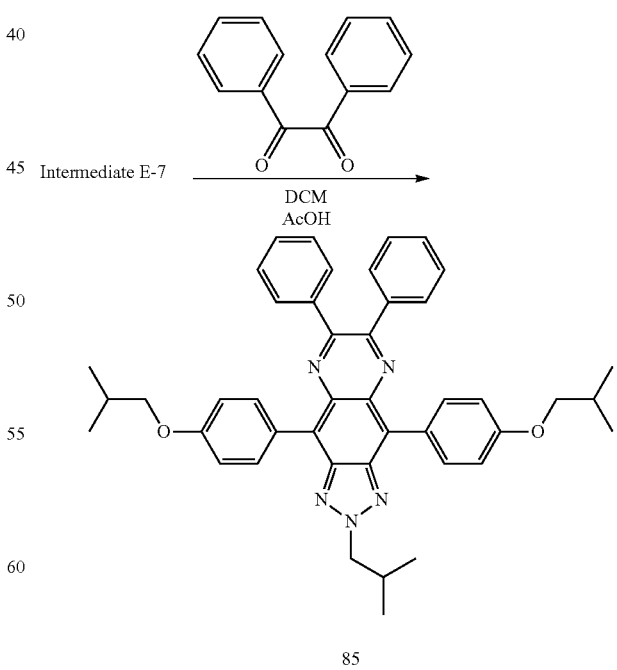

85

Compound 85 was obtained as red solid and was prepared starting from Intermediate E-7 using the same procedure that was used for Compound 81, with benzyl (1:1 molar ratio) in DCM, at room temperature in the presence of acetic acid. $^1$H NMR (400 MHz, CDCl$_3$): δ 8.11 (d, J=8.4 Hz, 4H), 7.63 (d, J=7.7 Hz, 4H), 7.30 (m, 6H), 7.14 (d, J=8.8 Hz, 4H), 4.70 (d, J=7.3 Hz, 2H), 4.12 (m, 2H), 3.86 (d, J=6.6 Hz, 4H), 2.15 (m, 1H), 1.08 (d, J=7.0 Hz, 12H), 1.03 (d, J=6.6 Hz, 6H). UV-vis spectrum: $\lambda_{max}$=477 nm (dichloromethane), Fluorometry: $\lambda_{max}$=577 nm (dichloromethane).

Compound 86

Synthesis of Compound 86 was performed according to the following scheme:

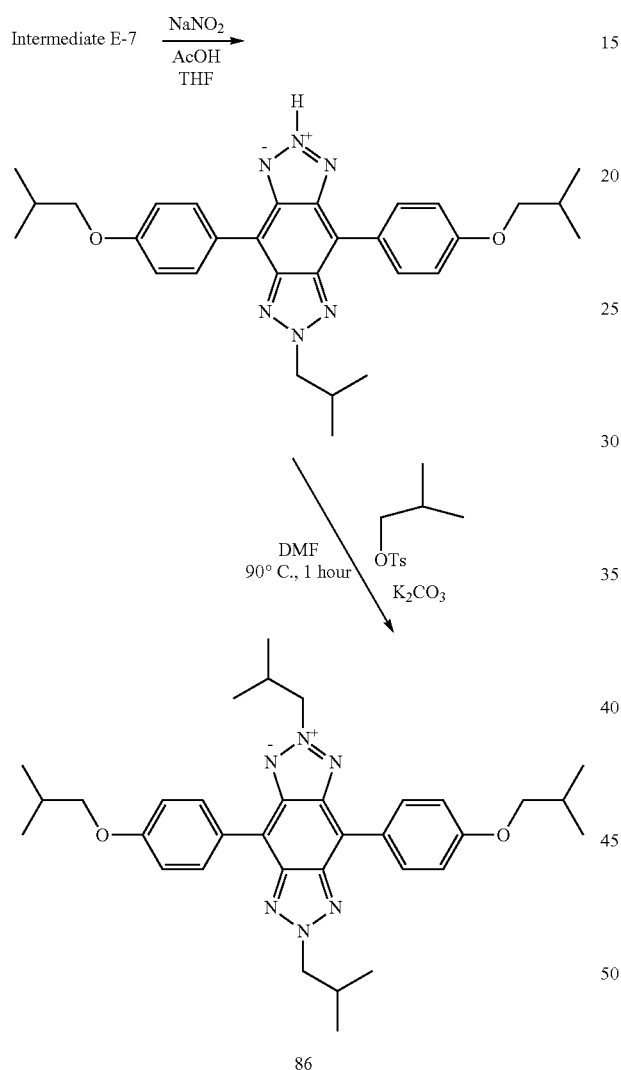

86

Compound 86 was prepared similarly to Compound 85, except first preparing benzotriazole from Intermediate E-7, and then alkylation with tosylate of isobutyl alcohol under standard condition. $^1$H NMR (400 MHz, CDCl$_3$): δ 8.54 (d, J=8.8 Hz, 4H), 7.11 (d, J=8.8 Hz, 4H), 4.67 (d, J=7.3 Hz, 2H), 4.12 (m, 4H), 3.83 (d, J=6.6 Hz, 4H), 2.68 (m, 2H), 2.15 (m, 2H), 1.05 (d, J=6.6 Hz, 12H, 1.04 (d, J=7.0 Hz, 12H). UV-vis spectrum: $\lambda_{max}$=471 nm (dichloromethane), Fluorometry: $\lambda_{max}$=537 nm (dichloromethane).

Intermediate B-8

Synthesis of Intermediate B-8 was performed according to the following scheme:

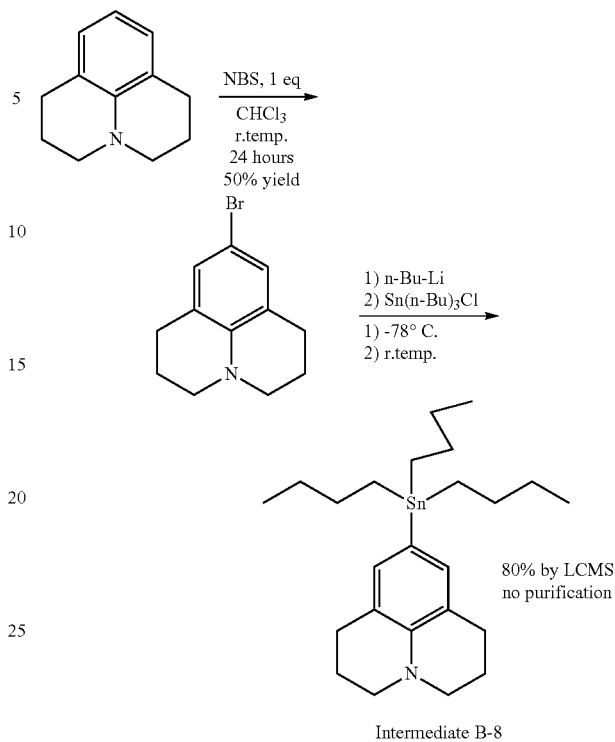

Intermediate B-8

Intermediate B-8 was prepared similarly to the procedure used for Intermediate B.

Intermediate C-8

Synthesis of Intermediate C-8 was performed according to the following scheme:

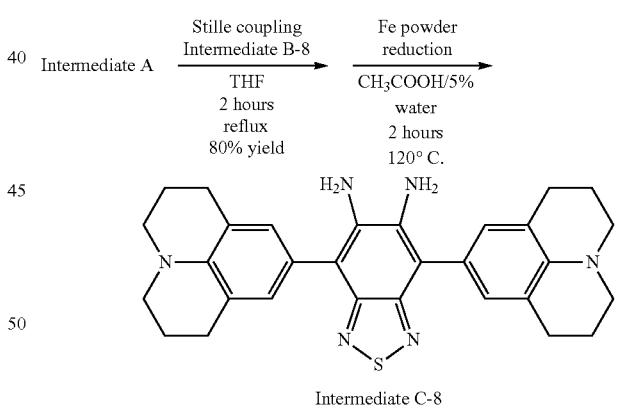

Intermediate C-8

Intermediate C-8 was prepared similarly to the procedure used for Intermediate C.

Compound 87

Synthesis of Compound 87 was performed according to the following scheme:

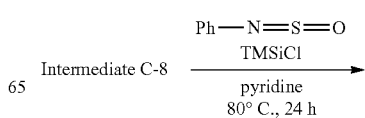

-continued

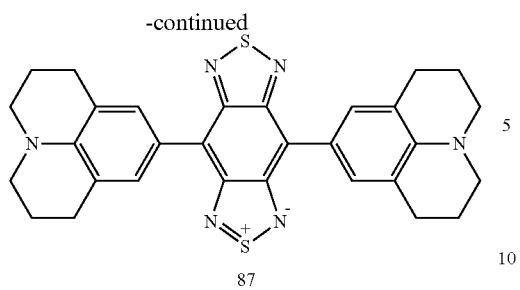

87

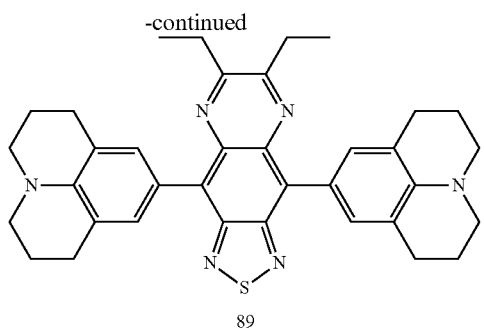

89

Compound 86 was prepared by reaction of Intermediate C-8 with thionyl aniline (0.8 mL per one mmol) in the presence of trimethylsilyl chloride (3 eq) in dry pyridine at 80° C. Work-up with water afforded crude dark greenish-blue solid which was purified by column chromatography (DCM/5% THF) to give pure product. $^1$H NMR (400 MHz, CDCl$_3$): δ 7.71 (s, 4H), 3.26 (t, J=5.5 Hz, 8H), 2.90 (t, J=6.2 Hz, 8H), 2.04 (m, 8H). UV-vis spectrum: $\lambda_{max}$=801 nm (dichloromethane), Fluorometry: $\lambda_{max}$=831 nm (dichloromethane).

Compound 88

Synthesis of Compound 88 was performed according to the following scheme:

Intermediate C-8 $\xrightarrow{\begin{array}{c}\text{NaNO}_2\\\text{1) )° C.}\\\text{2) r.temp.}\\\text{CH}_3\text{COOH}\\\text{THF, 1 hour}\end{array}}$

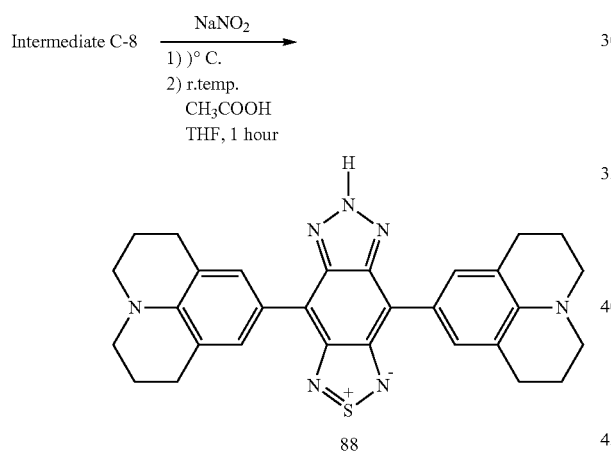

88

Compound 88 was prepared from Intermediate C-8 following the same procedure used for Compound 2. $^1$H NMR (400 MHz, CDCl$_3$): δ 6.94 (s, 4H), 3.18 (t, J=5.5 Hz, 8H), 2.82 (t, J=6.4 Hz, 8H), 2.00 (, 8H). (UV-vis spectrum: $\lambda_{max}$=602 nm (dichloromethane), Fluorometry: $\lambda_{max}$=742 nm (dichloromethane).

Compound 89

Synthesis of Compound 89 was performed according to the following scheme:

Intermediate C-8 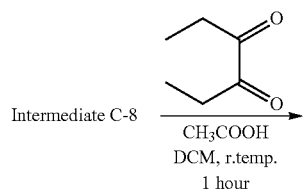 $\xrightarrow{\begin{array}{c}\text{CH}_3\text{COOH}\\\text{DCM, r.temp.}\\\text{1 hour}\end{array}}$ Compound 89 was prepared from Intermediate C-8 with 3,4-cyclohexanedione in DCM in the presence of acetic acid according to the same procedure used for Compound 1. The product obtained was a blue solid. $^1$H NMR (400 MHz, CDCl$_3$): δ 7.53 (s, 4H), 7.57 (t, J=5.5 Hz, 8H), 2.98 (q, J=7.5 Hz, 4H), 2.88 (t, J=6.6 Hz, 8H), 2.04 (m, 8H), 1.40 (t, J=7.3 Hz, 6H). UV-vis spectrum: $\lambda_{max}$=622 nm (dichloromethane), Fluorometry: $\lambda_{max}$=757 nm (dichloromethane).

Intermediate B-9

Synthesis of Intermediate B-9 was performed according to the following scheme:

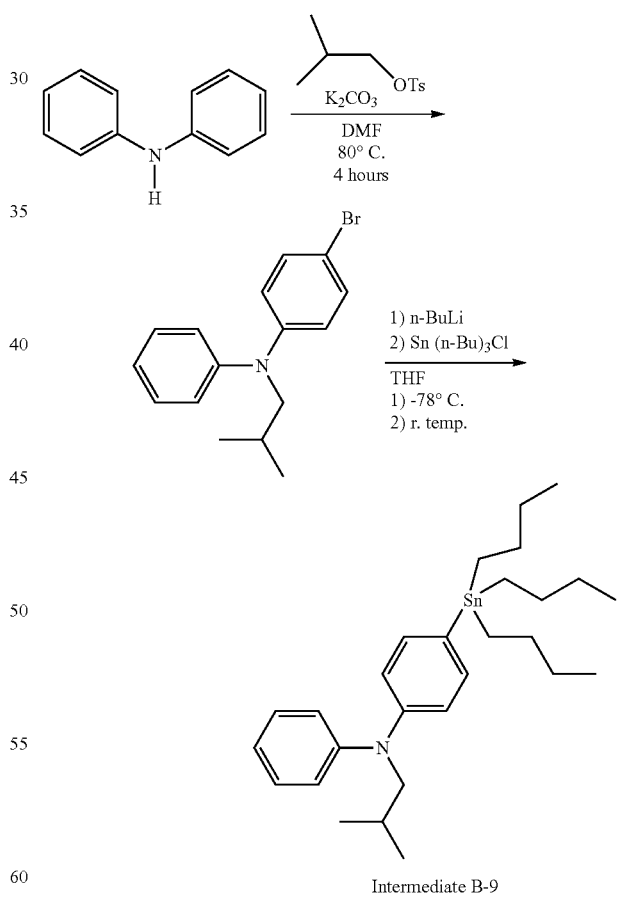

Intermediate B-9

Intermediate B-9 was prepared similarly to the procedure used for Intermediate B.

Intermediate E-9

Synthesis of Intermediate E-9 was performed according to the following scheme:

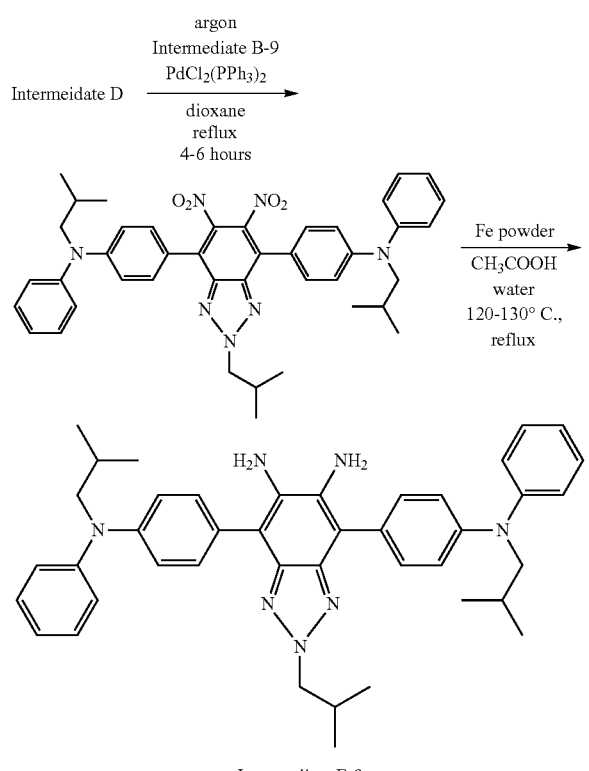

Intermediate E-9

Intermediate E-9 was prepared following the general method as was used for Intermediate E. $^1$H NMR (400 MHz, CDCl$_3$): δ 7.39 (t, J=8.8 Hz, 8H), 7.24 (d, J=9.2 Hz, 4H), 7.17 (t, J=7.3 Hz, 2H), 6.85 (d, J=9.2 Hz, 4H), 4.54 (d, J=7.3 Hz, 2H), 3.57 (d, J=7.3 Hz, 4H), 2.51 (m, 1H), 2.09 (m, 2H), 0.96 (d, J=6.6 Hz, 12H), 0.93 (d, J=6.6 Hz, 6H).

Compound 90

Synthesis of Compound 90 was performed according to the following scheme:

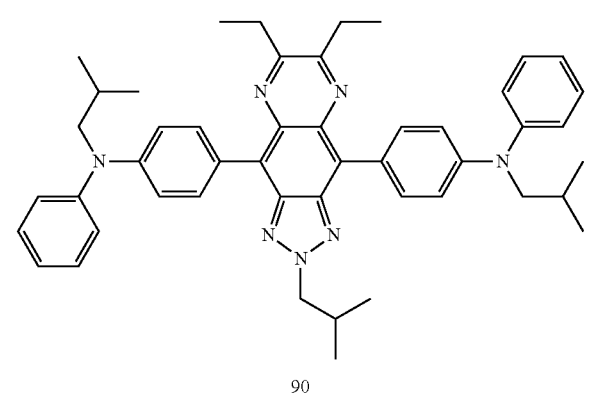

Compound 90 was prepared from Intermediate E-9 following the same procedure used for Compound 1. $^1$H NMR (400 MHz, CDCl$_3$): δ 8.05 (d, 8.8 Hz, 4H), 7.32 (t, J=8.6 Hz, 4H), 7.24, (t, J=7.3 Hz, 4H), 7.09 (d, J=8.8 Hz, 4H), 7.03 (t, J=7.5 Hz, 2H), 4.67 (d, J=7.3 Hz, 2H), 3.63 (d, J=7.3 Hz, 4H), 2.99 (q, J=7.3 Hz, 4H), 2.67 (m, 1H), 2.16 (m, 2H), 1.39 (t, J=7.3 Hz, 6H), 1.01 (d, J=6.6 Hz, 12H), 1.04 (d, J=6.6 Hz, 6H). UV-vis spectrum: λ$_{max}$=492 nm (dichloromethane), Fluorometry: λ$_{max}$=627 nm (dichloromethane).

Compound 91

Synthesis of Compound 91 was performed according to the following scheme:

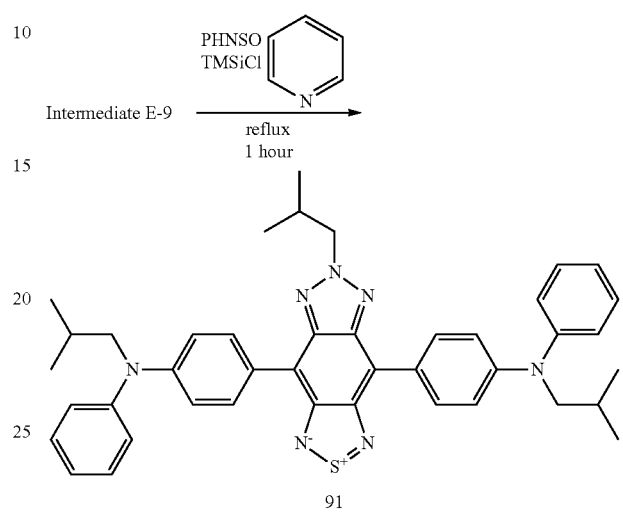

Compound 91 was prepared from Intermediate E-9 following the same procedure as for Compound 87. The product obtained was a blue solid. $^1$H NMR (400 MHz, CDCl$_3$): δ 8.32 (d, 9.2 Hz, 4H), 7.35 (t, J=8.4 Hz, 4H), 7.24, (d, J=9.2 Hz, 4H), 7.09 (d, J=9.2 Hz, 6H), 4.67 (d, J=7.3 Hz, 2H), 3.63 (d, J=7.3 Hz, 4H), 2.67 (m, 1H), 2.16 (m, 2H), 1.39 (t, J=7.3 Hz, 6H), 1.04 (d, J=6.6 Hz, 12H), 1.00 (d, J=6.6 Hz, 6H). UV-vis spectrum: λ$_{max}$=616 nm (dichloromethane), Fluorometry: λ$_{max}$=781 nm (dichloromethane).

Compound 92

Synthesis of Compound 92 was performed according to the following scheme:

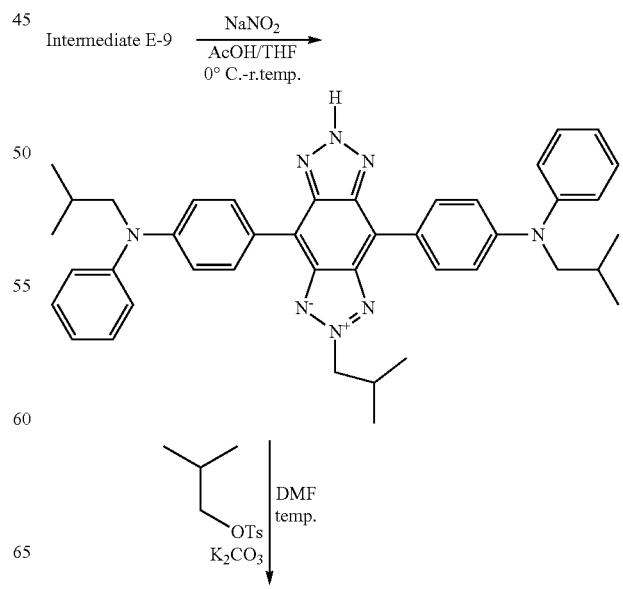

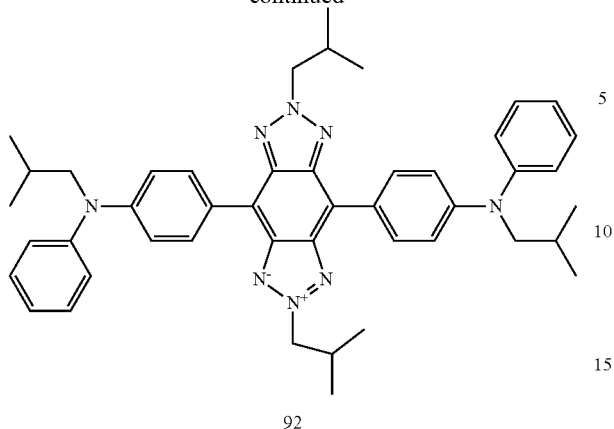

92

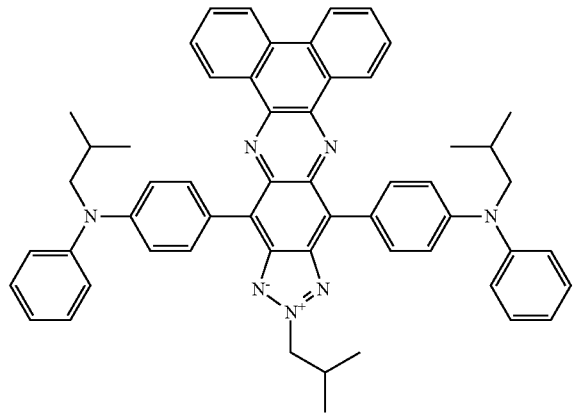

93

Compound 92 was prepared from Intermediate E-9 following the same procedure used for Compound 3. The product was isolated in a small amount and characterized only by LCMS. UV-vis spectrum: $\lambda_{max}$=521 nm (dichloromethane), Fluorometry: $\lambda_{max}$=618 nm (dichloromethane).

Compound 93

Synthesis of Compound 93 was performed according to the following procedures:

Compound 93 was prepared from Intermediate E-9 following the same procedure used for Compound 1 with (DCM/acetic acid, room temperature, 1 hour) but using phenanthrenequinone instead (1.1 eq). $^1$H NMR (400 MHz, CDCl$_3$): δ 9.12 (, J=7.7 Hz, 2H), 8.47 (d, J=8.1 Hz, 2H), 8.22 (d, J=8.4 Hz, 4H), 7.73 (t, J=7.4 Hz, 2H), 7.64 (t, J=7.7 Hz, 2H), 7.22-7.40 (m, 12H), 7.09 (t, J=8.4 Hz, 2H), 4.76 (d, J=7.3 Hz, 2H), 3.72 (d, J=7.3 Hz, 4H), 2.73 (m, 1H), 2.23 (m, 2H), 1.07 (d, J=6.6 Hz, 18H). UV-vis spectrum: $\lambda_{max}$=604 nm (dichloromethane), Fluorometry: $\lambda_{max}$=745 nm (dichloromethane).

Compound 94

Synthesis of Compound 94 was performed according to the following procedures:

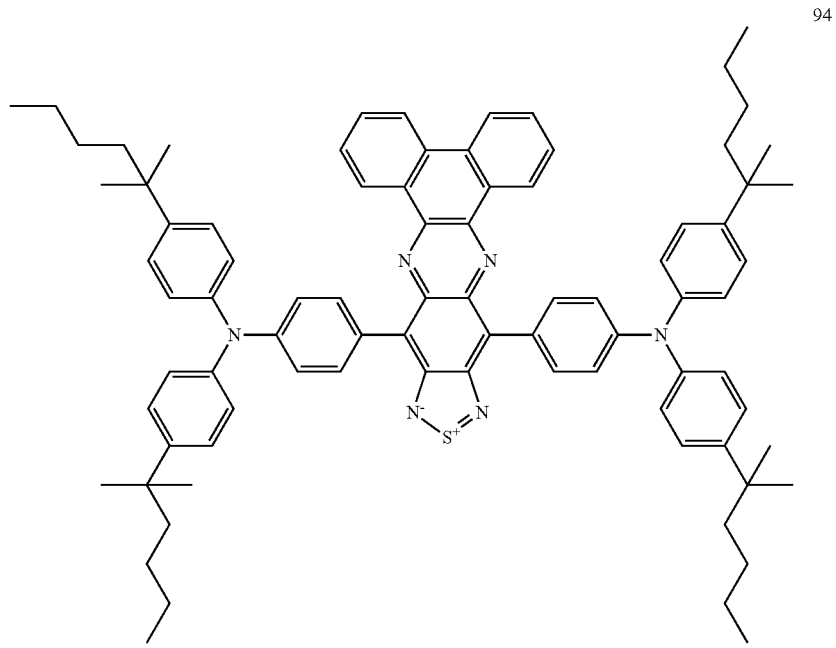 [SMILES: CCCCC(C)(C)c1ccc(N(c2ccc(-c3c4nc5c6ccccc6c6ccccc6c5nc4c(-c4ccc(N(c5ccc(C(C)(C)CCCC)cc5)c5ccc(C(C)(C)CCCC)cc5)cc4)c4[n-][s+]nc34)cc2)c2ccc(C(C)(C)CCCC)cc2)cc1]

94

Compound 94 was prepared from Compound 25 following the same procedure as was used for Compound 70. $^1$H NMR (400 MHz, CD$_2$Cl$_2$): δ 9.00 (d, J=8.0 Hz, 2H), 8.47 (d, J=8.0 Hz, 2H), 8.03 (d, J=8.4 Hz, 4H), 7.77 (t, J=7.0 Hz, 2H), 7.65 (t, J=7.7 Hz, 2H), 7.22-34 (m, 20H), 1.60-1.68 (m, 8H), 1.32 (s, 24H), 1.23-1.32 (m, 8H), 1.12-1.16 (m, 8H), 0.85 (t, J=7.3 Hz, 12H). UV-vis spectrum: $\lambda_{max}$=707 nm (dichloromethane), Fluorometry: $\lambda_{max}$=821 nm (dichloromethane).

Compound 95

Synthesis of Compound 95 was performed according to the following procedures:

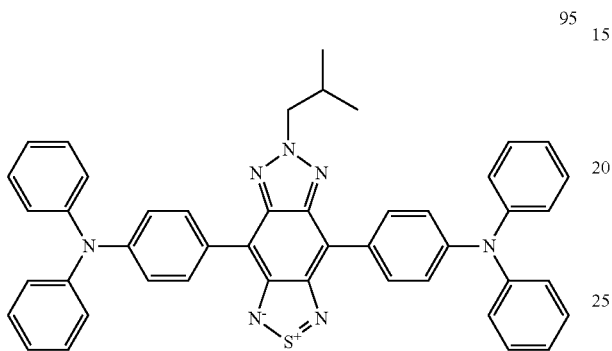

95

Compound 95 is the same as Compound 69. Compound 95 was prepared from Intermediate C by reaction with thionyl aniline in the presence of trimethylsilyl chloride in dry pyridine at 80° C. for two hours. The same compound was also prepared by alkylation of Compound 4 with isobutyl tosylate as described for Compound 5.

Compound 96

Synthesis of Compound 96 was performed according to the following procedures:

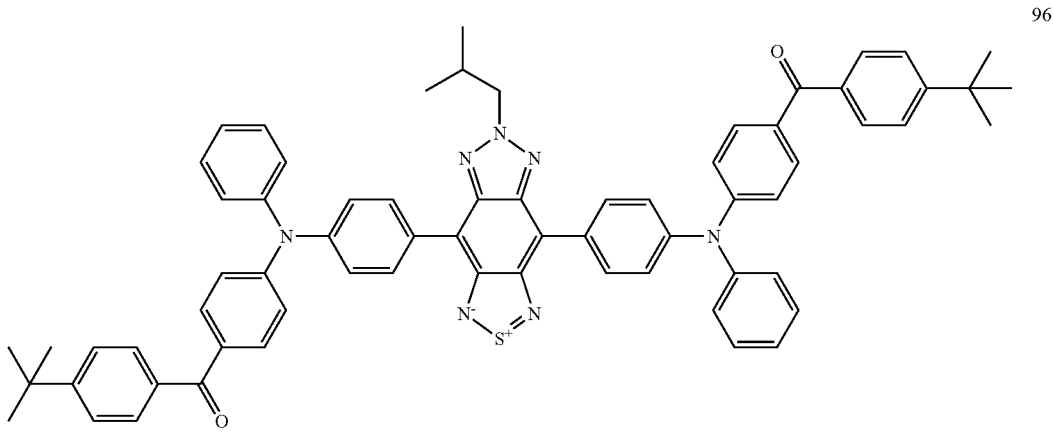 [SMILES: CC(C)Cn1nc2c(-c3ccc(N(c4ccccc4)c4ccc(C(=O)c5ccc(C(C)(C)C)cc5)cc4)cc3)c3n[s+][n-]c3c(-c3ccc(N(c4ccccc4)c4ccc(C(=O)c5ccc(C(C)(C)C)cc5)cc4)cc3)c2n1]

96

Compound 96 was prepared from Compound 95 by reacting 4-tert-butylbenzoyl chloride in the presence of zinc chloride in refluxing DCM for 24 hours. Work-up with sodium bicarbonate, washing the organic layer with water, drying, evaporation of the solvent and column chromatography (DCM-2.5% ethyl acetate) produced pure product as a dark blue solid. $^1$H NMR (400 MHz, CD$_2$Cl$_2$): δ 8.42 (d, J=8.8 Hz, 4H), 7.93 (d, J=8.8 Hz, 2H), 7.73 (d, J=8.8 Hz, 4H), 7.72 (d, J=8.4 Hz, 4H), 7.50 (d, J=8.4 Hz, 4H), 7.35-7.47 (m, 10H), 7.31 (d, J=7.7 Hz, 2H), 7.17-7.23 (m, 6H), 4.71 (d, J=7.3 Hz, 2H), 2.67 (m, 1H), 1.31-1.38 (24H, 6Me&i-Bu). UV-vis spectrum: $\lambda_{max}$=587 nm (dichloromethane), Fluorometry: $\lambda_{max}$=725 nm (dichloromethane).

Compound 97 and 98

Synthesis of Compound 97 and Compound 98 were performed according to the following procedures:

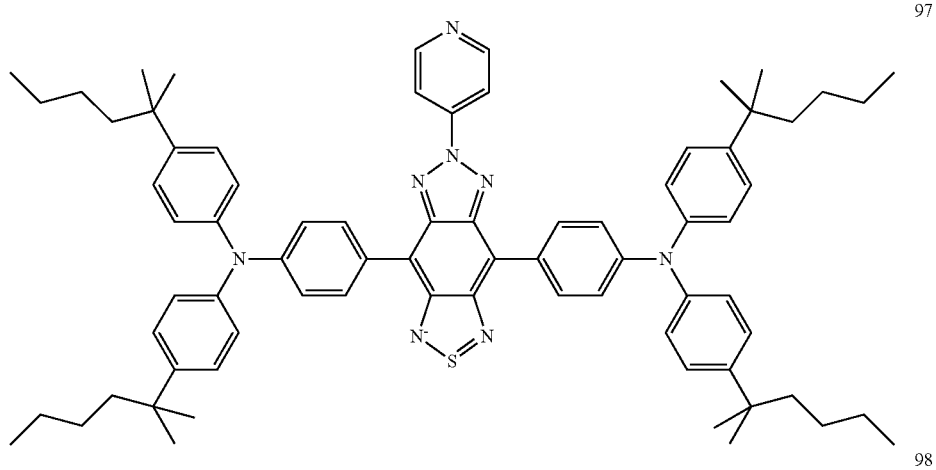

97

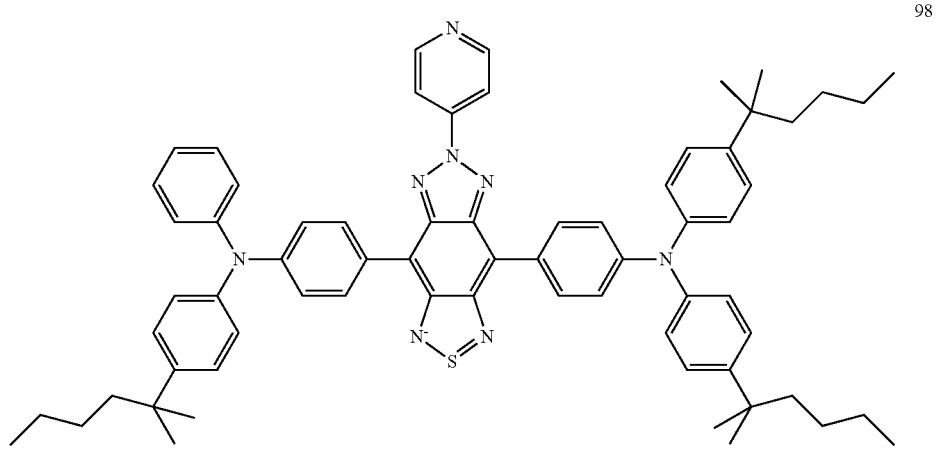

98

Compound 97 and Compound 98 were prepared following the same procedure used for Compound 70 using Compound 59 as the starting material.

$^1$H NMR for Compound 97 (400 MHz, CDCl$_3$): δ 8.88 (d, J=6.2 Hz, 2H), 8.48 (d, J=6.2 Hz, 2H), 8.44 (d, J=8.8 Hz, 4H), 7.27 (d, J=8.8 Hz, 6H), 2.26 (d, 8.8 Hz, 12H), 7.18 (d, J=8.8 Hz, 6H), 1.60 (m, 8H), 1.30 (s, 24H), 1.23-1.31 (m, 8H), 1.06-1.14 (m, 8H) 0.87 (t, J=7.0 Hz, 12H). UV-vis spectrum: λ$_{max}$=706 nm (dichloromethane), Fluorometry: λ$_{max}$=808 nm (dichloromethane).

Intermediate I

Synthesis of Intermediate I was performed according to the following scheme:

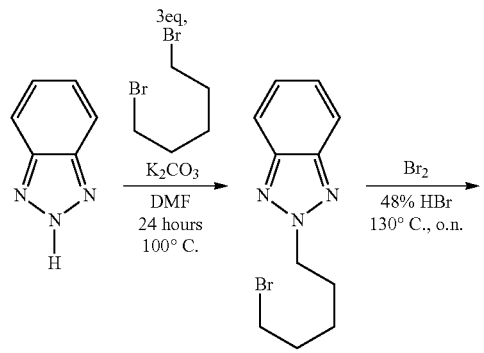

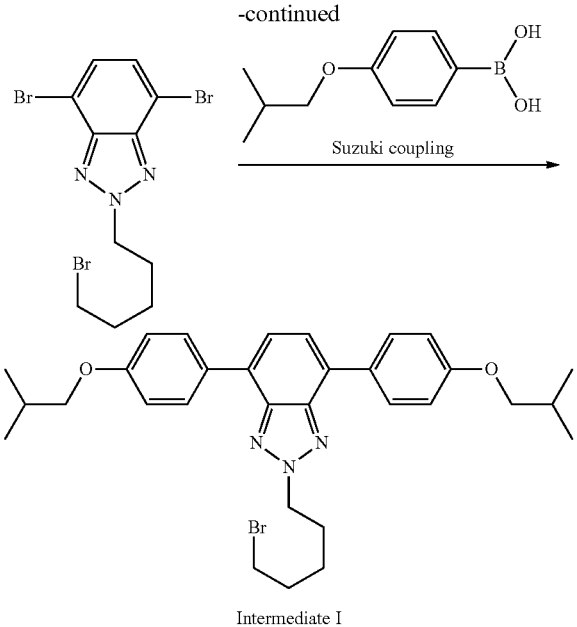

Intermediate I

Intermediate I was prepared as presented above. $^1$H NMR (400 MHz, CDCl$_3$): δ 7.99 (d, J=8.8 Hz, 4H), 7.55 (s, 2H), 7.04 (d, J=8.8 Hz, 4H), 4.78 (t, J=7.0 Hz, 2H), 3.79 (d, J=6.6 Hz, 4H), 3.39 (t, J=7.0 Hz, 2H), 2.11-2.18 (m, 4H), 1.85 (m, 2H), 1.50 (m, 2H), 1.04 (d, J=6.6 Hz, 12H).

Compound 99

Synthesis of Compound 99 was performed according to the following scheme:

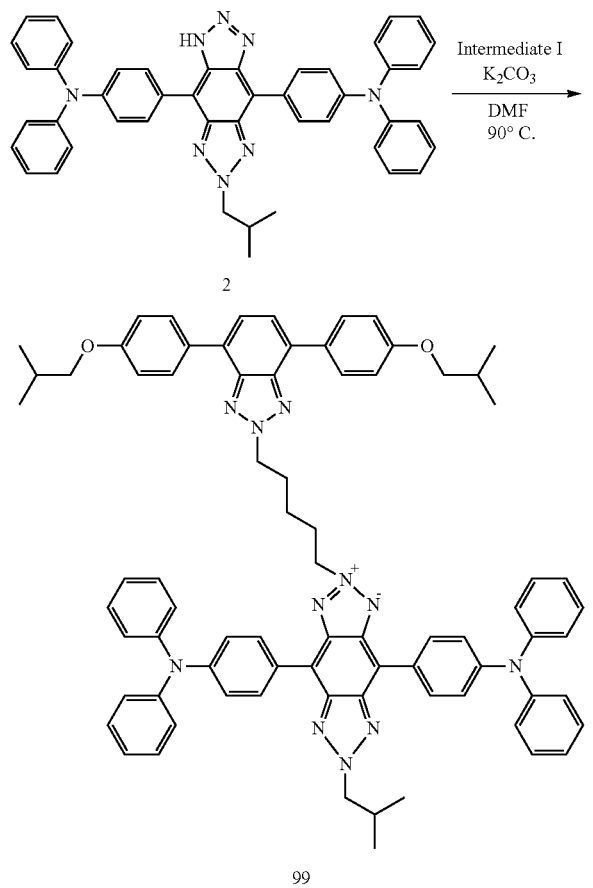

Compound 99 was obtained from Compound 2 and Intermediate I (1099-65) using standard alkylation conditions. $^1$H NMR (400 MHz, CDCl$_3$): δ 7.97 (m, 8H), 7.52 (s, 2H), 6.90-7.35 (m, 28H), 4.76 (m, 6H), 3.79 (d, J=6.6 Hz, 2H), 3.75 (d, J=6.6 Hz, 4H), 2.67 (m, 1H), 2.05-2.25 (m, 6H), 1.52 (m, 2H), 1.03 (m, 18H, 3 doublets overlapped).

Compound 100

Synthesis of Compound 100 was performed according to the following procedures:

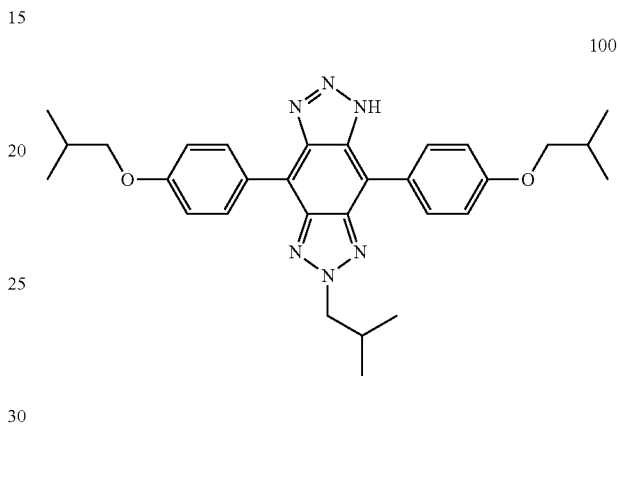

Compound 100 was prepared using Intermediate B-7 by reaction with Intermediate D following the same procedure that was used for Compound 2.

Compound 101

Synthesis of Compound 101 was performed according to the following scheme:

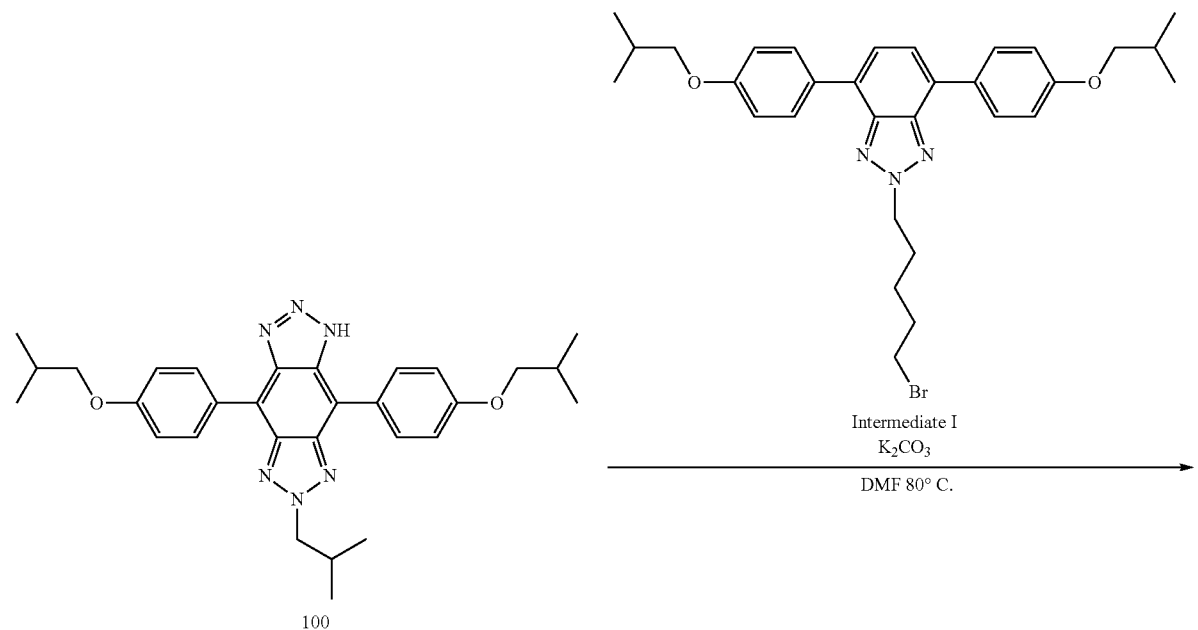

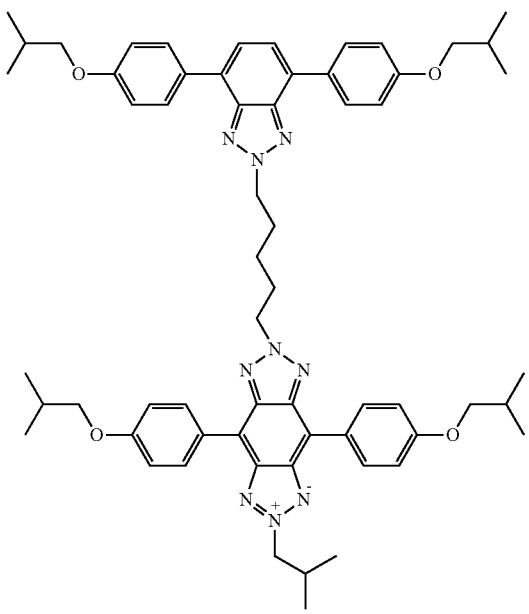
101
Compound 101 was prepared as presented in the scheme above, using the same conditions that were used for Compound 3. The reaction was easily monitored by TLC. $^1$H NMR (400 MHz, CDCl$_3$): δ 8.52 (d, J=8.8 Hz, 4H), 7.96 (d, J=8.8 Hz, 4H), 7.52 (S, 2H), 4.85 (d, J=7.3 Hz, 2H), 4.77 (d, J=7.0 Hz, 2H), 4.66 (d, J=7.3 Hz), 3.80 (d, 6.6 Hz, 4H), 3.75 (d, J=6.2 Hz, 4H), 1.68 (m, 1H), 2.05-2.25 (m, 8H), 1.51 (bs, 2H), 1.03 (3 doublets overlapped).
Compound 102
Synthesis of Compound 102 was performed according to the following scheme:
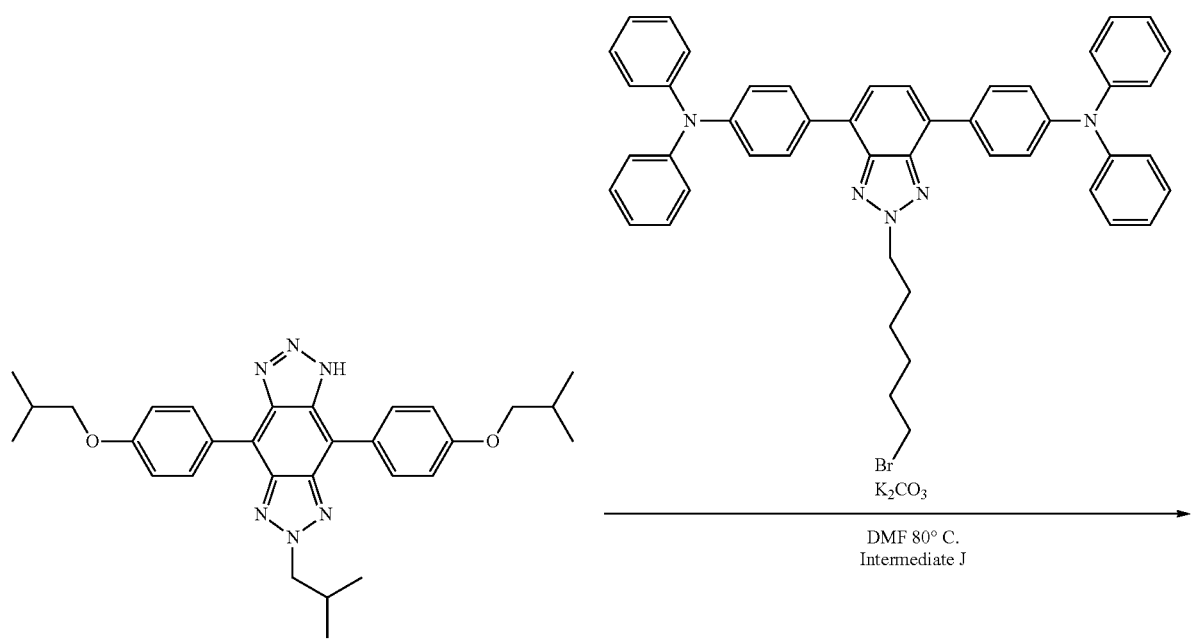
100

-continued

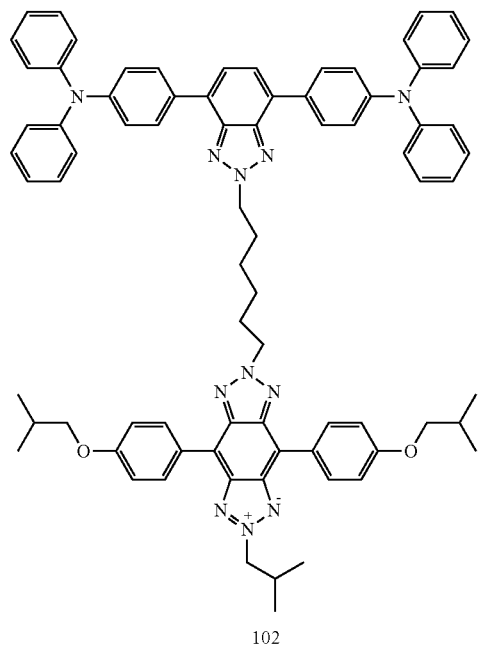

102

Compound 102 was prepared similarly to Compound 100 and Compound 101. Intermediate J was prepared by analogy to Intermediate I but using 1,6-dibromohexane for alkylation of benzotriazole and later Stille coupling with Intermediate B (instead of Suzuki coupling). $^1$H NMR (400 MHz, CDCl$_3$): δ 8.52 (d, J=8.8 Hz, 4H), 7.97 (d, J=8.8 Hz, 4H), 7.58 (s, 2H), 7.25 (m, 8H), 7.16 (m, 12H), 7.09 (d, 8.8 Hz, 4H), 7.02 (t, J=7.3 Hz, 4H), 4.84 (t, J=7.0, 2H), 4.78 (t, =7.3 Hz, 2H), 4.67 (d, J=7.3 Hz, 2H), 3.80 (d, J=6.6 Hz, 4H), 2.67 (m, 1H), 2.13-2.23 (m, 6H), 1.52 (bs, 4H), 1.04 (d, J=7.0 Hz, 18H).

Although the foregoing description has shown, described, and pointed out the fundamental novel features of the present teachings, it will be understood that various omissions, substitutions, and changes in the form of the detail of the invention as illustrated, as well as the uses thereof, may be made by those skilled in the art, without departing from the scope of the present teachings. Consequently, the scope of the present teachings should not be limited to the foregoing discussion, but should be defined by the appended claims. All patents, patent publications and other documents referred to herein are hereby incorporated by reference in their entirety.

What is claimed is:

1. A chromophore represented by formula (I):

D$_1$—Het—(L—Het)$_i$—D$_2$     (I)

wherein:
L is independently C$_{1-8}$ alkyl or C$_{6-10}$ aryl;
D$_1$ is selected from the group consisting of:
  (1) C$_{6-10}$ aryl-NR'R''; and
  (2) C$_{6-10}$ aryl-C$_{6-10}$ aryl-NR'R'';
D$_2$ is selected from the group consisting of:
  (1) C$_{6-10}$ aryl-NR'R''; and
  (2) C$_{6-10}$ aryl-C$_{6-10}$ aryl-NR'R'';
each R' is independently C$_{1-8}$ alkyl or C$_{6-10}$ aryl, wherein the C$_{6-10}$ aryl is substituted by —C(=O)R; or
each R', together with the C$_{6-10}$ aryl to which the nitrogen atom is attached to, forms a fused C$_{1-8}$ heterocyclic ring comprising nitrogen;
each R'' is independently C$_{1-8}$ alkyl or C$_{6-10}$ aryl, wherein the C$_{6-10}$ aryl is optionally substituted by —C(=O)R; or
each R'', together with the C$_{6-10}$ aryl to which the nitrogen atom is attached to, forms a fused C$_{1-8}$ heterocyclic ring comprising nitrogen; or
each R' and R'', together with the C$_{6-10}$ aryl to which the nitrogen atom is attached to, forms a fused C$_{1-8}$ heterocyclic ring comprising nitrogen;
Het is selected from the group consisting of:

X is —S—;
R$_a$ is selected from the group consisting of:
  (1) hydrogen;
  (2) C$_{1-8}$ alkyl, optionally substituted by:
    (a) halo;
    (b) CN;
    (c) C$_{1-6}$ alkoxy;
    (d) C$_{6-10}$ aryloxy, optionally substituted by halo, CN, or —C(=O)R;

(e) C$_{3-10}$ cycloalkyl; or
(f) C$_{6-10}$ aryl, optionally substituted by halo or CN;
(3) C$_{6-10}$ aryl, optionally substituted by:
  (a) halo;
  (b) CN;
  (c) C$_{1-8}$ alkyl;
  (d) C$_{1-6}$ alkoxy; or
  (e) C(=O)R; and
(4) C$_{6-10}$ heteroaryl, optionally substituted by:
  (a) halo;
  (b) CN; or
  (c) C$_{1-8}$ alkyl;
    wherein the C$_{6-10}$ heteroaryl contains one or more nitrogen heteroatoms;
R$_b$ is selected from the group consisting of:
(1) hydrogen;
(2) C$_{1-8}$ alkyl, optionally substituted by:
  (a) halo;
  (b) CN;
  (c) C$_{1-6}$ alkoxy;
  (d) C$_{6-10}$ aryloxy, optionally substituted by halo, CN, or —C(=O)R;
  (e) C$_{3-10}$ cycloalkyl; or
  (f) C$_{6-10}$ aryl, optionally substituted by halo or CN;
(3) C$_{6-10}$ aryl, optionally substituted by:
  (a) halo;
  (b) CN;
  (c) C$_{1-8}$ alkyl;
  (d) C$_{1-6}$ alkoxy; or
  (e) C(=O)R; and
(4) C$_{6-10}$ heteroaryl, optionally substituted by:
  (a) halo;
  (b) CN; or
  (c) C$_{1-8}$ alkyl;
    wherein the C$_{6-10}$ heteroaryl contains one or more nitrogen heteroatoms; or
R$_a$ and R$_b$, together with the carbon atoms to which they are attached, form a monocyclic ring or a polycyclic ring system selected from the group consisting of C$_{3-10}$ cycloalkyl and C$_{6-10}$ aryl;
wherein the monocyclic ring or polycyclic ring system is optionally substituted by:
  (a) halo;
  (b) C$_{1-8}$ alkyl;
  (c) C$_{1-6}$ alkoxy; or
  (d) C$_{6-10}$ aryl, optionally substituted by C$_{1-6}$ alkoxy;
each R is independently C$_{1-8}$ alkyl, C$_{1-6}$ alkoxy, or C$_{6-10}$ aryl, wherein the C$_{6-10}$ aryl is optionally substituted by C$_{1-8}$ alkyl; and
i is 0;
with the proviso that R$_a$ and R$_b$ are not both hydrogen.

2. The chromophore of claim 1, wherein:
D$_1$ is selected from the group consisting of:

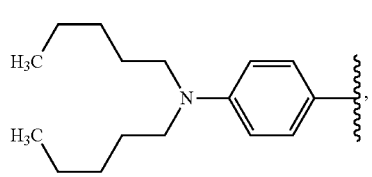

-continued

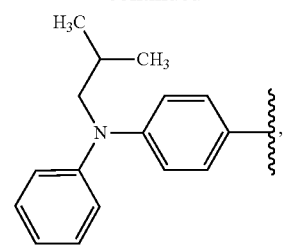

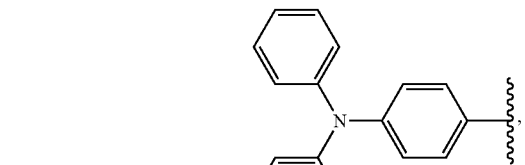

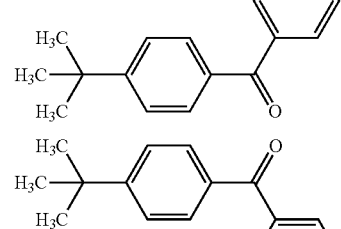

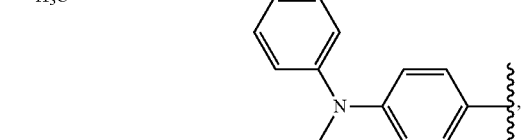

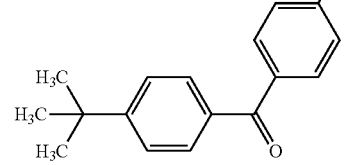

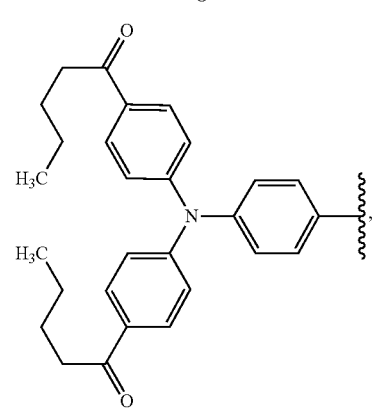

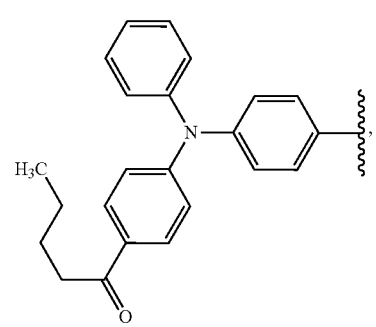

-continued

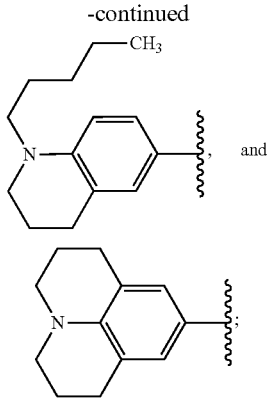

and $D_2$ is selected from the group consisting of:

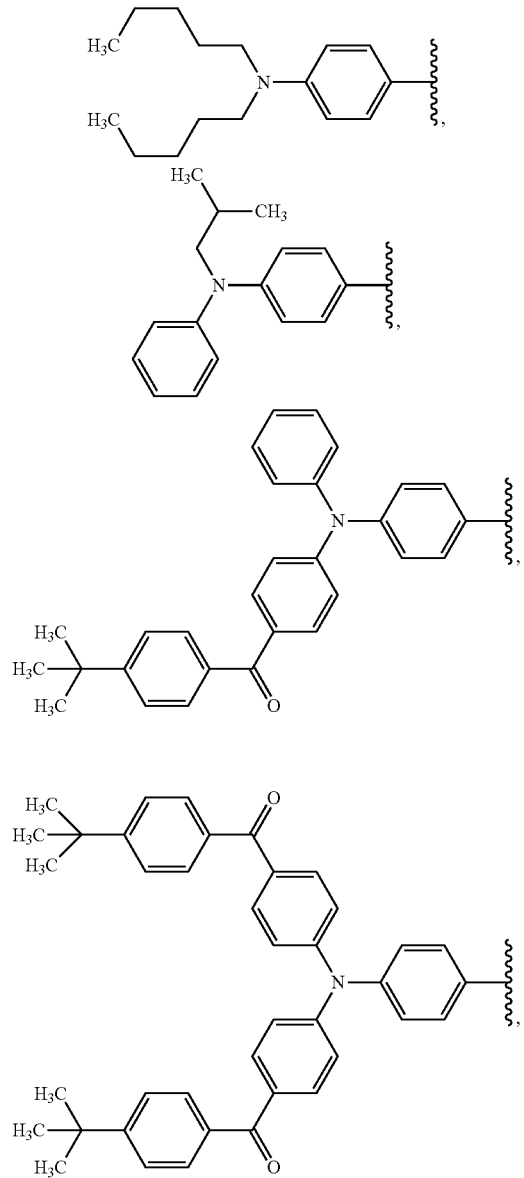

-continued

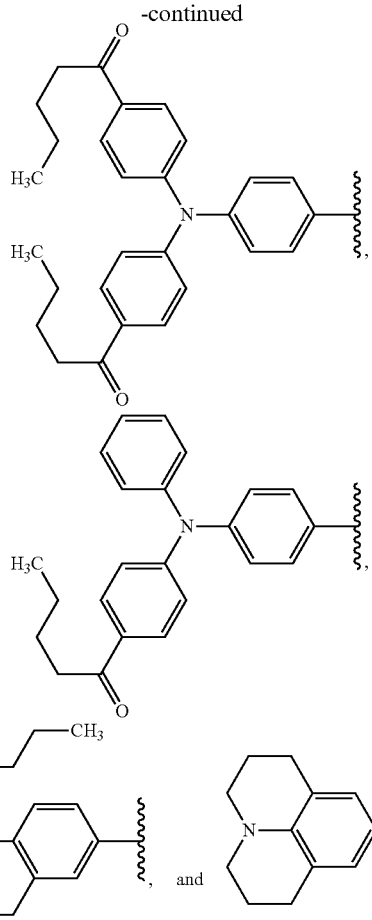

3. The chromophore of claim 1, wherein:

$R_a$ is selected from the group consisting of methyl, ethyl, n-propyl, isopropyl, n-butyl, isobutyl, tert-butyl, pentyl, hexyl, 2-ethylhexyl, 6-(3,5-difluorophenoxy)hexyl, 2-butoxyethyl, 4-(4-cyanophenoxy)butyl, 5-(4-cyanophenoxy)pentyl, 5-(4-acetylphenoxy)pentyl, cyclohexylmethyl, adamantylmethyl, 2-cyclohexylethyl, benzyl, 4-fluorobenzyl, 2,6-difluorobenzyl, phenyl, 4-(ethoxycarbonyl)phenyl, 3,4-dicyanophenyl, 4-pyridinyl, 2-pyrimidinyl, and 2-methylquinolin-4-yl; and $R_b$ is selected from the group consisting of methyl, ethyl, n-propyl, isopropyl, n-butyl, isobutyl, tert-butyl, pentyl, hexyl, 2-ethylhexyl, 6-(3,5-difluorophenoxy)hexyl, 2-butoxyethyl, 4-(4-cyanophenoxy)butyl, 5-(4-cyanophenoxy)pentyl, 5-(4-acetylphenoxy)pentyl, cyclohexylmethyl, adamantylmethyl, 2-cyclohexylethyl, benzyl, 4-fluorobenzyl, 2,6-difluorobenzyl, phenyl, 4-(ethoxycarbonyl)phenyl, 3,4-dicyanophenyl, 4-pyridinyl, 2-pyrimidinyl, and 2-methylquinolin-4-yl.

4. The chromophore of claim 1, wherein:

$R_a$ and $R_b$, together with the carbon atoms to which they are attached, form a monocyclic ring or polycyclic ring system selected from the group consisting of:

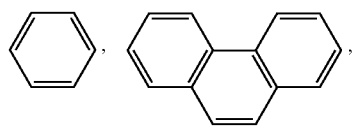

-continued

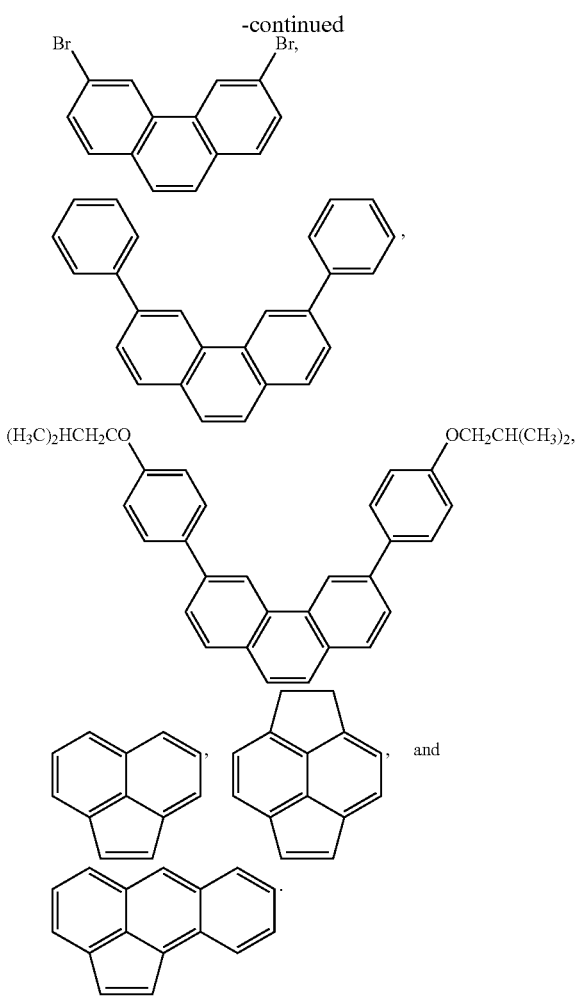

5. A wavelength conversion luminescent medium comprising an optically transparent polymer matrix and at least one luminescent dye comprising a chromophore of claim 1.

6. The wavelength conversion luminescent medium of claim 5, wherein the optically transparent polymer matrix comprises a substance selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, and polyacrylate, and combinations thereof.

7. The wavelength conversion luminescent medium of claim 5, wherein the refractive index of the optically transparent polymer matrix is in the range of 1.4 to 1.7.

8. The wavelength conversion luminescent medium of claim 5, wherein the at least one luminescent dye is present in the optically transparent polymer matrix in an amount in the range of 0.01 wt. % to 3 wt. %.

9. A photovoltaic module comprising at least one photovoltaic device or solar cell and a wavelength conversion luminescent medium of claim 5.

10. The photovoltaic module of claim 9, wherein the photovoltaic module further comprises a refractive, index matching liquid or optical adhesive %.

11. The photovoltaic module of claim 9, wherein the photovoltaic device or solar cell comprises at least one device selected from the group consisting of a cadmium sulfide/cadmium telluride solar cell, a copper indium gallium diselenide solar cell, an amorphous silicon solar cell, a microcrystalline silicon solar cell, and a crystalline silicon solar cell.

12. The photovoltaic module of claim 9, wherein the wavelength conversion luminescent medium is a film having a thickness in the range of 0.1 µm to 1 mm.

13. A method for improving the performance of a photovoltaic device of solar cell, wherein the method comprises:
(a) applying the wavelength conversion luminescent medium of claim 5 directly onto the light incident side of the photovoltaic device or solar cell; or
(b) encapsulating the wavelength conversion luminescent medium of claim 5 in the photovoltaic device or solar cell.

* * * * *